US008984374B2

(12) United States Patent
Yoshihara

(10) Patent No.: US 8,984,374 B2
(45) Date of Patent: Mar. 17, 2015

(54) STORAGE SYSTEM AND STORAGE CONTROL APPARATUS

(75) Inventor: Tomohiro Yoshihara, Yokohama (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 13/510,299

(22) PCT Filed: Apr. 27, 2012

(86) PCT No.: PCT/JP2012/002929
§ 371 (c)(1),
(2), (4) Date: May 17, 2012

(87) PCT Pub. No.: WO2013/160970
PCT Pub. Date: Oct. 31, 2013

(65) Prior Publication Data
US 2013/0290773 A1    Oct. 31, 2013

(51) Int. Cl.
G11C 29/00    (2006.01)
G06F 11/00    (2006.01)
H03M 13/00    (2006.01)
G06F 11/10    (2006.01)
H03M 13/09    (2006.01)
H04L 1/00    (2006.01)

(52) U.S. Cl.
CPC .......... *G06F 11/1076* (2013.01); *H03M 13/09* (2013.01); *G06F 2211/1059* (2013.01); *H04L 1/0063* (2013.01)
USPC .......... 714/766; 714/801; 714/773; 714/6.22; 714/6.24; 714/52

(58) Field of Classification Search
CPC .................. G06F 11/1076; G06F 2211/1054; G06F 11/108; G06F 11/10; G06F 2211/1059; G06F 2211/1009; G06F 11/14; G06F 3/0656; H03M 13/09; H04L 1/0061
USPC .......... 714/766, 769, 770, 771, 713, 801, 805, 714/800, 799, 6, 6.1, 6.13, 6.2, 6.21, 6.22, 714/6.24, 6.32, 10, 47.1, 48, 49, 52, 54, 714/773; 711/113, 114, 117, 118
See application file for complete search history.

(56) References Cited

U.S. PATENT DOCUMENTS 4,996,690 A * 2/1991 George et al. ................. 714/781
5,191,584 A   3/1993 Anderson
(Continued)

OTHER PUBLICATIONS

International Search Report received in International Application No. PCT/JP2012/002929 mailed on Dec. 6, 2012.

*Primary Examiner* — Christine Tu
(74) *Attorney, Agent, or Firm* — Mattingly & Malur, P.C.

(57) ABSTRACT

A storage system has a RAID group configured by storage media, a system controller with a processor, a buffer memory coupled to storage devices and the processor by a communication network, and a cache memory coupled to the processor and the buffer memory by the network. A processor that stores first data, which is related to a write request from a host computer, in a cache memory, specifies a first storage device for storing data before update, which is data obtained before updating the first data, and transfers the first data to the specified first storage device. A first device controller transmits the first data and second data based on the data before update, from the first storage device to the system controller. The processor stores the second data in the buffer memory, specifies a second storage device, and transfers the stored second data to the specified second storage device.

22 Claims, 92 Drawing Sheets

(56) References Cited

U.S. PATENT DOCUMENTS

| | | | |
|---|---|---|---|
| 5,373,512 A | * | 12/1994 | Brady .......................... 714/767 |
| 5,499,337 A | * | 3/1996 | Gordon ....................... 714/6.12 |
| 5,875,460 A | | 2/1999 | Kojima et al. |
| 5,958,078 A | | 9/1999 | Yamamoto et al. |
| 6,098,191 A | | 8/2000 | Yamamoto et al. |
| 6,473,867 B2 | | 10/2002 | Yamamoto et al. |
| 8,151,060 B2 | | 4/2012 | Mizushima |
| 2008/0109602 A1 | | 5/2008 | Ananthamurthy et al. |
| 2010/0017650 A1 | | 1/2010 | Chin et al. |
| 2011/0238885 A1 | | 9/2011 | Kitahara et al. |

* cited by examiner

STORAGE SYSTEM AND STORAGE CONTROL APPARATUS

TECHNICAL FIELD

The present invention relates to technology for computing a redundancy code stored in a storage device.

BACKGROUND ART

There is known a storage system that has a plurality of disk devices and a storage controller for controlling these disk devices, wherein each of the disk devices functions to create a parity (Patent Literature 1, for example). In this storage system, the storage controller transmits updated data (new data) to a disk device storing data before update (old data). From the old data and the new data, the disk device creates an intermediate value (intermediate parity) used for creating a new parity, writes the new data into the disk thereof, and empties the storage region in which the old data was stored, to have a blank region. The disk device transmits this intermediate parity to the storage controller. The storage controller stores the intermediate parity in a cache memory and nonvolatile memory of the storage controller. The storage controller then reads the intermediate parity from the cache memory and transmits the intermediate parity to a disk device storing an old parity. This disk device creates a new parity from the received intermediate parity and the old parity, writes the new parity into the disk thereof, and empties the storage region in which the old parity was stored, to have a blank region.

CITATION LIST

Patent Literature

[PTL (Patent Literature) 1]
U.S. Pat. No. 6,098,191

SUMMARY OF INVENTION

Technical Problem

In Patent Literature 1, the process for storing the intermediate parity in both the cache memory and the nonvolatile memory increases the load imposed on the storage controller. This makes the performance of the storage controller a bottleneck, deteriorating the performance of the storage controller. However, storing the intermediate parity in either the cache memory or the nonvolatile memory can cause data loss in case of a system fault.

Solution to Problem

A storage system as one aspect of the present invention has: a plurality of storage devices, each of which has a plurality of storage media and a device controller for controlling the plurality of storage media and has a RAID group configured by the plurality of storage media; and a system controller that has a processor, a buffer memory coupled to the plurality of storage devices and the processor by a predetermined communication network, and a cache memory coupled to the processor and the buffer memory by the predetermined communication network.

The processor stores first data, which is related to a write request from a host computer, in the cache memory, specifies from the plurality of storage devices a first storage device for storing data before update, which is data obtained before updating the first data, and transfers the first data to the specified first storage device. A first device controller of the first storage device transmits the first data and second data based on the data before update, from the first storage device to the system controller.

The processor stores the second data in the buffer memory, specifies a second storage device from the plurality of storage devices, and transfers the stored second data to the specified second storage device. The processor also manages a process stage information item indicating a stage of a process performed on the write request.

DESCRIPTION OF EMBODIMENTS

Several embodiments of the present invention are now described hereinafter.

In the following description, various types of information are expressed by "* table," but the various types of information may be expressed by data structures other than tables. In order to describe that the various types of information are independent of the data structures, "* table" can be referred to as "*** information."

Furthermore, in the following description, each process is described using "program" as the subject of the sentence; however, the subject of the sentence describing each process may be "processor", because a program is executed by a processor (e.g., a CPU (Central Processing Unit)), to perform a certain process by appropriately using a storage resource (e.g., memory) and/or a communication interface device (e.g., a communication port). The process that is described using "program" as the subject may be performed by a storage system, a controller contained in the storage system, an MPPK contained in the controller, which is described hereinafter, or an MP (Microprocessor) inside the MPPK. The processor may include a hardware circuit that performs part of or the entire process performed by the processor. The computer program may be installed from a program source into each computer. The program source may be, for example, a program distribution server or a storage medium.

Embodiment 1

Configuration of Storage System

A configuration of a storage system is described hereinafter as an example of the application of the present invention.

Figure 1:
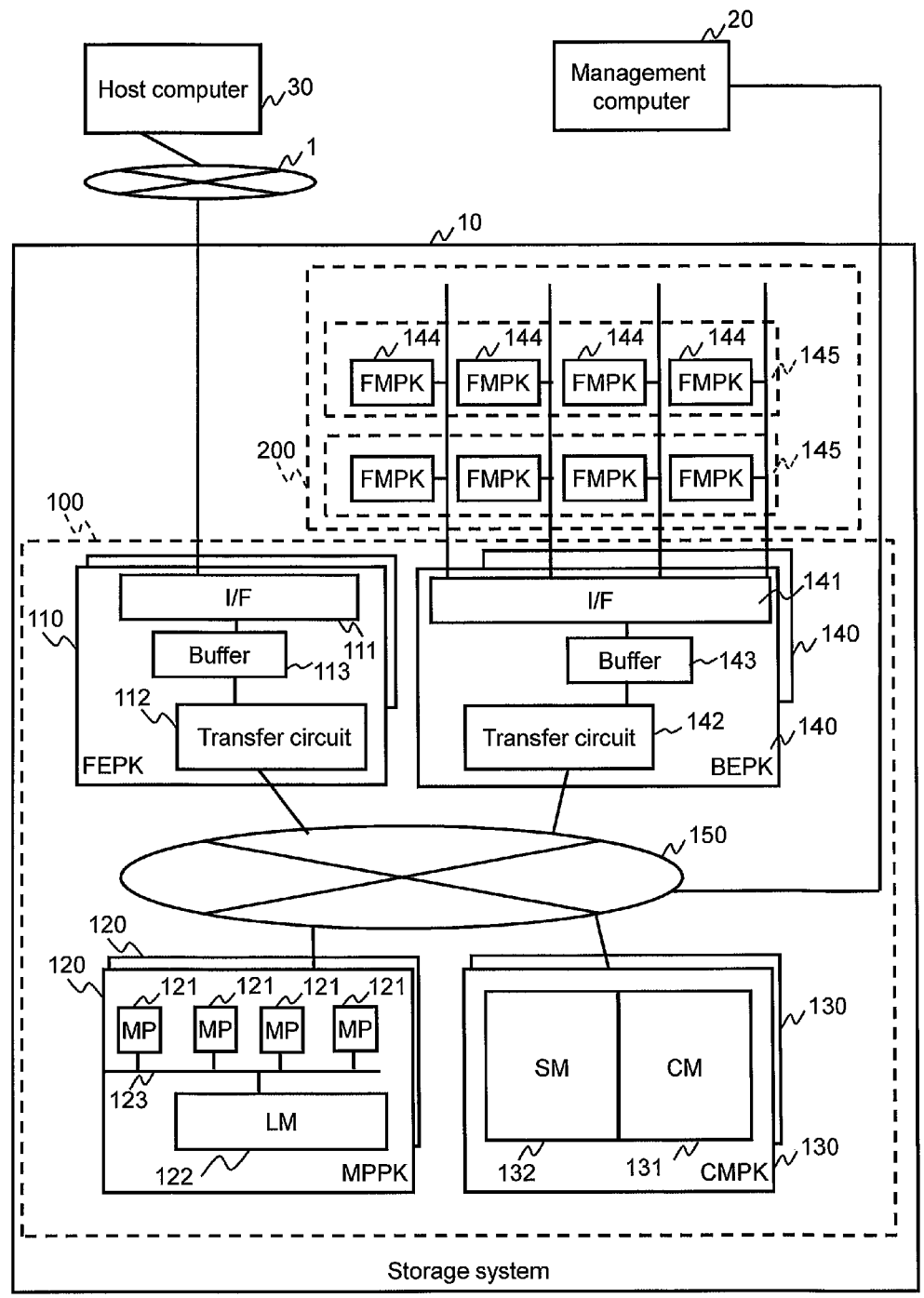
FIG. 1 shows a configuration of a storage system.

FIG. 1 shows a configuration of a storage system. The storage system 10 has a controller 100, and a storage unit 200 coupled to the controller 100. In the diagram, the controller 100 and the storage unit 200 are coupled to each other by a BE-I/F (Back End Inter/Face) 141.

The storage unit 200 has a plurality of (or one) FMPKs (Flash Memory PacKage) 144. A physical storage medium adopted in the storage unit 200 is a memory drive (e.g., an SSD (Solid State Drive)) that has a nonvolatile semiconductor memory (e.g., a flash memory). One or a plurality of RAID (Redundant Arrays of Inexpensive (or Independent) Disks) groups 145 are configured by the plurality of FMPKs 144. In the present embodiment, a RAID group of RAID level 5 is formed by the controller 100 using the plurality of FMPKs 144. Furthermore, in the present embodiment, the FMPKs included in a single RAID group are coupled to different buses. In the case where the RAID group is configured from the plurality of FMPKs coupled to a single bus, if a fault occurs in the bus, none of the FMPKs becomes accessible; therefore, the data cannot be recovered. However, the RAID group may be configured by the plurality of FMPKs coupled to the same bus.

One or a plurality of host computers 30 and a management computer 20 are coupled to the controller 100. The controller 100 and the host computer 30 are coupled to each other by a predetermined communication network 1 (e.g., a SAN (Storage Area Network)). The controller 100 and the management computer 20 are coupled to each other by a predetermined communication network 150 (including e.g., a switch or a LAN (Local Area Network)).

The controller 100 is composed of various packages (PK) such as an FEPK (Front End Package) 110, an MPPK (Microprocessor Package) 120, a CMPK (Cache Memory Package) 130, and a BEPK (Back End Package) 140. In the example shown in FIG. 1, a plurality of the various packages (PK) are multiplexed, but at least one type of PK of the plurality of types of PKs may exist in the singular. The FEPK 110, the MPPK 120, the CMPK (Cache Memory Package) 130, and the BEPK 140 are coupled to one another by the predetermined communication network (including e.g., a switch) 150.

The FEPK 110 has one or more FE-IFs (Front End Inter/Faces) 111, a transfer circuit 112, and a buffer 113. The FE-I/F 111 is an interface device communicating with a communication device that exists at a front end of the host computer 30 or the like. For example, the FE-I/F 111 receives an I/O request (a write request or a read request) from the host computer 30, temporarily stores the received I/O request in the buffer 113, and transfers the I/O request to the MPPK 120 via the transfer circuit 112. The FEPK 110 may have a control device such as a CPU. The buffer 113 is, for example, a volatile semiconductor memory. The buffer 113 may also be a nonvolatile semiconductor memory.

The BEPK 140 has one or more BE-I/Fs 141, a transfer circuit 142, and a buffer 143. The BE-I/F 141 is an interface device communicating with the FMPKs 144. For example, the BE-I/F 141 reads data from the FMPKs 144 and temporarily stores the data in the buffer 143. The transfer circuit 142 sends to the CMPK 130 the data written from the FMPKs 144 to the buffer 143. The transfer circuit 142 also writes the data read from the CMPK 130, into the buffer 143. The BE-I/F 141 sends the data written to the buffer 143 to the FMPKs 144. The BEPK 140 may have a control device such as a CPU. The BEPK 140 may also be an interface such as a disk adapter between a control device and a storage device. The buffer 143 is, for example, a volatile semiconductor memory. The buffer 143 may also be a nonvolatile semiconductor memory.

The MPPK 120 has a plurality of (or one) microprocessors ("MP," hereinafter) 121, and one or a plurality of LMs (Local Memories) 122 coupled to the MPs 121 by an internal path 123. The MPs 120 process the I/O request sent from the FE-I/F 111. Each LM 122 stores a necessary portion of management information stored in an SM (Shared Memory) 132 or stores a computer program executed by the MPs 121. In the system configuration according to the present embodiment, the MPPK 120 is coupled to the FEPK 110, the CMPK 130, and the BEPK 140 by internal networks thereof. Therefore, the MPPK 120 can control transfer of data with the PKs (the MPPK 120, FEPK 110, CMPK 130, and BEPK 140), and storage/deletion of data transmitted to the buffer 113 of the FEPK 110, the CM (Cache Memory) 131 and SM 132 of the CMPK 130, and the buffer 143 of the BEPK 140.

The CMPK 130 has a CM 131 and the SM 132. The CM 131 and the SM 132 are, for example, volatile semiconductor memories. At least either the CM 131 or the SM 132 may be a nonvolatile memory.

The CM 131 has a storage region for temporarily storing I/O target data for the storage medium. The SM 132 has a storage region in which are stored various pieces of management information (various pieces of information used in operations performed by the storage system) and computer programs.

The buffer 143 of the BEPK 140 stores data read from the CM 131 and transmitted to the FMPK 144. Generally, a buffer has a smaller capacity than a CM. The buffer keeps data related to one certain process (e.g., an I/O process) until the completion of the process. In other words, the data stored in the buffer is deleted once a series of processes are completed. On the other hand, data stored in the CM basically is not deleted even after the completion of a certain I/O process and remains on the CM as long as the CM has enough capacity. Furthermore, the data is reused in another I/O process. Data related to an I/O process is stored in the CM; however, the data is deleted asynchronously with the I/O process. When deleting the data stored in the CM, for example, the data may be deleted starting with the chronologically oldest data that has been stored for the longest period of time, or with the data having the oldest last access time. Regions in the CM and the data stored in the CM are used by the MPPK, FEPK and BEPK; therefore a great amount of load is imposed on the CM.

At least one type of an FC (Fibre Channel), a SAS (Serial Attached SCSI) or a SATA (Serial ATA) may be the interfaces of these components.

The management computer 20 is, for example, a computer with a display device and an input device. For instance, the management computer 20 transmits a command for establishing various settings on the storage system, in response to an operation of an SVP (Service Processor) by an administrator. The SVP updates the management information stored in the SM 132 and sets information in the SM 132, in response to a command from the administrator. The management information includes region information indicating a region within the CM 131 for storing data, and process stage information indicating one of a plurality of states of the system during a write process.

Figure 2:
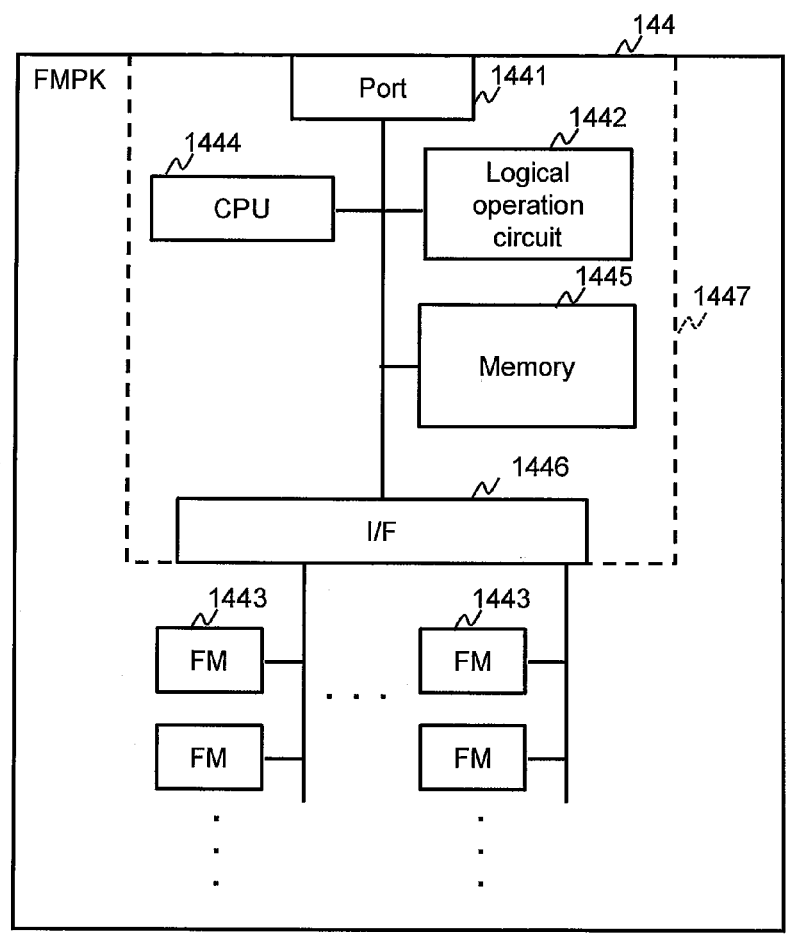
FIG. 2 shows a configuration of an FMPK 144.

FIG. 2 shows a configuration example of one of the FMPKs 144. The FMPK 144 has communication interface devices, storage devices, and a control device coupled to the communication interface devices and the storage devices. The communication interface devices are, for example, a port 1441 coupled to the communication network, and a disk I/F 1446 coupled to FMs 1443. An FM controller 1447 includes the port 1441, a logical operation circuit 1442, a CPU 1444, a memory 1445, and the disk I/F 1446.

The storage devices are, for example, the memory 1445 and the FMs (Flash Memories) 1443. The control device is, for example, the CPU 1444. In addition to such a processor as the CPU 1444, the control device may include a dedicated hardware circuit that performs a predetermined process (e.g., compression, expansion, encryption, or decryption). The dedicated hardware circuit is, for example, the logical operation (e.g., XOR (exclusive or) operation) circuit 1442 that computes a parity or a halfway parity. The logical operation circuit 1442 is referred to as "XOR circuit 1442" in the following description.

The FM 1443 is a nonvolatile semiconductor memory (typically a NAND-type FM chip) into/from which data is written/read in units of pages or in which data is erased in units of blocks. The FM includes a plurality of blocks, each of which includes a plurality of pages. When rewriting data stored in the FM 1443, data cannot be overwritten on a physical region (a physical page) in which the former data is stored. Therefore, when the FM controller 1447 receives data to be updated to data stored in a certain physical page, the received data is written to another physical page. In so doing, mappings of a logical page address and physical page address are updated. Then, the FM controller 1447 disables data before update, to obtain disabled data, and manages the updated data as enabled data. A physical page in which the disabled data is stored is erased. A physical page in which the enabled data is stored is associated with a logical page, but the physical page in which the disabled data is stored is not associated with the logical page. In the FM 1443, in order to rewrite the data stored in a certain physical region, an erasing process ("block erasing," hereinafter) needs to be executed on the data in the physical region, in units of blocks. The block subjected to the erasing process can be emptied so that data can be rewritten thereto. The FM 1443 may not only be a flash memory but also be a WORM memory (e.g., a phase-change memory). The FM controller 1447 carries out a reclamation process. In the reclamation process, the FM controller 1447 copies the enabled data stored in a certain block (data associated with the logical page) to another block, disables the enabled data of the copy-source block, and erases this block. The FM controller 1447 then erases the data in units of blocks.

A pointer table that associates a logical page accessed from the controller 100 with a physical page inside the FM 1443 is stored in the memory 1445 of the FMPK 144. The memory 1445 may temporarily have stored therein data obtained from the controller 100. The memory 1445 is, for example, a volatile semiconductor memory. The memory 1445 may also be a nonvolatile semiconductor memory.

The RAID group that uses the plurality of FMPKs 144 is described next.

The controller 100 creates a RAID group of RAID level 5 from the plurality of FMPKs 144 (see FIG. 1). The controller 100 allocates consecutive regions from address spaces of the created RAID group to a plurality of logical volumes (LU: Logical Units).

The controller 100 allocates stripe lines extending across the address spaces on the plurality of FMPKs 144. The address spaces on the plurality of FMPKs 144 that configure the stripe lines include an address space having user data stored therein and one address space having parity data stored therein. For example, the controller 100 allocates an FMPK number to each of the plurality of FMPKs 144, and shifts the FMPK numbers allocated to the user data and the parity data, for each stripe line. The controller 100 writes information related to each RAID group and the LUs into the LMs 122.

Hereinafter, of the plurality of FMPKs 144 allocated to the RAID group, the FMPK 144 that stores the user data indicated by a write command is referred to as "data FMPK 144A", and the FMPK 144 that stores the parity data based on the user data is referred to as "parity FMPK 144P."

The storage system 10 is capable of performing a read-modify-write process in accordance with a write request from the host computer 30. The read-modify-write process is a write process for updating only the user data stored in a logical region (block or page) of a single FMPK 144 in a certain stripe line.

In the following description, user data before update in the logical region designated by the write request is referred to as "old user data," user data after update in the logical page as "new data," parity data before update based on the old user data as "old parity," and parity data after update based on the new user data as "new parity." In the following description and drawings, the old user data is referred to as "oD," the new user data as "nD," the old parity as "oP," and the new parity as "nP." In addition, an XOR operator is marked with "+."

In the read-modify-write process, for example, an intermediate parity is generated by the XOR operation performed on the old data and the new data, and the new parity is generated by the XOR operation performed on the intermediate parity and the old parity. In the following description and drawings, the intermediate parity is referred to as "mP." In other words, the mP is computed from (oD+nD), and the nP is computed from (oP+mP).

Setting of parity calculation functions of the FMPK 144 is described next.

In the following embodiments, the FMPK 144 having the logical operation circuit 1442 performs parity calculation for generating intermediate parities and parities in accordance with instructions from the controller 100. The controller 100 (any one or more of the MPPK 120, the BEPK 140, the FEPK 110, and the CMPK 130) may have a logical operation function. In the case where both the FMPK 144 and the controller 100 have logical operation functions, which one of the logical operation functions should be used to calculate the intermediate parities and/or parities may be determined based on a user operation.

Figure 3:
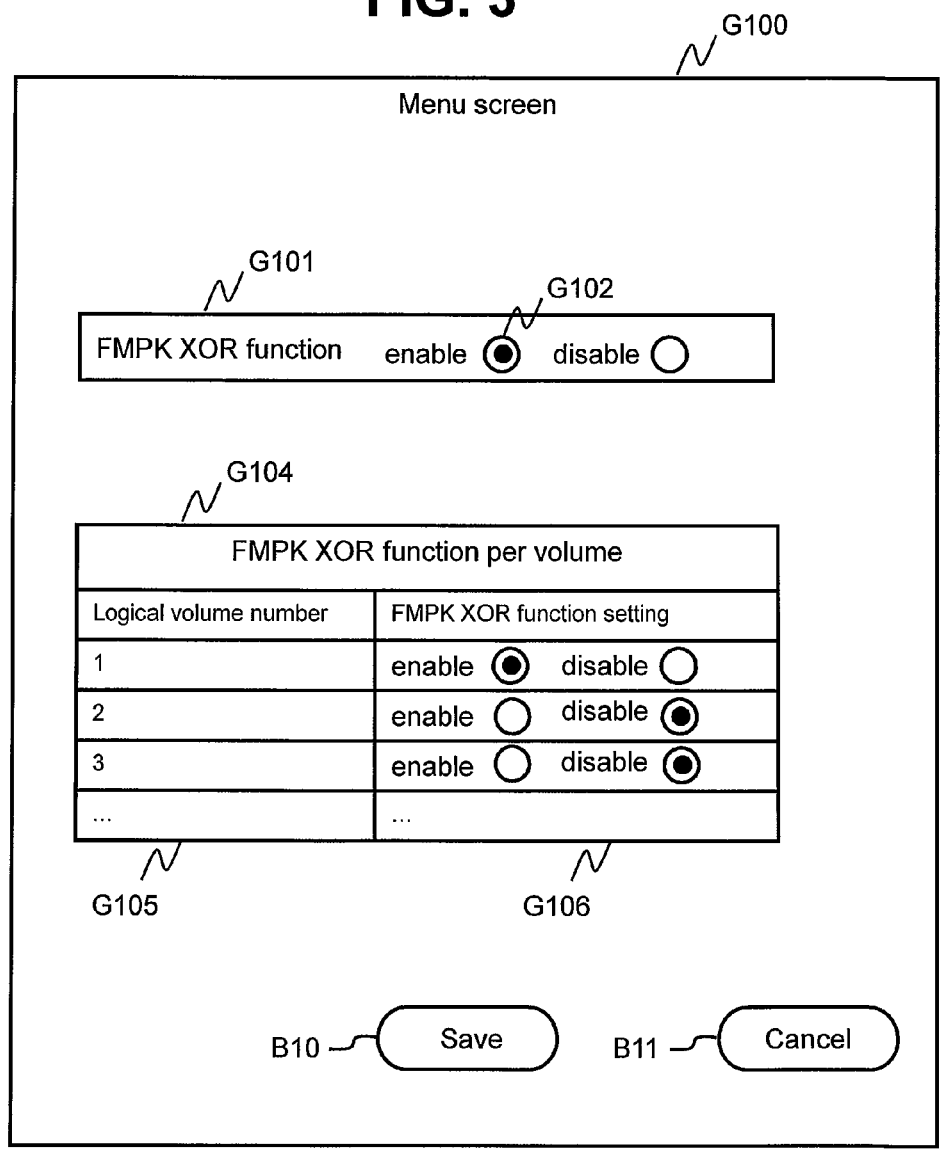
FIG. 3 shows a menu screen.

In this case, the management computer 20 may display a menu screen for setting the parity calculation functions of the FMPK 144. FIG. 3 shows the menu screen. This menu screen G100 has an FMPK setting field G101, a logical volume setting field G104, a save button B10, and a cancel button B11.

The FMPK setting field G101 is an entry field for setting the availability of an XOR function of the FMPK 144. The FMPK setting field G101 has a GUI, such as a radio button G102, for inputting an enable state or a disable state of the XOR function of the FMPK 144.

The logical volume setting field G104 becomes enabled when the XOR function of the FMPK 144 is set as enable through the FMPK setting field G101. The logical volume setting field G104 has a logical volume number display field G105 and an XOR function setting field G106. The logical volume number display field G105 displays a logical volume number created by the FMPK 144. The XOR function setting field G106 is an entry field for setting the availability of the XOR function of the FMPK 144 with respect to the logical volume displayed on the logical volume number display field G105. The XOR function setting field G106 is a GUI, such as a radio button, for inputting an enable state or a disable state of the XOR function of the logical volume.

The save button B10 is a button for saving the settings input to the menu screen G100 and then closing the menu screen G100. The cancel button B10 is a button for discarding the settings input to the menu screen G100 and then closing the menu screen G100.

In the case where the XOR function of the FMPK 144 is set as enable for a certain logical volume, the XOR circuit 1442 of the FMPK 144 generates the intermediate parity or the new parity during the write process for the logical volume. When the XOR function of the FMPK 144 is set as disable for a certain logical volume, the controller 100 generates the intermediate parity or the new parity during the write process for the logical volume.

In this manner, a user can set the availability of the XOR function of the FMPK 144 and the availability of the XOR function of the FMPK 144 for each logical volume. According to the above description, the storage regions based on the RAID group are allocated beforehand to all of the regions of the logical volume. However, a logical volume according to thin provisioning (virtual volume) may be applied to the logical volume. Storage regions for storing data are not allocated beforehand to the virtual volume; however, the storage regions are allocated to the virtual volume in terms of a predetermined unit, in response to a write request with respect to the virtual volume. In the case where the write request is targeted to the regions of the virtual volume to which the storage regions are allocated, the storage regions are not necessarily allocated. The MPPK 120 of the controller 100 allocates the storage regions and manages the allocated or unallocated regions.

Write Process According to Embodiment 1

A normal write process is now described hereinafter.

Here is described a case where the storage system 10 performs the read-modify-write process based on a write command from the host computer 30. The read-modify-write process updates data stored at least in a single page within the RAID group created by the FMPKs 144.

In this embodiment, in addition to a normal write command and a normal read command, a new data transmission command, an intermediate parity reception command, an intermediate parity transmission command, and a new data commit command are defined as I/O commands sent from the controller 100 to the FMPK 144.

Figure 4:
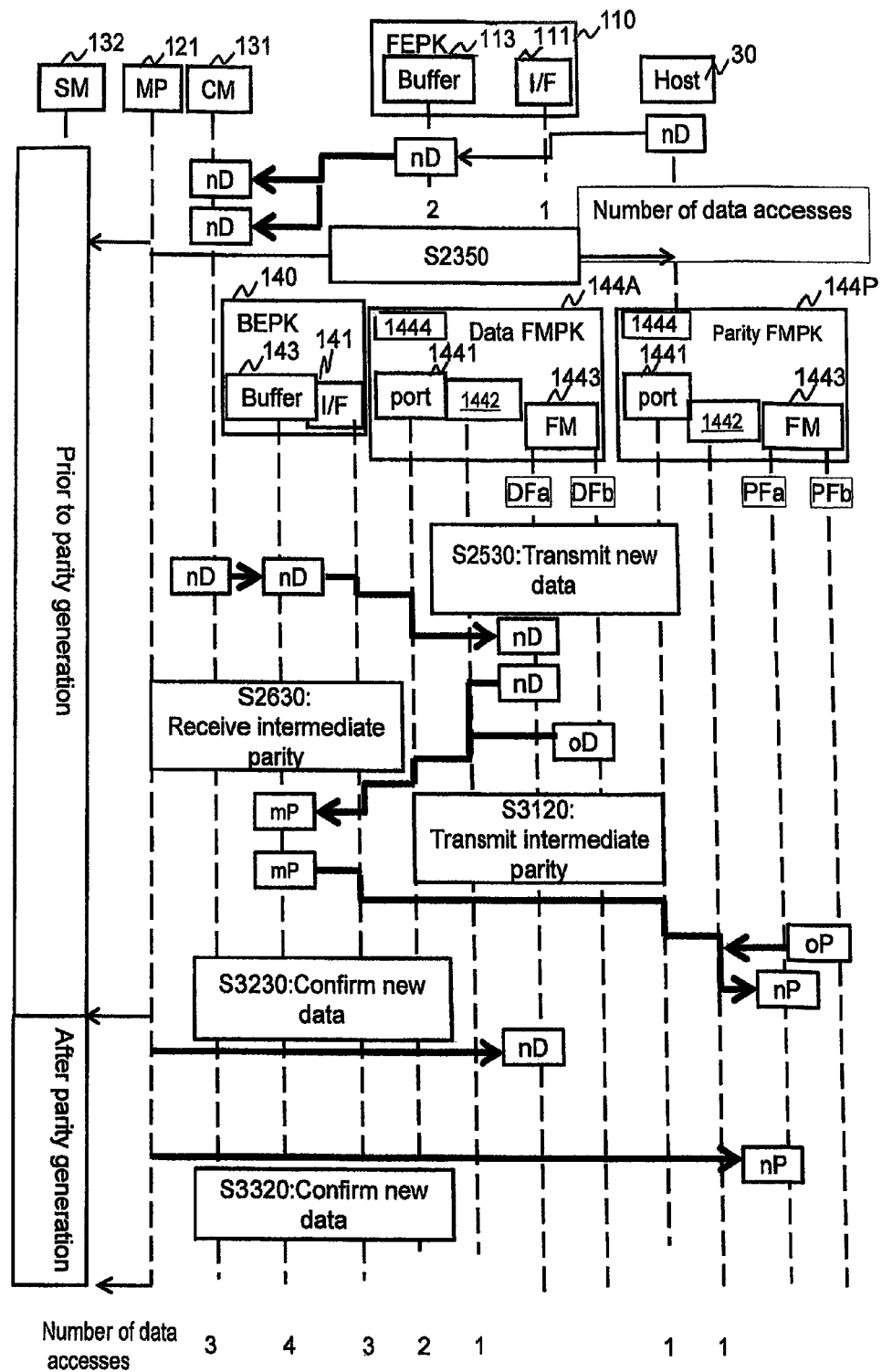
FIG. 4 shows a write process according to Embodiment 1.

FIG. 4 shows a write process according to Embodiment 1. This diagram and the subsequent sequence diagrams show operations by the host computer 30, the controller 100, the data FMPK 144A, and the parity FMPK 144P. The operation targets in the upper sequence (operations prior to S2350) in this sequence diagram are the SM 132, the MP 121, the CM 131, the buffer 113 of the FEPK 110, the I/F 111 of the FEPK 110, and the host computer 30. The operation targets in the lower sequence (operations after S2350) in the sequence diagram are the SM 132, the MP 121, the CM 131, the buffer 143 of the BEPK 140, the I/F 141 of the BEPK 140, the port 1441 of the data FMPK 144A, the XOR circuit 1442 of the data FMPK 144A, storage media DFa and DFb of the data FMPK 144A, the port 1441 of the parity FMPK 144P, the XOR circuit 1442 of the parity FMPK 144P, and storage media PFa and PFb of the parity FMPK 144P.

Here, the storage medium DFa of the data FMPK 144A represents the memory 1445 of the FM 1443. The storage medium DFb represents a physical page of the FM 1443.

Furthermore, the storage medium DFa of the data FMPK 144A represents the memory 1445 of the FM 1443. The storage medium DFb represents a physical page of the FM 1443. The storage medium PFa of the parity FMPK 144P represents the memory 1445 of the parity FM 1443. The storage medium PFb represents a physical page inside the parity FM 1443.

In this sequence diagram, the number of accesses to each of the operation targets in the write process is shown below an operation (lifeline) of each operation target.

In the data FMPK 144A, the DFb is a physical page that stores the old user data before the write process, and DFa is a physical page, different from the DFb, which stores the new user data after the write process. In the parity FMPK 144P, the PFb is a physical page, different from the PFa, which stores an old parity before the write process, and the PFa is a physical page that stores the new parity after the write process.

For the purpose of illustration, hereinafter a state of the storage system 10 in the write process is referred to as a "system state." Some system states of the storage system 10 are defined hereinafter. As will be described later, data loss upon the occurrence of a fault can be avoided by changing the process performed upon the occurrence of a fault, in accordance with the system state.

First, the host computer 30 sends a write command for updating the old user data to the new user data to the controller 100 of the storage system 10.

Figure 5:
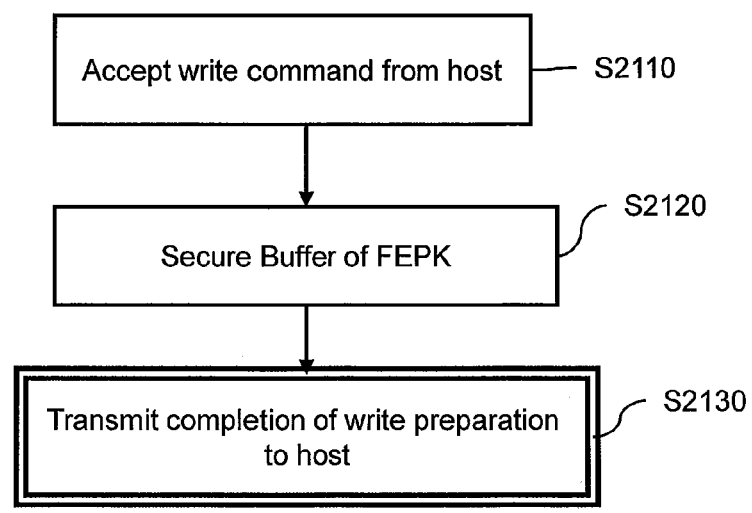
FIG. 5 shows an operation performed by an MP 121 upon reception of a write command, according to Embodiment 1.

FIG. 5 shows an operation performed by the MP 121 upon reception of the write command, according to Embodiment 1. The MP 121 receives the write command from the host computer 30 (S2110). The MP 121 then secures a region in the buffer 113 of the FEPK 110 to write the new user data thereto (S2120). The MP 121 then transmits a write preparation completion to the host computer 30 (S2130).

In the controller 100 shown in FIGS. 1 and 4, the I/F 111 of the FEPK 110 writes the new data obtained from the host computer into a region in the buffer 113, secured in S2120.

Figure 6:
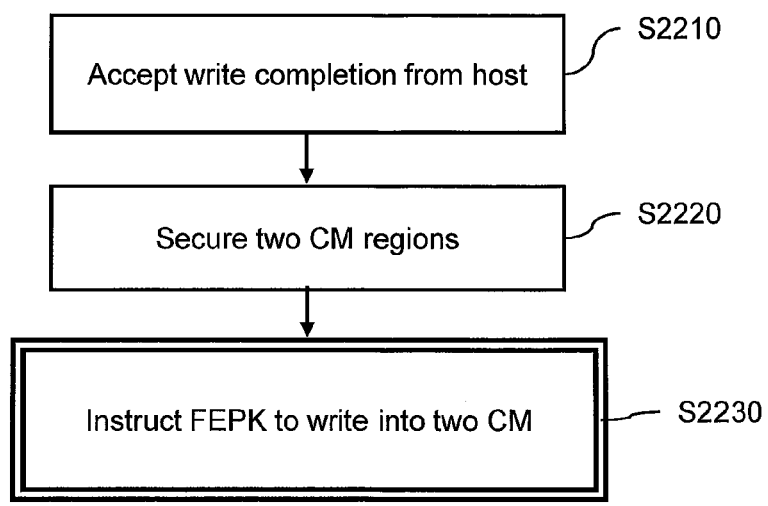
FIG. 6 shows an operation performed by the MP 121 after the execution of writing into a buffer 113 of an FEPK 110, according to Embodiment 1.

FIG. 6 shows an operation performed by the MP 121 after the execution of writing into the buffer 113 of the FEPK 110, according to Embodiment 1. Subsequently, the MP 121 is notified by the host computer 30 of the completion of writing into the buffer 113 (S2210). The MP 121 then secures regions in the CMs 131 of two CMPKs 130 to write the new user data thereto (S2220). The MP 121 then transmits to the FEPK 110 a write instruction for writing the new user data into the secured regions of the two CMs 131 (S2230).

In the controller 100 shown in FIGS. 1 and 4, the transfer circuit 112 of the FEPK 110 duplicates the new user data stored in the buffer 113 and writes the resultant data into the regions of the two CMs 131, secured in S2230.

Figure 7:
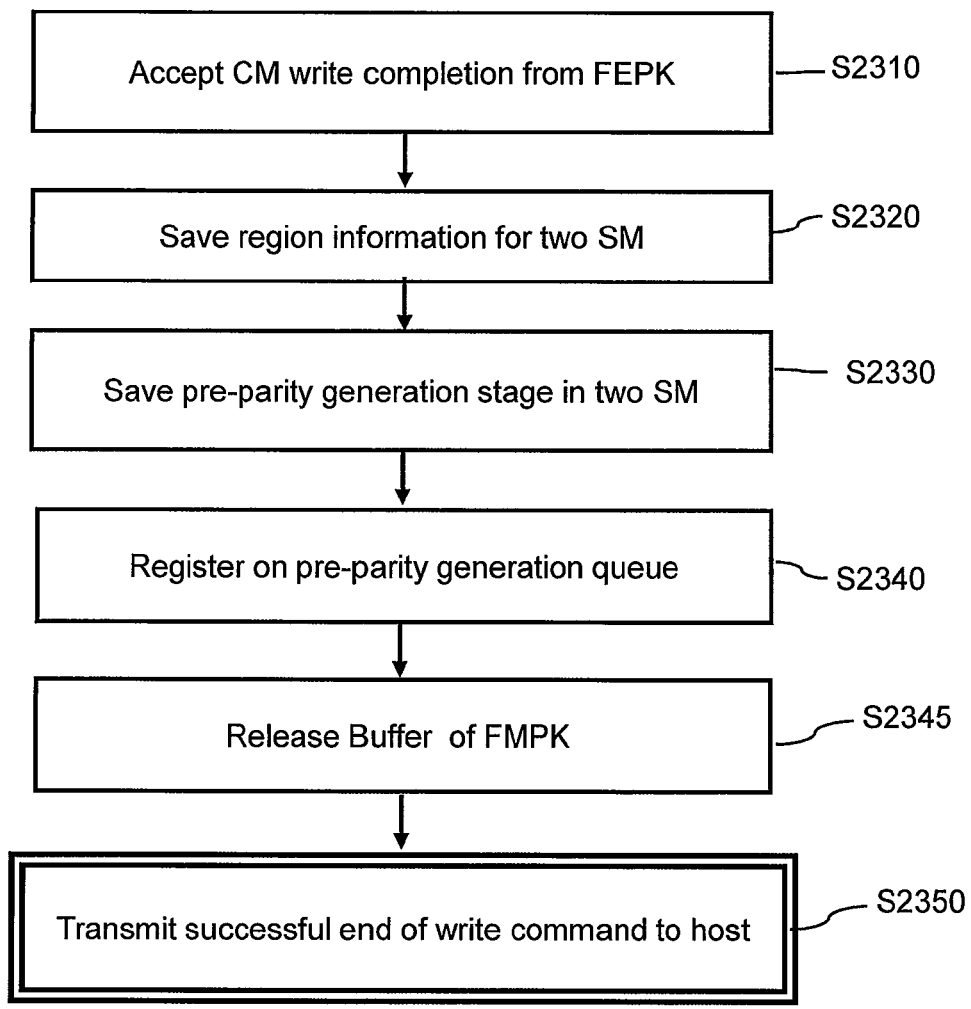
FIG. 7 shows an operation performed by the MP 121 after the execution of writing into a CM 131, according to Embodiment 1.

FIG. 7 shows an operation performed by the MP 121 after the execution of writing new user data into the CMs 131, according to Embodiment 1. Subsequently, the MP 121 is notified by the FEPK 110 of the completion of writing into the two CMs 131 (S2310). The MP 121 then writes values (addresses on CM) indicating the regions of the two CMs 131, in which the new user data are stored, into region information items stored in two SMs 132 corresponding to the two CMs 131 (S2320). The MP 121 then writes values indicating a pre-parity generation stage into process stage information items stored in the two SM 132 corresponding to the regions of the two CMs 131 (S2330). The MP 121 then registers this pre-parity generation stage in a pre-parity generation queue in the SM 132 (S2340). Subsequently, the MP 121 instructs the FEPK 110 to release the buffer 113 in which the new user data is stored (S2345). The MP 121 then notifies the host computer 30 of a normal end of the write command (S2350). MP 121 stores the region information items and process step information items on the SM for each write process performed on the new user data. When a fault occurs in an MP, other MPs are enabled to take over a write process by referring to process step information items.

The system state at this moment is called "state 1."

Figure 8:
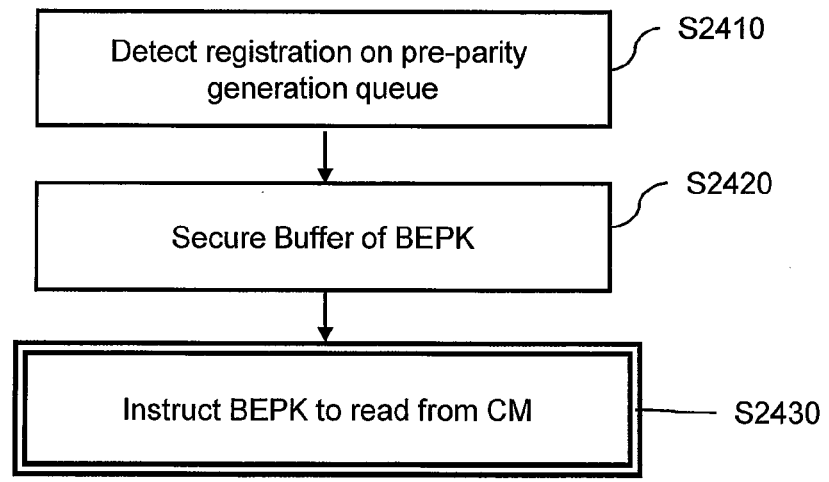
FIG. 8 shows an operation performed by the MP 121 after a write command response is obtained, according to Embodiment 1.

FIG. 8 shows an operation performed by the MP 121 after a write command response is obtained, according to Embodiment 1. Subsequently, once the MP 121 detects that there is a registration in the pre-parity generation queue (S2410), the MP 121 secures a region in the buffer 143 of the BEPK 140 to write the new user data thereto (S2420). The MP 121 then transmits to the BEPK 140 an instruction for reading the new user data from one of the CMs 131 (S2430).

In the controller 100 shown in FIG. 4, the transfer circuit 142 of the BEPK 140 reads the new user data from the CM 131 and writes the new user data into the buffer 143.

Figure 9:
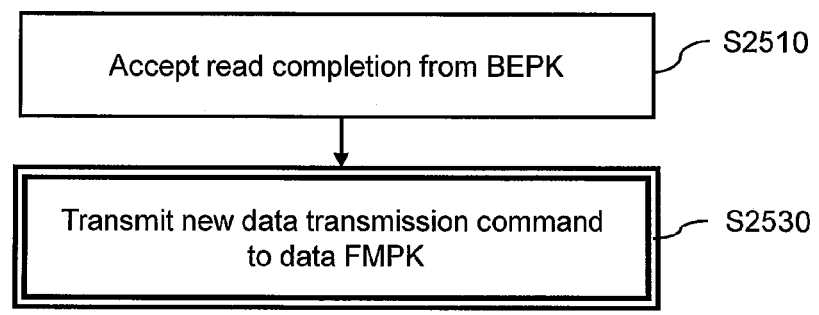
FIG. 9 shows an operation performed by the MP 121 after the execution of writing into a BEPK 140, according to Embodiment 1.

FIG. 9 shows an operation performed by the MP 121 after the execution of writing into the buffer 143 of the BEPK 140, according to Embodiment 1. Subsequently, once the MP 121 is notified by the BEPK 140 of the completion of the reading (S2510), it transmits to the data FMPK 144A a new data transmission command for writing the new user data (S2530). This new data transmission command designates a logical page that stores a logical page of the old user data, and accompanies the new user data.

At this moment, the I/F 141 of the BEPK 140 reads the new user data from the buffer 143 and sends the new user data to the data FMPK 144A.

Next, in the data FMPK 144A shown in FIG. 4, the CPU 1444 receives the new data transmission command and the new user data via the port 1441, writes the new user data into the DFa of the FM 1443, and notifies the controller 100 of a normal end of the new data transmission command. Here, in the FM 1443, the new user data and the old user data are stored and kept in a physical page associated with a certain logical page address. The stored new user data and old user data are kept in the physical page, at least until a new parity is generated based on the stored new user data and old data and then written to the physical page.

The system state at this moment is called "state 2."

Figure 10:
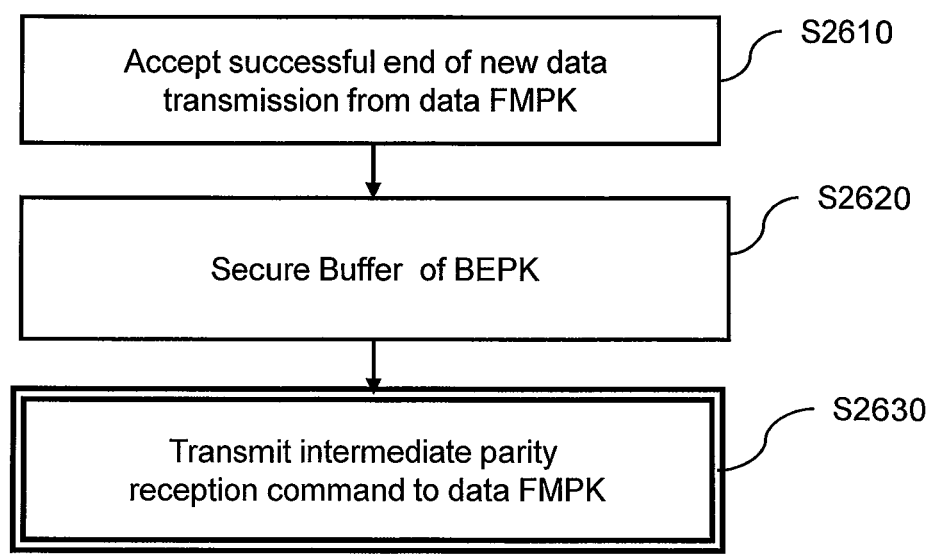
FIG. 10 shows an operation performed by the MP 121 after a normal end of a new data transmission command, according to Embodiment 1.

FIG. 10 shows an operation performed by the MP 121 after the normal end of the new data transmission command, according to Embodiment 1. Subsequently, once the MP 121 is notified by the data FMPK 144A of the normal end of the new data transmission command (S2610), the MP 121 secures the storage region of the buffer 143 of the BEPK 140 (S2620), and transmits to the data FMPK 144A an intermediate parity reception command for causing the data FMPK 144A to generate an intermediate parity and acquiring the intermediate parity (S2630). This intermediate parity reception command designates the logical page that stores the logical page of the old user data.

In the data FMPK 144A shown in FIG. 4, the CPU 1444 receives the intermediate parity reception command via the port 1441, reads the old user data from the DFb, reads the new user data from the DFa, and sends the old user data and the new user data to the XOR circuit 1442. The XOR circuit 1442 calculates an intermediate parity from the old user data and the new user data. The CPU 1444 notifies the BEPK 140 of a normal end of the intermediate parity reception command, through the port 1441, and sends the intermediate parity to the controller 100.

Next, in the controller 100 shown in FIG. 4, the I/F 141 of the BEPK 140 writes the intermediate parity received from the data FMPK 144A, into the storage region of the buffer 143, secured in S2620.

Figure 11:
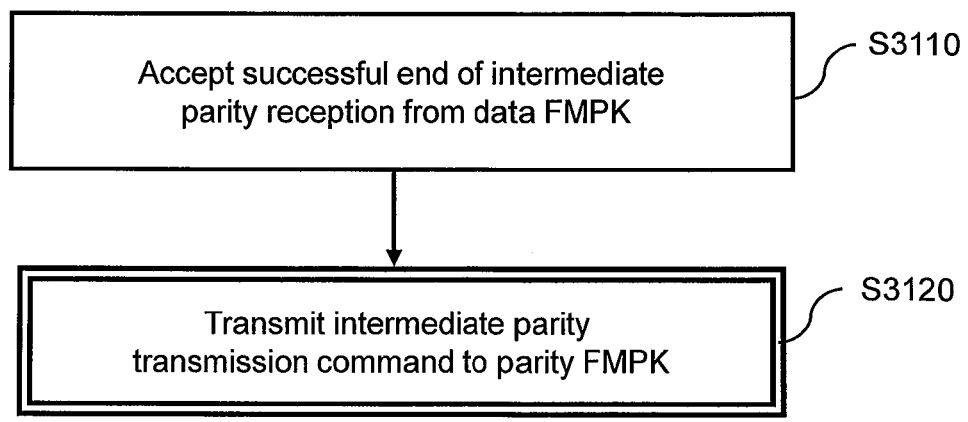
FIG. 11 shows an operation performed by the MP 121 after a normal end of an intermediate parity reception command, according to Embodiment 1.

FIG. 11 shows an operation performed by the MP 121 after the normal end of the intermediate parity reception command, according to Embodiment 1. Once the MP 121 is notified by the data FMPK 144A of the normal end of the intermediate parity reception command (S3110), the MP 121 sends to the parity FMPK 144P an intermediate parity transmission command for generating and writing a new parity from the intermediate parity (S3120). This intermediate parity transmission command designates the logical page that stores the logical page of the old parity, and accompanies the intermediate parity.

At this moment, the I/F 141 of the BEPK 140 reads the intermediate parity from the buffer 143 and sends the intermediate parity to the parity FMPK 144P. Here, the MP 121 stores the intermediate parity, which is read from the data FMPK 144A, into the buffer 143 of the BEPK 140, and then transfers the intermediate parity to the parity FMPK without storing the intermediate parity in the CM 131. Because the CM 131 is not used when transferring the intermediate parity, the load imposed on the CM 131 can be reduced, improving the performance of the storage system. Moreover, because each FMPK 144 is coupled to a position in the vicinity of the buffer 143, the intermediate parity can be transferred efficiently.

Next, in the parity FMPK 144P shown in FIG. 4, the CPU 1444 receives the intermediate parity transmission command and the intermediate parity via the port 1441, reads the old parity from the PFb, and sends the old parity and the intermediate parity to the XOR circuit 1442. The XOR circuit 1442 calculates a new parity from the old parity and the new parity. The CPU 1444 writes the new parity into the PFa and notifies the controller 100 of a normal end of the intermediate parity transmission command.

The system state at this moment is called "state 3."

Figure 12:
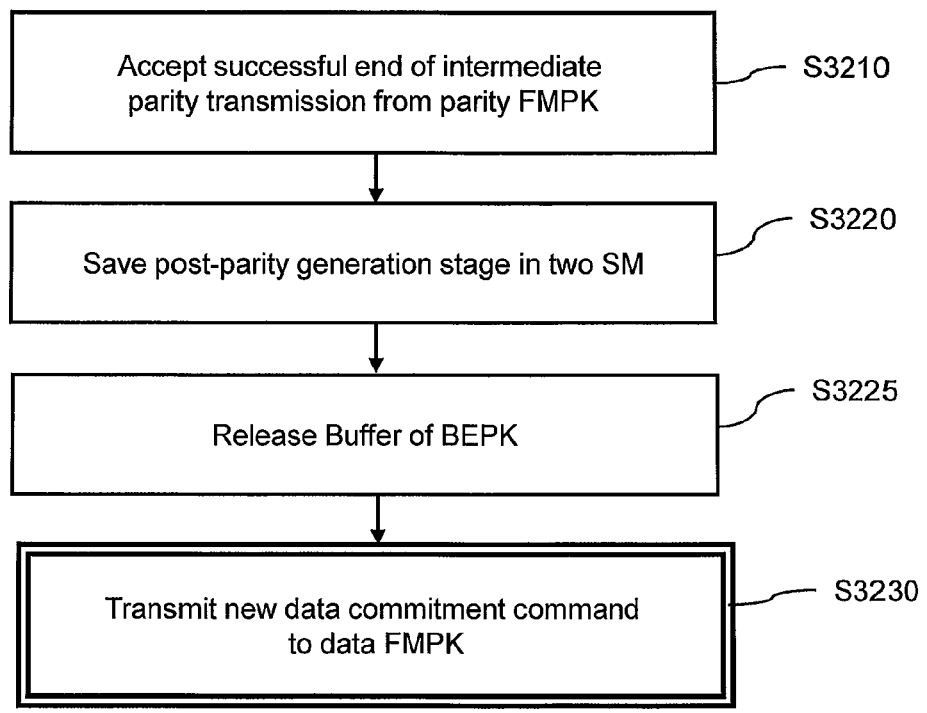
FIG. 12 shows an operation performed by the MP 121 after a normal end of an intermediate parity transmission command, according to Embodiment 1.

FIG. 12 shows an operation performed by the MP 121 after the normal end of the intermediate parity transmission command, according to Embodiment 1. Subsequently, once the MP 121 is notified by the parity FMPK 144P of the normal end of the intermediate parity transmission command (S3210), the MP 121 writes values indicating a post-parity generation stage into the process stage information items stored in the abovementioned two SMs 132 (S3220). The system state at this moment is called "state 4." Next, the MP 121 instructs the BEPK 140 to release the buffer area in which the intermediate parity is stored (S3225). The MP 121 then sends a new data commit command to the data FMPK 144A (S3230). The new data commit command designates the logical page that stores the logical page of the old user data.

Next, in the data FMPK 144A shown in FIG. 4, the CPU 1444 receives the new data commit command via the port 1441, determines the new user data as the user data after update, and notifies the controller 100 of a normal end of the new data commit command. As a result, the new user data can be accessed based on the normal write command and the normal read command sent from the controller 100.

The system state at this moment is called "state 5."

Figure 13:
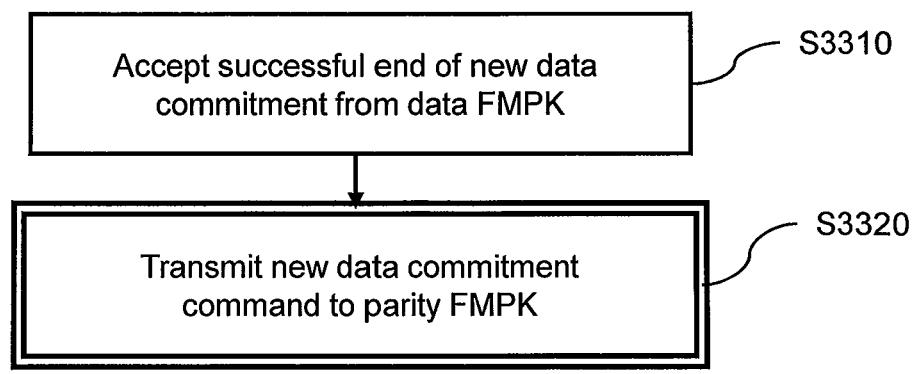
FIG. 13 shows an operation performed by the MP 121 after a normal end of a new data commit command transmitted to a data FMPK 144A, according to Embodiment 1.

FIG. 13 shows an operation performed by the MP 121 after the normal end of the new data commit command transmitted to the data FMPK 144A, according to Embodiment 1. Once the MP 121 is notified by the data FMPK 144A of the normal end of the new data commit command (S3310), the MP 121 sends a new data determination to the parity FMPK 144P (S3320). This new data commit command designates the logical page that stores the old parity. As a result, the new user data can be accessed based on the normal write command and the normal read command sent from the controller 100. The transmission of the new data commit command to the data FMPK 144A and the transmission of the new data commit command to the parity FMPK 144P may occur in reverse order.

Next, in the parity FMPK 144P shown in FIG. 4, the CPU 1444 receives the new data commit command via the port 1441, determines the new parity as a parity after update, and notifies the controller 100 of a normal end of the new data commit command.

The system state at this moment is called "state 6."

Figure 14:
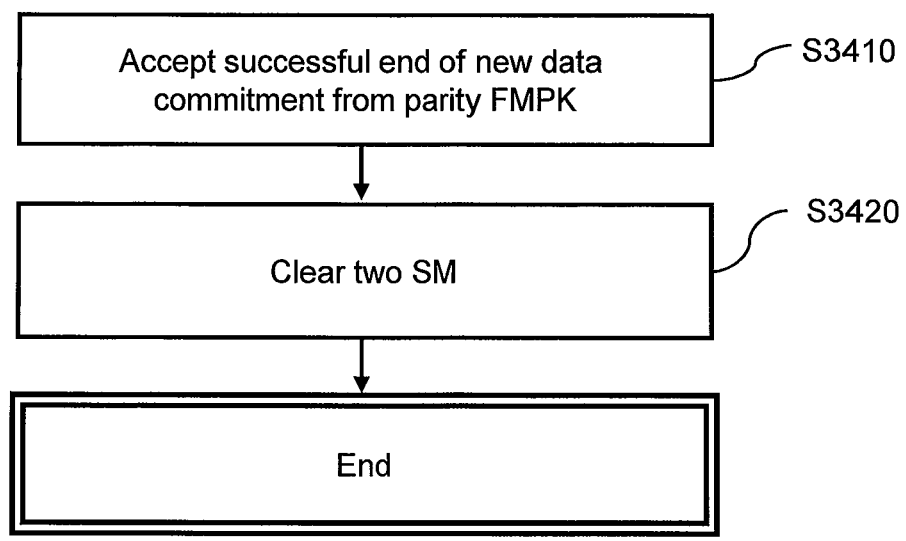
FIG. 14 shows an operation performed by the MP 121 after a normal end of the new data commit command transmitted to a parity FMPK 144P, according to Embodiment 1.

FIG. 14 shows an operation performed by the MP 121 after the normal end of the new data commit command transmitted to the parity FMPK 144P, according to Embodiment 1. Once the MP 121 is notified by the parity FMPK 144P of the normal end of the new data commit command (S3410), the MP 121 clears the regions of the two SMs 132 in which the process stage information items are stored (S3420), and ends the write process.

The system state at this moment is called "state 7."

The above is the write process. The number of accesses to CM is indicated in parentheses below.

In this write process, the new user data from the host computer 30 is duplicated and written (twice) into the CM 131 of the CMPK 130 and is read from the other CM 131 and then sent from the CM 131 to the buffer 143 of the BEPK 140. The new user data from the CM 131 is written to the buffer 143 and sent from the buffer 143 to the data FMPK 144A. The intermediate parity from the data FMPK 144A is written to the buffer 143 and sent from the buffer 143 to the parity FMPK 144P. Because of this, the number of accesses to the CM 131 become three times in a single write process, hence the number of accesses to the CM 131 can be reduced.

As described above, the FMPK 144 executes the parity calculation and the controller 100 sends the intermediate parity from the buffer 143 to the parity FMPK 144P without writing the intermediate parity received from the data FMPK 144A into the CM 131. As a result, the load imposed on the MP and the CM in the storage controller can be reduced, improving the write process performance of the storage system.

For a comparison purpose, now is described a case where the controller 100 performs the parity calculation on the RAID 5 using the CM 131 in a conventional write process. In this case, the controller 100 duplicates the new user data obtained from the host computer, writes the resultant data into the CM (twice), acquires the old user data from the data FMPK 144A, writes the old user data into the CM 131 (once), acquires the old parity from the parity FMPK 144P, and writes the old parity into the CM 131 (once). Furthermore, the controller 100 reads the old user data, the new user data, and the old parity stored in the CM 131 (three times) to calculate a new parity, duplicates the new parity and writes the resultant parities into two CMs 131 (twice), reads the new user data stored in the CM 131 (once), writes the new user data into the data FMPK 144A, reads the new parities stored in the CMs 131 (once), and writes the new parities into the parity FMPK 144P. In this case, the number of accesses to the CM 131 in a single write process is eleven.

In this embodiment, the intermediate parity can be transferred efficiently by using the buffer 143 of the BEPK 140 located in the vicinity of the FMPK 144.

Furthermore, the RAID 5 is configured by the plurality of FMPKs 144 coupled to the different buses, in order to maintain a redundant configuration upon system fault. Allowing the plurality of FMPKs 144 to share the buffer of the BEPK 140 can maintain the redundant configuration and transfer the intermediate parity using the buffer. According to this embodiment, the reliability of the storage system 10 can be improved by storing the new user data in two CMPKs 130 and storing the process stage information items corresponding to the new user data into the SMs 132.

The CM 131 having the new user data stored therein and the SM 132 having the process stage information corresponding to the new user data stored therein may be provided in the packages different from each other. Furthermore, the pointer table of the FMPK 144 is stored in the memory 1445 but may be stored in the FM 1443.

Transition Write Process according to Embodiment 1

A transition write process that is performed upon an occurrence of an MP fault is described hereinafter.

The takeover write process is a process that occurs when a fault occurs in the MP 121 during the write process. In this case, the other MPs 121 free of faults perform the transition write process that takes over the write process. During the write process, the MPs 121 free of faults can recognize the process stage information items, since the process stage information items are stored in the two SMs 132, and perform an appropriate transition write process in accordance with the process stage information items. If the process stage information items are lost, data loss occurs. Data loss is a situation where write data of the host computer are lost and therefore cannot be recovered. Data loss is not a favorable condition for the storage system. Therefore, the process stage information items are duplicated and stored. Moreover, a transition write process described hereinafter is executed in order to avoid data loss caused upon the occurrence of an MP fault.

Figure 15:
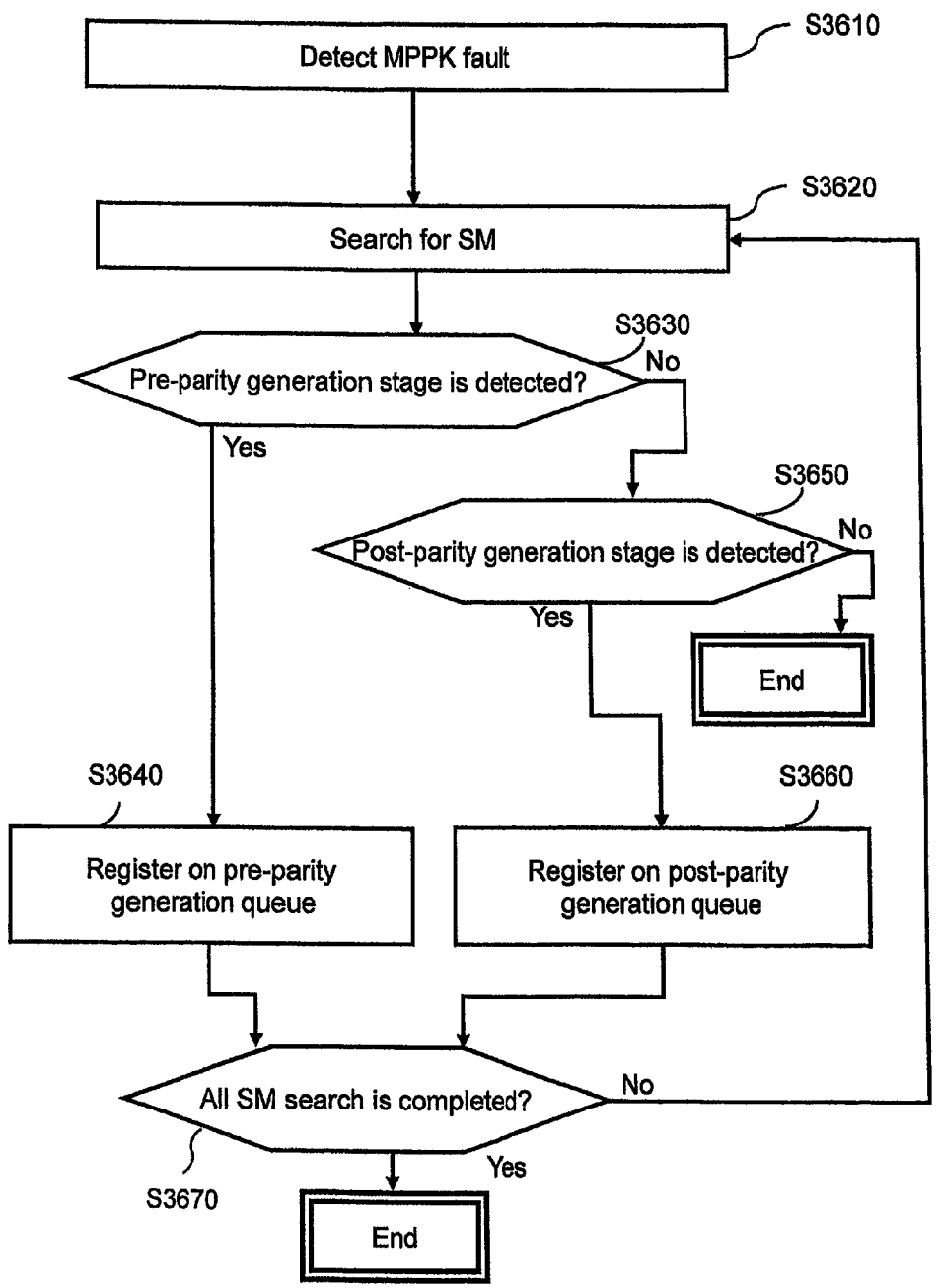
FIG. 15 shows an operation performed by the MP 121 upon an occurrence of an MP fault, according to Embodiment 1.

The transition write process is now described. FIG. 15 shows an operation performed by the MP 121 upon the occurrence of the MP fault, according to Embodiment 1. First, the MP 121 of the MPPK 120 free of faults detects the occurrence of a fault in the other MPPK 120 (S3610). The MP 121 then selects one of the SMs 132 that is not searched from among a plurality of SMs 132 (S3620), searches this SM 132, and determines whether or not the pre-parity generation stage of the process stage information items is detected from the searched SM 132 (S3630).

When the pre-parity generation stage is detected (S3630, YES), the MP 121 registers the pre-parity generation stage in the pre-parity generation queue of the SM 132 on the basis of the region information stored in the SM 132 (S3640), and advances the process to S3670.

On the other hand, when the pre-parity generation stage is not detected (SS3630, NO), the MP 121 determines whether or not a post-parity generation stage of the process stage information item is detected from the searched SM 132 (S3650).

When the post-parity generation stage is detected (S3650, YES), the MP 121 registers this post-parity generation stage in the post-parity generation queue stored in the SM 132 based on the region information stored in the SM 132 (S3660), and advances the process to S3670.

When the post-parity generation stage is not detected (S3650, NO), the MP 121 ends this process flow.

Subsequent to S3640 and S3660, the MP 121 determines whether searching for all SMs 132 is completed or not (S3670). When searching for all SMs 132 is not completed (S3670, NO), the MP 121 returns the process to S3620. When searching for all SMs 132 is completed (S3670, YES), the MP 121 ends this process flow.

The operations that are performed by the MP 121 when there is a registration in the pre-parity generation queue are the same as S2410 to S2430 described above. In other words, the MP 121 takes over the process at the stage where the new user data stored in the CM 131 is transferred to the BEPK 140.

Figure 16:
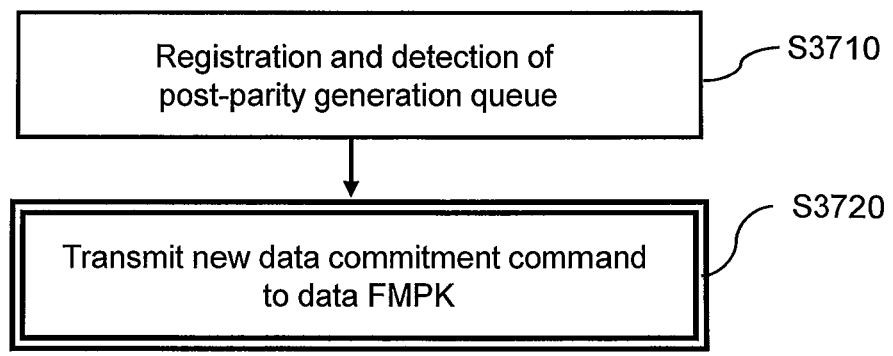
FIG. 16 shows an operation performed by the MP 121 in the case where there is a registration in a post-parity generation queue, according to Embodiment 1.

FIG. 16 shows an operation performed by the MP 121 in the case where there is a registration in the post-parity generation queue, according to Embodiment 1. Once the MP 121 detects that there is a registration in the post-parity generation queue (S3710), the MP 121 sends the new data commit command to the data FMPK 144A (S3720). Specifically, when there is a registration in the post-parity generation queue of any of the SMs 132, the MP 121 takes over the write process, from the point where the new data commit command is transmitted to the data FMPK 144A, as with the case of the normal write process.

In this manner, the MP 121 free of faults can take over the write process from the MP 121 having a fault, depending on the type of the process stage information item stored in the SM 132.

Specific Examples of Transition Write Process According to Embodiment 1

Several specific examples of the transition write process performed upon the occurrence of the MP fault are now described.

First Specific Example of Transition Write Process According to Embodiment 1

Here is described the transition write process that is performed upon the occurrence of the MP fault in the pre-parity generation stage.

Figure 17:
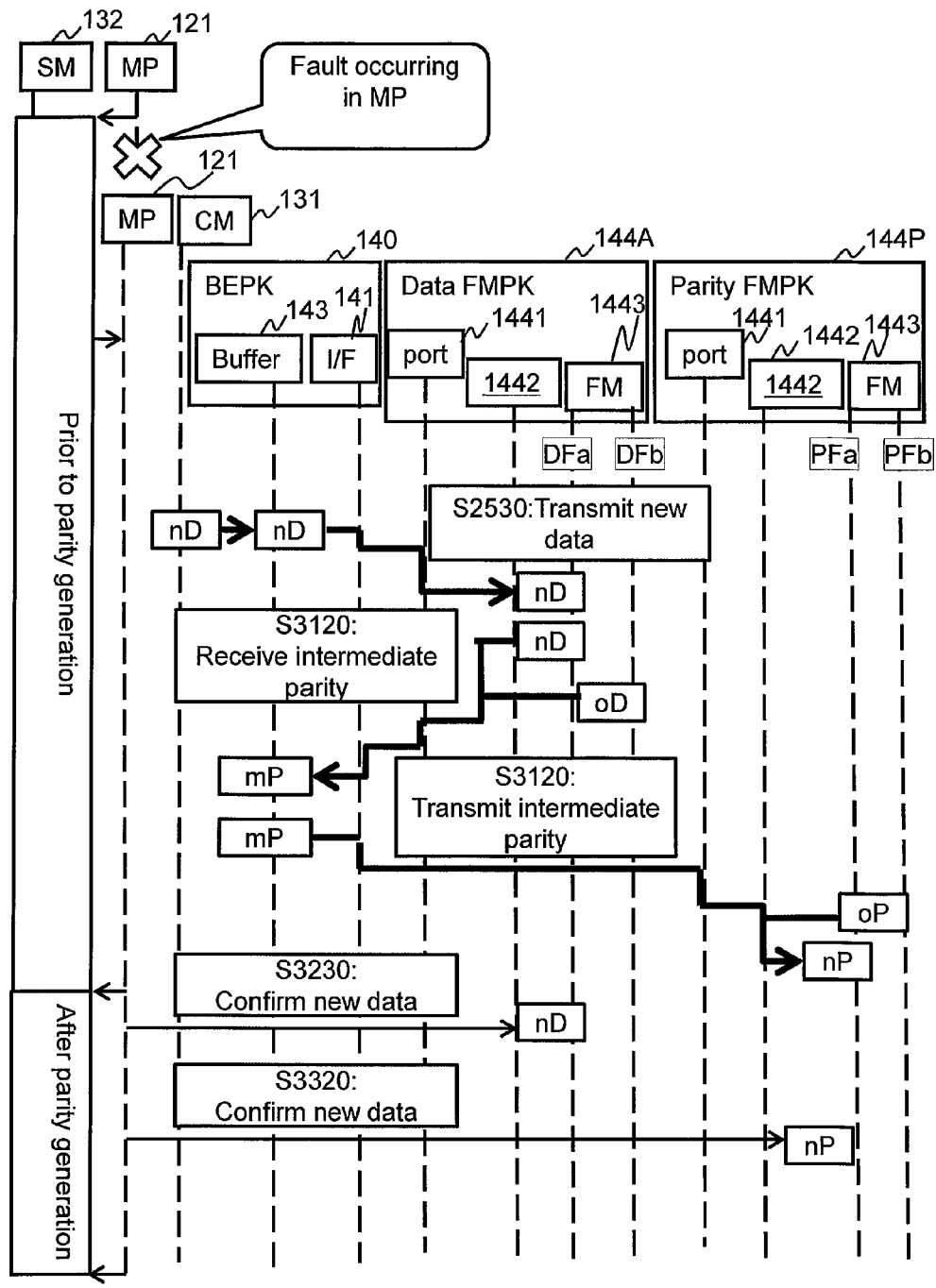
FIG. 17 shows a transition write process performed upon the occurrence of the MP fault in a pre-parity generation stage, according to Embodiment 1.

FIG. 17 shows a transition write process performed upon the occurrence of the MP fault in the pre-parity generation stage, according to Embodiment 1. The key components of the operations shown in this sequence diagram are the same as those shown in the sequence diagrams related to the normal write process.

Once the MP 121 free of faults acknowledges that the process stage information items indicate the pre-parity generation stage, the MP 121 free of faults send the new data transmission command to the data FMPK 144A, as in the normal write process described above (S2530). Consequently, the data FMPK 144A writes the new user data into the DFa (memory 1445).

Next, in the controller 100, the MP 121 sends the intermediate parity reception command to the data FMPK 144A, as in the normal write process (S2630). Accordingly, the data FMPK 144A calculates the intermediate parity and sends the intermediate parity to the controller 100. Consequently, the BEPK 140 writes the intermediate parity into the buffer 143.

In the controller 100, the MP 121 then sends the intermediate parity transmission command to the parity FMPK 144P, as in the normal write process (S3120). Consequently, the parity FMPK 144P calculates the new parity and writes the new parity into the PFa (memory 1445).

Subsequently, in the controller 100, the MP 121 sends the new data commit command to the data FMPK 144A, as in the normal write process (S3230). Consequently, the data FMPK 144A determines the new user data as the user data after update.

In the controller 100, the MP 121 then sends the new data commit command to the parity FMPK 144P, as in the normal write process (S3320). Consequently, the parity FMPK 144P determines the new parity as the parity after update.

The above is the transition write process.

Because the process stages are recorded in the SMs 132, another MP 121 free of faults can take over the write process even upon the occurrence of a fault in a certain MP 121. When the process stage information items indicate the pre-parity generation stage at the time of the occurrence of the MP fault, the other MP 121 free of faults takes over the write process at the stage where the new user data is transferred from the CM 131 to the BEPK 140.

Second Specific Example of Transition Write Process According to Embodiment 1

Here is described the transition write process that is performed upon the occurrence of the MP fault in the post-parity generation stage.

Figure 18:
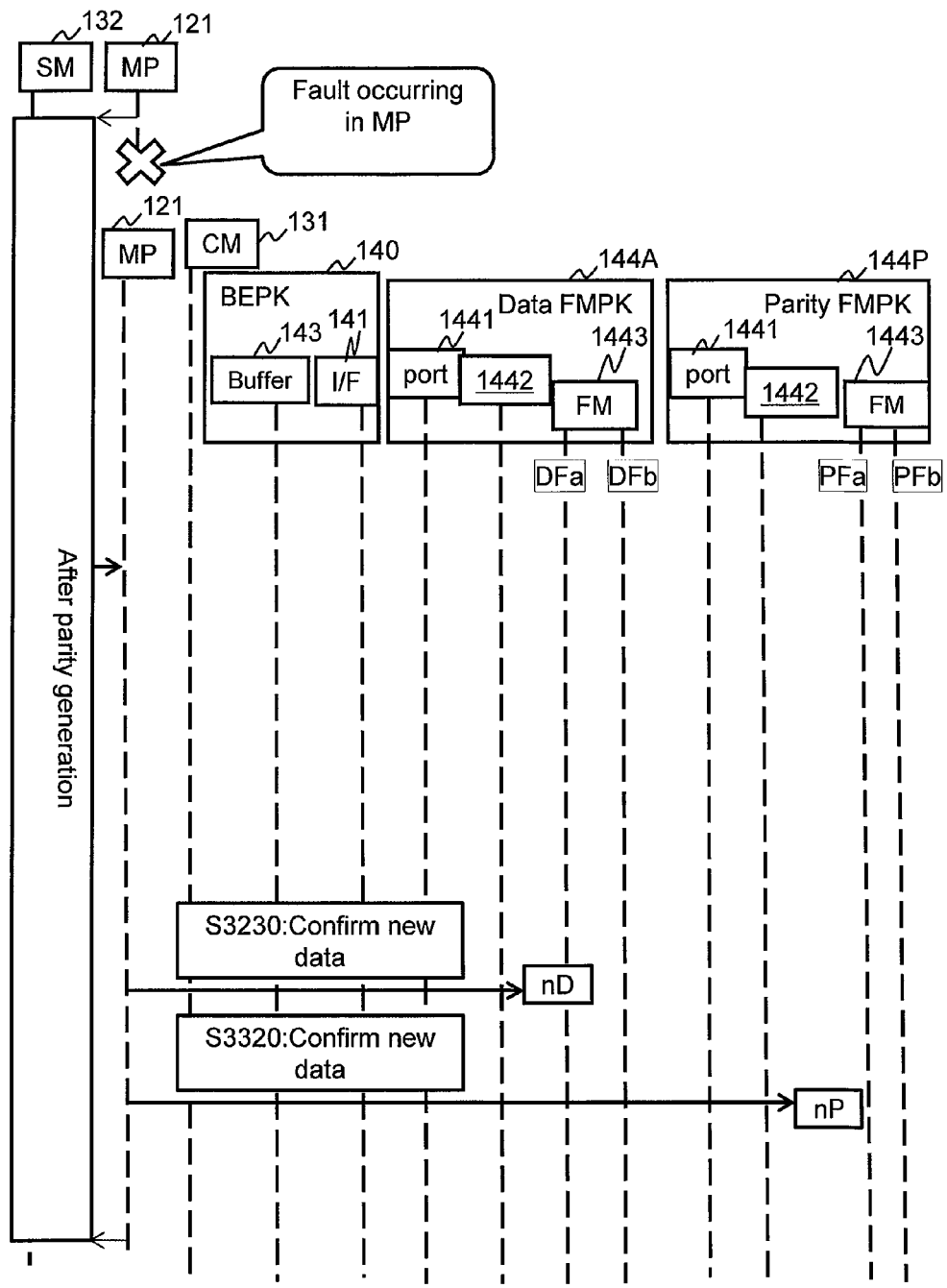
FIG. 18 shows the transition write process performed upon the occurrence of the MP fault in a post-parity generation stage, according to Embodiment 1.

FIG. 18 shows a transition write process performed upon the occurrence of the MP fault in the post-parity generation stage, according to Embodiment 1. The operation targets of the operations shown in this sequence diagram are the same as those shown in the sequence diagrams related to the normal write process. Once the MP 121 free of faults acknowledges that the process stage information items indicate the post-parity generation stage, the MP 121 free of faults sends the new data commit command to the data FMPK 144A, as in the normal write process (S3230). Consequently, the data FMPK 144A determines the new user data as the user data after update.

In the controller 100, the MP 121 then sends the new data commit command also to the parity FMPK 144P, as in the normal write process (S3320). Consequently, the parity FMPK 144P determines the new parity as the parity after update.

The above is the transition write process.

As described above, recording the process stage information items in the SMs 132 can allow the other MP to take over the write process even upon the occurrence of a fault in a certain MP. When the process stage information items indicate the post-parity generation stage at the time of the occurrence of the MP fault, the other MP 121 free of faults takes over the write process at the stage where the new user data stored in the data FMPK 144A is determined. When the process stage information items indicate the post-parity generation stage, it is not necessary to re-transfer the user data from the CM 131, because the new user data exists in the FMPK 144A. In other words, this transition write process does not cause additional access to the CM 131.

FMPK State in Write Process According to Embodiment 1

Figure 19:
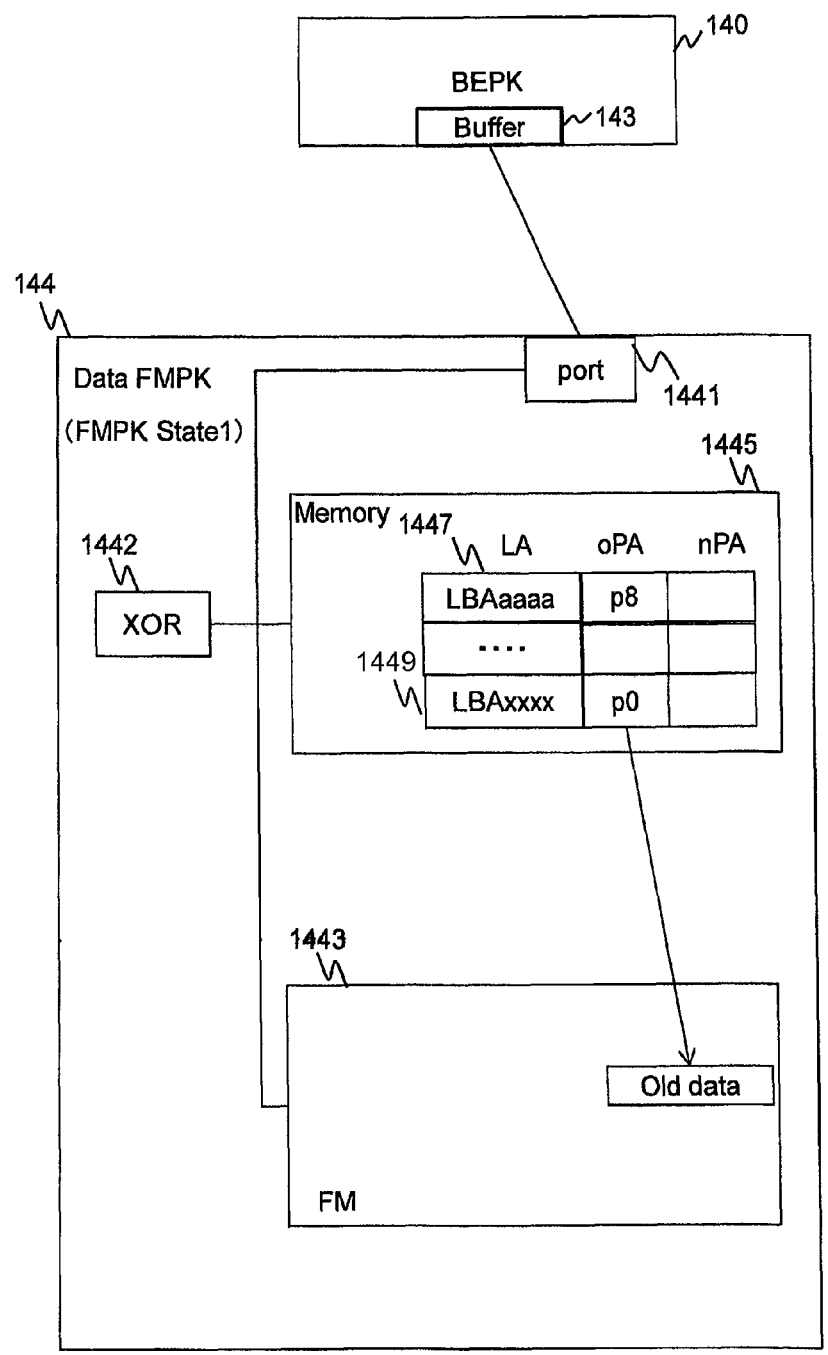
FIG. 19 shows a FMPK state 1, according to Embodiment 1.
Figure 20:
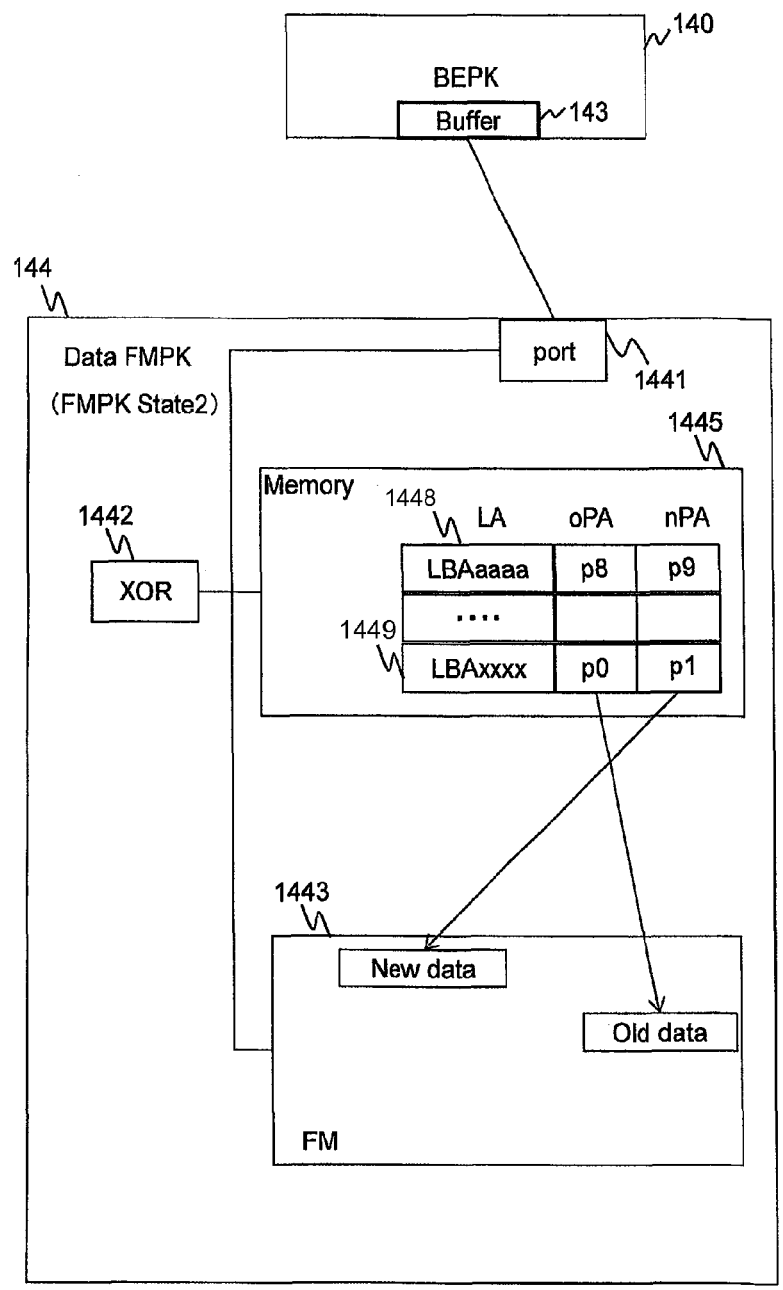
FIG. 20 shows a FMPK state 2, according to Embodiment 1.

Hereinafter, the state of the parity FMPK 144P during the write process is referred to as "FMPK state," and "FMPK state 1" and "FMPK state 2" are described hereinbelow. FIG. 19 shows the FMPK state 1, according to Embodiment 1. FIG. 20 shows the FMPK state 2, according to Embodiment 1.

In the following description of the operations by the FMPK 144, the old user data stored in the data FMPK 144A and the old parity stored in the parity FMPK 144P are referred to as "old data." The new user data stored in the data FMPK 144A and the new parity stored in the parity FMPK 144P are referred to as "new data." In other words, the operations by the FMPK 144 described hereinafter can be applied to the operations by the data FMPK 144A and the operations by the parity FMPK 144P. Furthermore, "additional data" indicates the new user data that is re-transmitted from the controller 100 to the FMPK 144 by the transition write process. The operations performed mainly by the CPU 1444 of the FMPK 144 are described using the FMPK 144.

A pointer table 1448 that associates a logical page accessed from the controller 100 with some physical pages inside the FM 1443 is stored in the memory 1445 of each FMPK 144. The pointer table 1448 includes correspondence relationships of the physical pages to all logical pages within the FMPK 144. In the following description, of the logical pages within each FMPK 144, the logical page designated by a command sent from the controller 100 to the FMPK 144 is referred to as "target logical page." Of the entries in the pointer table 1448 shown in the memory 1445, the entry for the target logical page is referred to as "target entry 1449."

The target entry 1449 has a field for a logical page address, which is a logical address (e.g., LBA: Logical Block Address) designating the target logical page, a field for an old physical page address, which is a physical address designating an old physical page, and a field for a new physical page address, which is a physical page different from the abovementioned physical page and designating a new physical page as a candidate for an old physical page. In the diagram and the following description, in the target entry 1449, the logical page address is called "LA," the old physical page address is called "oPA," and the new physical page address is called "nPA." In the diagram and the following description, the value of the logical page address is described as "LBA xxxx," and the values of the old physical page address and the new physical page address are described as "p0," "p1," "p2," etc.

In the diagrams, an arrow directed from the physical page address stored in the target entry 1449 to the inside of the FM 1443 represents a pointer, indicating that this physical page address indicates the physical page pointed by the arrow. When the arrow is in the form of a dashed line, it means that the pointer of the arrow is deleted.

In the case where the FMPK 144 receives from the controller 100 a normal write command and a normal read command for the target physical page, the FMPK 144 associates the target logical page with the old physical page based on the target entry 1449 of the pointer table, to access the old physical page. In other words, the normal access from the controller 100 is performed only on the old physical page.

The target entry 1449 may have stored therein a logical page number indicating the logical page, in place of the logical page address. The target entry 1449 may have stored therein a physical page number indicating the old physical page, in place of the physical page address. The target entry 1449 may have stored therein a physical page number indicating the new physical page, in place of the new physical page address. The pointer table is managed and updated by the CPU 1444.

In the following description, when the FMPK 144 registers the value of a physical address for storing data, into the old physical page address or the new physical page address of the target entry 1449, this operation is called "pointer connection" for the data. In addition, when the FMPK 144 changes the value registered in the old physical page address or the new physical page address of the target entry 1449 to the value of a physical address of a physical page having other data, this operation is called "pointer replacement" for the data. When the FMPK 144 deletes the value registered in the old physical page address or the new physical page address of the target entry 1449, this operation is called "pointer deletion" for the data. These operations mean that the CPU 1444 updates the target entry 1449 of the pointer table.

In "FMPK state 1," the old data is stored in the old physical page. The logical page address and the old physical page address are stored in the target entry 1449. In the "FMPK state 2," the old data is stored in the old physical page, and the new data is stored in the new physical page. The logical page address, the old physical page address, and the new physical page address are stored in the target entry 1449. In "FMPK state 1," the old data is the enabled data. In "FMPK state 2," the new data and the old data are the enabled data. In the case where the reclamation process is executed in "FMPK state 2," since the new data and the old data are the enabled data, the new data and the old data are copied from the blocks that respectively store the new data and the old data, to other empty blocks. The FM controller 1447 may perform control in a manner that the blocks that include the new data and/or the old data obtained during the parity calculation are not reclaimed. Either way, the FM controller 1447 does not erase the old data until receiving the new data commit command. In this manner, the intermediate parity can be generated in a process performed upon the occurrence of a fault, the process being described hereinafter. Next is described the target entry of the pointer table. The FM controller 1447 can execute the parity calculation process and the read/write process in parallel on a plurality of entries (logical pages).

Operations by FMPK 144 Based on Command

An operation by the FMPK 144 based on each command is described hereinafter.

Figure 21:
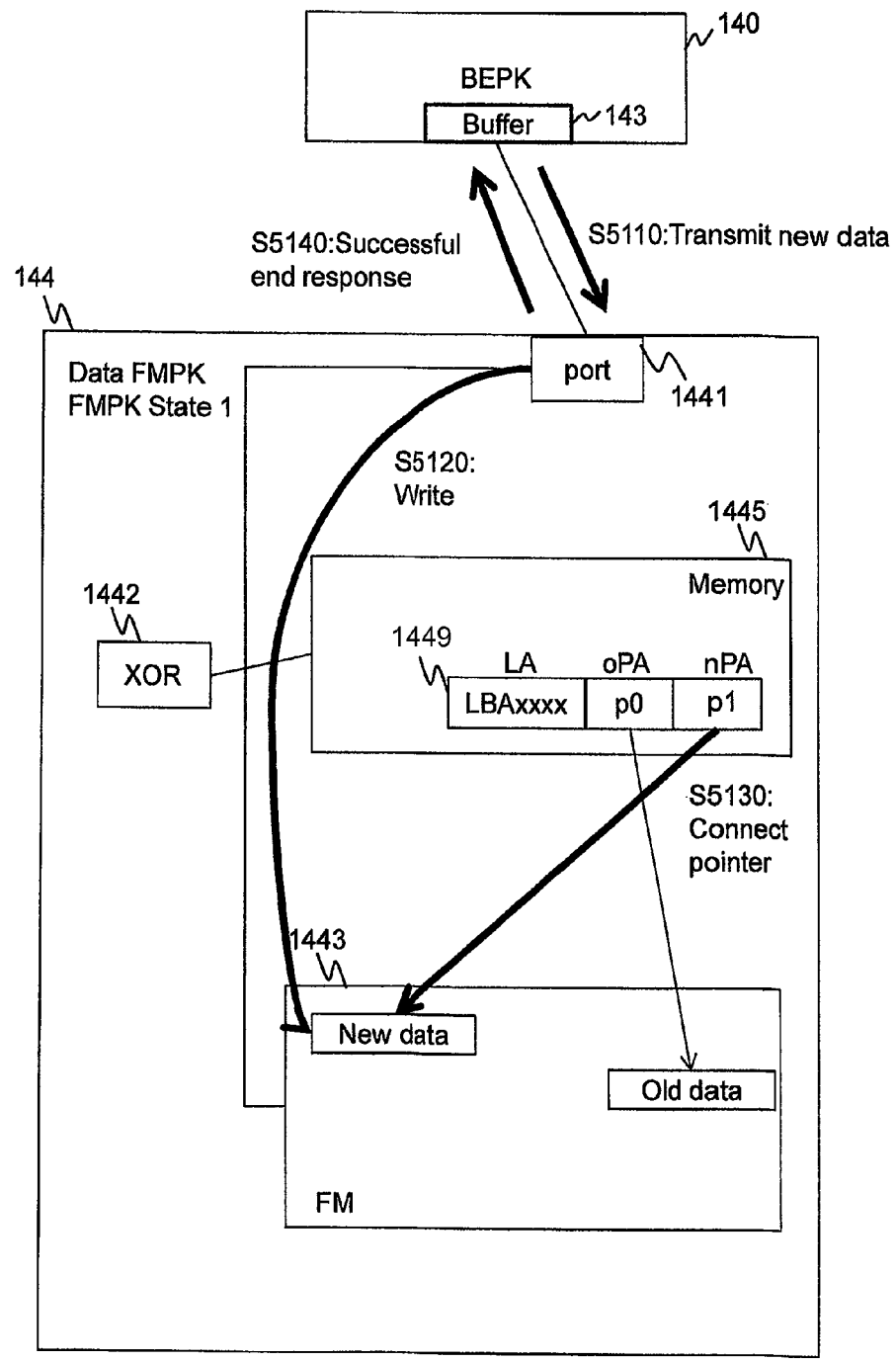
FIG. 21 shows an operation performed based on the new data transmission command under the FMPK state 1, according to Embodiment 1.

FIG. 21 shows an operation performed based on the new data transmission command under the FMPK state 1, according to Embodiment 1. This operation corresponds to S2530 described above. In the FMPK 144, the old data is stored in the old physical page. In the target entry 1449, the old physical page address indicates the old physical page. First, the BEPK 140 sends the new data transmission command designating the target logical page and accompanying new data to the FMPK 144 (S5110). The FMPK 144 stores the new data temporarily in the memory 1445 and afterward writes the new data into the new physical page of the FM 1443 (S5120). The FMPK 144 then performs the pointer connection on the new data by designating the new physical page for the new physical page address of the target entry 1449 (S5130). Subsequently, the FMPK 144 sends a normal end response to the controller 100 (S5140). This operation allows the system state to transit from the state 1 to the state 2. With this new data transmission command, the correspondence relationship between the logical page address and the old physical page address can be maintained even after writing the new data, without having the old data disabled. When the FM controller 1447 described hereinafter receives the new data commit command, the correspondence relationship between the logical page address and the old physical page address is canceled. Moreover, with the new data transmission command, the new data can be written to the physical page of the physical page of the FM prior to the generation of the intermediate parity. The old user data is kept in the parity FMPK 144P until the new parity is written to the physical storage region. Accordingly, even upon the occurrence of a fault, the intermediate parity can be generated using the old user data. The normal write process, on the other hand, is described with reference to FIG. 31.

Figure 22:
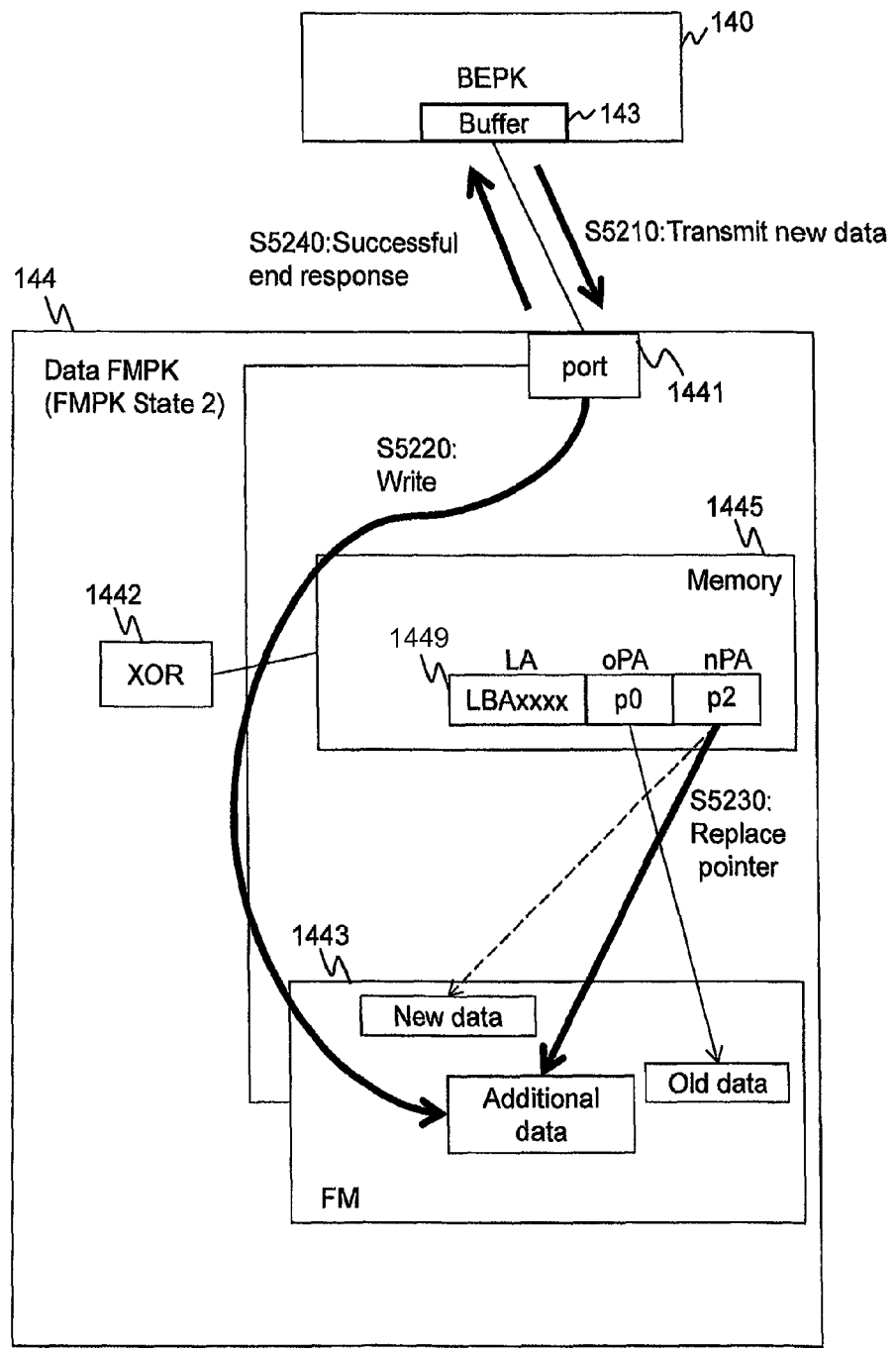
FIG. 22 shows an operation performed based on the new data transmission command under the FMPK state 2, according to Embodiment 1.

FIG. 22 shows an operation performed based on the new data transmission command under the FMPK state 2, according to Embodiment 1. In the FMPK 144, the old data is stored in the old physical page and the new data is stored in the new physical page. In the target entry 1449, the old physical page address indicates the old physical page, and the new physical page address indicates the new physical page. First, the controller 100 sends the new data transmission command designating the target logical page and accompanying additional data to the FMPK 144 (S5210). The FMPK 144 stores the additional data temporarily in the memory 1445 and afterward writes the additional data into an additional physical page, which is a physical page different from the old physical page and the new physical page of the FM 1443 (S5220). The FMPK 144 then performs the pointer replacement for replacing the new data with the additional data, by designating the additional physical page for the new physical page address of the target entry 1449 (S5230). Subsequently, the FMPK 144 sends a normal end response to the controller 100 (S5240). In this process, the new data stored in the FM is not taken as the old data. Since the stage occurs prior to the generation of the new parity, the old data obtained when the old parity was generated is maintained as the old data. When processing the new data transmission command, the FMPK state does not transit from the FMPK state 2. In other words, when processing the new data transmission command in the FMPK state 1, the FMPK state transits to the FMPK state 2. When processing the new data transmission command in the FMPK state 2, the FMPK state remains as the FMPK state 2. This means that the transition of the state of the FMPK occurs due to the new data transmission command, regardless of the state of the FMPK. The normal write process, on the other hand, is described with reference to FIG. 32.

Figure 23:
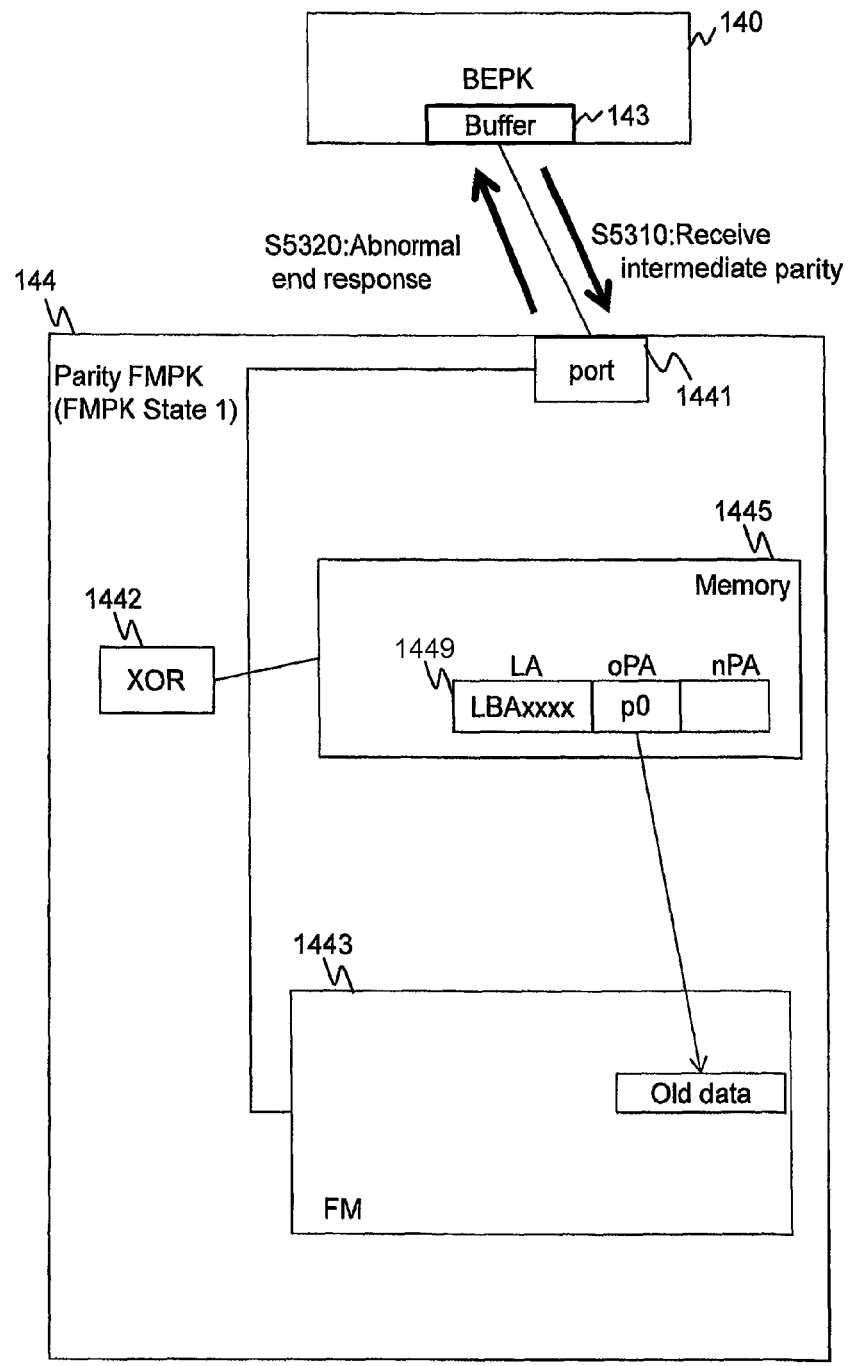
FIG. 23 shows an operation performed based on the intermediate parity reception command under the FMPK state 1, according to Embodiment 1.

FIG. 23 shows an operation performed based on the intermediate parity reception command under the FMPK state 1, according to Embodiment 1. First, the controller 100 sends the intermediate parity reception command to the FMPK 144 (S5310). This intermediate parity reception command designates the target logical page. Subsequently, the FMPK 144 sends an abnormal end response to the controller 100 (S5320).

Figure 24:
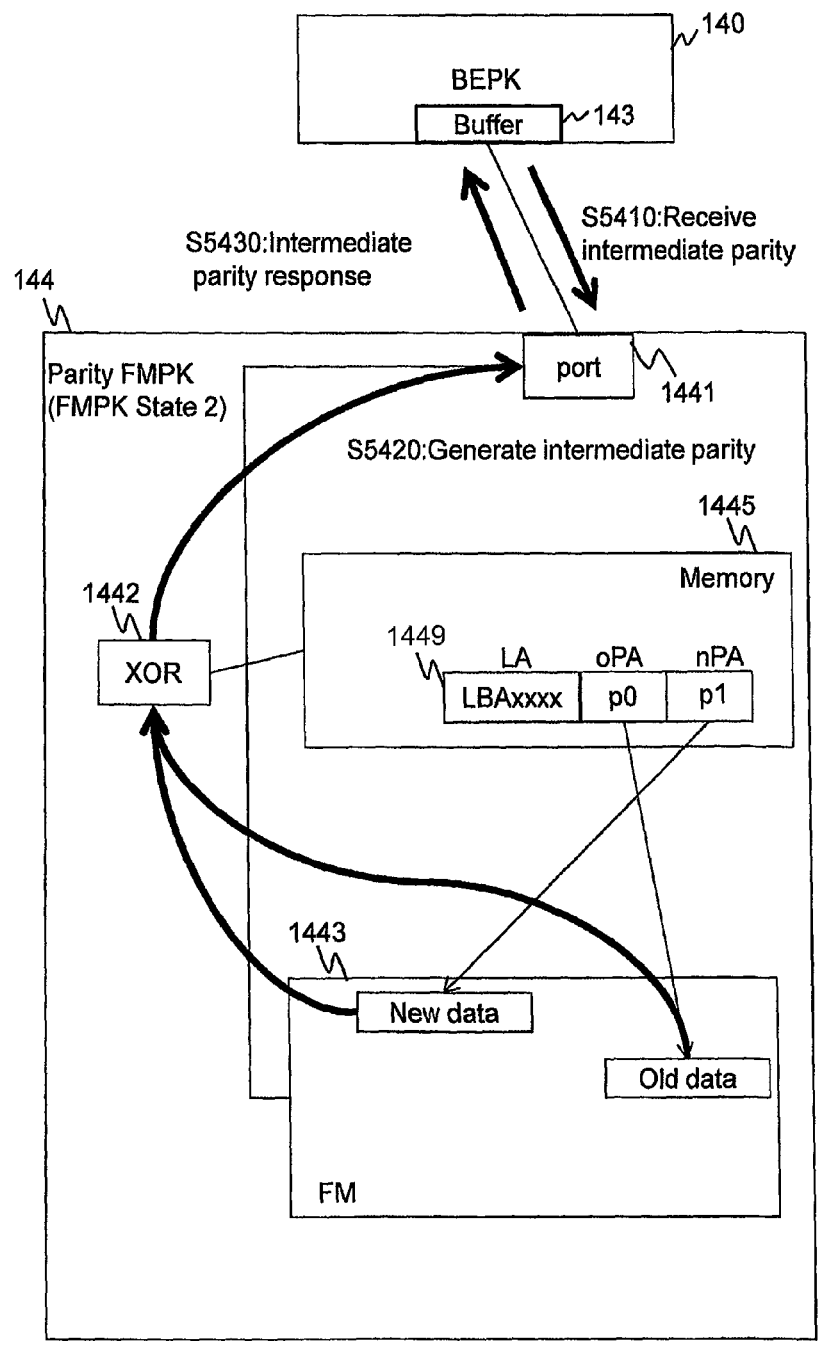
FIG. 24 shows an operation performed based on the intermediate parity reception command under the FMPK state 2, according to Embodiment 1.

FIG. 24 shows an operation performed based on the intermediate parity reception command under the FMPK state 2, according to Embodiment 1. In the FMPK 144, the old data is stored in the old physical page, and the new data in the new physical page. In the target entry 1449, the old physical page address indicates the old physical page, and the new physical page address indicates the new physical page. In other words, the old physical page and the new physical page are mapped to the logical page address. First, the controller 100 sends the intermediate parity reception command to the FMPK 144 (S5410). This intermediate parity reception command designates the target logical page. The FMPK 144 then reads the old data and the new data indicated respectively by the old physical page address and the new physical page address stored in the target entry 1449, and generates an intermediate parity using the XOR circuit 1442 (S5420). In the FMPK 144, mapping to the old data is maintained based on the new data transmission command from the controller 100. Accordingly, the FM controller can specify the new user data and the old user data for a certain logical page address. Subsequently, the FMPK 144 sends a response regarding the intermediate parity to the controller 100 (S5430). In addition, as shown in FIG. 22, the same process is carried out even when the additional data is stored in the FM. In other words, the FM controller generates the intermediate parity from the additional user data and the old user data. In the FMPK 144, the intermediate parity generation process is executed a number of times on the other user data, in parallel with the normal read/write process, and the memory 1445 is used in these processes as well. Therefore, maintaining the written new user data in the memory 1445 and writing the intermediate parity to the FM after the generation thereof increases the period of time in which the new user data is stored in the memory. This can deteriorate the performance of the read/write process. In the present embodiment, the FM controller reads the new user data and the old user data to generate the intermediate parity after writing the new data into the FM and upon reception of the intermediate parity reception command. Thus, the period of time in which the new user data and the old user data are stored in the memory 1445 of the FMPK 144 can be shortened when the intermediate parity is generated. As a result, the region in the memory that can be used in the read/write process can be increased, improving the process performance of the FMPK 144.

Figure 25:
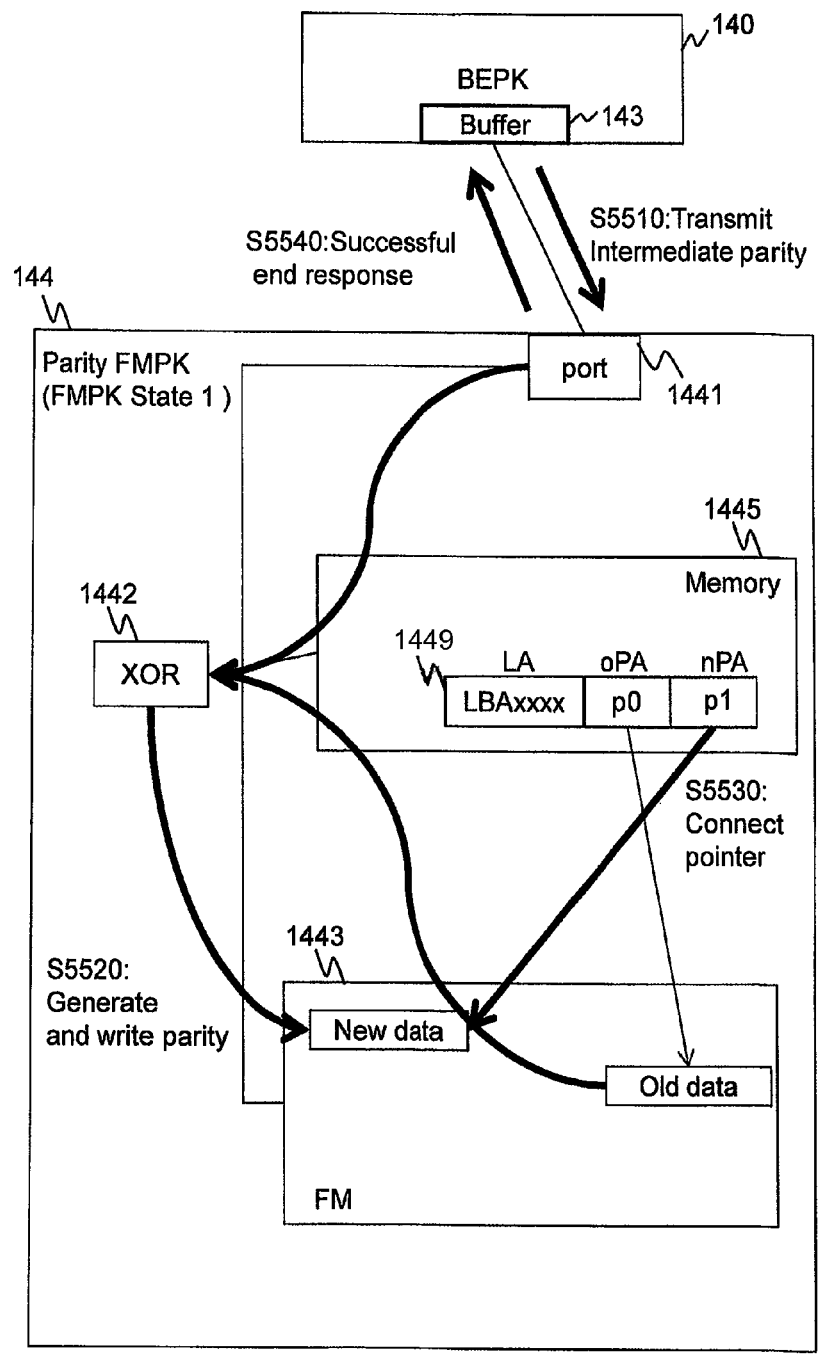
FIG. 25 shows an operation performed based on the intermediate parity transmission command under the FMPK state 1, according to Embodiment 1.

FIG. 25 shows an operation performed based on the intermediate parity transmission command under the FMPK state 1, according to Embodiment 1. In the FMPK 144, the old parity is stored in the old physical page. In the target entry 1449, the old physical page address indicates the old physical page. First, the BEPK 140 sends to the FMPK 144 the intermediate parity transmission command designating the target logical page and related to the intermediate parity (S5510). Then, the FMPK 144 temporarily stores the intermediate parity in the memory 1445, reads the old parity from the old physical page indicated by the old physical page address of the target entry 1449, temporarily stores the old parity in the memory 1445, generates a new parity from the intermediate parity and the old parity by using the XOR circuit 1442, and writes the new parity to the new physical page (S5520). The FMPK 144 then performs the pointer connection on the new parity by designating the new physical page for the new physical page address of the target entry 1449 (S5530). Subsequently, the FMPK 144 sends a normal end response to the controller 100 (S5540).

Figure 26:
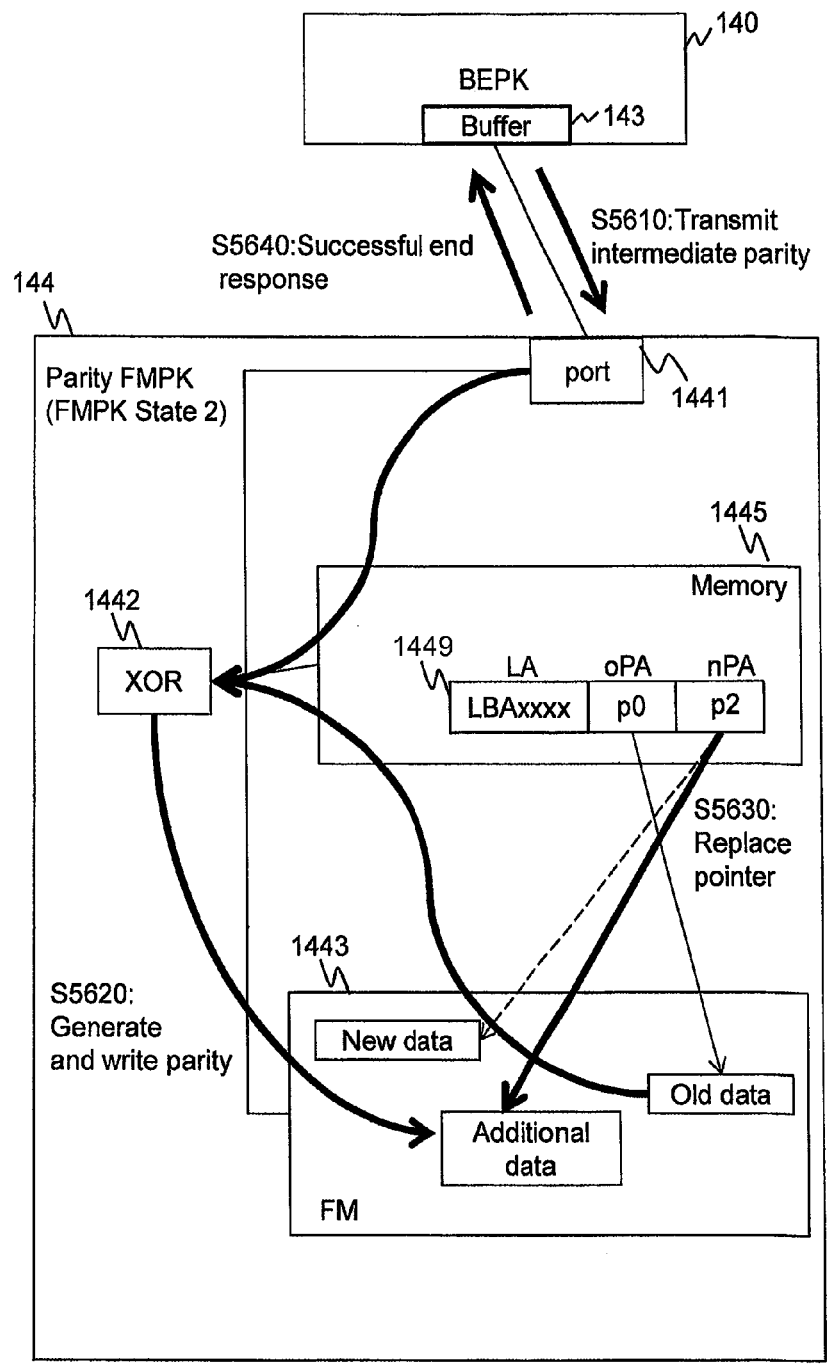
FIG. 26 shows an operation performed based on the intermediate parity transmission command under the FMPK state 2, according to Embodiment 1.

FIG. 26 shows an operation performed based on the intermediate parity transmission command under the FMPK state 2, according to Embodiment 1. In the FMPK 144, the old data is stored in the old physical page and the new data is stored in the new physical page. In the target entry 1449, the old physical page address indicates the old physical page, and the new physical page address indicates the new physical page. First, the controller 100 sends the intermediate parity transmission command designating the target logical page and accompanying the intermediate parity to the FMPK 144 (S5610). The FMPK 144 then reads the old data from the old physical page indicated by the old physical page address stored in the target entry 1449, generates additional data from the intermediate parity and the old data using the XOR circuit 1442, and writes the additional data into the additional physical page different from the old physical page and the new physical page (S5620). The FMPK 144 then performs the pointer replacement for replacing the new data with the additional data, by designating the additional physical page for the new physical page address of the target entry 1449 (S5630). Subsequently, the FMPK 144 sends a normal end response to the controller 100 (S5640). In this manner, even in the FMPK state 1 or the FMPK state 2, the additional parity (same as the new parity) can be generated from the old parity and the intermediate parity when the FM controller receives the intermediate parity transmission command.

Figure 27:
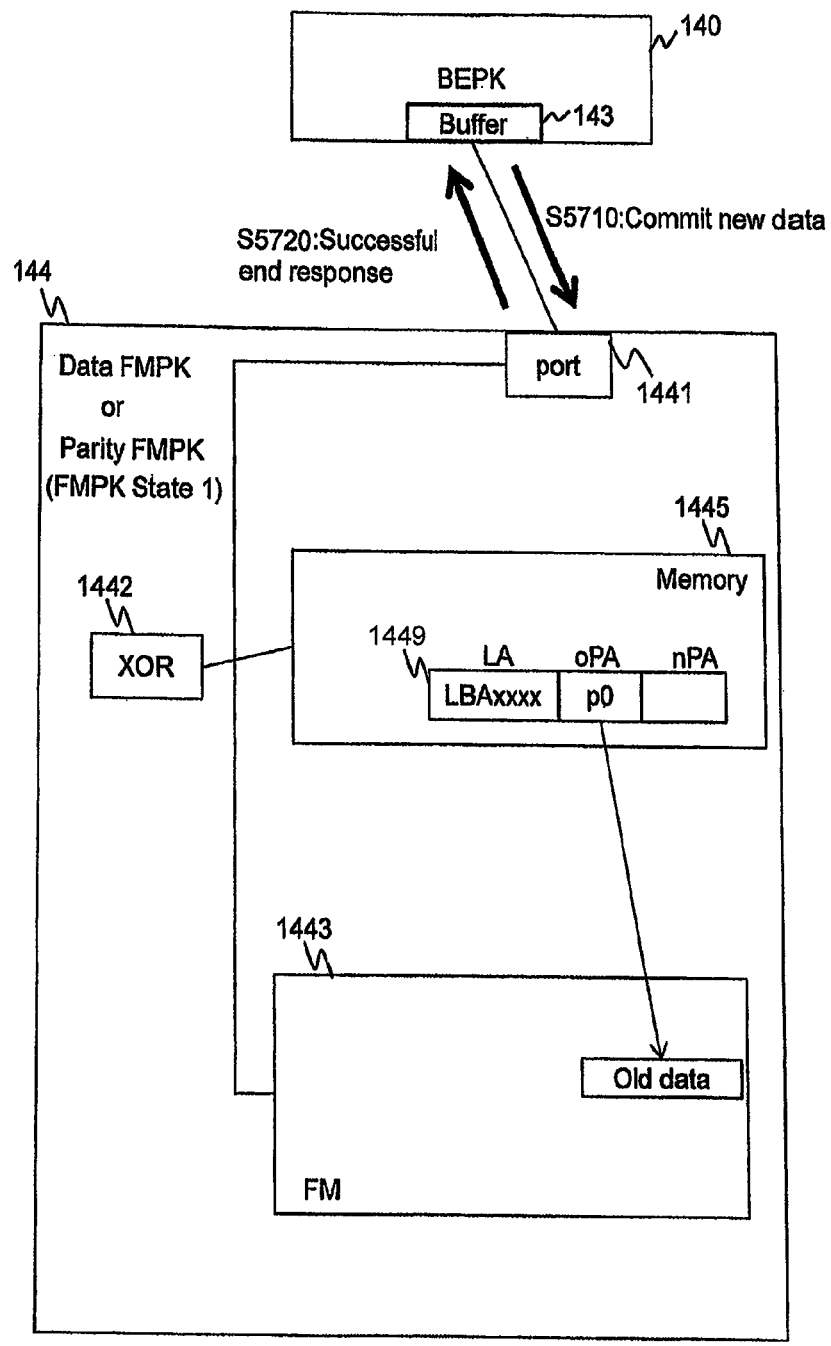
FIG. 27 shows an operation performed based on the new data commit command under the FMPK state 1, according to Embodiment 1.

FIG. 27 shows an operation performed based on the new data commit command under the FMPK state 1, according to Embodiment 1. When this process is performed by the data FMPK 144A, the new data is determined. When the process is performed by the parity FMPK 144P, the new parity is determined. In the FMPK 144, the old data is stored in the old physical page. In the target entry 1449, the old physical page address indicates the old physical page. First, the controller 100 sends the new data commit command to the FMPK 144 (S5710). This new data commit command designates the target logical page. Subsequently, the FMPK 144 sends a normal end response to the controller 100 (S5720). In other words, because the new data is already determined, the FMPK state 1 is recognized as a normal state. This process is executed in order to confirm the FMPK state, when a system fault occurs after the new data and the new parity are determined and before the process stage information items in the SMs 132 are cleared.

Figure 28:
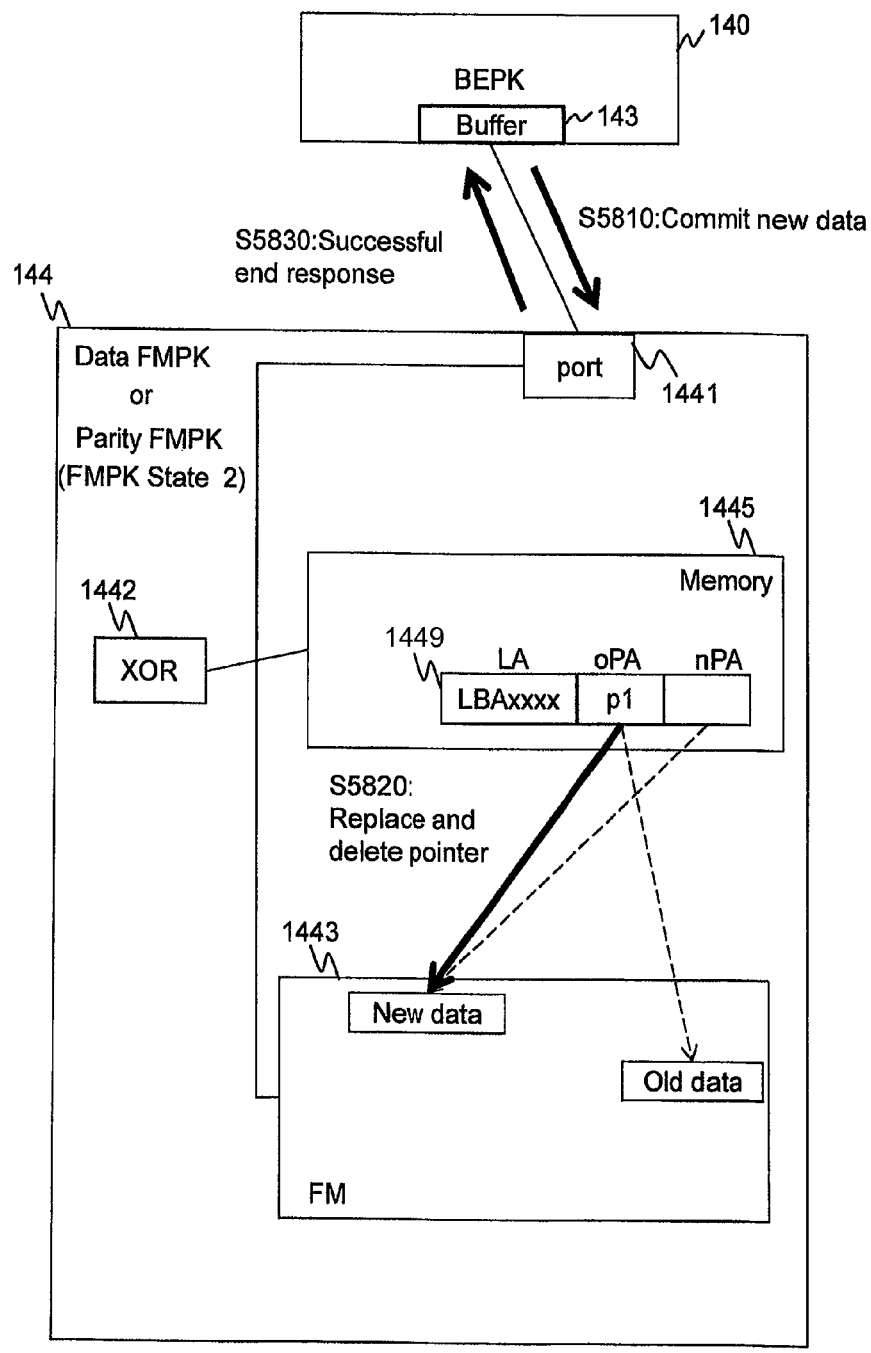
FIG. 28 shows an operation performed based on the new data commit command under the FMPK state 2, according to Embodiment 1.
Figure 29:
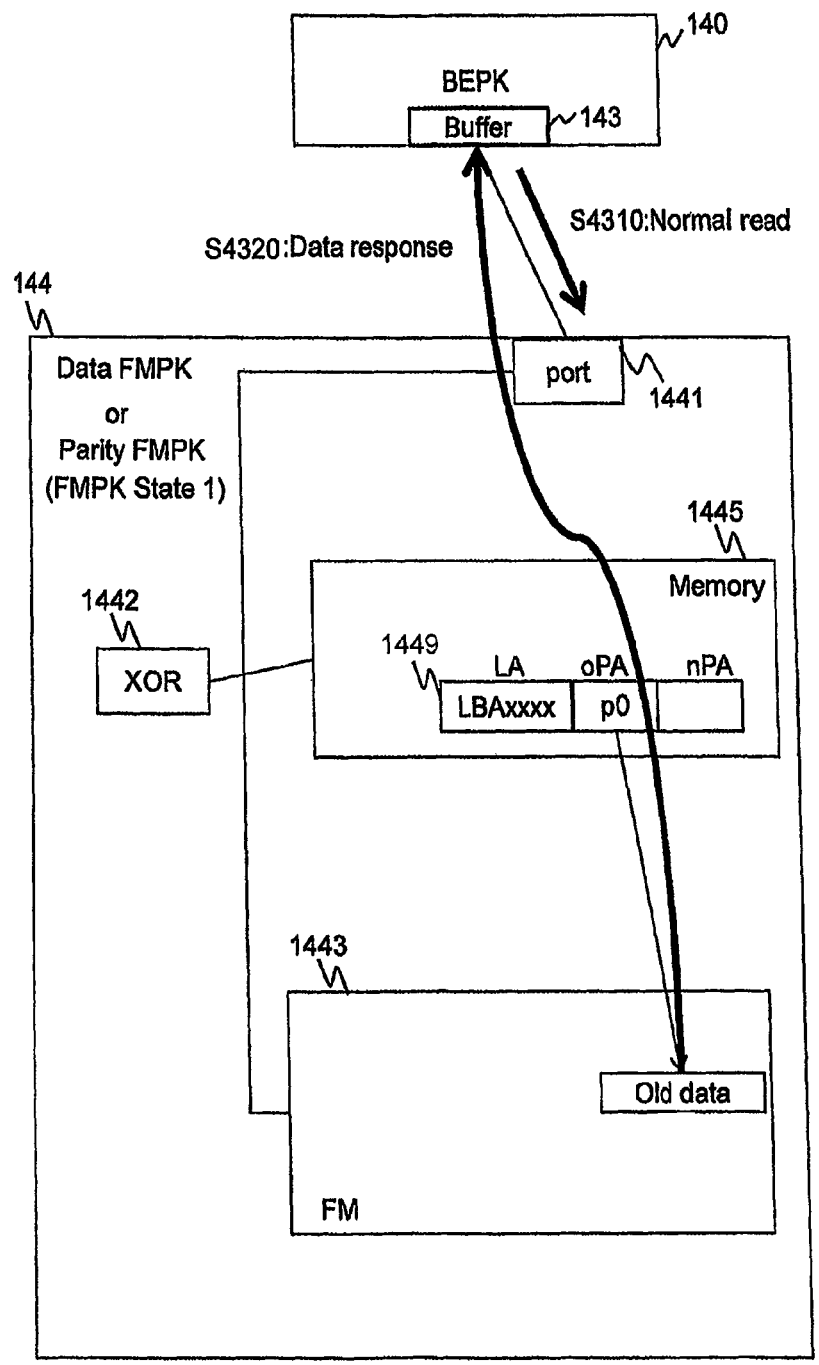
FIG. 29 shows an operation performed based on a normal read command under the FMPK state 1, according to Embodiment 1.

FIG. 28 shows an operation performed based on the new data commit command under the FMPK state 2, according to Embodiment 1. When this process is performed by the data FMPK 144A, the new data is determined. When the process is performed by the parity FMPK 144P, the new parity is determined. As a result of this process, the state of the FMPK 144 transits from the FMPK state 2 to the FMPK state 1. In the FMPK 144, the old data is stored in the old physical page and the new data is stored in the new physical page. In the target entry 1449, the old physical page address indicates the old physical page, and the new physical page address indicates the new physical page. First, the controller 100 sends the new data commit command to the FMPK 144 (S5810). This new data commit command designates the target logical page. The FMPK 144 then performs the pointer replacement for replacing the old data with the new data, by designating the new physical page for the old physical page address of the target entry 1449, and performs the pointer deletion on the new data by deleting the new physical page from the new physical page address of the target entry 1449 (S5820). Subsequently, the FMPK 144 sends a normal end response to the controller 100 (S5830). After these steps, the FM controller responds with new data when receiving a read request. In this way, in both FMPK state 1 and FMPK state 2, the establishment of the FMPK state 1 is ensured when the new data commit command is received FIG. 29 shows an operation performed based on the normal read command under the FMPK state 1, according to Embodiment 1. First, the controller 100 sends the normal read command to the FMPK 144 (S4310). This normal read command designates the target logical page. The FMPK 144 then reads the old data indicated by the old physical page address of the target entry 1449, and sends a response regarding the old data to the controller 100 (S4320).

Figure 30:
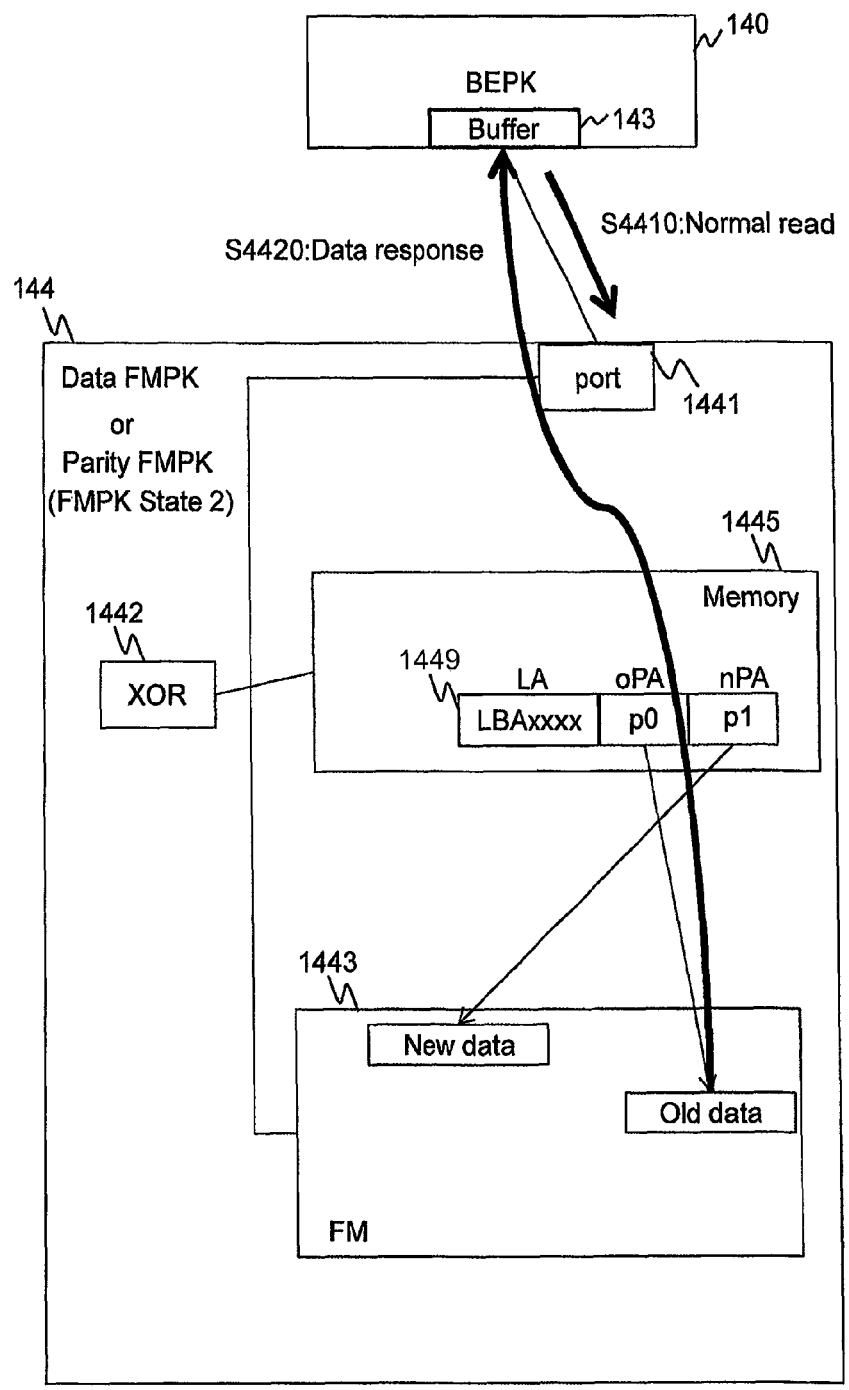
FIG. 30 shows an operation performed based on the normal read command under the FMPK state 2, according to Embodiment 1.

FIG. 30 shows an operation performed based on the normal read command under the FMPK state 2, according to Embodiment 1. In the FMPK 144, the old data is stored in the old physical page, and the new data in the new physical page. In the state 2, both the old physical page and the new physical page are mapped to a certain LBA. In other words, for the storage system, this state is where writing of the new data is not completed. First, the controller 100 sends the normal read command to the FMPK 144 (S4410). This normal read command designates the target logical page. The FMPK 144 then reads the old data indicated by the old physical page address of the target entry 1449, and sends a response regarding the old data to the controller 100 (S4420).

Figure 31:
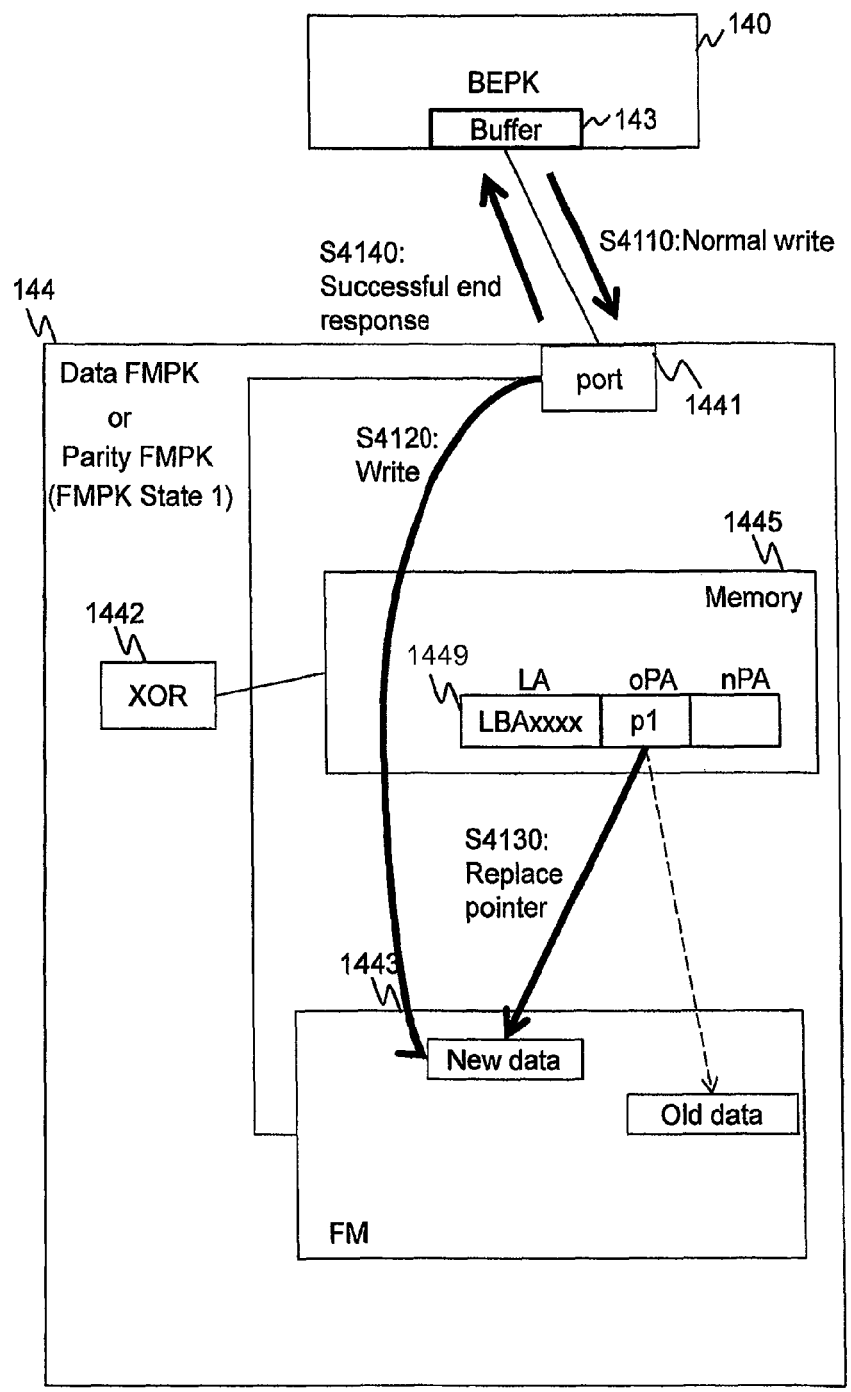
FIG. 31 shows an operation performed based on a normal write command under the FMPK state 1, according to Embodiment 1.

FIG. 31 shows an operation performed based on the normal write command under the FMPK state 1, according to Embodiment 1. In the FMPK 144, the old data is stored in the old physical page. In the target entry 1449, the old physical page address indicates the old physical page. First, the controller 100 sends the normal write command designating the target logical page and accompanying new data to the FMPK 144 (S4110). The FMPK 144 then writes the new data into the new physical page stored in the FM 1443 (S4120). The FMPK 144 then performs the pointer replacement for replacing the old data with the new data, by designating the new physical page for the old physical page address of the target entry 1449 (S4130). Subsequently, the FMPK 144 sends a normal end response to the controller 100 (S4140). This operation does not allow the FMPK state to transit from the FMPK state 1.

Figure 32:
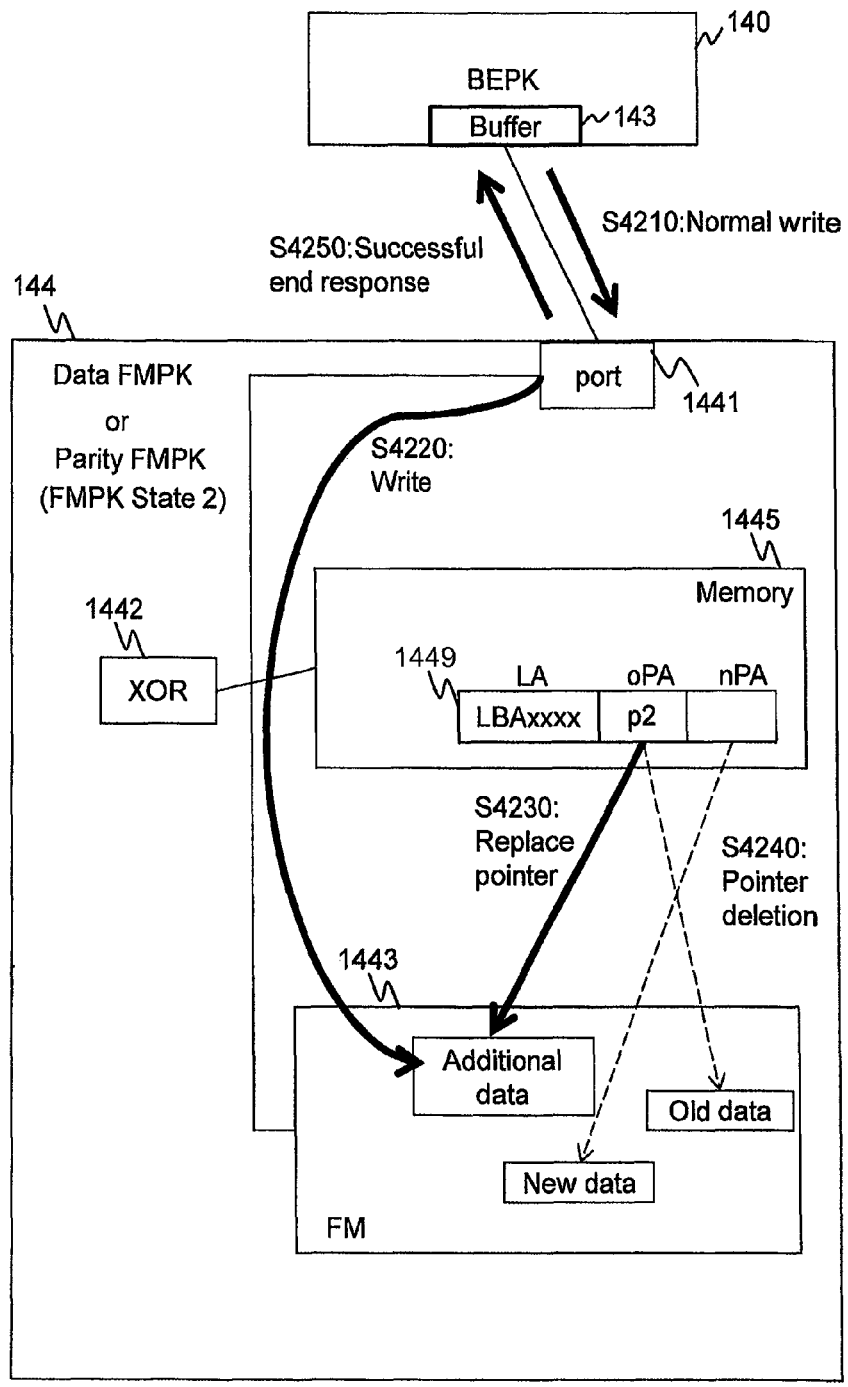
FIG. 32 shows an operation performed based on the normal write command under the FMPK state 2, according to Embodiment 1.

FIG. 32 shows an operation performed based on the normal write command under the FMPK state 2, according to Embodiment 1. In the FMPK 144, the old data is stored in the old physical page and the new data is stored in the new physical page. In the target entry 1449, the old physical page address indicates the old physical page, and the new physical page address indicates the new physical page. First, the controller 100 sends the normal write command designating the target logical page and accompanying additional data to the FMPK 144 (S4210). The FMPK 144 then writes the additional data into the additional physical page, which is a physical page different from the old physical page and the new physical page stored in the FM 1443 (S4220). The FMPK 144 then performs the pointer replacement on the old data by designating the additional physical page for the old physical page address of the target entry 1449 (S4230). Subsequently, the FMPK 144 performs the pointer deletion on the new data by deleting the new physical page from the new physical page address of the target entry 1449 (S4240). The FMPK 144 then sends a normal end response to the controller 100 (S4250). This operation allows the system state to transit from the FMPK state 2 to the FMPK state 1.

Transitions of System State

Figure 33:
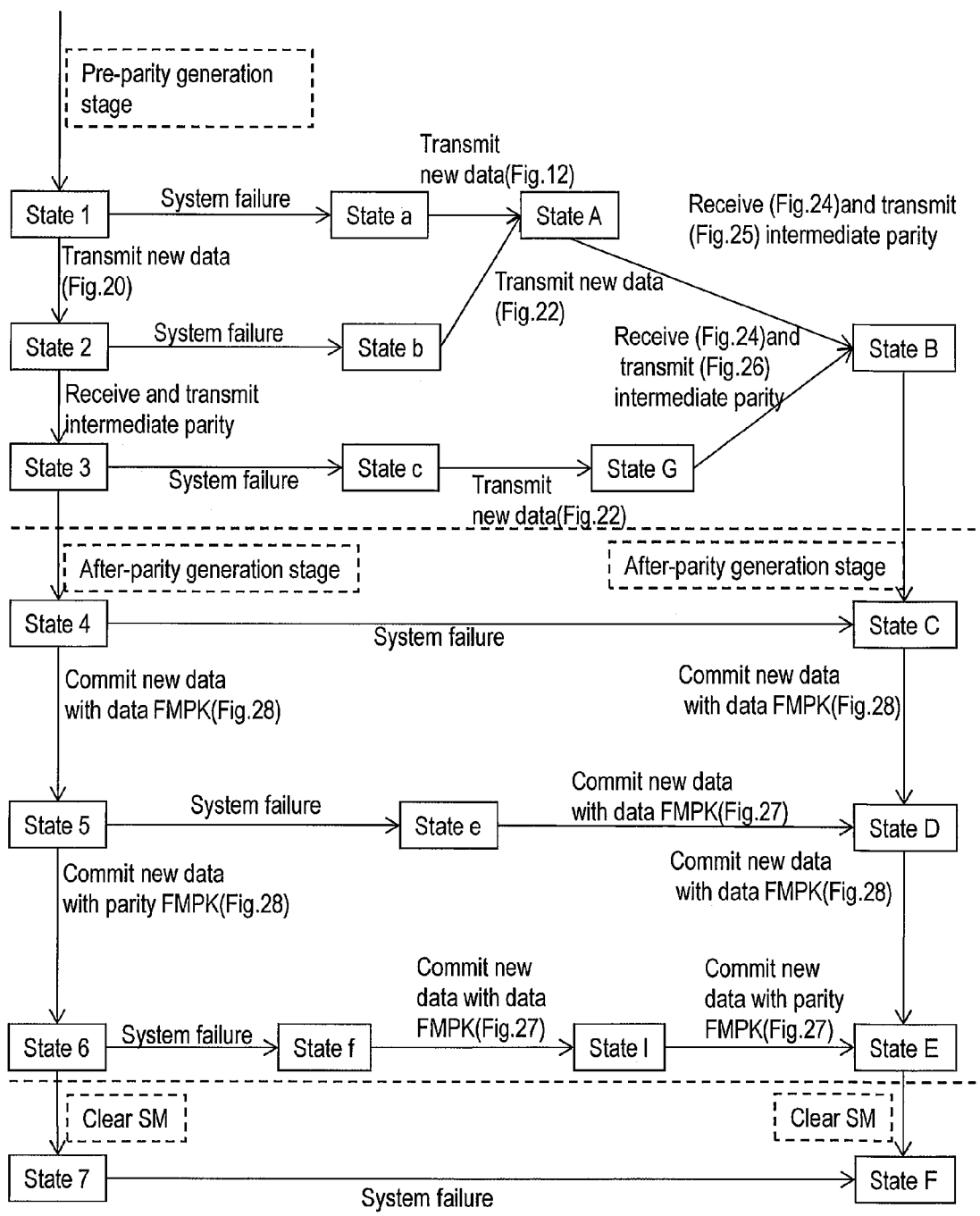
FIG. 33 shows transitions of the system states, according to Embodiment 1.

FIG. 33 shows the each process according to Embodiment 1 and transitions of the state of the system caused due to the occurrence of a system fault. The states of the system adopted in this embodiment are, in addition to the system states 1 to 7 described above, a system state a, system state b, system state c, system state e, system state f, system state A, system state B, system state C, system state D, system state E, system state F, system state G, and system state I, each of which indicates a state of the system upon the occurrence of a fault. The numbers of the drawings describing the corresponding processes by the FMPK are shown in parentheses. In the drawing, the terms "pre-parity generation stage" and "post-parity generation stage" indicate the contents of the process stage information items stored in the SM 132. The term "clear SM" means that the new data and the new parity are determined and that the process stage information items related to the FMPK are deleted from the SM 132. In the system states 1 to 3, the correspondence relationship between the logical page and the physical page in which the old user data is stored is kept in the data FMPK 144A. In the system states 1 to 3, the correspondence relationship between the logical page and the physical page in which the old parity is stored is kept in the parity FMPK 144P. Therefore, when faults occur in the system states 1 to 3, the intermediate parity can be generated by allowing the controller 100 to transmit the new user data to the data FMPK 144A, and the new parity can be generated from the intermediate parity and the old parity. In the system states 4 to 6, the correspondence relationship between the logical page and the physical page in which the new user data is stored is kept in the data FMPK 144A. In the system states 4 to 6, the correspondence relationship between the logical page and the physical page in which the new parity is stored is kept in the parity FMPK 144P. Therefore, when faults occur in the system states 4 to 6, the new user data and the new parity can be determined by allowing the controller 100 to transmit the new data commit command to the data FMPK 144A and the parity FMPK 144P. As described above, the process stage information item stored in the SM 132 has two stages: "pre-parity generation stage" and "post-parity generation stage." For this reason, data loss that is caused upon the occurrence of a fault can be avoided, and the load imposed to manage the process stage information item can be reduced. Managing the process stage information item in detail increases the number of accesses to the SMs 132 for recording the process stage information item therein and increases the load caused as a result of the accesses made to the SMs 132.

First, a Normal Transition of the System State is Described.

Figure 34:
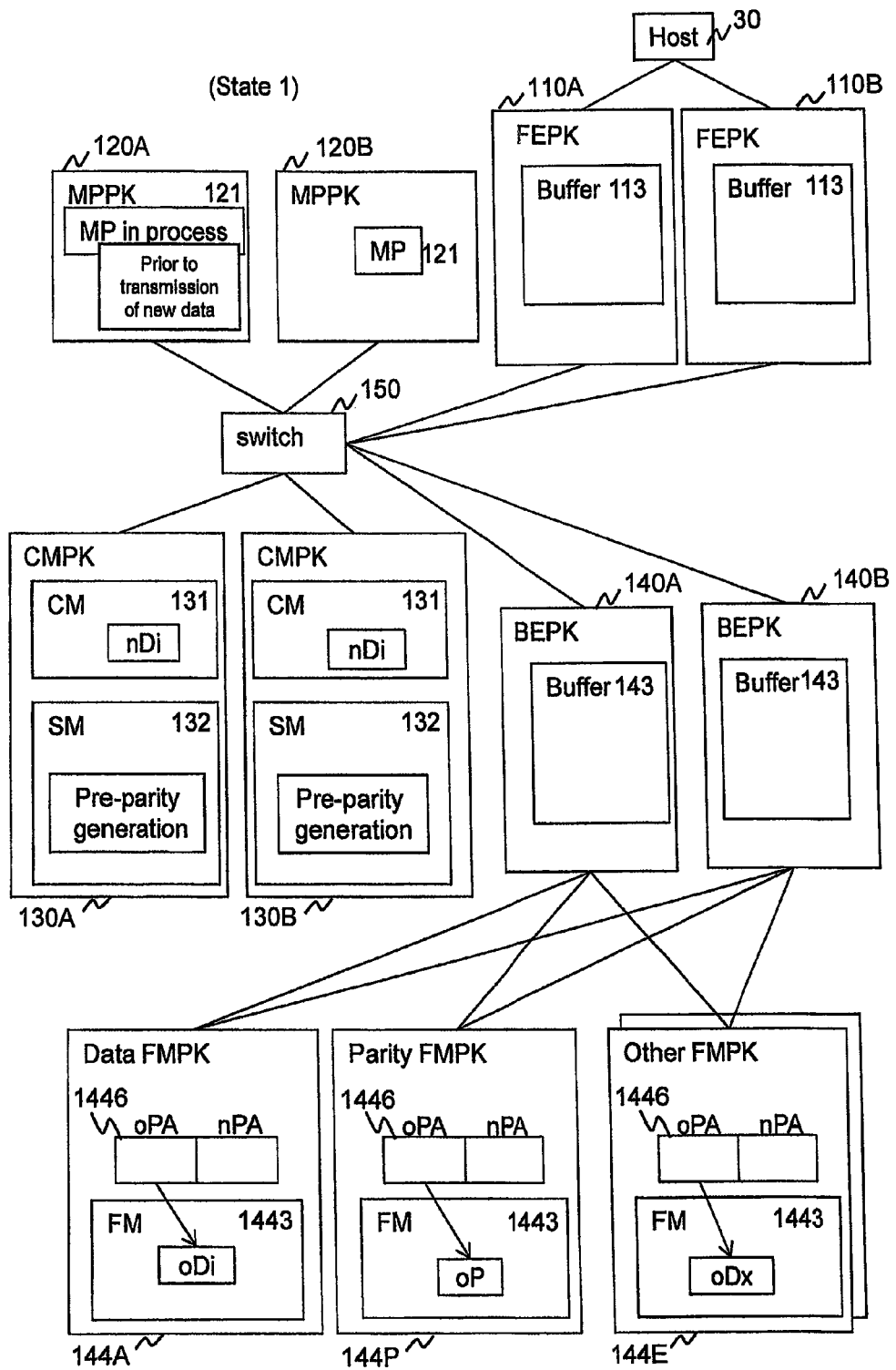
FIG. 34 shows an arrangement of data in a system state 1, according to Embodiment 1.

FIG. 34 shows an arrangement of data in the system state 1, according to Embodiment 1. In the following description, two of the FEPKs 110 of the controller 100 are referred to as "FEPK 110A" and "FEPK 110B," respectively. Two of the MPPKs 120 of the controller 100 are referred to as "MPPK 120A" and "MPPK 120B," respectively. Two of the CMPKs 130 of the controller 100 are referred to as "CMPK 130A" and "CMPK 130B," respectively. Two of the BEPKs 140 of the controller 100 are referred to as "BEPK 140A" and "BEPK 140B," respectively. Of the plurality of FMPKs 144 configuring the RAID groups, the FMPKs 144 other than the data FMPK 144A and the parity FMPK 144P are referred to as "other data FMPKs 144E." In addition, in the diagram and the following description, the old user data, which is the user data obtained before the update by the write process, is referred to as "oDi," the new user data, which is the user data after the update, is referred to as "nDi," other user data, which is the user data stored in the other data FMPKs 144E within the same stripe as the oDi, is referred to as "oDx." Furthermore, the intermediate parity is referred to as "mP," the old parity as "oP," and the new parity as "nP." In the drawings and the following description, the MP 121 of the MPPK 120A in the write process is referred to as "MP in process."

The system state 1 occurs before the controller 100 transmits the new data transmission command. The CM 131 of the CMPK 130A and the CM 131 of the CMPK 130B have the new user data stored therein. The SM 132 of the CMPK 130A and the SM 132 of the CMPK 130B show the pre-parity generation stages. The data FMPK 144A has the old user data stored therein. The parity FMPK 144P has the old parity stored therein. The other FMPKs 144E have other user data stored therein. The old physical page address of the target entry 1449 of the data FMPK 144A indicates the old user data. The old physical page address of the target entry 1449 of the parity FMPK 144P indicates the old parity.

In the state 1, the controller 100 sends the new data transmission command to the data FMPK 144A. As a result, the system state transits to the state 2.

Figure 35:
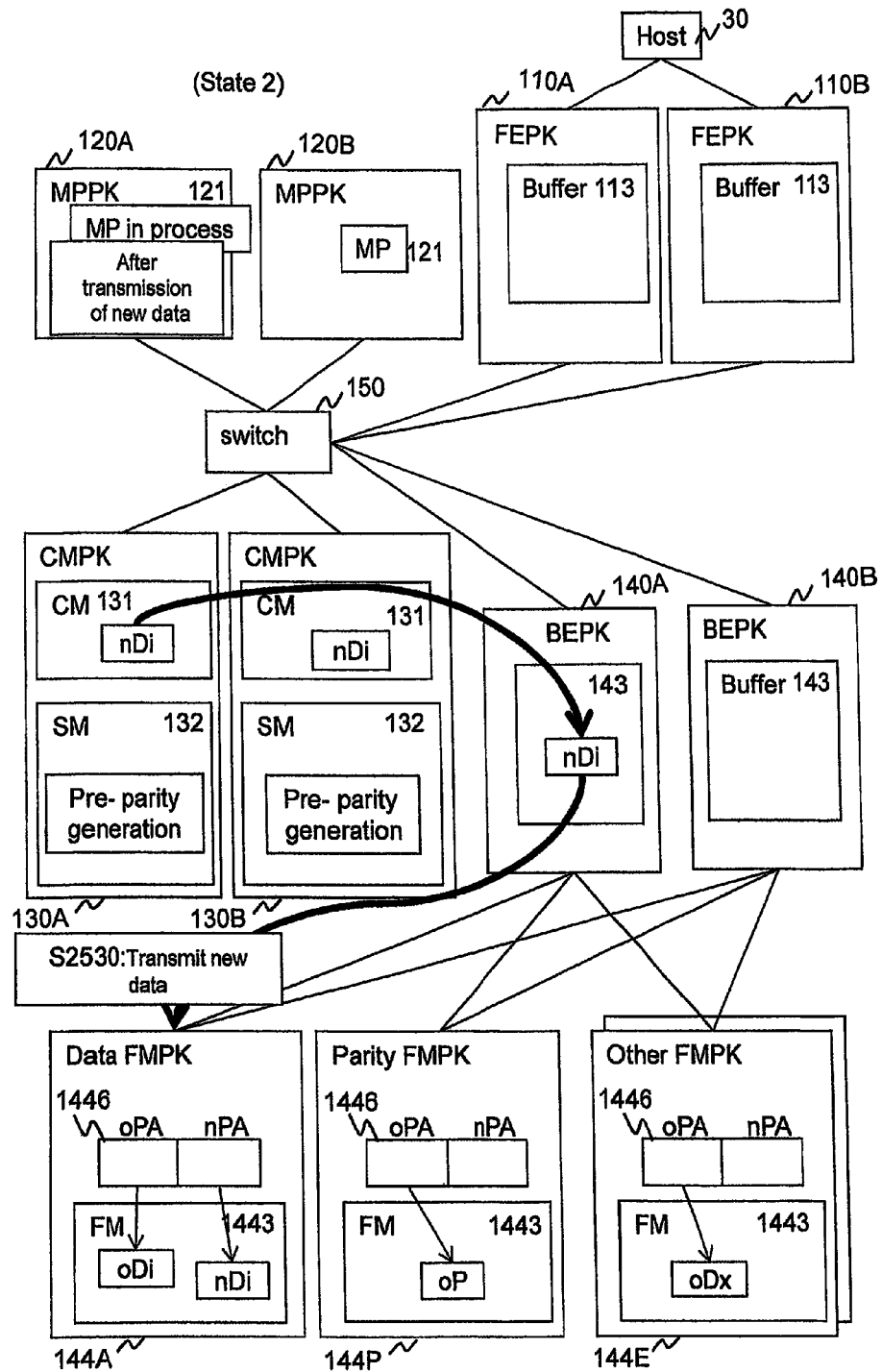
FIG. 35 shows an arrangement of data in a system state 2, according to Embodiment 1.

FIG. 35 shows an arrangement of data in the system state 2, according to Embodiment 1. This state occurs after the completion of the new data transmission command by the controller 100. The new data transmission command sends the new user data stored in the CM 131 of the CMPK 130A, to the FMPK 144A via the BEPK 140A. As a result, the BEPK 140A stores the new user data. Also, the data FMPK 144A stores the old user data and the new user data. Both the new physical page address and the old physical page address are associated with the target logical page address in the data FMPK 144A. The new physical page address indicates the physical page in which the new user data is stored, and the old physical page address indicates the physical page in which the old user data is stored.

In the system state 2, the controller 100 sends the intermediate parity reception command to the data FMPK 144A and the intermediate parity transmission command to the parity FMPK 144P. As a result, the system state transits to the state 3.

Figure 36:
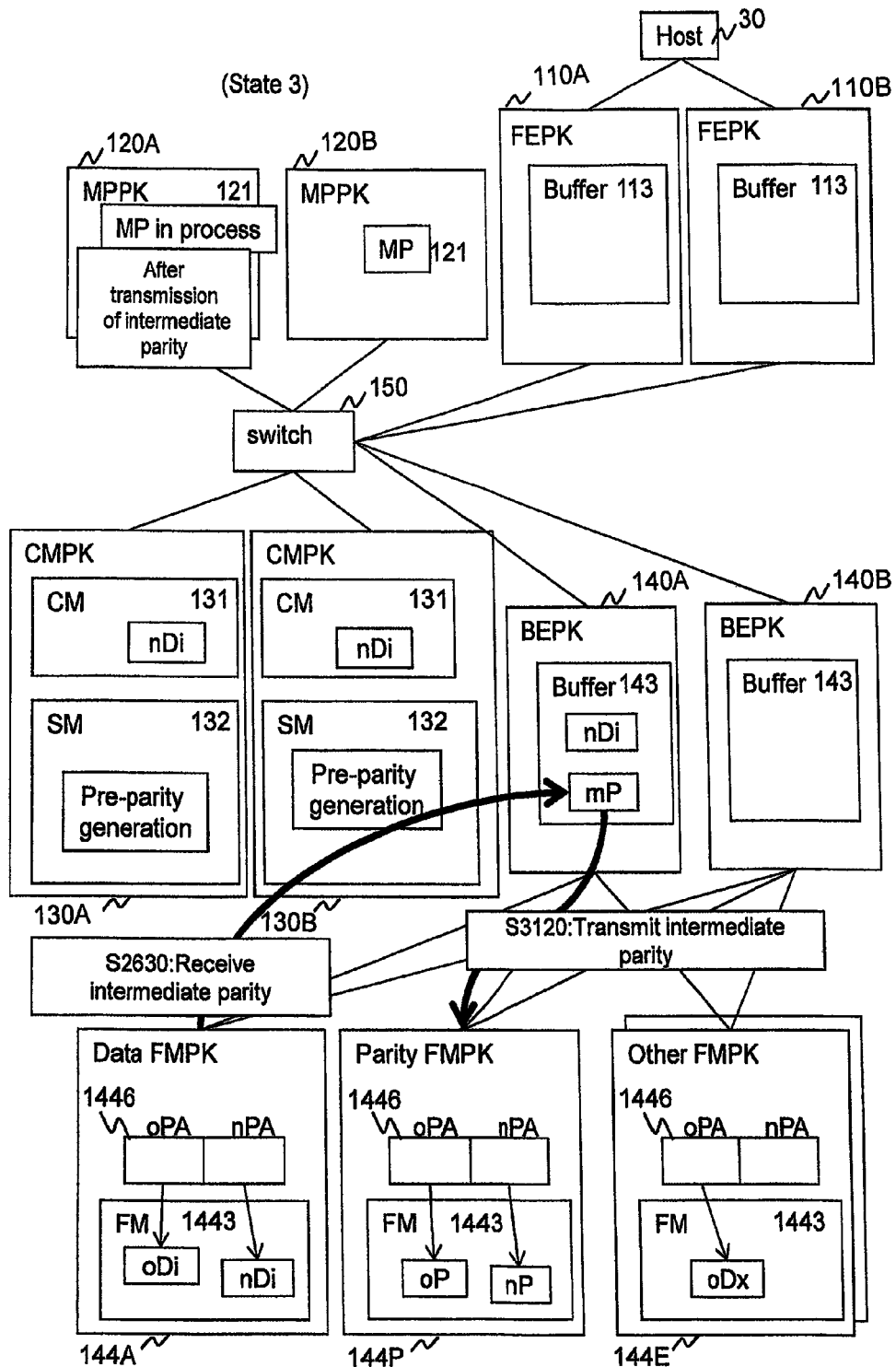
FIG. 36 shows an arrangement of data in a system state 3, according to Embodiment 1.

FIG. 36 shows an arrangement of data in the system state 3, according to Embodiment 1. This state occurs after the completion of the intermediate parity reception command and the intermediate parity transmission command by the controller 100. The intermediate parity reception command sends the intermediate parity generated by the data FMPK 144A, to the buffer 143 of the BEPK 140A. The intermediate parity transmission command sends the intermediate parity of the buffer 143 of the BEPK 140A to the parity FMPK 144P without being stored in the CM, and writes the new parity generated by the parity FMPK 144P into the parity FMPK 144P. Accordingly, the buffer 143 of the BEPK 140A stores the new user data and the intermediate parity. Both the new physical page address and the old physical page address are associated with the target logical page address in the parity FMPK 144P. The new physical page address indicates the physical page in which the new parity is stored, and the old physical page address indicates the physical page in which the old parity is stored. At least up to this stage, the correspondence relationship between the target logical page address and the old physical page in which the old user data is stored is kept in the data FMPK 144A. Therefore, when faults occur in the states 1 to 3, as will be described hereinafter, transmitting the new data to the data FMPK 144A can generate the intermediate parity.

In the system state 3, the controller 100 changes the process stage information of the SMs 132 to the post-parity update stage, whereby the system state transits to the state 4.

Figure 37:
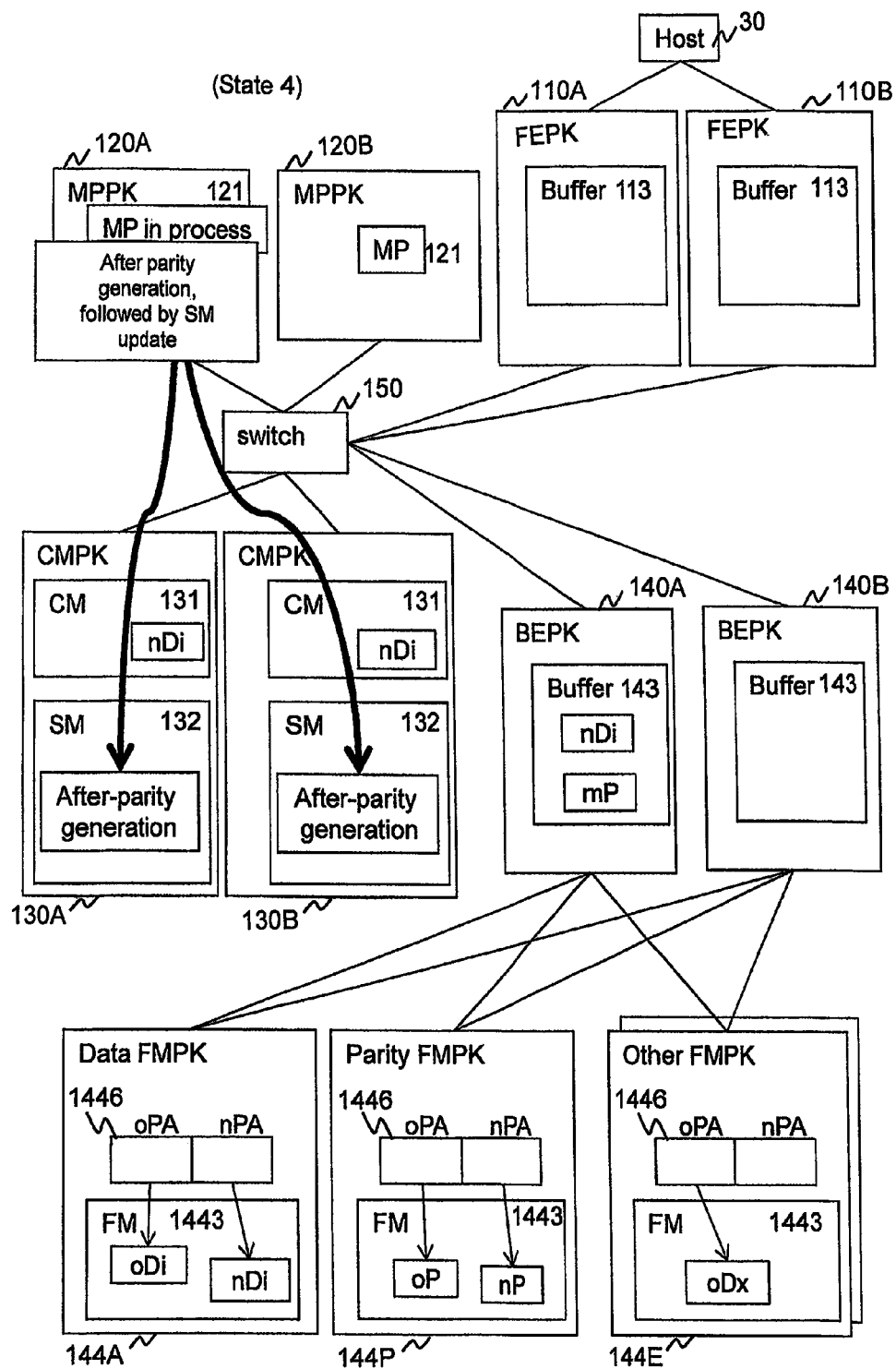
FIG. 37 shows an arrangement of data in a system state 4, according to Embodiment 1.

FIG. 37 shows an arrangement of data in the system state 4, according to Embodiment 1. This state occurs after the transmission of the intermediate parity transmission command by the controller 100, after completion of the writing of the new parity in the parity FMPK, and after the MP updates the process stage information item stored in the SM 132 to the post-parity generation stage. The process stage information item is stored in both the SM 132 of the CMPK 130A and the SM 132 of the CMPK 130B to obtain a redundant process stage information.

In the system state 4, the controller 100 sends the new data commit command to the data FMPK 144A. As a result, the system state transits to the state 5.

Figure 38:
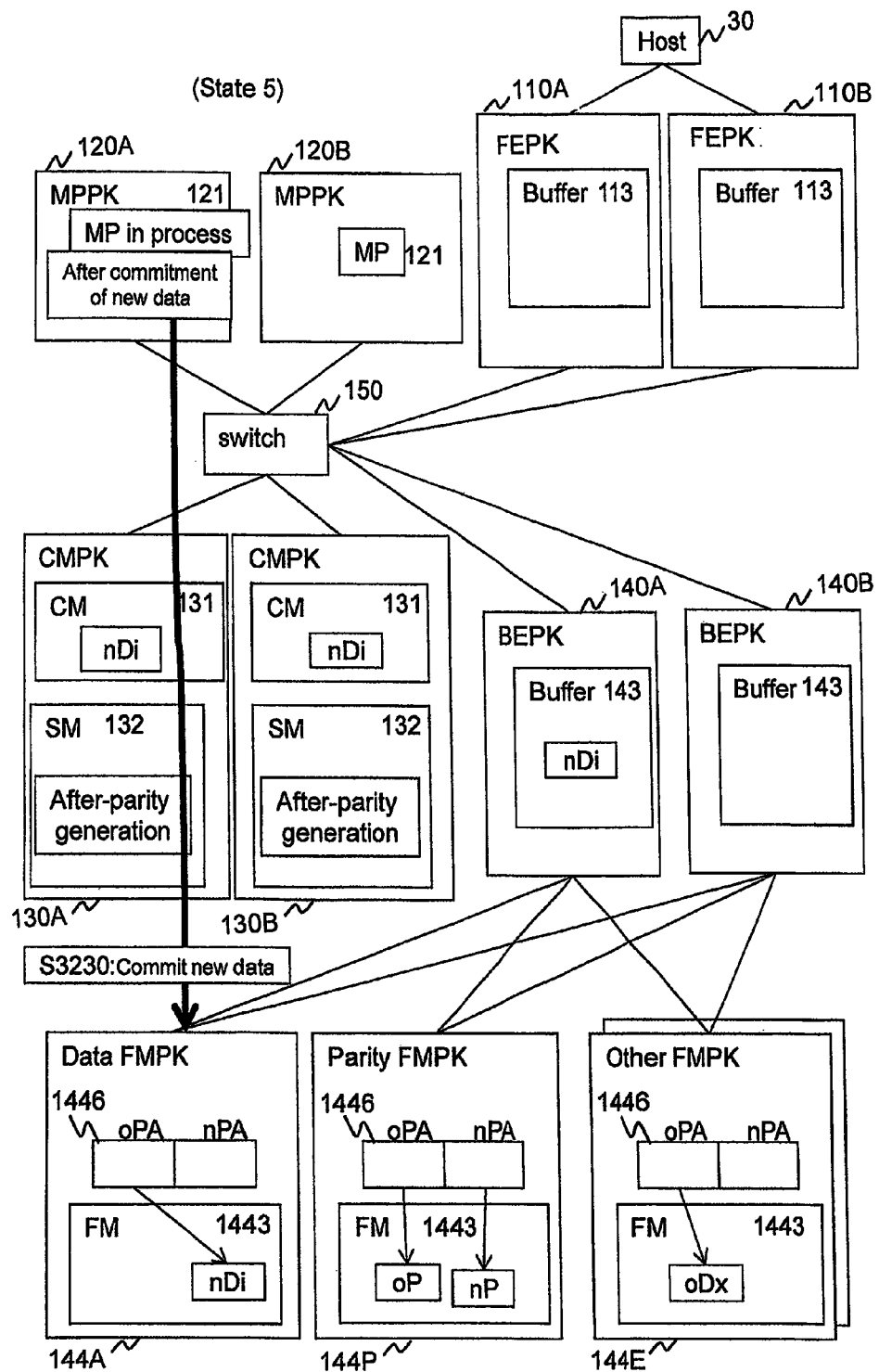
FIG. 38 shows an arrangement of data in a system state 5, according to Embodiment 1.

FIG. 38 shows an arrangement of data in the system state 5, according to Embodiment 1. This state occurs after the completion of the new data commit command on the new user data by the controller 100. Accordingly, the old physical page address of the target entry 1449 in the data FMPK 144A indicates the new user data, and the new physical page address is cleared. After the new parity is written to the physical page of the FM in the parity FMPK 144P, the old data stored in the data FMPK 144A becomes no longer necessary. Mapping of the logical page and the old physical page in which the old data is stored is canceled by the new data commit command, and thus the old physical page is erased. The storage device having the FMs needs empty regions in order for the reclamation process, a wear leveling process and the like to be performed. In the present embodiment, therefore, the old data can be erased by not mapping the old data, as soon as the old data becomes unnecessary, so that empty blocks (free spaces) can be ensured in the FMs by executing appropriate processes.

In the system state 5, the controller 100 sends the new data commit command to the parity FMPK 144P. As a result, the system state transits to the state 6.

Figure 39:
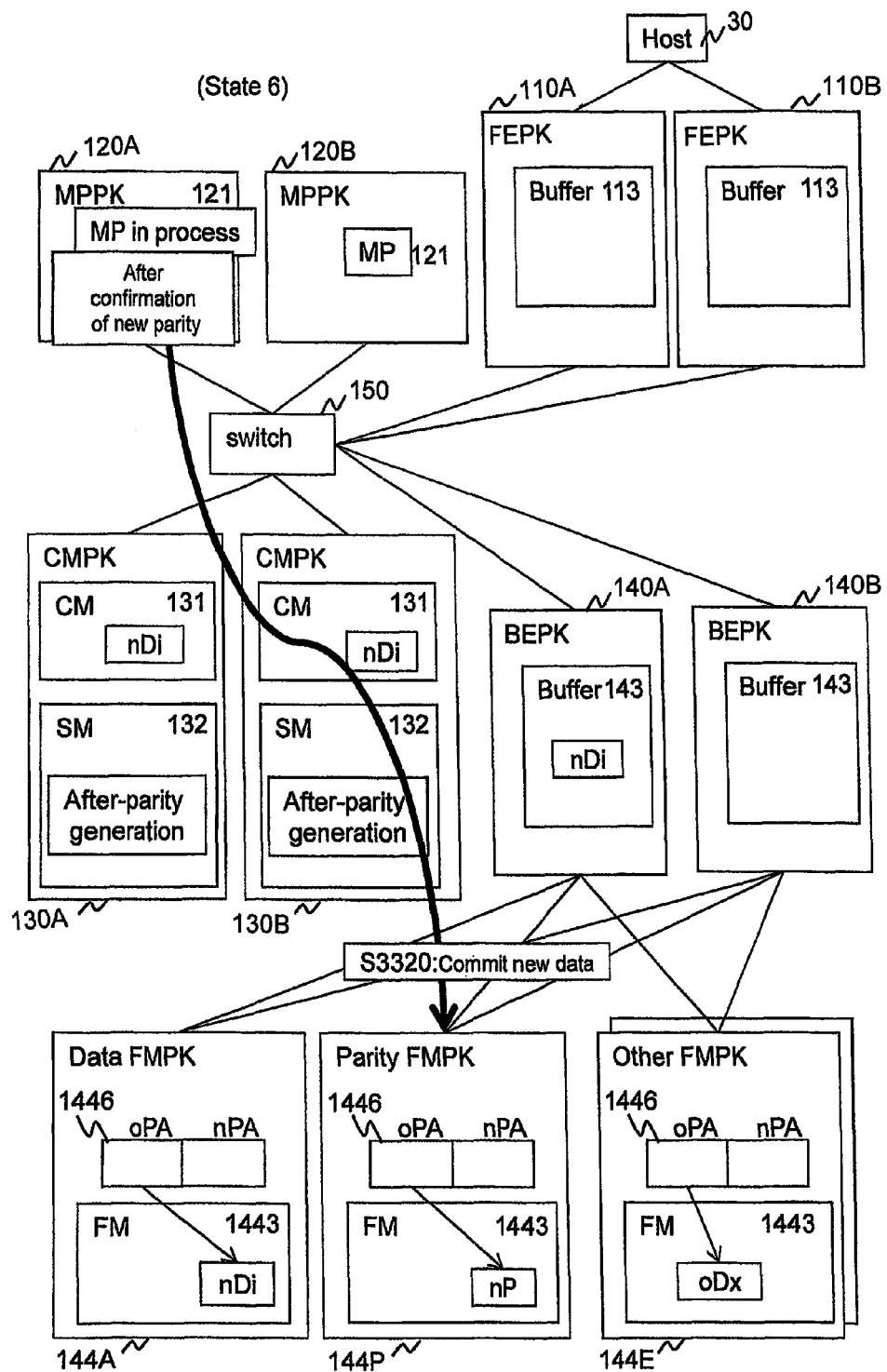
FIG. 39 shows an arrangement of data in a system state 6, according to Embodiment 1.

FIG. 39 shows an arrangement of data in the system state 6, according to Embodiment 1. This state occurs after the completion of the new data commit command on the parity FMPK 144P by the controller 100. Therefore, the old physical page address of the target entry 1449 in the parity FMPK 144P indicates the new parity, and the new physical page address is cleared.

In the system state 6, the controller 100 clears the process stage information item stored in each SM 132, whereby the system state transits to the system state 7.

Figure 40:
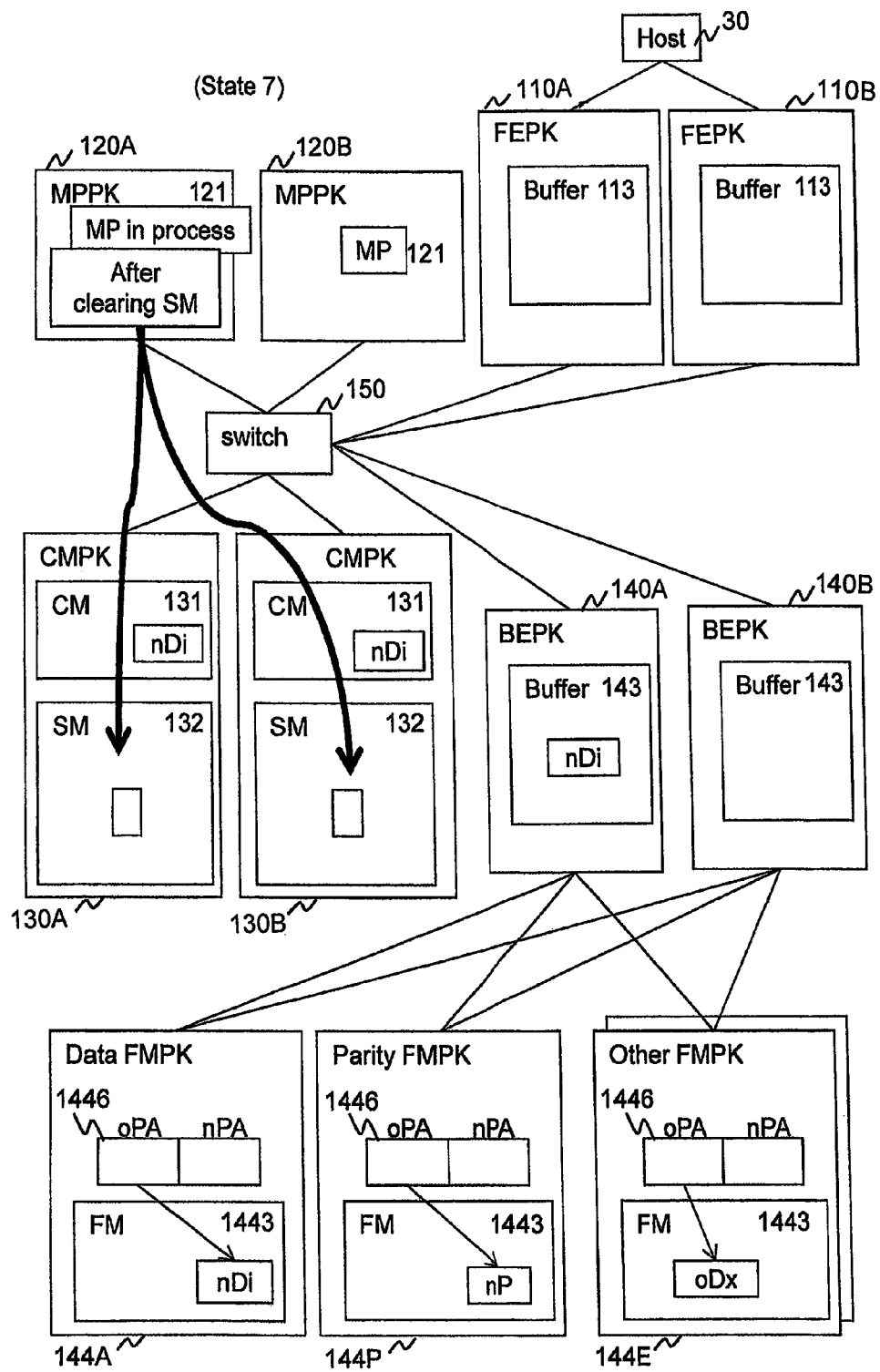
FIG. 40 shows an arrangement of data in a system state 7, according to Embodiment 1.

FIG. 40 shows an arrangement of data in the system state 7, according to Embodiment 1. This system state 7 occurs after the process stage information item stored in each SM 132 is cleared by the controller 100. As a result, both the SM 132 of the CMPK 130A and the SM 132 of the CMPK 130B are cleared.

Next is described a restoration process that is executed when a system fault occurs in each of the states 1 to 7.

The system fault here means a simultaneous point of fault occurring in the plurality of MPPKs 120, the plurality of CMPKs 130, the plurality of BEPKs 140, and the plurality of FMPKs 144. Upon the occurrence of this system fault, the number of faulty packages of one type is equal to or less than one. In addition, the occurrence of this system fault includes a simultaneous occurrence of faults in a plurality of types of pages. As will be described hereinafter, even upon a simultaneous occurrence of faults in a plurality of types of packages, the data thereof can be restored without being lost.

In the state 1, the occurrence of the system fault causes the system state to transit to the state a.

Figure 41:
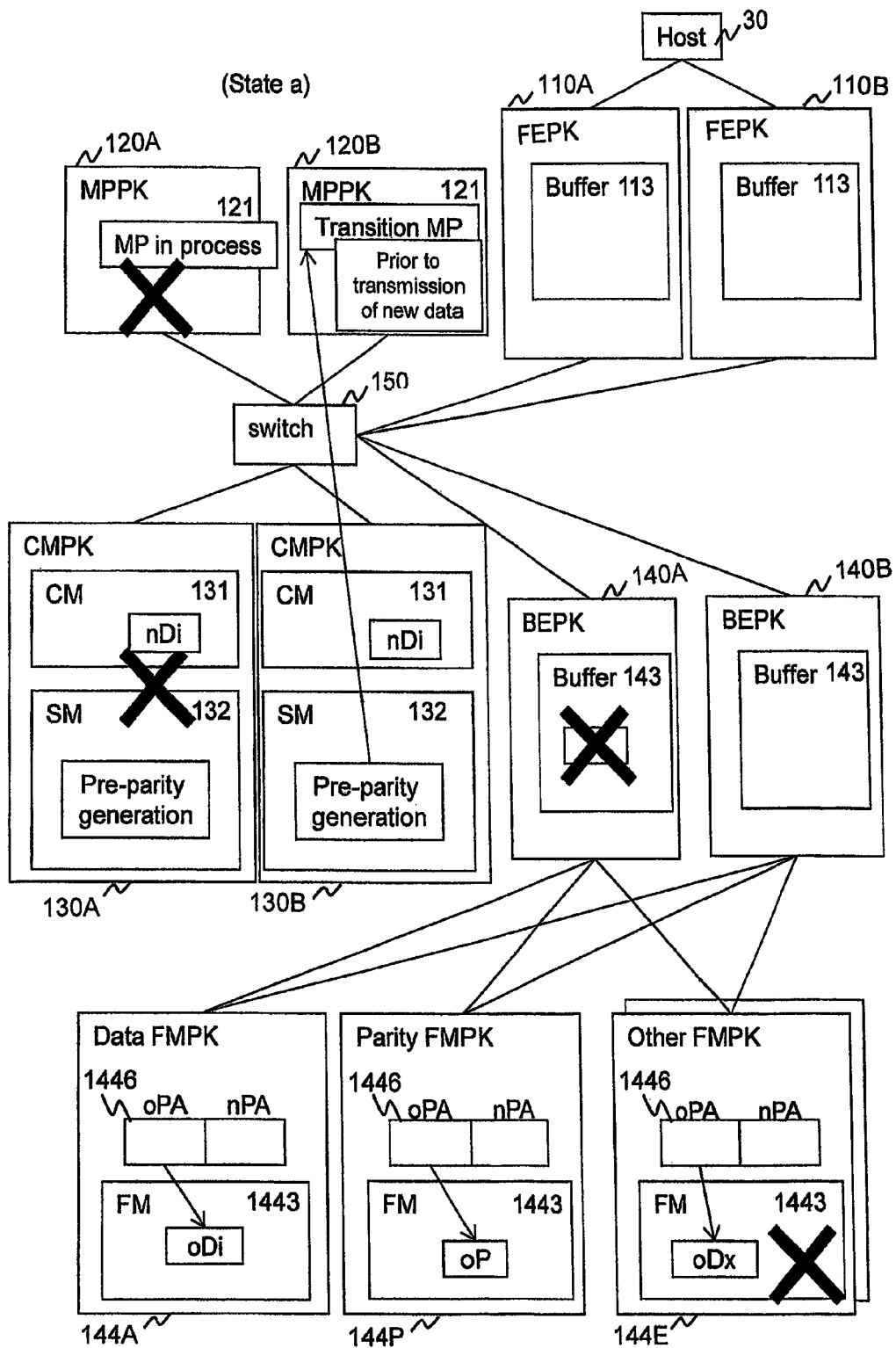
FIG. 41 shows an arrangement of data in a system state a, according to Embodiment 1.

FIG. 41 shows an arrangement of data in the system state a, according to Embodiment 1. This system state a means a situation where faults occur in the MPPK 120A in the write process, the CMPK 130A, the BEPK 140A having the new user data stored therein, and the FMPK 144E having the other user data stored therein. The sections where the faults occur are shown by "X" in this diagram. In the diagram and the following description, the MP 121 of the MPPK 120B that takes over the process by the MPPK 120A in which a fault has occurred is referred to as "transition MP." The transition MP detects that the process stage information stored in the SM 132 of the CMPK 130B indicates the pre-parity generation stage. In response to this detection, the transition MP transmits the new data transmission command.

In the system state a, the controller 100 sends the new data transmission command to the data FMPK 144A. As a result, the system state transits to the system state A.

Figure 42:
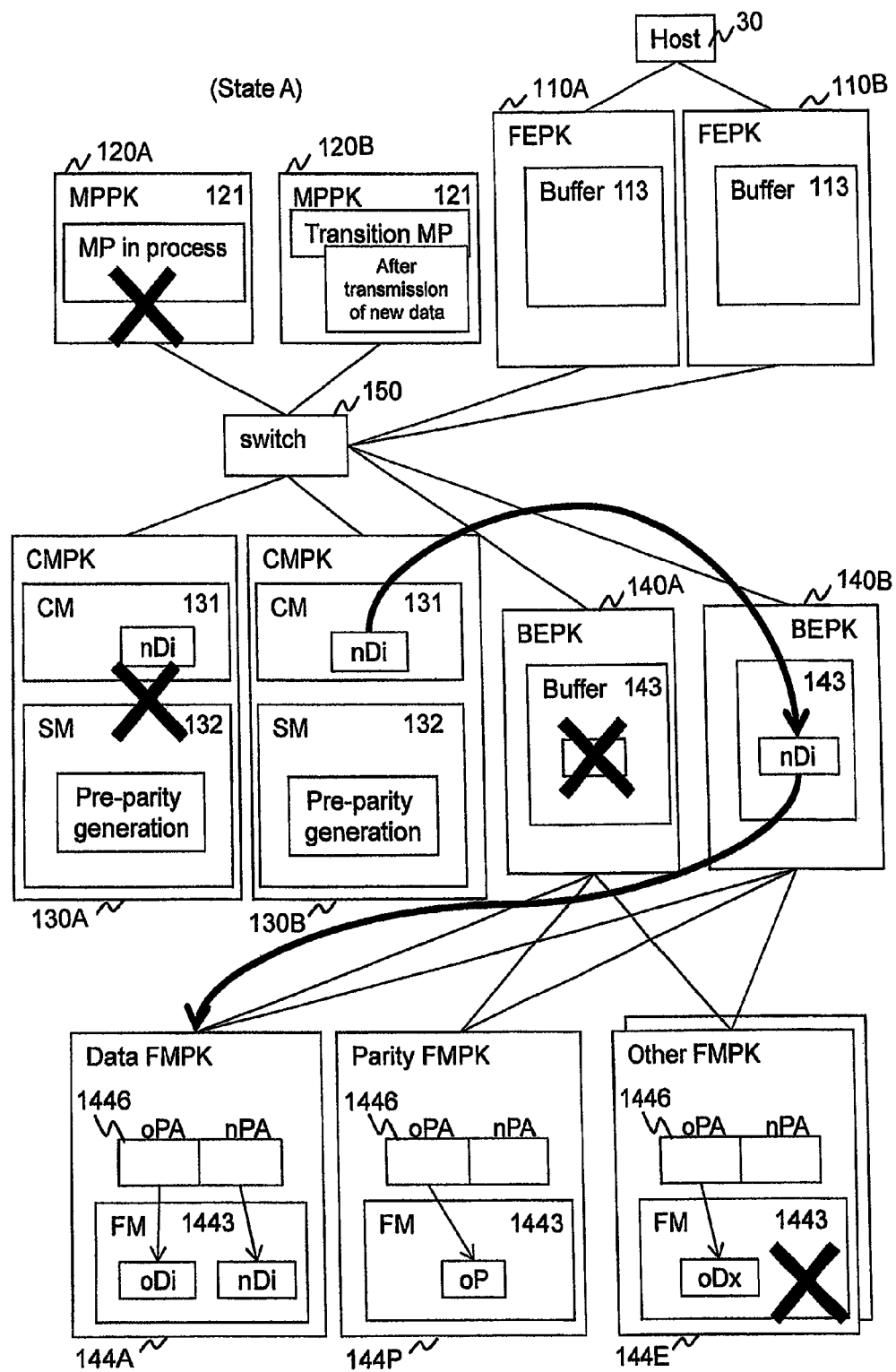
FIG. 42 shows an arrangement of data in a system state A, according to Embodiment 1.

FIG. 42 shows an arrangement of data in the system state A, according to Embodiment 1. This system state A occurs after the completion of the new data transmission command by the controller 100. The new data transmission command sends the new user data stored in the CM 131 of the CMPK 130B free of faults to the data FMPK 144A via the BEPK 140B free of faults. Accordingly, the BEPK 140B has the new user data stored therein. The data FMPK 144A has the old user data and the new user data stored therein. The new physical page address stored in the target entry 1449 of the data FMPK 144A indicates the new user data.

In the system state A, the controller 100 sends the intermediate parity reception command to the data FMPK 144A and the intermediate parity transmission command to the parity FMPK 144P. As a result, the system state transits to the state B.

Figure 43:
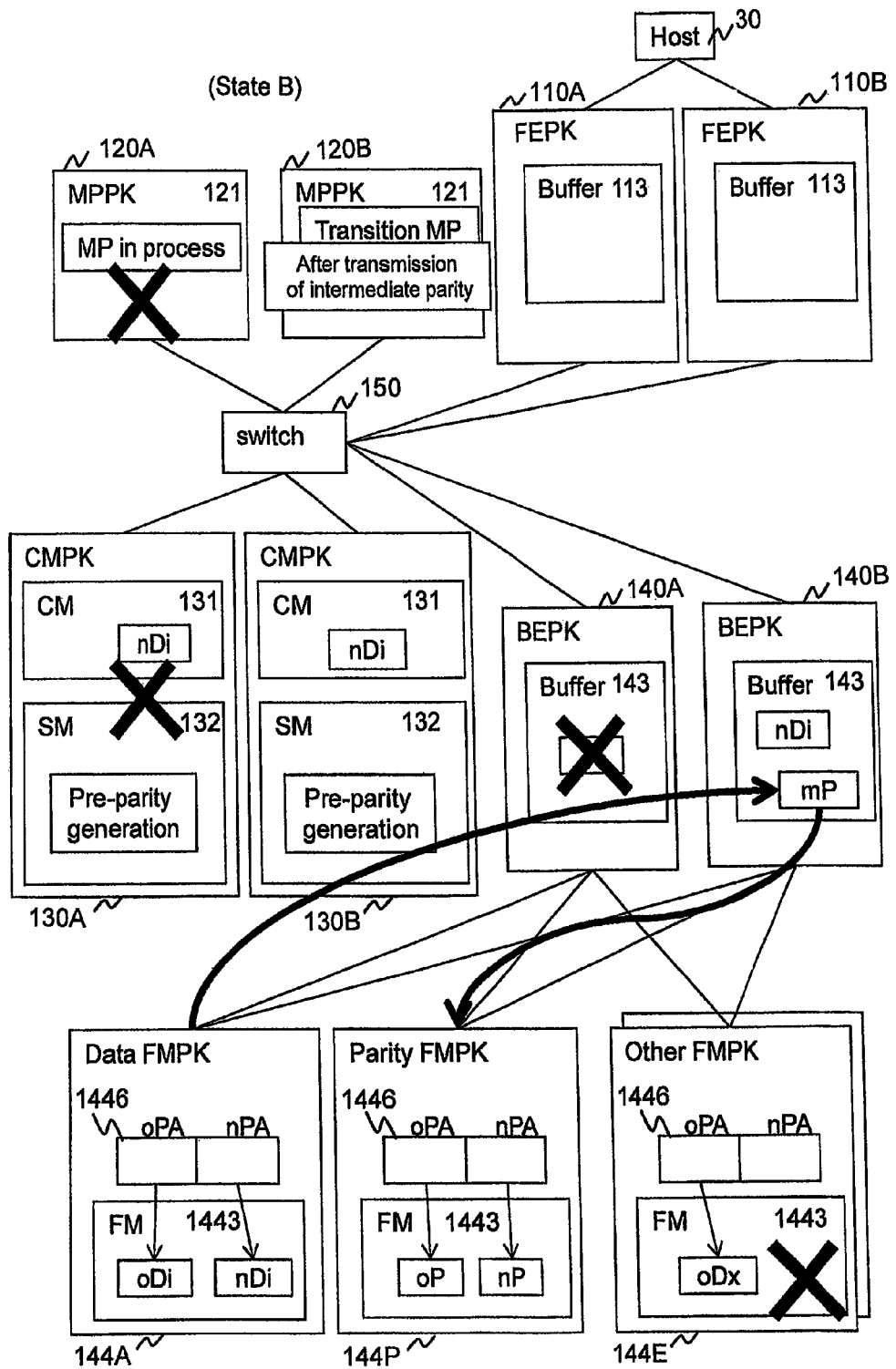
FIG. 43 shows an arrangement of data in a system state B, according to Embodiment 1.

FIG. 43 shows an arrangement of data in the system state B, according to Embodiment 1. This state occurs after the completion of the intermediate parity reception command and the intermediate parity transmission command by the BEPK 140. The intermediate parity reception command sends the intermediate parity, which is generated by the data FMPK 144A, to the BEPK 140B. The intermediate parity transmission command sends the intermediate parity stored in the buffer of the BEPK 140B to the parity FMPK 144P without being stored in the CM 131, and writes the new parity generated by the parity FMPK 144P into the parity FMPK 144P. Accordingly, the BEPK 140B has the new user data and the intermediate parity stored therein. The parity FMPK 144P has the old parity and the new parity stored therein.

In the system state B, the controller 100 changes the process stage information of each SM 132, whereby the system state transits to the system state C.

Figure 44:
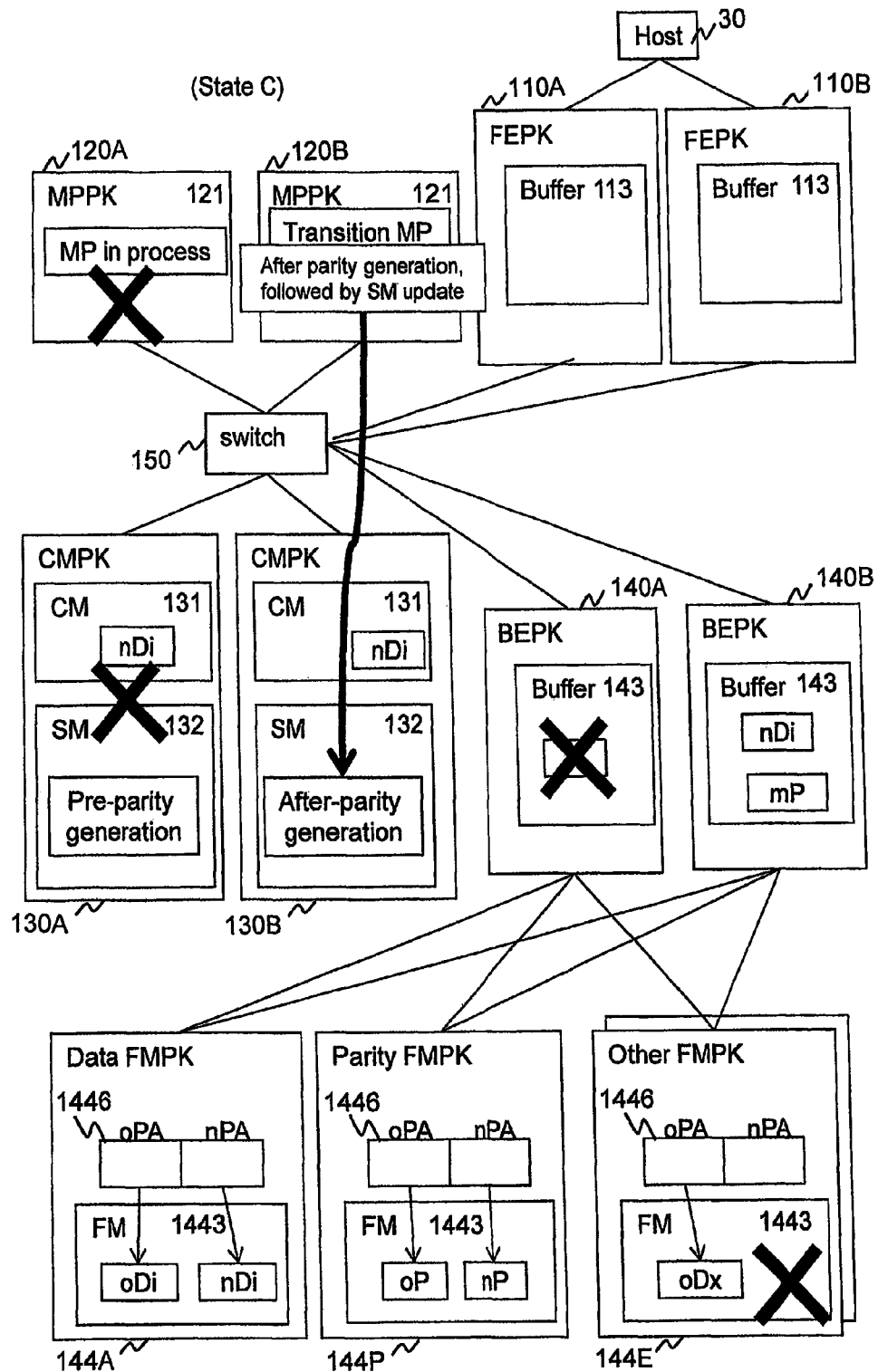
FIG. 44 shows an arrangement of data in a system state C, according to Embodiment 1.

FIG. 44 shows an arrangement of data in a system state C, according to Embodiment 1. This state occurs after the controller 100 completes the parity transmission command and updates the process stage information stored in each SM 132. Thus, the SM 132 of the CMPK 130B indicates the post-parity generation stage.

In the system state C, the controller 100 sends the new data commit command to the data FMPK 144A. As a result, the system state transits to the system state D.

Figure 45:
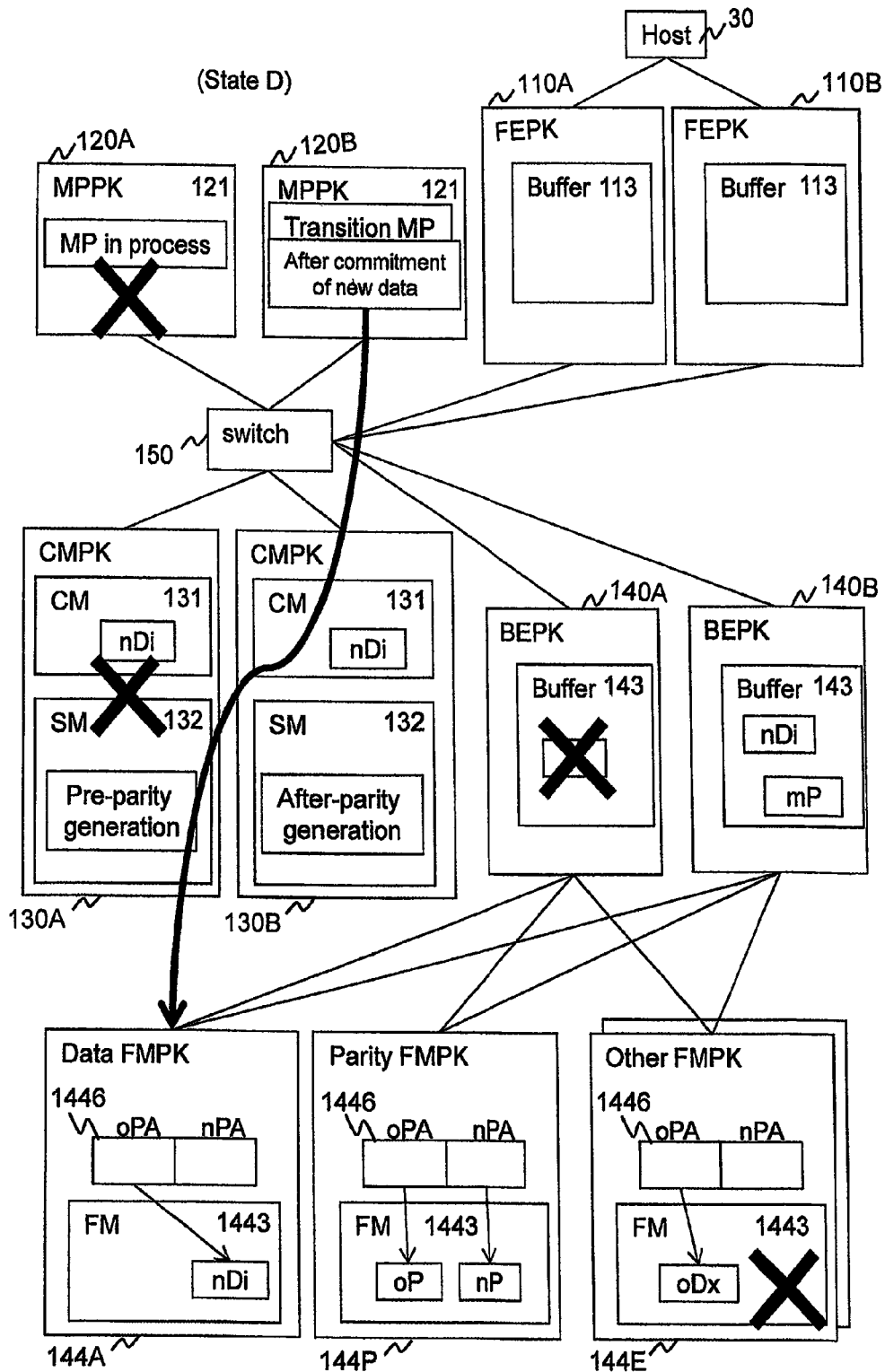
FIG. 45 shows an arrangement of data in a system state D, according to Embodiment 1.

FIG. 45 shows an arrangement of data in a system state D, according to Embodiment 1. This system state D occurs after the completion of the new data commit command on the new user data by the controller 100. Thus, the old physical page address stored in the target entry 1449 of the data FMPK 144A indicates the new user data, and the new physical page address is cleared.

In the system state D, the controller 100 sends the new data commit command to the parity FMPK 144P, whereby the system state transits to the system state E.

Figure 46:
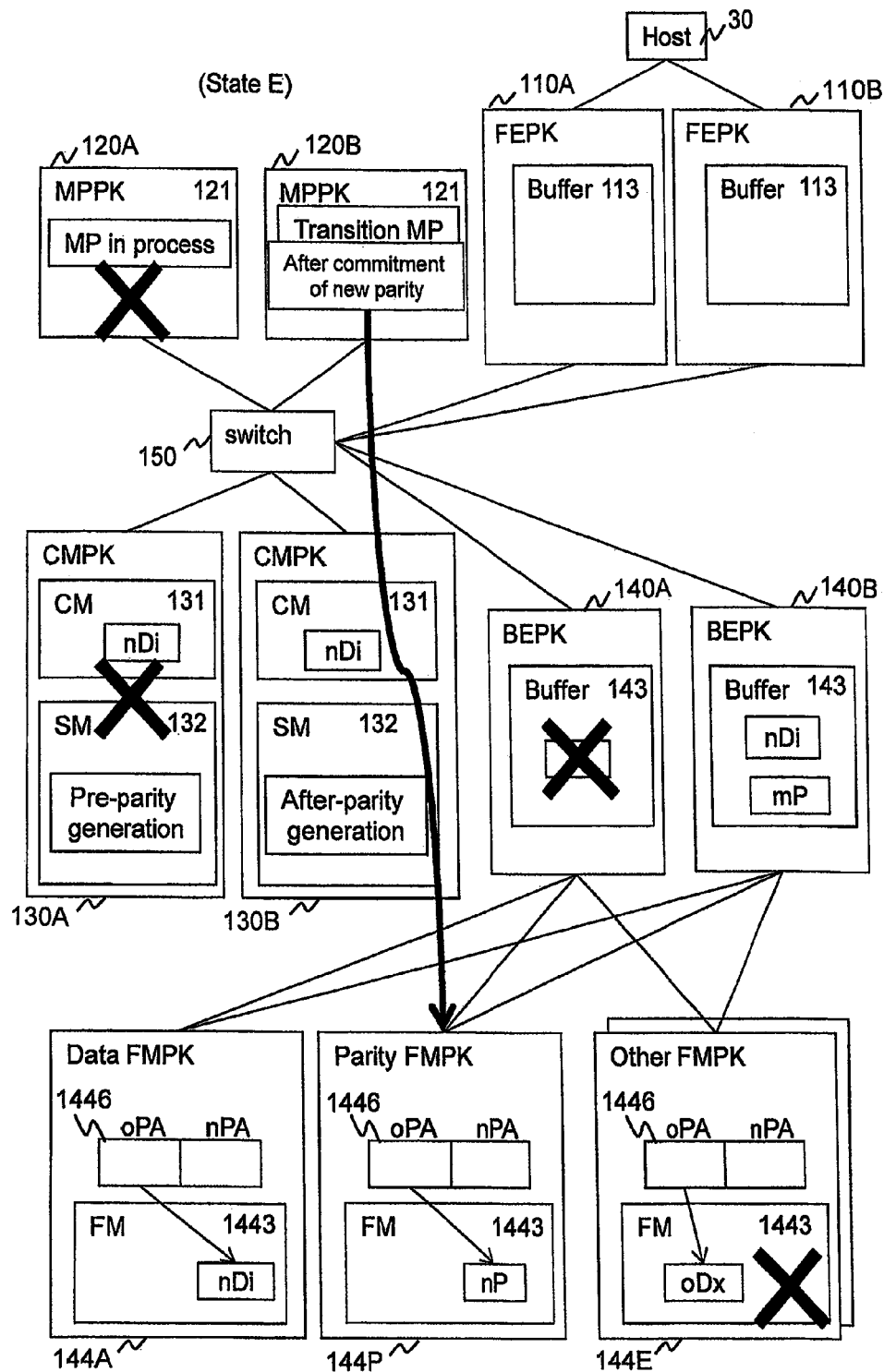
FIG. 46 shows an arrangement of data in a system state E, according to Embodiment 1.

FIG. 46 shows an arrangement of data in the system state E, according to Embodiment 1. This system state occurs after the completion of the new data commit command on the new parity by the controller 100. Thus, the old physical page address stored in the target entry 1449 of the parity FMPK 144P indicates the new parity, and the new physical page address is cleared.

In the system state E, the controller 100 clears the process stage information of the SM 132, whereby the system state transits to the system state F.

Figure 47:
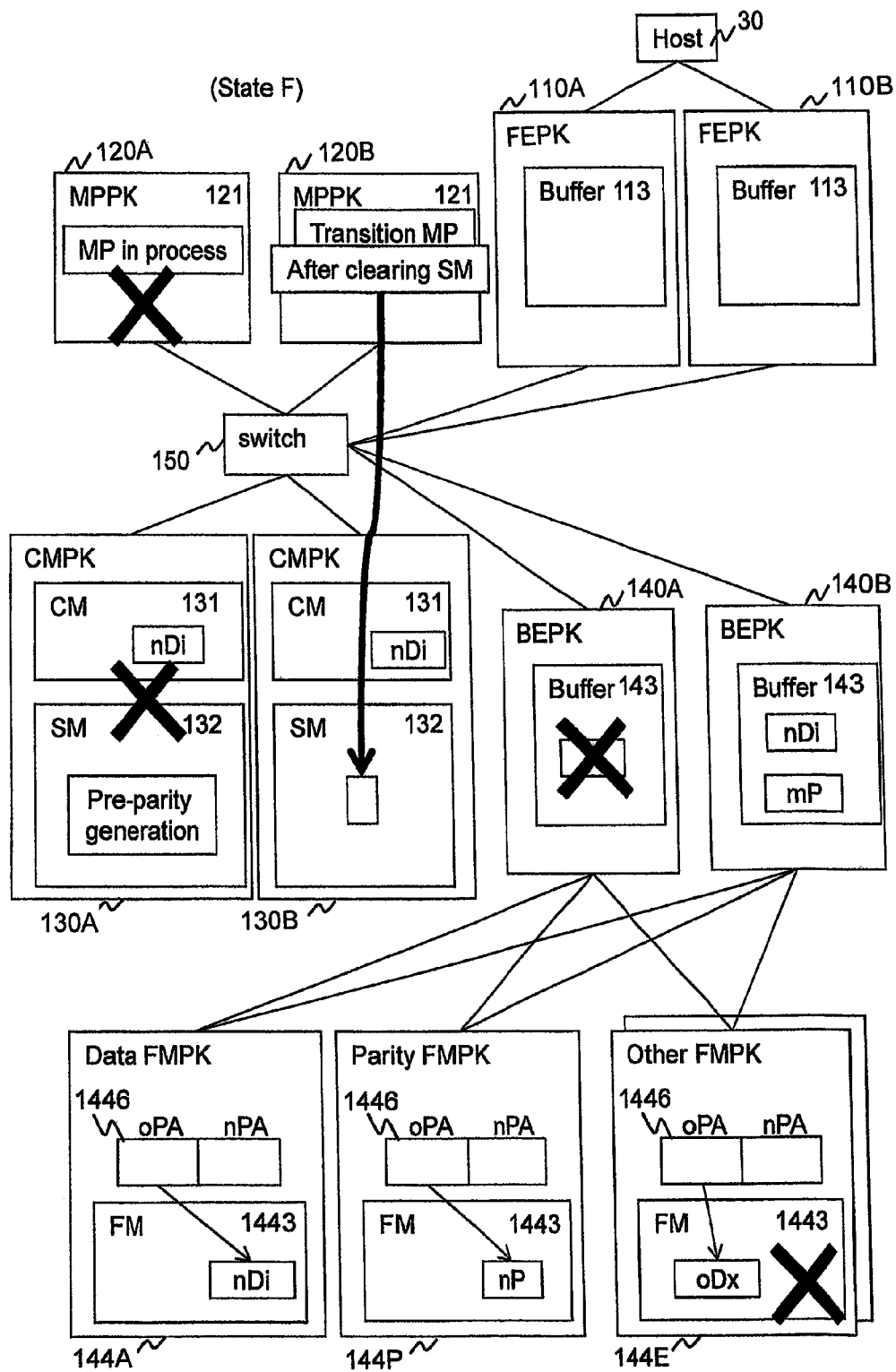
FIG. 47 shows an arrangement of data in a system state F, according to Embodiment 1.

FIG. 47 shows an arrangement of data in the system state F, according to Embodiment 1. In this system state F, the process stage information item stored in the SM 132 of the CMPK 130B is cleared. This system state F occurs after the completion of the write process related to parity generation. When the system state transits to the system state F, it is determined that the write process is completed without causing data loss.

As a result of the occurrence of a system fault in the system state 2, the system state transits to the system state b.

Figure 48:
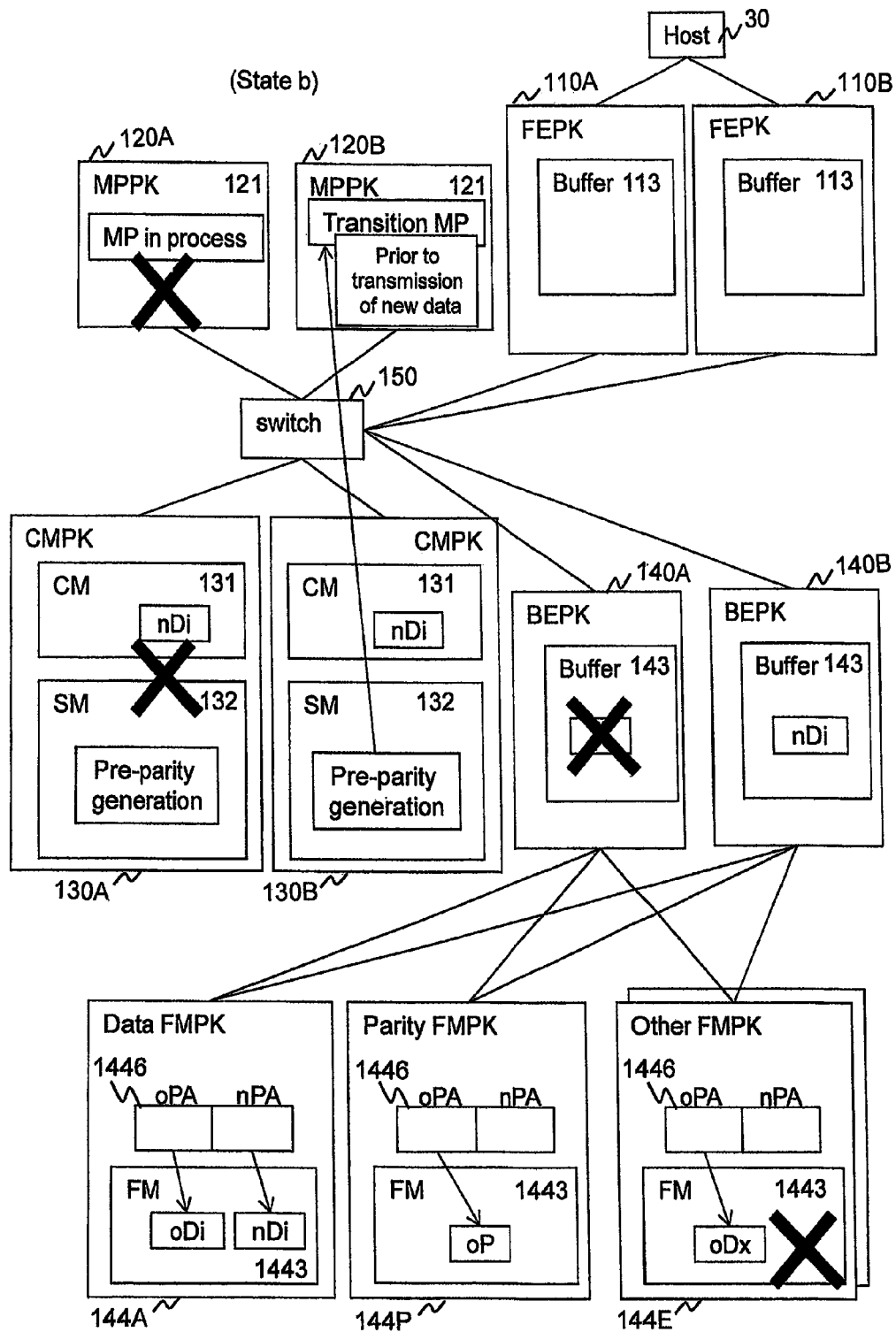
FIG. 48 shows an arrangement of data in a system state b, according to Embodiment 1.

FIG. 48 shows an arrangement of data in the system state b, according to Embodiment 1. As with the system state a, this system state b means a situation where faults occur in the MPPK 120A in the write process, the CMPK 130A, the BEPK 140A having the new user data stored therein, and the FMPK 144E having the other user data stored therein. The transition MP detects that the process stage information item stored in the SM 132 of the CMPK 130B indicates the pre-parity generation stage. In response to this detection, the transition MP transmits the new data transmission command. In this system state b, because the old user data is associated with the logical page to which the new user data is to be written, transmission of the new user data can generate the intermediate parity.

In the system state b, the controller 100 sends the new data transmission command to the data FMPK 144A, whereby the system state transits to the state A. Thereafter, the system state can transit in order of the system state B, the system state C, the system state D, the system state E, and the system state F.

As a result of the occurrence of the system fault in the system state 3, the system state transits to the system state c.

Figure 49:
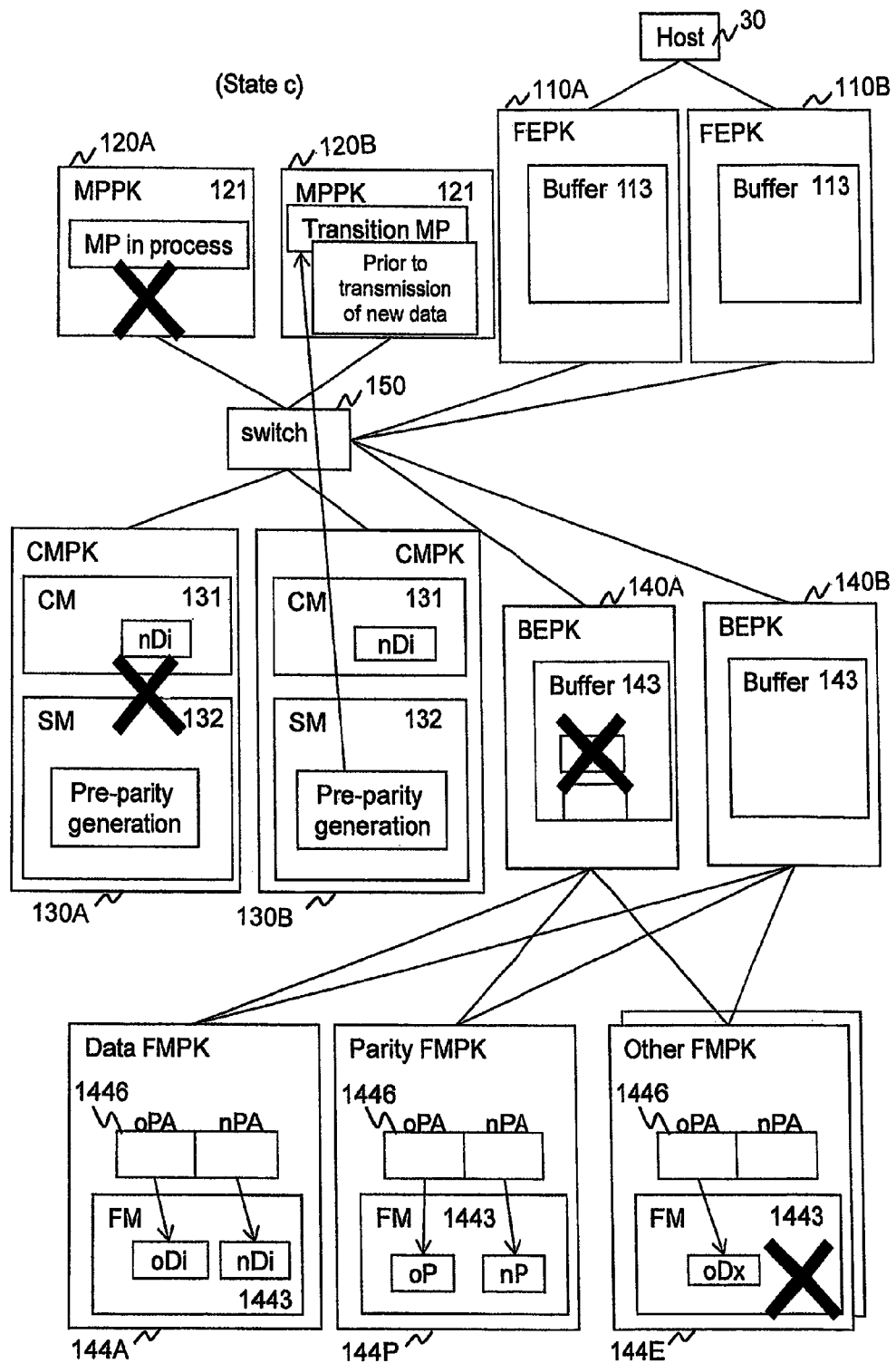
FIG. 49 shows an arrangement of data in a system state c, according to Embodiment 1.

FIG. 49 shows an arrangement of data in the system state c, according to Embodiment 1. As with the state a, this state means a situation where faults occur in the MPPK 120A in the write process, the CMPK 130A, the BEPK 140A having the new user data stored therein, and the FMPK 144E having the other user data stored therein. The transition MP detects that the process stage information stored in the SM 132 of the CMPK 130B indicates the pre-parity generation stage. In response to this detection, the transition MP transmits the new data transmission command. The data FMPK 144A has the old user data and the new user data stored therein. In the target entry 1449 of the data FMPK 144A, the old physical page address indicates the old user data, and the new physical page address indicates the new user data. The parity FMPK 144P has the old parity and the new parity stored therein. In the target entry 1449 of the parity FMPK 144P, the old physical page address indicates the old parity, and the new physical page address indicates the new parity. The data FMPK in the system state c maintains the correspondence relationship between the old user data and the logical page to which the new user data is to be written. Therefore, the intermediate parity can be generated by transmitting the new data.

In the system state c, the controller 100 sends the new data transmission command to the data FMPK 144A, whereby the system state transits to the state G.

Figure 50:
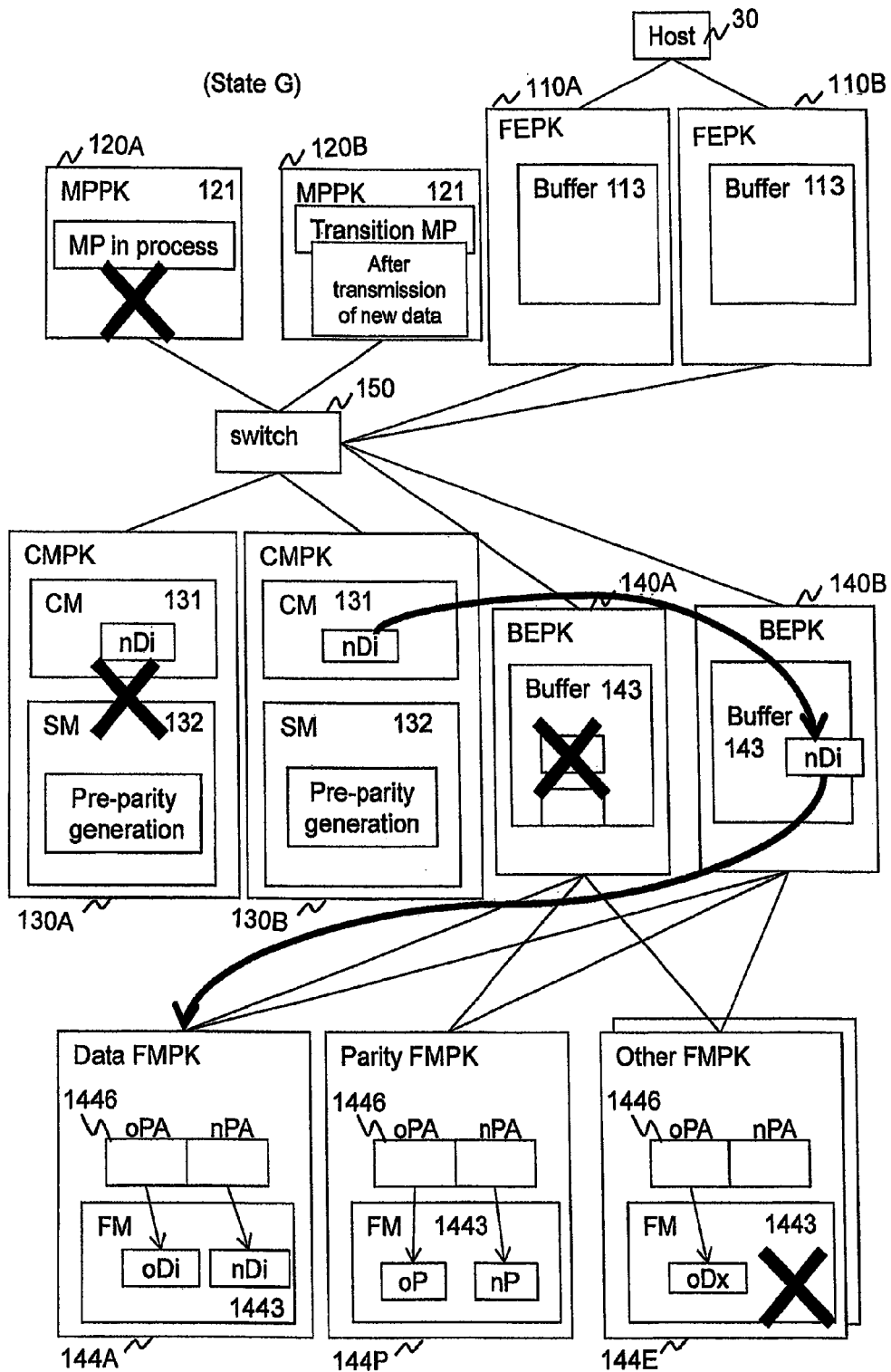
FIG. 50 shows an arrangement of data in a system state G, according to Embodiment 1.

FIG. 50 shows an arrangement of data in the system state G, according to Embodiment 1. This system state G occurs after the completion of the new data transmission command by the controller 100. As in the system state A, the new data transmission command sends the new user data stored in the CM 131 of the CMPK 130B free of faults to the data FMPK 144A via the BEPK 140B free of faults. Accordingly, the BEPK 140B stores the new user data. The data FMPK 144A in the system state G maintains the correspondence relationship between the old user data and the logical page to which the new user data is to be written. Therefore, the intermediate parity can be generated by transmitting the new data. Moreover, the parity FMPK 144P in the state G maintains the correspondence relationship between the old parity and the target logical page. Thus, the new parity can be generated by transmitting the intermediate parity.

In the system state G, the controller 100 sends the intermediate parity reception command to the data FMPK 144A and the intermediate parity transmission command to the parity FMPK 144P. As a result, the system state transits to the system state B. Subsequently, the system state can transit in order of the system state C, the system state D, the system state E, and the system state F.

As a result of the occurrence of the system fault in the state 4, the system state transits to the state C. Subsequently, the system state can transit in order of the system state D, the system state E, and the system state F.

As a result of the occurrence of the system fault in the system state 5, the system state transits to the system state e.

Figure 51:
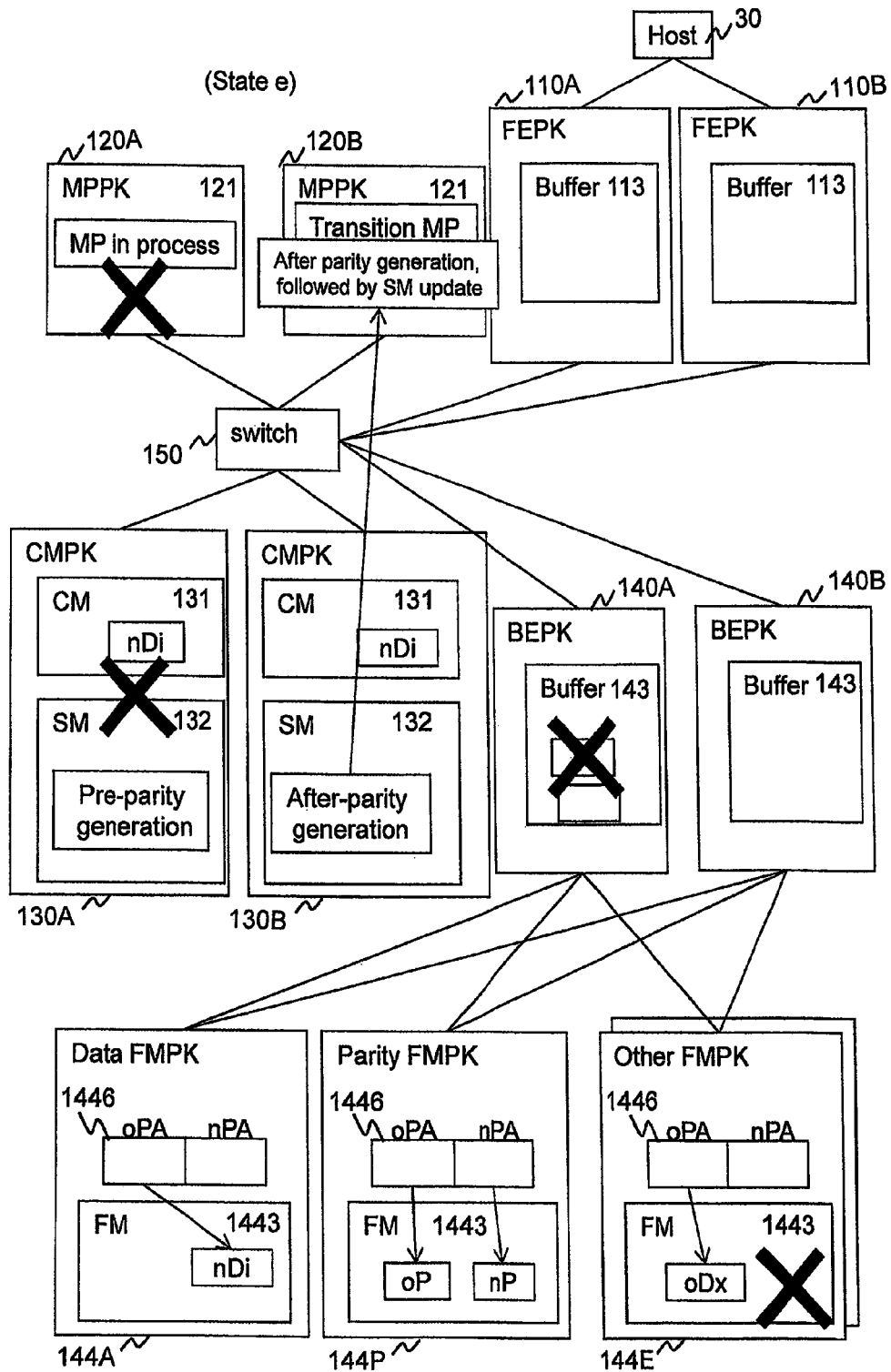
FIG. 51 shows an arrangement of data in a system state e, according to Embodiment 1.

FIG. 51 shows an arrangement of data in the system state e, according to Embodiment 1. As with the system state a, this system state e means a situation where faults occur in the MPPK 120A in the write process, the CMPK 130A, the BEPK 140A having the new user data stored therein, and the FMPK 144E having the other user data stored therein. The transition MP detects that the process stage information stored in the SM 132 of the CMPK 130B indicates the post-parity generation stage. In other words, this state occurs after the completion of the parity transmission command by the controller 100 and after the process stage information stored in the SM 132 is updated. In response to the detection, the transition MP transmits the new data commit command to the data FMPK 144A. The data FMPK 144A has the new user data stored therein. In the target entry 1449 of the data FMPK 144A, the old physical page address indicates the new user data. The parity FMPK 144P has the old parity and the new parity stored therein. In the target entry 1449 of the parity FMPK 144P, the old physical page address indicates the old parity, and the new physical page address indicates the new parity.

In the system state e, the controller 100 sends the new data commit command to the data FMPK 144A, whereby the system state transits to the state D. Subsequently, the system state can transit from the system state E to the system state F.

As a result of the occurrence of the system fault in the system state 6, the system state transits to the system state f.

Figure 52:
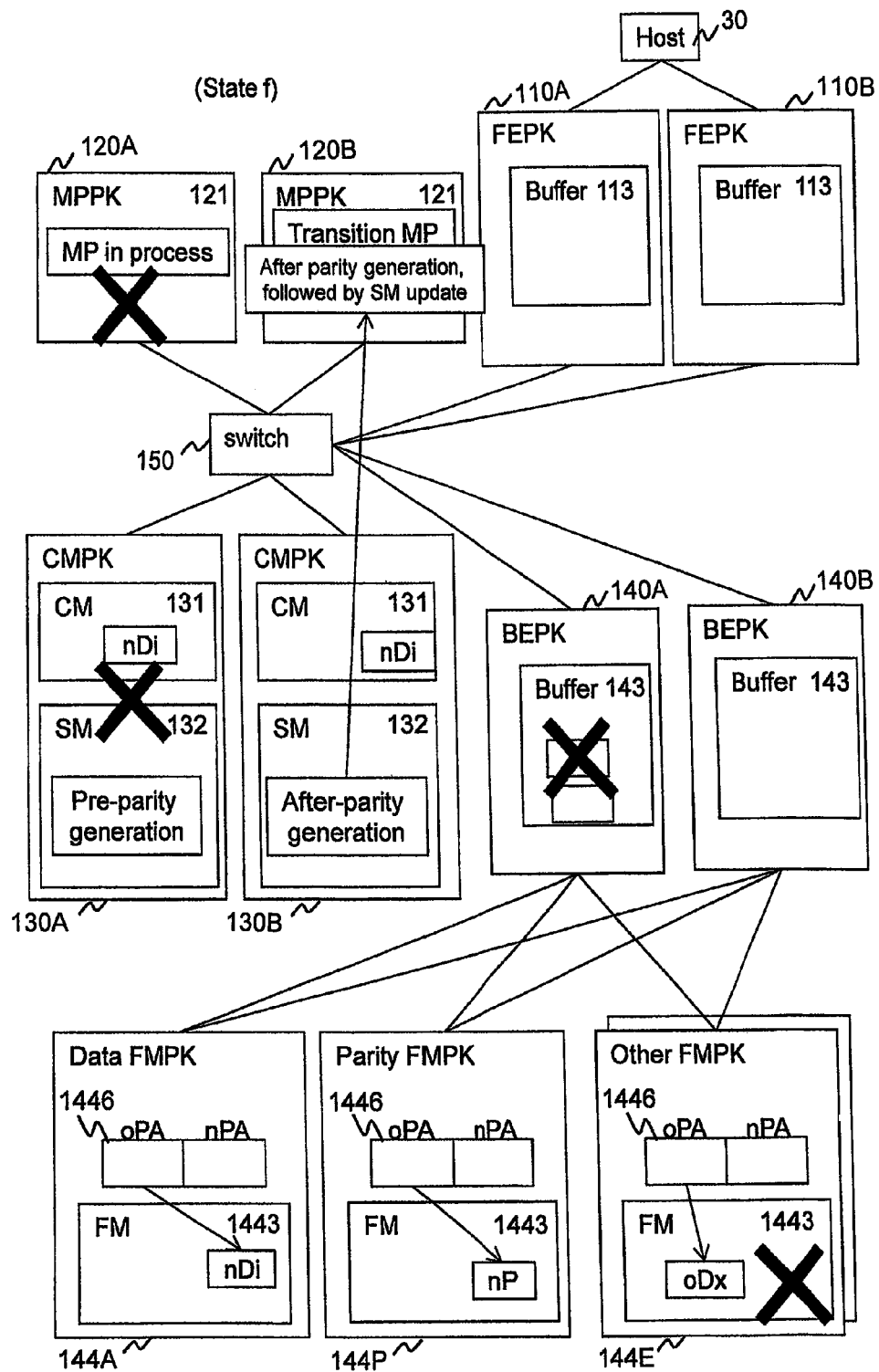
FIG. 52 shows an arrangement of data in a system state f, according to Embodiment 1.

FIG. 52 shows an arrangement of data in the system state f, according to Embodiment 1. As with the system state a, this state means a situation where faults occur in the MPPK 120A in the write process, the CMPK 130A, the BEPK 140A having the new user data stored therein, and the FMPK 144E having the other user data stored therein. The transition MP detects that the process stage information item stored in the SM 132 of the CMPK 130B indicates the post-parity generation stage. In other words, this state occurs after the completion of the parity transmission command by the controller 100 and after the process stage information item stored in the SM 132 is updated. Accordingly, the transition MP transmits the new data commit command to the data FMPK 144A. The data FMPK 144A stores the new user data. In the target entry 1449 of the data FMPK 144A, the old physical page address indicates the new user data. The parity FMPK 144P stores the new parity. In the target entry 1449 of the parity FMPK 144P, the old physical page address indicates the new parity.

In the system state f, the controller 100 sends the new data commit command to the data FMPK 144A, whereby the system state transits to the state I.

Figure 53:
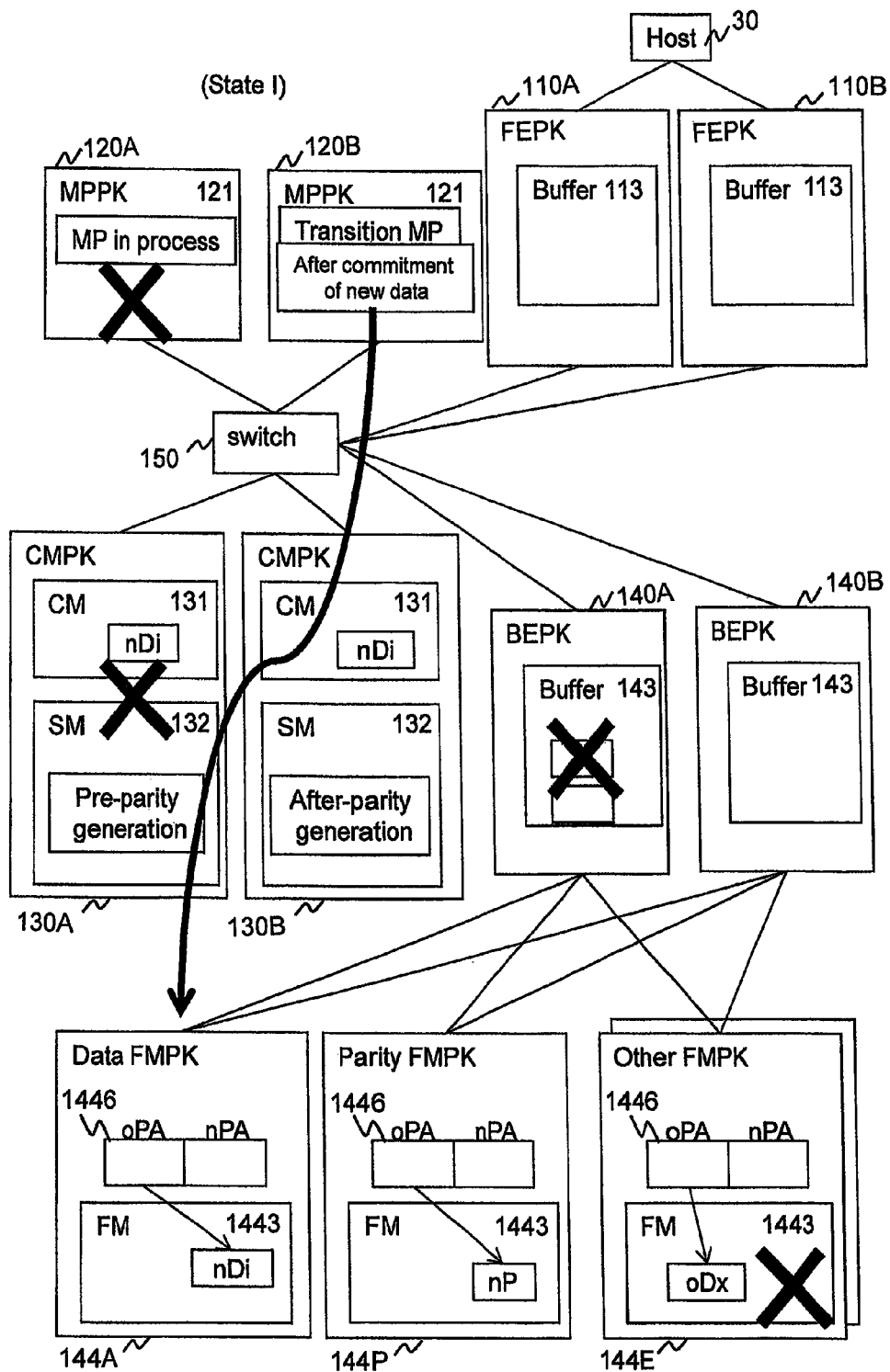
FIG. 53 shows an arrangement of data in a system state I, according to Embodiment 1.

FIG. 53 shows an arrangement of data in the system state I, according to Embodiment 1. As with the system state a, this system state I means a situation where faults occur in the MPPK 120A in the write process, the CMPK 130A, the BEPK 140A having the new user data stored therein, and the FMPK 144E having the other user data stored therein. This state occurs after the completion of the new data commit command on the new user data by the controller 100. In response to the detection, the transition MP transmits the new data commit command to the parity FMPK 144P. The data FMPK 144A has the new user data stored therein. In the target entry 1449 of the data FMPK 144A, the old physical page address indicates the new user data. The parity FMPK 144P has the new parity stored therein. In the target entry 1449 of the parity FMPK 144P, the old physical page address indicates the new parity.

In the system state I, the controller 100 sends the new data commit command to the parity FMPK 144P, whereby the system state transits to the state E. Subsequently, the system state can transit to the system state F.

As a result of the occurrence of a system fault in the system state 7, the system state transits to the system state F. In the system state 7 the data stored in the FMPKs 144 are determined and the process stage information items are cleared. Therefore, no additional processes are required even when the system fault occurs and the system state consequently transits to the state F. Therefore, even upon the occurrence of a system fault, the host computer 30 can read oDi and oD1 to oDy free of faults that are shown in the stripes of the RAID, as long as the system state can transit to the system state 7 or the state F. Therefore, data loss does not occur because the host computer 30 can also read oDx in which a fault occurs, by XORing the oD1 . . . nDi . . . oDy, nP within the stripes.

In this embodiment, the number of the MPPKs 120, the CMPKs 130, and the BEPKs 140 are each two but may be three or more. Even when the number of the MPPKs 120, the CMPKs 130, or the BEPKs 140 is one, the same operations can be carried out as long as no faults occur in a section thereof.

According to the state transitions described above, data loss does not occur, even when the system fault occurs in any of the system states 1 to 7. In other words, data loss does not occur even when the simultaneous point of fault occurs in the plurality of MPPKs 120, the plurality of CMPKs 130, the plurality of BEPKs 140 and the plurality of FMPKs 144. Thus, the reliability of the storage system 10 can be improved. Note that the present embodiment can couple the other storage systems having the XOR function in place of the FMPKs 144 and cause the other storage devices to implement the intermediate parity and/or parity calculation process.

Furthermore, because overwriting of data cannot be performed in a normal flash memory, the new physical page is allocated to the logical page in a normal write process.

The present embodiment uses the data that are stored in the old physical page which is disabled as a result of the allocation of the new physical page. Therefore, the present embodiment does not increase the number of times the write process is performed and the number of times the data is erased. In other words, in the present embodiment, the operating life of the flash memory is not shortened.

Embodiment 2

This embodiment illustrates a situation where the FMPK 144 supports the XOR function based on a request regarding a SCSI command. Examples of the SCSI command include XDWRITE, XDREAD, and XPWRITE. The rest of the configurations of the storage system 10 are the same as those described in Embodiment 1. In the present embodiment, the storage media are not limited to the flash memory devices as long as these SCSI commands are supported.

Write Process According to Embodiment 2

A normal write process is now described.

Figure 54:
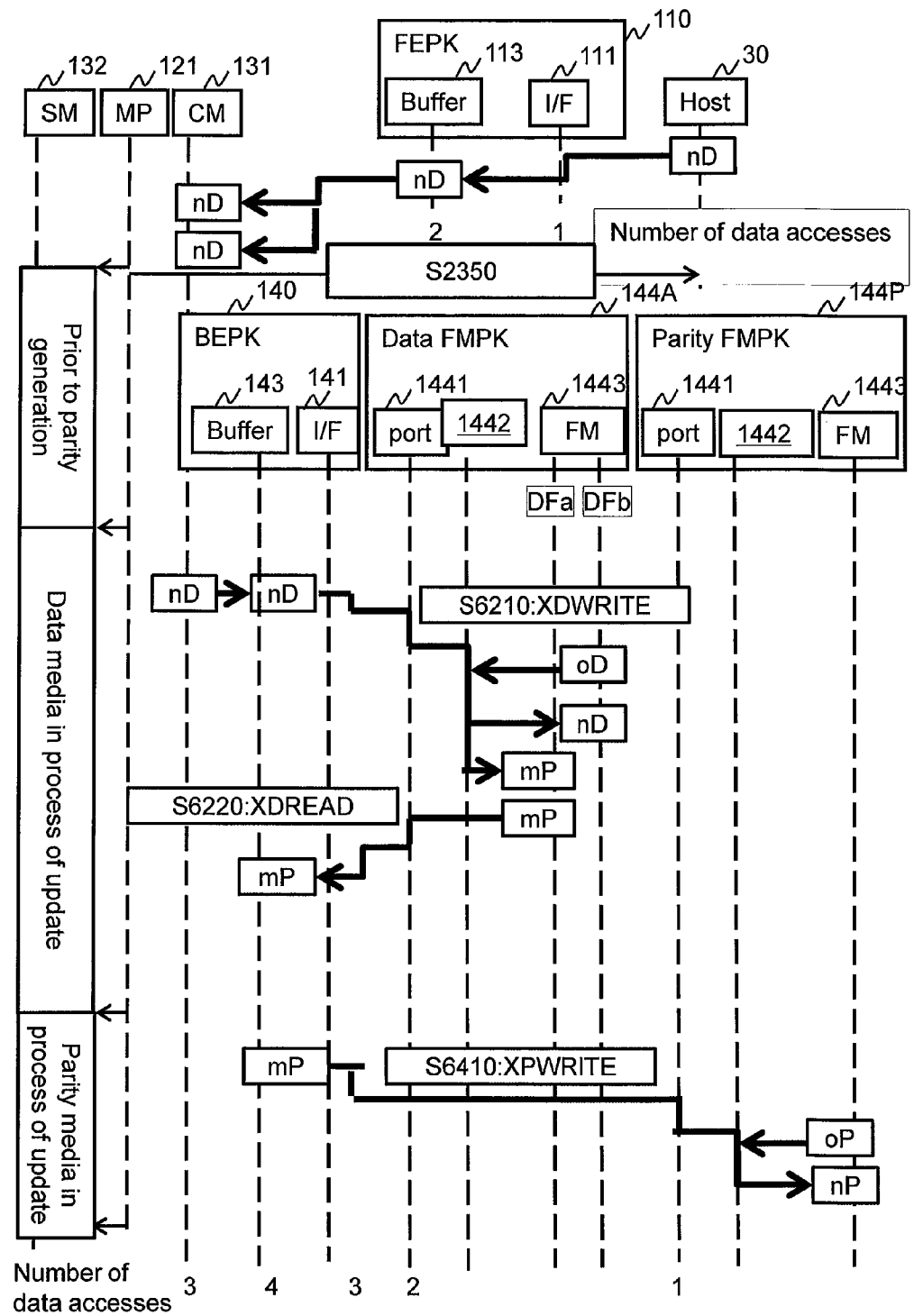
FIG. 54 shows a write process according to Embodiment 2.

FIG. 54 shows a write process according to Embodiment 2. In this sequence diagram as well, the DFa and the DFb of the data FMPK 144A represent the memory 1445 and the FM 1443 (physical page) of the data FMPK 144A. Furthermore, the DFa and the DFb of the parity FMPK 144P represent the memory 1445 and the FM 1443 (physical page) of the parity FMPK 144P. The other key components of the operations in the sequence diagram are the same as those shown in the sequence diagram illustrating the write process according to Embodiment 1.

In the present embodiment, the process stage information items stored in the SMs 132 indicate "pre-parity generation stage," "stage in process of data media update," "stage in process of parity media update," and "post-parity generation stage." Compared to Embodiment 1, the present embodiment has more of the process stage information items stored in the SMs 132. First, the MP 121 performs the processes S2110 to S2350, as in the write process of Embodiment 1. The MP 121 accordingly changes the values of the process stage information items stored in the two SMs 132 corresponding to the regions of the two CMs 131 having the new user data stored therein, to values corresponding to the stage in process of data media update.

Next, the MP 121 sends an XDWRITE command to the data FMPK 144A (S6210). This XDWRITE command designates the logical page in which the old user data is stored, and accompanies the new user data. At this moment, in response to an instruction from the MP 121, the BEPK 140 secures the buffer 143, reads the new user data from the CM 131, and writes the new user data into the secured buffer 143. The MP 121 then reads the new user data from the buffer 143 and sends the new user data to the data FMPK 144A.

The data FMPK 144A then receives the XDWRITE command and the new user data from the controller 100. The data FMPK 144A accordingly writes the new user data into the FM 1443. Subsequently, the data FMPK 144A reads the old user data and the new user data stored in the FM 1443, generates the intermediate parity using the XOR circuit 1442, and writes the intermediate parity into the memory 1445. The data FMPK 144A then sends a normal end of the XDWRITE command the controller 100.

Thereafter, the MP 121 receives the normal end of the XDWRITE command from the data FMPK 144A. The MP 121 accordingly sends an XDREAD command to the data FMPK 144A (S6220). This XDREAD command designates the address of the memory 1445 having the intermediate parity stored therein. Note that the address of the memory 1445 having the intermediate parity stored therein is stored in the memory 1445.

The data FMPK 144A then receives the XDREAD command from the controller 100. The data FMPK 144A accordingly reads the intermediate parity stored in the memory 1445 on the basis of information in the memory 1445, sends the intermediate parity to the controller 100, and sends a normal end of the XDREAD command to the controller 100.

At this moment, the BEPK 140 receives the intermediate parity from the data FMPK 144A and writes the intermediate parity into the buffer 143. Next, the MP 121 receives the normal end of the XDREAD command from the data FMPK 144A. The MP 121 accordingly changes the values of the process stage information items to a mid-stage of parity media update.

The MP 121 then sends an XPWRITE command to the parity FMPK 144P (S6410). This XPWRITE command designates the logical page having the old parity stored therein, and accompanies the intermediate parity. At this moment, in response to an instruction from the MP 121, the BEPK 140 reads the intermediate parity from the buffer 143 and sends the intermediate parity to the parity FMPK 144P.

Next, the parity FMPK 144P receives the XPWRITE command and the intermediate parity from the controller 100. The parity FMPK 144P accordingly receives the intermediate parity and writes the intermediate parity into the memory 1445. As a result of the XOR operation on the old parity stored in the PFb and the intermediate parity stored in the memory 1445, the parity FMPK 144P generates the new parity and writes the same into the FM 1443. Subsequently, the parity FMPK 144P sends a normal end of the XPWRITE command to the controller 100.

Thereafter, the MP 121 clears the process stage information items stored in the SM 132.

The Above is the Write Process.

As described above, the controller 100 sends the intermediate parity from the buffer 143 to the parity FMPK 144P without writing the intermediate parity received from the data FMPK 144A into the CM 131. Accordingly, the number of accesses to the CM 131 during the write process becomes three, thereby the number of accesses to the CM 131 can be reduced (see paragraph [0208]).

According to this embodiment, the reliability of the storage system 10 can be improved by storing the new user data and each process stage information in two CMPKs 130.

In addition, this embodiment can increase the speed of the storage system 10 because the new data commit commands (in S3230 and S3320) are not required.

According to this embodiment, the storage medium employed for the storage system 10 may be a magnetic storage medium, an optical storage medium, or other nonvolatile storage medium.

Specific Examples of Transition Write Process According to Embodiment 2

Several specific examples of the transition write process performed upon the occurrence of the MP fault are now described.

First Specific Example of Transition Write Process According to Embodiment 2

Here is described the transition write process that is performed upon the occurrence of the MP fault in the pre-parity generation stage.

Figure 55:
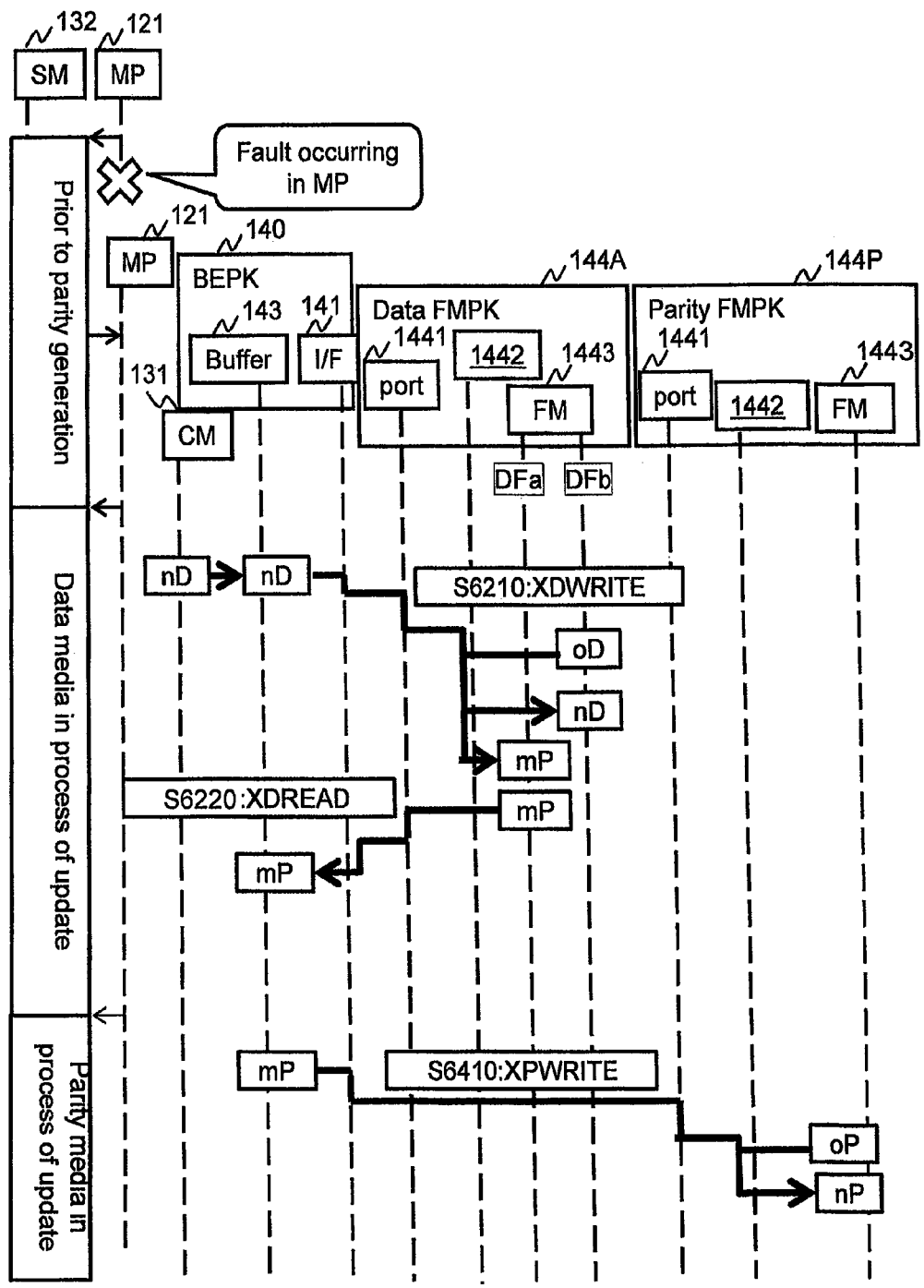
FIG. 55 shows a transition write process performed upon the occurrence of the MP fault in the pre-parity generation stage, according to Embodiment 2.

FIG. 55 shows a transition write process performed upon the occurrence of an MP fault in the pre-parity generation, according to Embodiment 2. The operation targets of the operations shown in this sequence diagram are the same as those shown in the sequence diagrams related to the normal write process.

Once the MP 121 free of faults recognizes that a fault has occurred in another MP 121, the MP 121 acknowledges that each process stage information indicates the pre-parity generation. The MP 121 accordingly changes the values of the process stage information items stored in the two SMs 132 corresponding to the regions of the two CMs 131 having the new user data stored therein, to the data media update.

Next, the MP 121 performs the processes S6210 to S6410, as in the normal write process. In other words, the MP 121 free of faults takes over the write process, from the point where the XDWRITE command is sent to the data FMPK 144A (S6210). Because the new user data is stored in the CM 131, the BEPK 140 reads the new user data from the CM 131, writes the new user data into the buffer 143, reads the new user data from the buffer 143, and sends the new user data to the data FMPK 144A, in response to the instruction from the MP 121. In this manner, the MP 121 free of faults can take over the write process to perform the write process successfully.

Subsequently, the MP 121 clears the process stage information items stored in the SMs 132.

The above is the transition write process.

As described above, even when the MP fault occurs in the pre-parity generation stage, another MP 121 free of faults can take over the write process to perform the write process successfully based on the process stage information items stored in the SMs 132. When the process stage information item obtained upon the occurrence of the MP fault indicates the pre-parity generation stage, the MP 121 takes over the write process, from the point where the XDWRITE command is sent to the data FMPK 144A (S6210).

Second Specific Example of Transition Write Process According to Embodiment 2

Here is described the transition write process that is performed upon the occurrence of the MP fault in the mid-stage of data media update.

Figure 56:
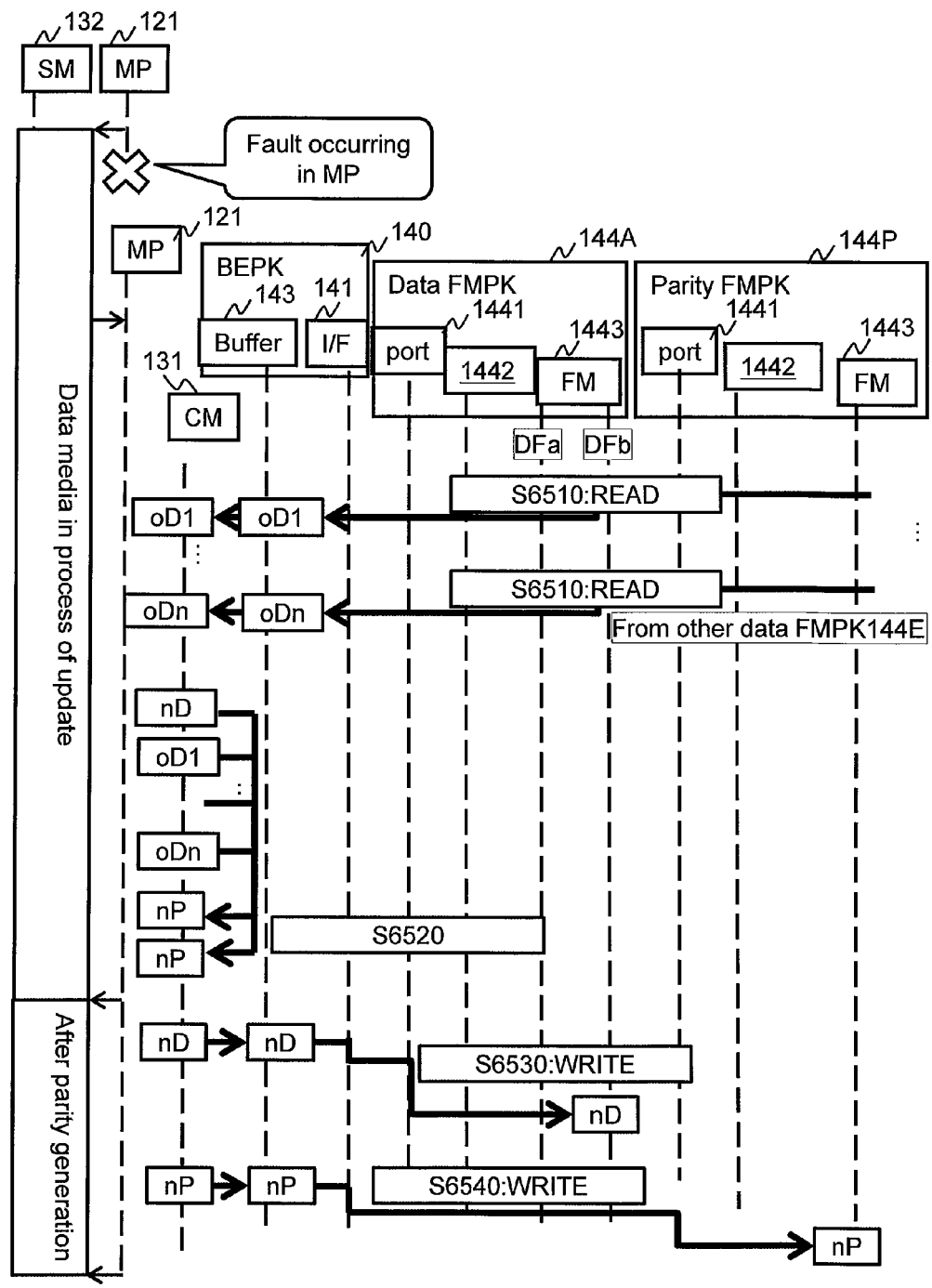
FIG. 56 shows the transition write process performed upon the occurrence of the MP fault in a mid-stage of data media update, according to Embodiment 2.

FIG. 56 shows a transition write process performed upon the occurrence of the MP fault in the mid-stage of data media update, according to Embodiment 2. The operation targets shown in this sequence diagram are the same as those shown in the sequence diagrams related to the normal write process. In the diagram and the following description, the user data other than the old user data stored in the RAID groups configured by the plurality of FMPKs 144 are referred to as "other user data." The FMPK 144 having the other user data stored therein is referred to as "other data FMPK 144E." In the diagram and the following description, the other user data are referred to as "oD1, . . . , oDn."

Once the MP 121 free of faults recognizes a fault occurring in another MP 121, the MP 121 acknowledges that each process stage information item indicates the state in process of data media update. The MP 121 accordingly sends the normal read (READ) command to the other data FMPK 144E (S6510). In other words, the MP 121 free of faults takes over the write process, from the point where the new parity is generated. This normal read command designates the logical page having the other user data stored therein. The other data FMPK 144E accordingly reads the other user data and sends the other user data to the controller 100. Consequently, the BEPK 140 writes the other user data into the buffer 143 and further writes the other user data into the CM 131.

Next, the MP 121 performs the XOR operation on the new user data and the other user data stored in the CM 131, generates the new parity, and writes the new parity into the two CMs 131 (S6520). The MP 121 then writes a value indicating the post-parity generation into the process stage information items stored in the two SMs 132 corresponding to the two CMs 131.

Subsequently, the MP 121 sends the normal write (WRITE) command to the data FMPK 144A (S6530). This normal write command accompanies the new user data. Consequently, the BEPK 140 writes the new user data stored in the CM 131 into the buffer 143, and sends the new user data to the data FMPK 144A. The data FMPK 144A accordingly writes the new user data into the FM 1443.

Subsequently, the MP 121 sends the normal write command to the parity FMPK 144P (S6540). This normal write command accompanies the new parity. Consequently, the BEPK 140 writes the new parity stored in the CM 131 into the buffer 143, and sends the new parity to the parity FMPK 144P. The parity FMPK 144P accordingly writes the new parity into the FM 1443.

The MP 121 then clears the process stage information items stored in the SM 132.

The above is the transition write process.

As described above, even when the MP fault occurs in the mid-stage of data media update, the other MPs 121 can take over the write process to perform the transition write process. When the process stage information items during the occurrence of MP fault are being data-media updated, the MP 121 free from a fault takes over a write process from a stage in which other data are transferred from the FMPK to the CM 131.

Third Specific Example of Transition Write Process According to Embodiment 2

Here is described a transition write process performed upon the occurrence of the MP fault in the mid-stage of parity media update.

Figure 57:
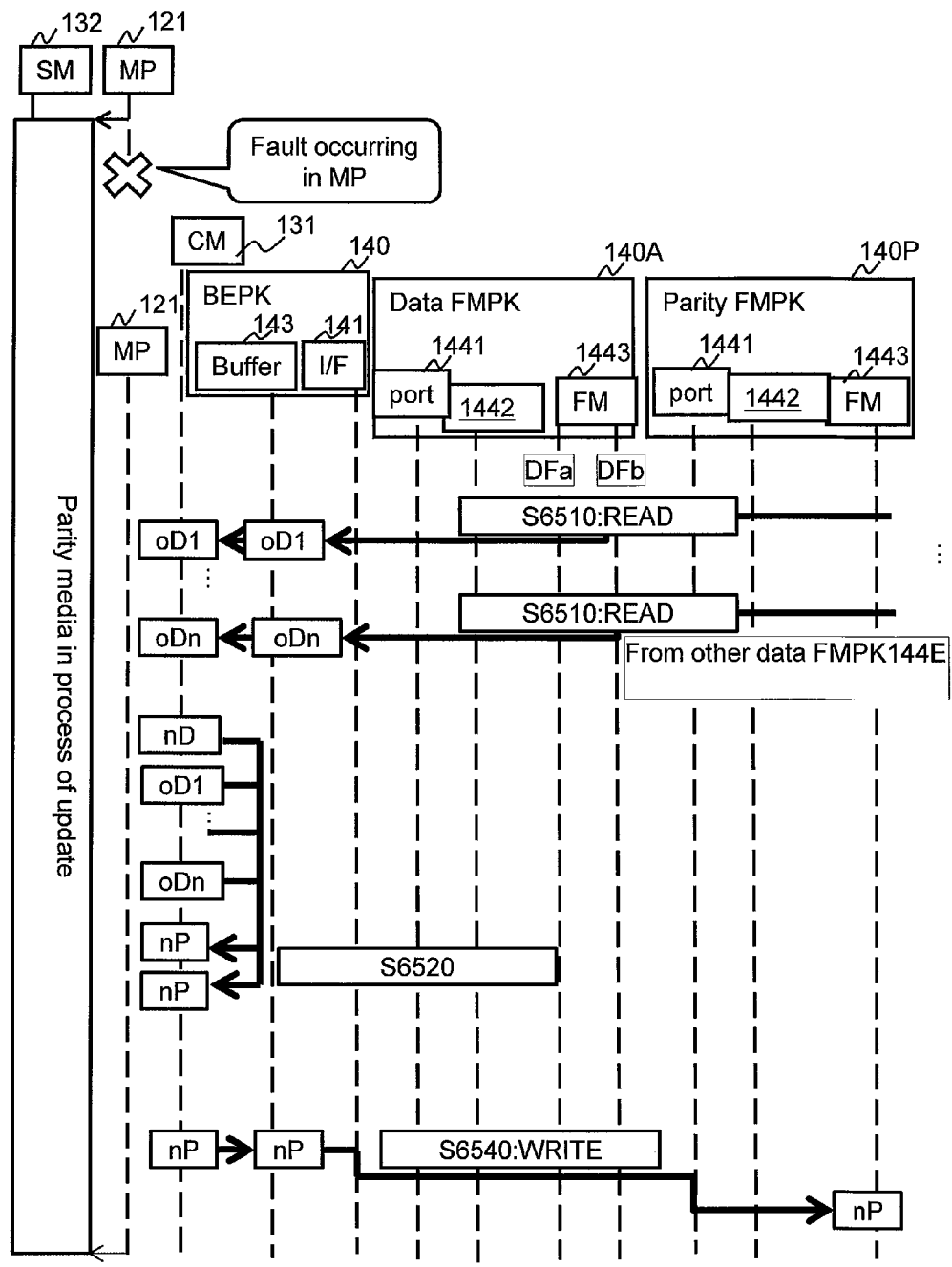
FIG. 57 shows the transition write process performed upon the occurrence of the MP fault in a mid-stage of parity media update, according to Embodiment 2.

FIG. 57 shows a transition write process performed upon the occurrence of the MP fault in the mid-stage of parity media update, according to Embodiment 2. The operation targets shown in this sequence diagram are the same as those shown in the sequence diagrams related to the normal write process.

Once the MP 121 free of faults recognizes that a fault has occurred in another MP 121, the MP 121 acknowledges that each process stage information indicates the mid-stage of parity media update. The MP 121 accordingly performs S6510, S6520 and S6540 described above (see FIG. 56). Consequently, the new parity stored in the CM 131 is written to the parity FMPK 144P.

Subsequently, the MP 121 clears the process stage information items stored in the SM 132.

The above is the transition write process.

As described above, even when the MP fault occurs in the mid-stage of parity media update, the other MPs 121 can take over the write process to perform the transition write process. When the process stage information items during the occurrence of MP fault are being parity-media updated, a write process is taken over from a stage in which other data are transferred from the FMPK 144E to the CM 131.

Fourth Specific Example of Transition Write Process According to Embodiment 2

Here is described a transition write process performed upon the occurrence of an MP fault in the post-parity generation stage.

Figure 58:
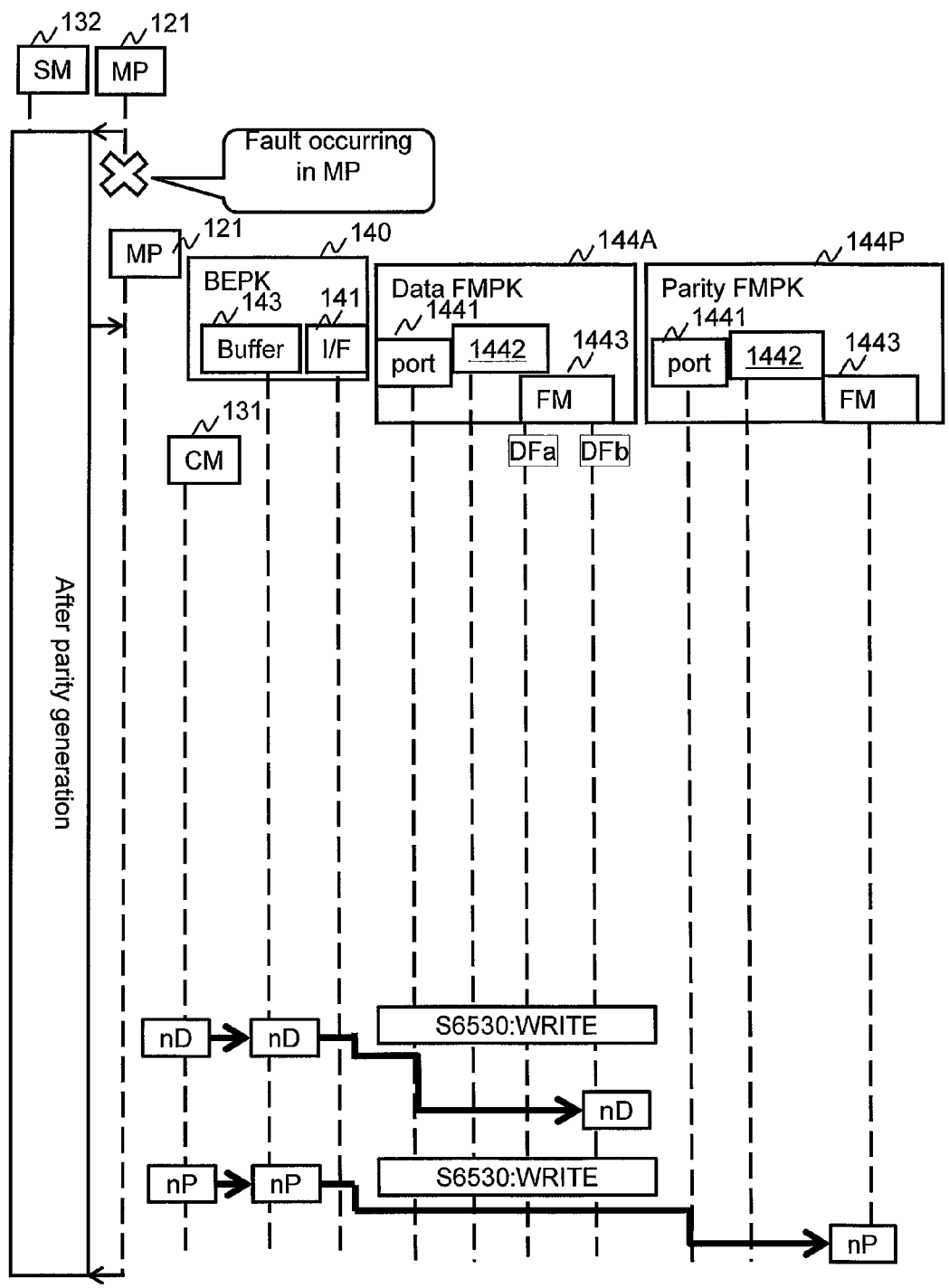
FIG. 58 shows the transition write process performed upon the occurrence of the MP fault in the post-parity generation stage, according to Embodiment 2.

FIG. 58 shows a transition write process performed upon the occurrence of the MP fault in the post-parity generation stage, according to Embodiment 2. The operation targets shown in this sequence diagram are the same as those shown in the sequence diagrams related to the normal write process.

Once the MP 121 free of faults recognizes an MP 121 in which a fault has occurred, the MP 121 acknowledges that each process stage information indicates the post-parity generation. The MP 121 accordingly performs S6530 and S6540 described above. Consequently, the new user data stored in the CM 131 is written to the data FMPK 144A. Furthermore, the new parity stored in the CM 131 is written to the parity FMPK 144P.

Subsequently, the MP 121 clears the process stage information items stored in the SM 132.

The above is the transition write process.

As described above, even when the MP fault occurs in the post-parity generation stage, the other MPs 121 free from faults can take over the write process to perform the transition write process. Similarly, data loss does not occur even when the simultaneous point of fault occurs in the plurality of MPPKs 120, the plurality of CMPKs 130, and the plurality of BEPKs 140. Thus, the reliability of the storage system 10 can be improved. In the case where the process stage information obtained upon the occurrence of the MP fault indicates the post-parity generation stage, the MP 121 free of faults takes over the write process, from the point where the new user data is written to the data FMPK 144A and the new parity is written to the parity FMPK 144P.

Operations by FMPK 144 Based on Command, According to Embodiment 2

An operation by the FMPK 144 based on each command is described hereinafter.

Figure 59:
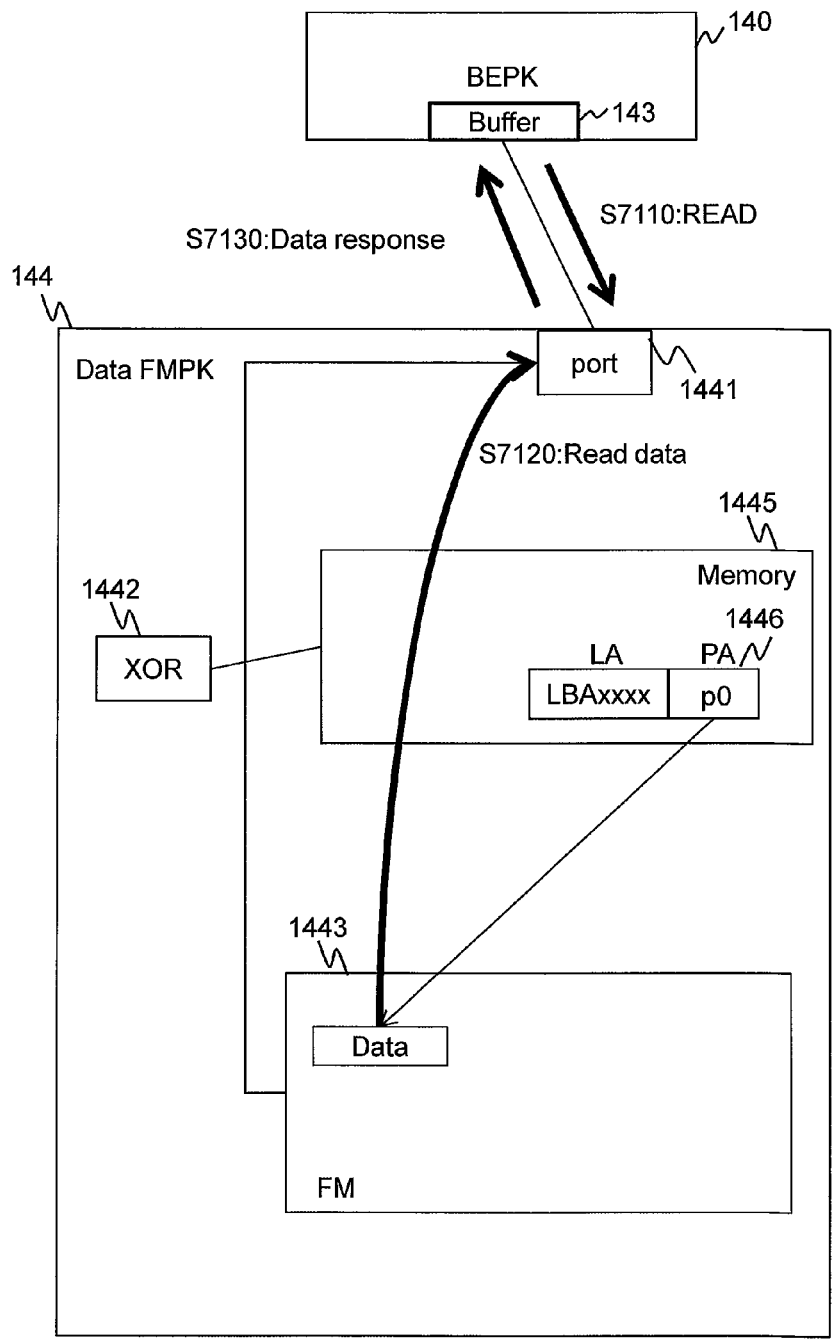
FIG. 59 shows an operation performed based on the normal read command, according to Embodiment 2.

FIG. 59 shows an operation performed based on the normal read command, according to Embodiment 2. In the following description, the logical page that is designated by a command sent from the controller 100 to the FMPK 144 is referred to as "target logical page." Of the entries of the pointer table shown in the memory 1445 of the FMPK 144, the entry corresponding to the target logical page is referred to as "target entry 1449." The target entry 1449 has a field for a logical page address, which is a logical address designating the target logical page, and a field for a physical page address, which is a physical address designating a physical page corresponding to the target logical page. In the diagram and the following description, in the target entry 1449, the logical page address is called "LA," and the old physical page address is called "PA." In addition, the value of the logical page address is described as "LBA xxxx," and the values of the physical page address are described as "p0" and "p1."

In Embodiment 2, the FMPK 144 receiving the normal read command is the same as the other data FMPK 144E. First, the other data FMPK 144E receives the normal read command from the BEPK 140 of the controller 100 (S7110). This normal read command designates the target logical page having the old data stored therein. The other data FMPK 144E then reads the old data from the old physical page designated by the physical page address of the target entry 1449 (S7120). The other data FMPK 144E then sends a data response including the old data to the controller 100 (S7130).

Figure 60:
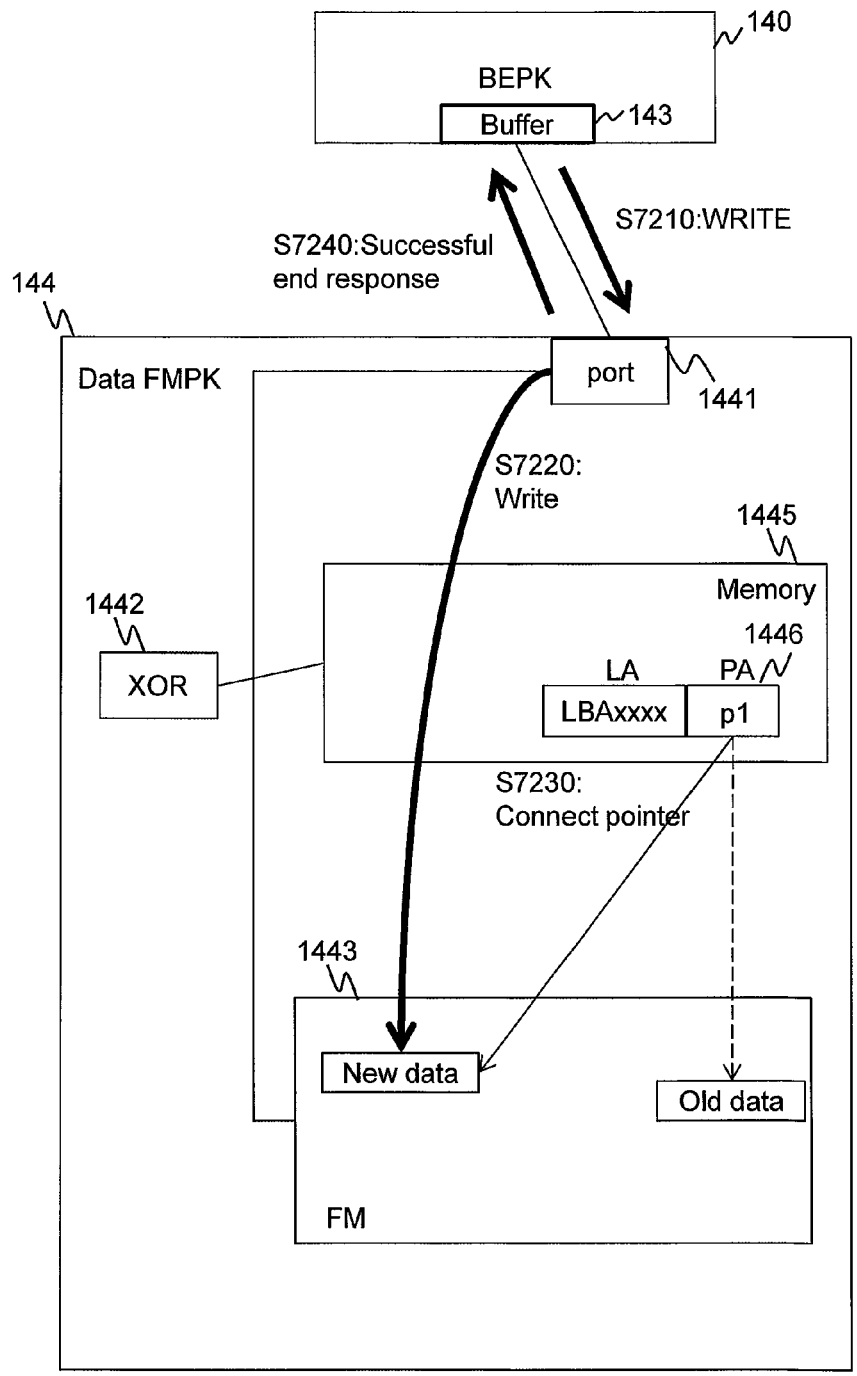
FIG. 60 shows an operation performed based on the normal write command, according to Embodiment 2.

FIG. 60 shows an operation performed based on the normal write command, according to Embodiment 2. In Embodiment 2, the FMPK 144 receiving the normal write command is the same as the data FMPK 144A or the parity FMPK 144P. First, the FMPK 144A or 144P receives the normal write command from the BEPK 140 of the controller 100 (S7210). This normal write command designates the target logical page having the old data stored therein, and accompanies the new data. The FMPK 144A or 144P then writes the new data into a new physical page different from the old physical page (S7220).

The FMPK 144A or 144P then performs the pointer connection on the new data by designating the new physical page for the physical page address of the target entry 1449 (S7230). Subsequently, the FMPK 144A or 144P sends a normal end response to the controller 100 (S7240).

Figure 61:
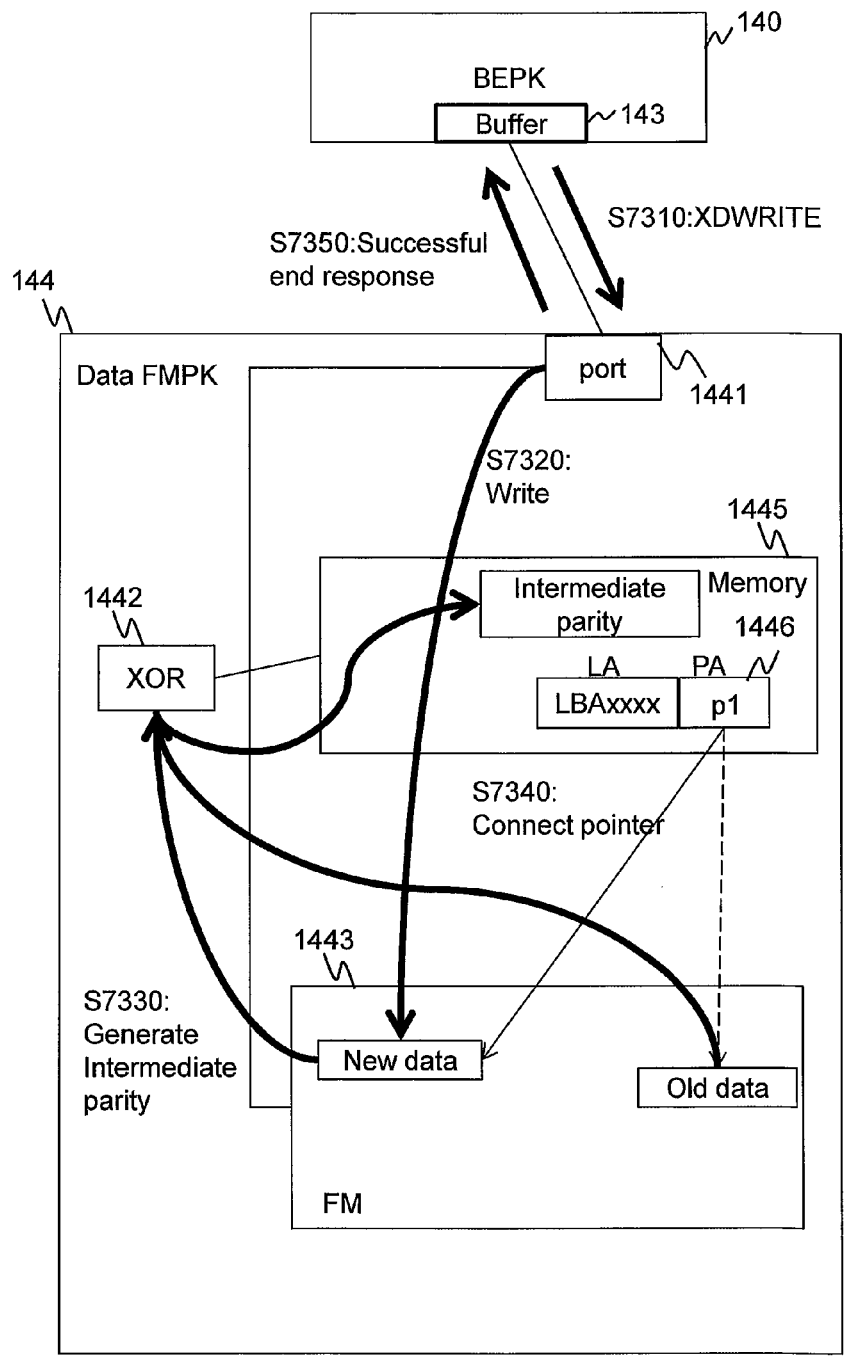
FIG. 61 shows an operation performed based on an XDWRITE command, according to Embodiment 2.

FIG. 61 shows an operation performed based on the XDWRITE command, according to Embodiment 2. In Embodiment 2, the FMPK 144 receiving the XDWRITE command is the same as the data FMPK 144A. First, the data FMPK 144A receives the XDWRITE command from the BEPK 140 of the controller 100 (S7310). This XDWRITE command designates the target logical page having the old data stored therein, and accompanies the new data. The data FMPK 144A then writes the new data into the new physical page different from the old physical page (S7320). Next, the data FMPK 144A reads the old data stored in the old physical page and the new data stored in the new physical page, generates the intermediate parity using the XOR circuit 1442, and writes the intermediate parity into the memory 1445 (S7330). The data FMPK 144A then performs the pointer connection on the new data by designating the new physical page for the physical page address of the target entry 1449 (S7340). Subsequently, the FMPK 144 sends a normal end response to the controller 100 (S7350). With this XDWRITE command, the intermediate parity can be written into the memory 1445 and the new data can be determined, while reducing the load imposed on the CM 131 and the number of accesses to the data FMPK 144A. In the present embodiment, the new data commit command (S3230 and S3320) described in Embodiment 1 is not required for determining the data stored in the FMPK 144.

Figure 62:
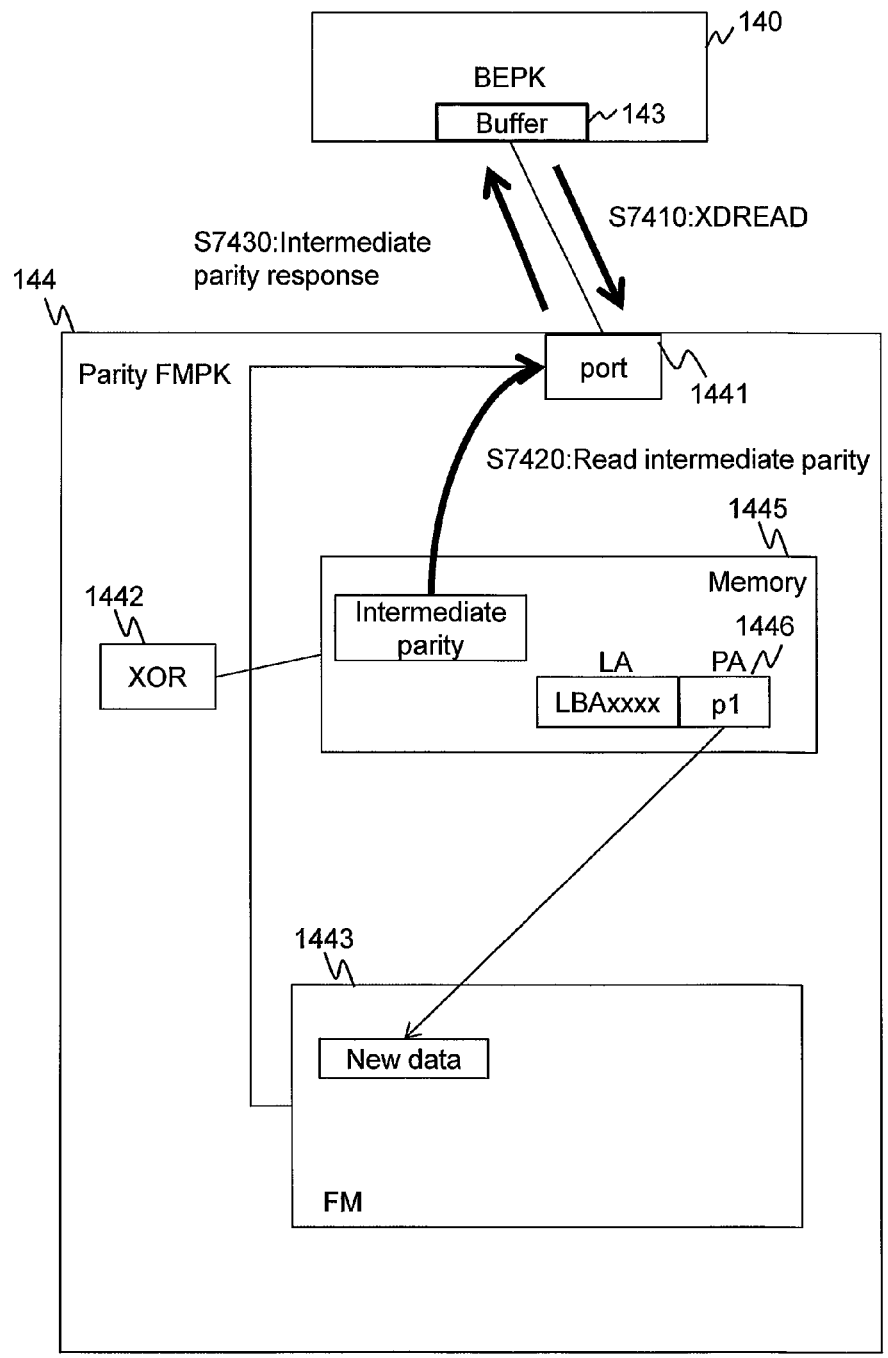
FIG. 62 shows an operation performed based on an XDREAD command, according to Embodiment 2.

FIG. 62 shows an operation performed based on the XDREAD command, according to Embodiment 2. In Embodiment 2, the FMPK 144 receiving the XDREAD command is the same as the data FMPK 144A in which the intermediate parity is written for the memory 1445. First, the data FMPK 144A receives the XDREAD command from the BEPK 140 of the controller 100 (S7410). This XDREAD command designates the address having the intermediate parity therein. The data FMPK 144A then reads the intermediate parity stored in the memory 1445 (S7420). The data FMPK 144A then sends a data response including the intermediate parity to the controller 100 (S7430).

Figure 63:
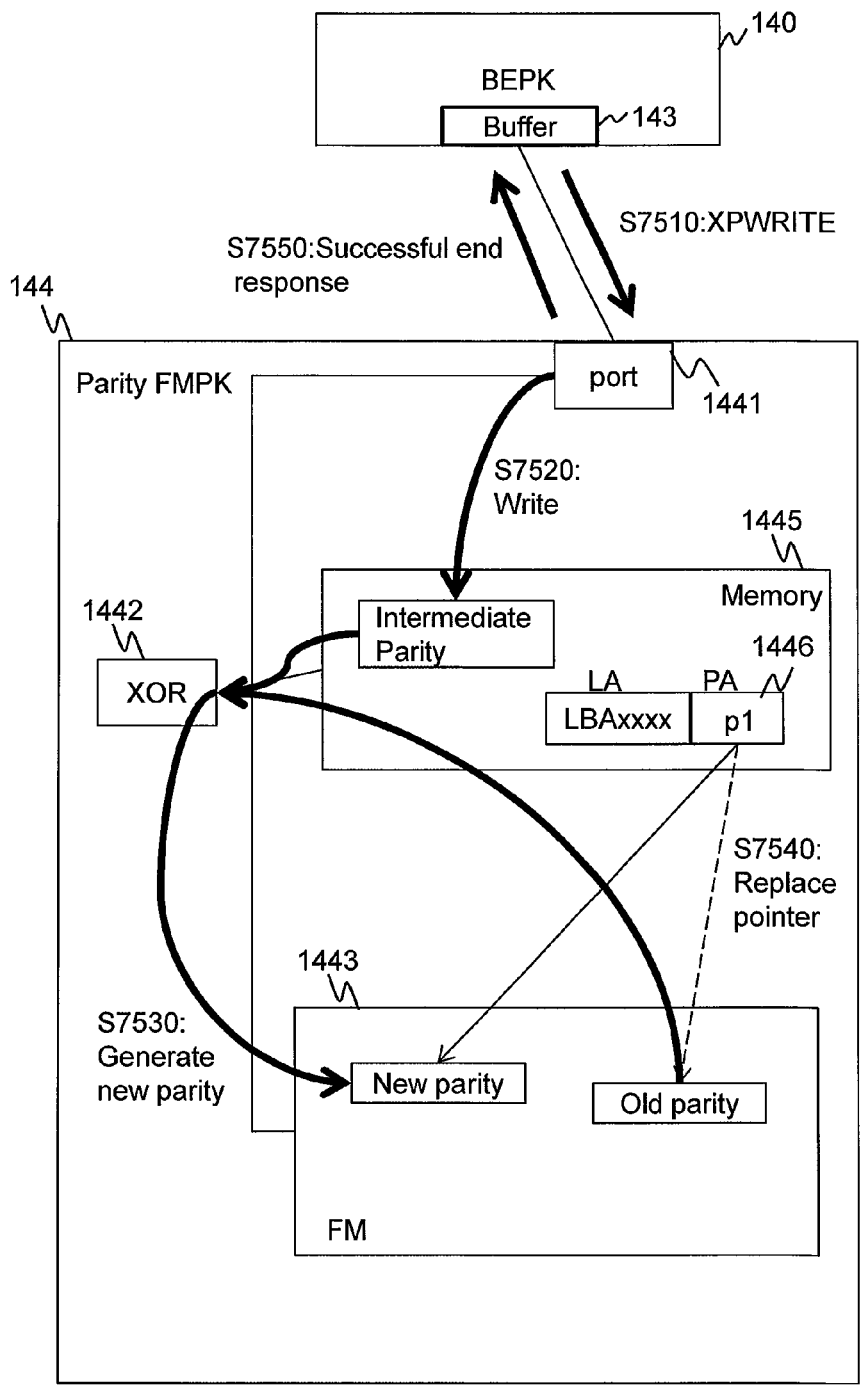
FIG. 63 shows an operation performed based on an XPWRITE command, according to Embodiment 2.

FIG. 63 shows an operation performed based on the XPWRITE command, according to Embodiment 2. In Embodiment 2, the FMPK 144 receiving the XPWRITE command is the same as the parity FMPK 144P. First, the parity FMPK 144P receives the XPWRITE command from the BEPK 140 of the controller 100 (S7510). This XPWRITE command designates the target logical page having the old parity stored therein, and accompanies the intermediate parity. The parity FMPK 144P then writes the intermediate parity into the memory 1445 (S7520). Next, the parity FMPK 144 reads the old parity from the old physical page indicated by the physical page address of the target entry 1449, reads the intermediate parity from the memory 1445, generates the new parity using the XOR circuit 1442, and writes the new parity into the new physical page different from the old physical page (S7530). The parity FMPK 144P then performs the pointer connection on the new parity by designating the new physical page for the physical page address of the target entry 1449 (S7540). Subsequently, the parity FMPK 144P sends an end response to the controller 100 (S7550). This XPWRITE process can generate and determine the new parity, while reducing the load imposed on the CM 131 and the number of accesses made to the data FMPK 144A. In the present embodiment, the new data commit command (S3230 and S3320) described in Embodiment 1 is not required for determining the data.

Embodiment 3

As with Embodiment 2, this embodiment illustrates a situation where the FMPK 144 supports the XOR function of the standard SCSI command. The rest of the configurations of the storage system 10 are the same as those described in Embodiment 1.

As with Embodiment 2, in the present embodiment the process information item stored in the SM 132 indicates "pre-parity generation stage," "stage in process of data media update," "stage in process of parity media update," and "post-parity generation stage."

Write Process According to Embodiment 3

A normal write process is now described.

Figure 64:
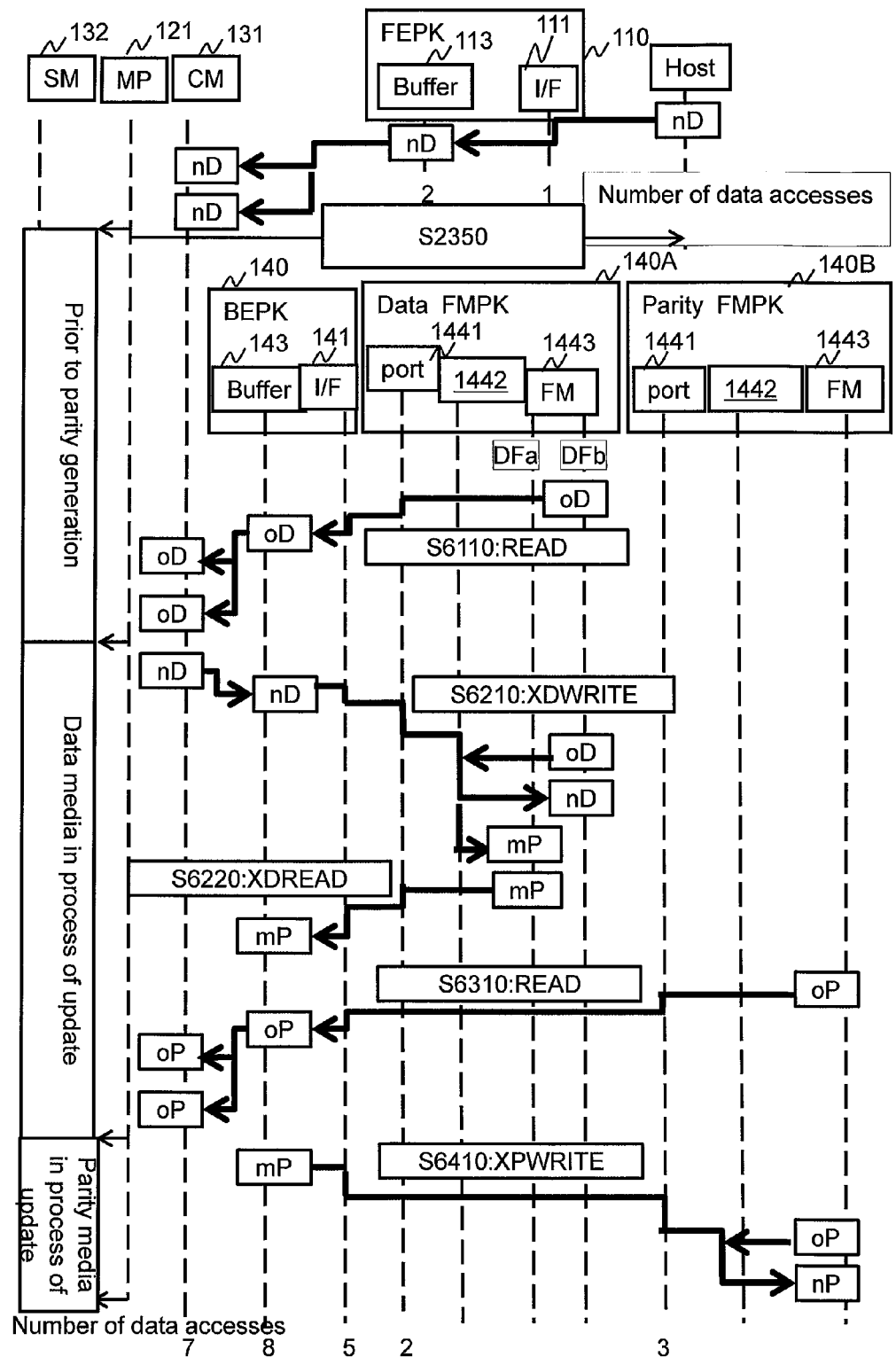
FIG. 64 shows a write process according to Embodiment 3.

FIG. 64 shows a write process according to Embodiment 3. In this sequence diagram as well, the DFa and the DFb of the data FMPK 144A represent the memory 1445 and the FM 1443 (physical page) of the data FMPK 144A. Furthermore, the DFa and the DFb of the parity FMPK 144P represent the memory 1445 and the FM 1443 (physical page) of the parity FMPK 144P. The key components of the operations in this sequence diagram are the same as those shown in the sequence diagram illustrating the write process according to Embodiment 2.

First, the MP 121 performs the processes S2110 to S2350, as in the write processes according to Embodiments 1 and 2. As in the write process according to Embodiment 2, the MP 121 accordingly changes the values of the process stage information items stored in the two SMs 132 corresponding to the regions of the two CMs 131 having the new user data stored therein, from the value corresponding to the pre-parity generation stage to the value corresponding to the stage in process of data media update. The present embodiment can cope with a simultaneous point of fault in the MP 121 or the CM 131.

The MP 121 then sends the normal read command to the data FMPK 144A (S6110). This normal read command designates the logical page having the old user data stored therein. The data FMPK 144A accordingly reads the old user data and sends the old user data to the controller 100. Consequently, the BEPK 140 writes the old user data into the buffer 143 and further writes the old user data into the two CMs 131. Next, the MP 121 writes the value indicating the mid-stage of data media update into the process stage information items stored in the two SMs 132 corresponding to the two CMs 131.

Subsequently, as in the write process according to Embodiment 2, the MP 121 sends the XDWRITE command to the data FMPK 144A (S6210). This XPWRITE command designates the logical page having the old user data stored therein, and accompanies the new user data. Accordingly, in the data FMPK 144A, the new user data is stored and the intermediate parity is stored in the memory 1445.

Subsequently, as in the write process according to Embodiment 2, the MP 121 sends the XDREAD command to the data FMPK 144A (S6220). This XDREAD command designates the logical page having the intermediate parity stored therein. Consequently, the intermediate parity is stored in the buffer 143 of the BEPK 140.

The MP 121 then sends the normal read command to the parity FMPK 144P (S6310). This normal read command designates the logical page having the old parity stored therein. The parity FMPK 144P accordingly reads the old parity and sends the old parity to the controller 100. Consequently, the BEPK 140 writes the old parity into the buffer 143 and further writes the old parity into the two CMs 131. The MP 121 then changes the values of the process stage information items to the mid-stage of parity media update.

Subsequently, as in the write process according to Embodiment 2, the MP 121 sends the XPWRITE command to the parity FMPK 144P (S6410). This XPWRITE command designates the logical page having the old parity stored therein, and accompanies the intermediate parity. Accordingly, the new parity is stored in the parity FMPK 144P.

The MP 121 then clears the process stage information items stored in the SM 132.

The Above is the Write Process.

As described above, the controller 100 writes the old user data received from the data FMPK 144A and the old parity received from the parity FMPK 144P into the CM 131, but sends the intermediate parity from the buffer 143 to the parity FMPK 144P without writing the intermediate parity received from the data FMPK 144A into the CM 131. Therefore, the number of accesses to the CM 131 during the write process becomes seven, thereby the number of accesses to the CM 131 can be reduced. Accordingly, the number of accesses to the CM 131 in the write process can be reduced, lowering the number of accesses to the CM 131 and improving the write process performance of the storage system.

In addition, according to the present embodiment, the new user data, the old user data, the old parity, and each of the process stage information items are stored in the two CMPKs 130. Therefore, even when one of the data items is lost, the other data can be used, improving the reliability of the storage system 10.

Transition Write Process According to Embodiment 3

Several specific examples of the transition write process are now described.

First Specific Example of Transition Write Process According to Embodiment 3

Here is described the transition write process that is performed upon the occurrence of the MP fault in the pre-parity generation stage.

Figure 65:
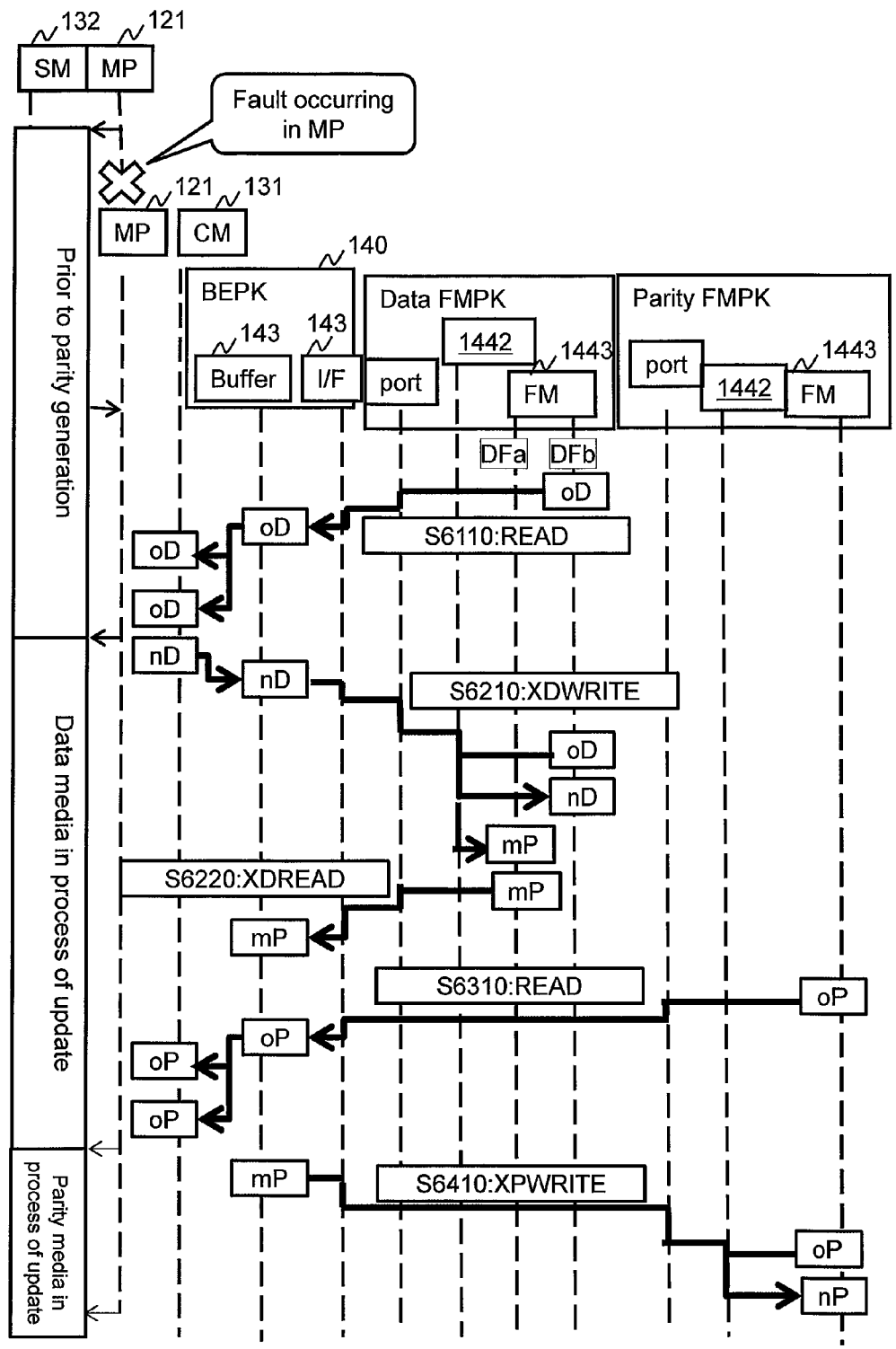
FIG. 65 shows a transition write process performed upon the occurrence of the MP fault in the pre-parity generation stage, according to Embodiment 3.

FIG. 65 shows a transition write process performed upon the occurrence of an MP fault in the pre-parity generation stage, according to Embodiment 3. The operation targets shown in this sequence diagram are the same as those shown in the sequence diagrams related to the normal write process.

Once the MP 121 free of faults recognizes the MP 121 having a fault, the MP 121 acknowledges that each process stage information item indicates the pre-parity generation stage. The MP 121 accordingly performs the processes S6110 to S6410, as in the normal write process. In other words, the MP 121 free of faults takes over the write process, from the point where the XDWRITE command is sent to the data FMPK 144A (S6210). Because the new user data is stored in the CM 131, the BEPK 140, in response to the instruction from the MP 121, reads the new user data from the CM 131, writes the new user data into the buffer 143, reads the new user data from the buffer 143, and sends the new user data to the data FMPK 144A. As a result, the MP 121 free of faults can take over the write process and perform the write process successfully.

The MP 121 then clears the process stage information items stored in the SM 132.

The Above has Described the Transition Write Process.

As described above, even when the MP fault occurs in the pre-parity generation stage, the other MPs 121 free from faults can take over the write process to perform the transition write process on the basis of the process stage information.

Second Specific Example of Transition Write Process According to Embodiment 3

Here is described the transition write process that is performed upon the occurrence of the MP fault in the mid-stage of data media update.

Figure 66:
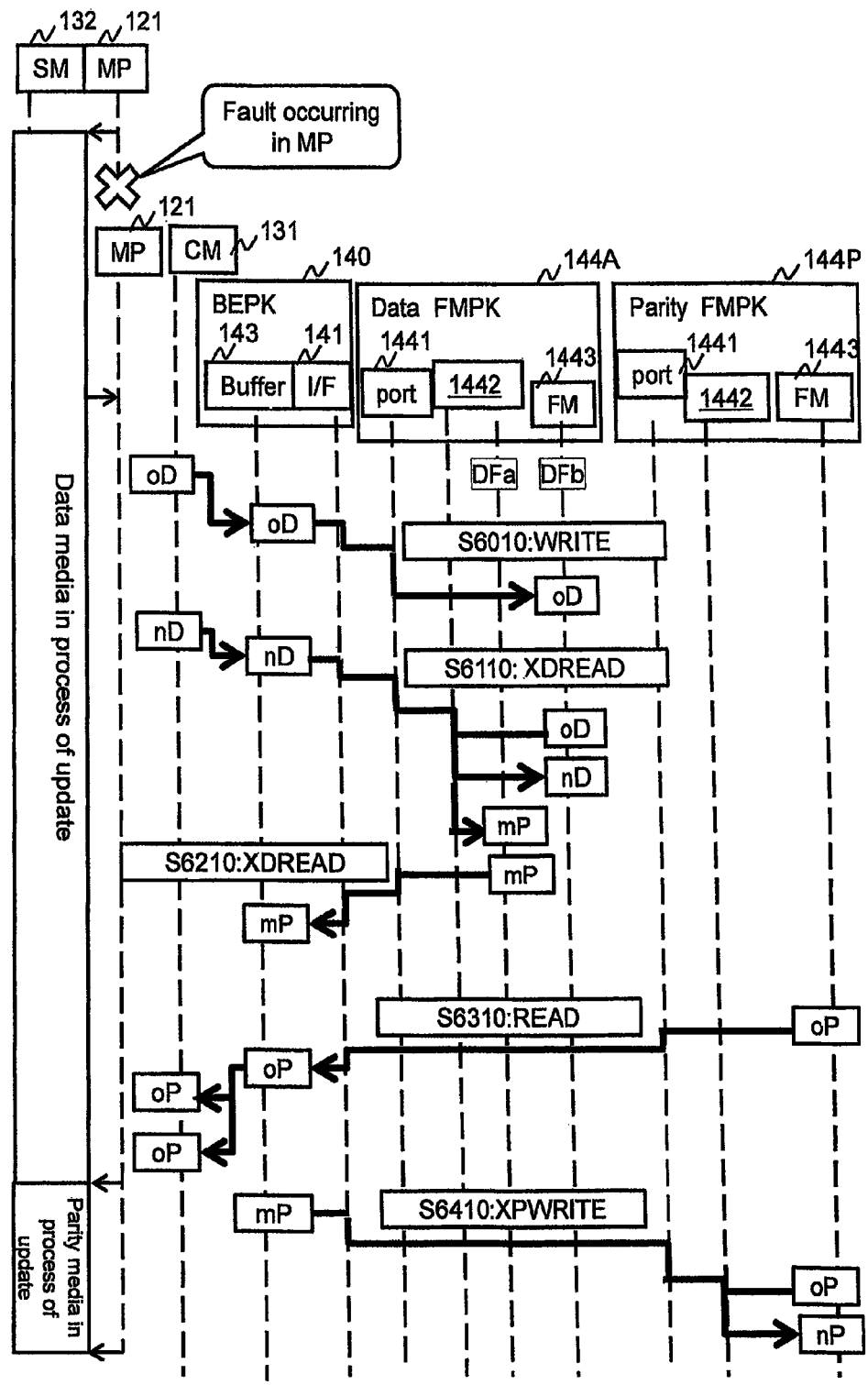
FIG. 66 shows the transition write process performed upon the occurrence of the MP fault in the mid-stage of data media update, according to Embodiment 3.

FIG. 66 shows a transition write process performed upon the occurrence of the MP fault in the mid-stage of data media update, according to Embodiment 3. The operation targets shown in this sequence diagram are the same as those shown in the sequence diagrams related to the normal write process.

Once the MP 121 free of faults recognizes an MP fault, the MP 121 acknowledges that each process stage information indicates the data media update. The MP 121 accordingly sends the normal write command to the data FMPK 144A (S6010). This normal write command accompanies the old user data. At this moment, in response to an instruction from the MP 121, the BEPK 140 reads the old user data from the CM 131, writes the old user data into the buffer 143, reads the old user data from the buffer 143, and sends the old user data to the data FMPK 144A.

The MP 121 then performs the processes S6110 to S6410, as in the normal wrote process. In other words, when the process stage information item indicates the stage in process of data media update, the MP 121 free of faults takes over the write process, from the stage where the normal read command is sent to the data FMPK 144A (S6110).

Subsequently, the MP 121 clears the process stage information items stored in the SM 132.

The above is the transition write process.

As described above, even when the MP fault occurs in the mid-stage of data media update, the other MPs 121 free from faults can take over the write process to perform the transition write process on the basis of the process stage information.

Third Specific Example of Transition Write Process According to Embodiment 3

Here is described a transition write process performed upon the occurrence of the MP fault in the mid-stage of parity media update.

Figure 67:
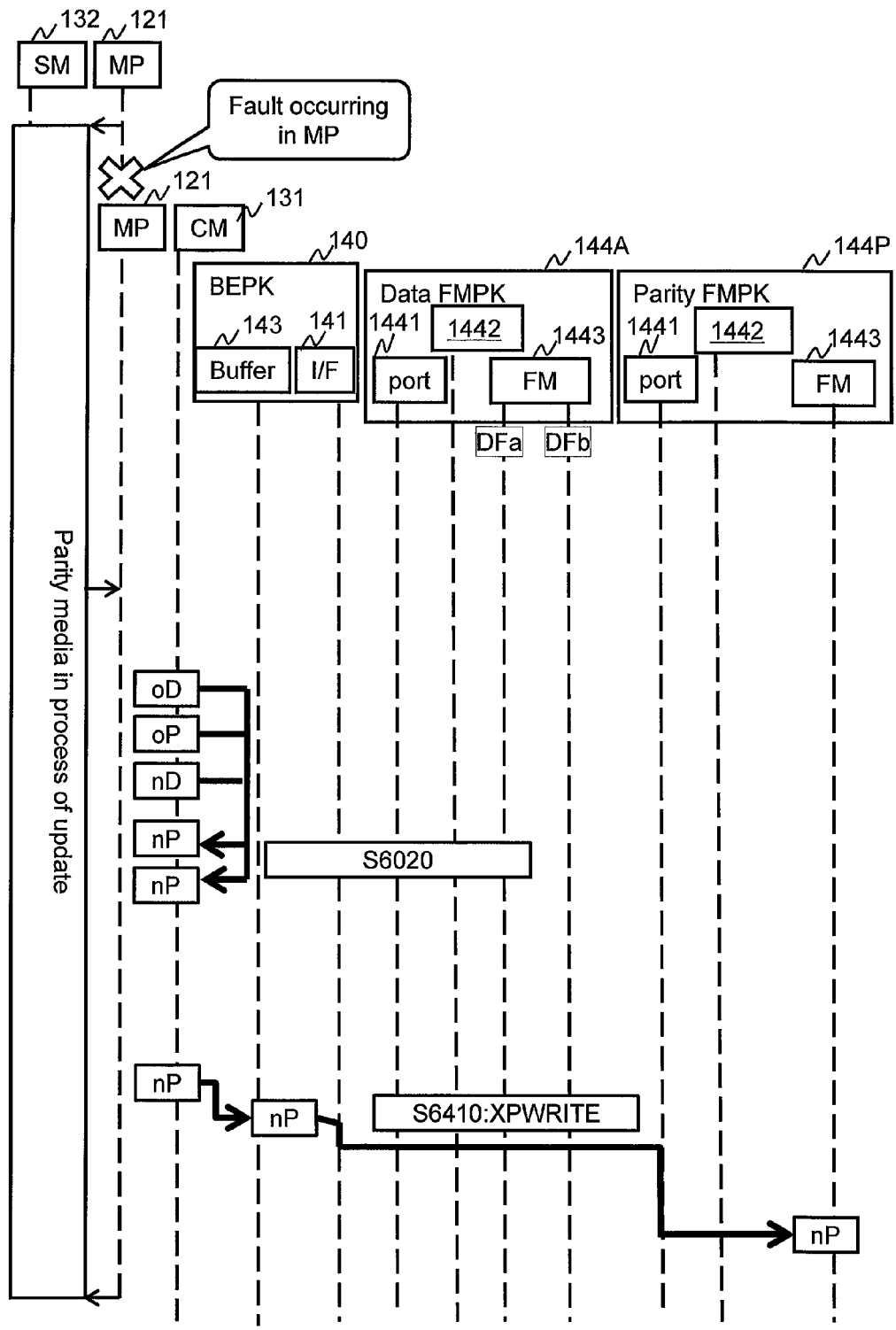
FIG. 67 shows the transition write process performed upon the occurrence of the MP fault in the mid-stage of parity media update, according to Embodiment 3.

FIG. 67 shows a transition write process performed upon the occurrence of the MP fault in the mid-stage of parity media update, according to Embodiment 3. The operation targets shown in this sequence diagram are the same as those shown in the sequence diagrams related to the normal write process.

Once the MP 121 free of faults recognizes an MP having a fault, the MP 121 acknowledges that each process stage information item indicates the stage in process of parity media update. The MP 121 accordingly reads the old user data, the old parity, and the new user data stored in the CM 131, generates the new parity by means of the XOR operation, and writes the new parity into the two CMs 131 (S6020). In other words, when each process stage information item indicates the stage in process of parity media update, the MP 121 free of faults takes over the write process, from the point where the new parity is generated from the old user data, the old parity, and the new user data that are stored in the CM 131.

The MP 121 then performs the process S6410, as in the normal write process.

Subsequently, the MP 121 clears the process stage information items stored in the SM 132.

The above is the transition write process.

As described above, even when the MP fault occurs in the mid-stage of parity media update, the other MPs 121 free from faults can take over the write process to perform the transition write process on the basis of the process stage information.

In this embodiment, the storage device of the storage unit 200 is not limited to the FM 1443.

According to this embodiment, the simultaneous point of fault occurring in the MPPKs 120 and the FMPKs 144 configuring the RAID groups in process of destaging can be tolerated, preventing the occurrence of data loss. Destaging here means writing the data stored in the CM 131 into the FM 1443 of the FMPK 144. Similarly, even when the simultaneous point of fault occurs in the plurality of MPPKs 120, the plurality of CMPKs 130, the plurality of BEPKs 140, and the plurality of FMPKs 144, data loss does not occur. Therefore, the reliability of the storage system 10 can be improved. Therefore, the reliability of the storage system 10 can be improved.

Embodiment 4

The rest of the configurations of the storage system 10 are the same as those described in Embodiment 1.

Write Process According to Embodiment 4

A normal write process is now described.

Figure 68:
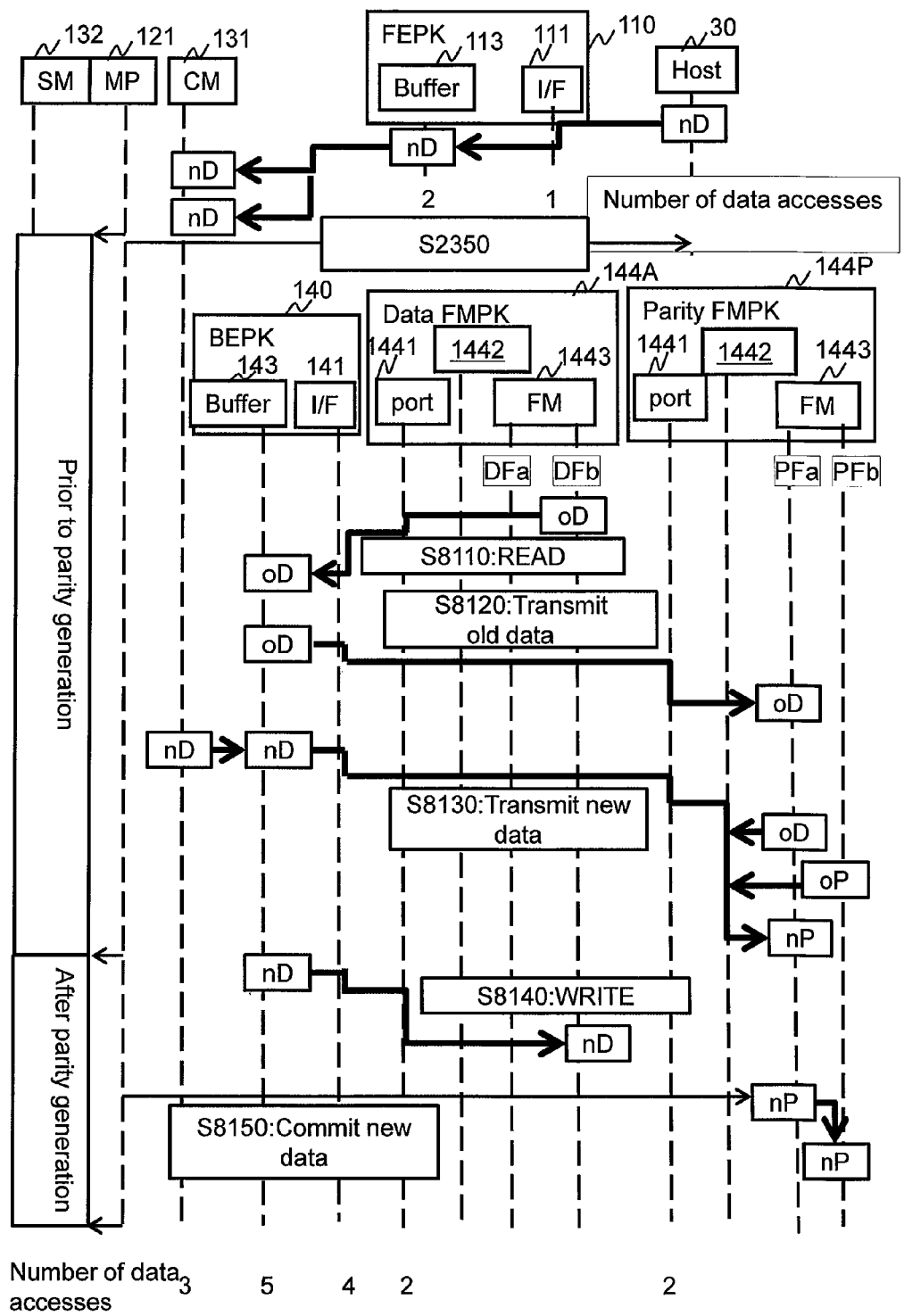
FIG. 68 shows a write process according to Embodiment 4.

FIG. 68 shows a write process according to Embodiment 4. The operation targets in this sequence diagram are the same as those shown in the sequence diagram illustrating the write process according to Embodiment 1.

In the present embodiment, an old data transmission command, new data transmission command, and new data commit command are defined as the I/O commands sent from the controller 100 to the FMPKs 144. Moreover, in the present embodiment, the process stage information items stored in the SMs 132 indicate the pre-parity generation and post-parity generation stages.

For the purpose of illustration, the state of the parity FMPK 144P in the write process is referred to as "FMPK state." Several states of the FMPK 144 are defined hereinafter.

First, the MP 121 performs the processes S2110 to S2350, as in the write process according to Embodiment 1. The MP 121 accordingly registers the values of the process stage information items stored in the two SMs 132, as the pre-parity generation stage, as in the write process according to Embodiment 1.

The MP 121 then sends the normal read command to the data FMPK 144A (S8110). This normal read command designates the logical page having the old user data stored therein. Accordingly, the data FMPK 144A reads the old user data from the FM 1443, sends the old user data to the controller 100, and notifies the controller 100 of a normal end of the normal read command.

At this moment, the BEPK 140 receives the old user data from the data FMPK 144A, and writes the old user data into the buffer 143.

Subsequently, the MP 121 is notified by the data FMPK 144A of the normal end of the normal read command.

Figure 71:
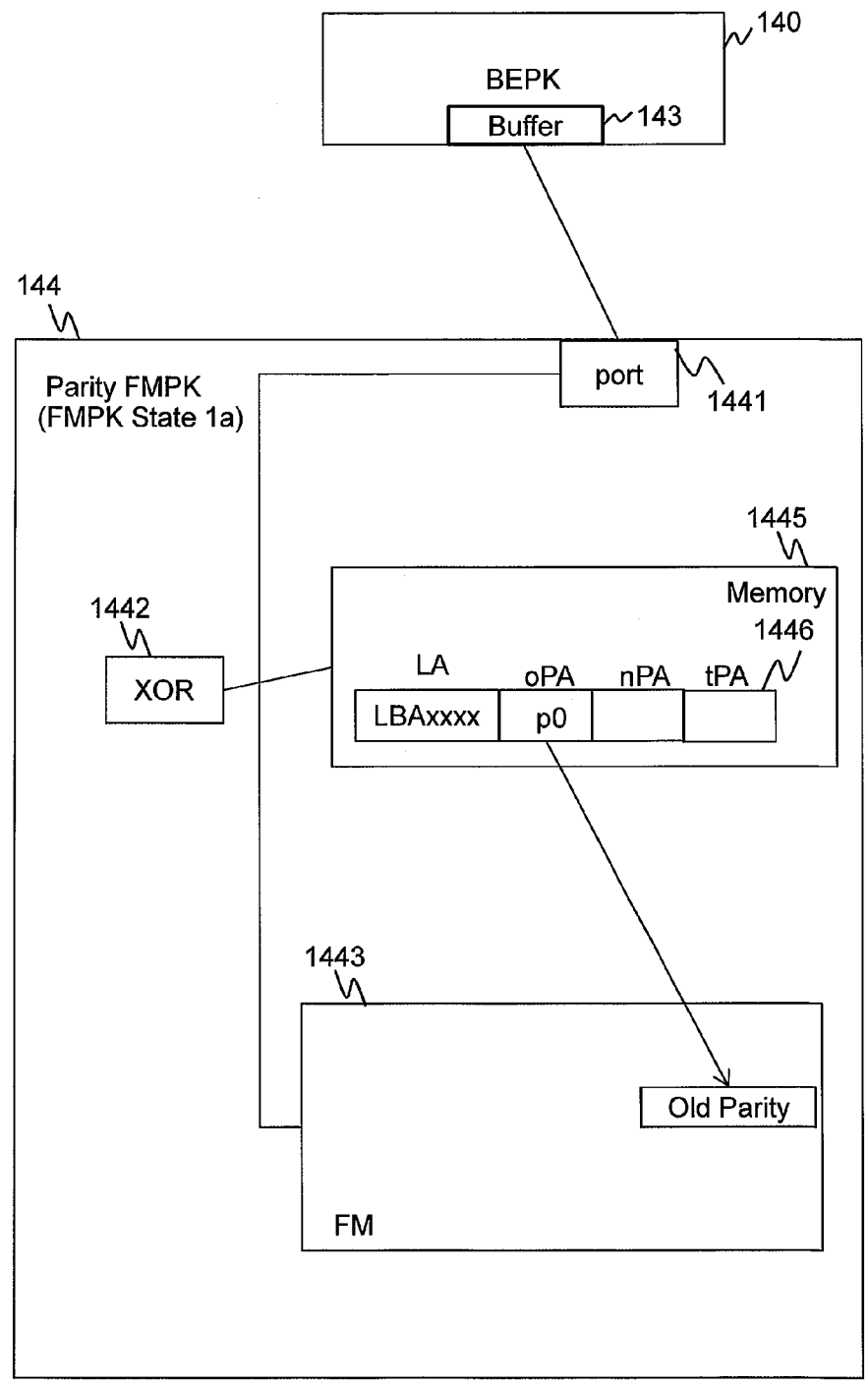
FIG. 71 shows a FMPK state 1a according to Embodiment 4.

The state of the parity FMPK 144P obtained at this moment is referred to as "FMPK state 1a." FIG. 71 shows the FMPK state of the parity FMPK 144P.

The MP 121 then sends the old data transmission command to the parity FMPK 144P (S8120). This old data transmission command designates the logical page having the old parity stored therein, and accompanies the old user data. At this moment, in response to an instruction from the MP 121, the BEPK 140 reads the old user data from the buffer 143, and sends the old user data to the parity FMPK 144P. Because the MPPK 120 is coupled to the CMPK 130 and the BEPK 140 by the internal networks, the MPPK 120 can control storage of data in the CMPK 130 and the BEPK 140. Therefore, after being read from the data FMPK 144 and stored in the buffer of the BEPK 140, the old user data can be transferred to the parity FMPK 144P without being stored in the CM 131, reducing the access load imposed on the CM 131.

Subsequently, the parity FMPK 144P receives the old data transmission command and the old user data from the controller 100. The parity FMPK 144P accordingly writes the old user data into the FM 1443, and notifies the controller 100 of a normal end of the old data transmission command.

Thereafter, the MP 121 is notified by the parity FMPK 144P of the normal end of the old data transmission command.

Figure 72:
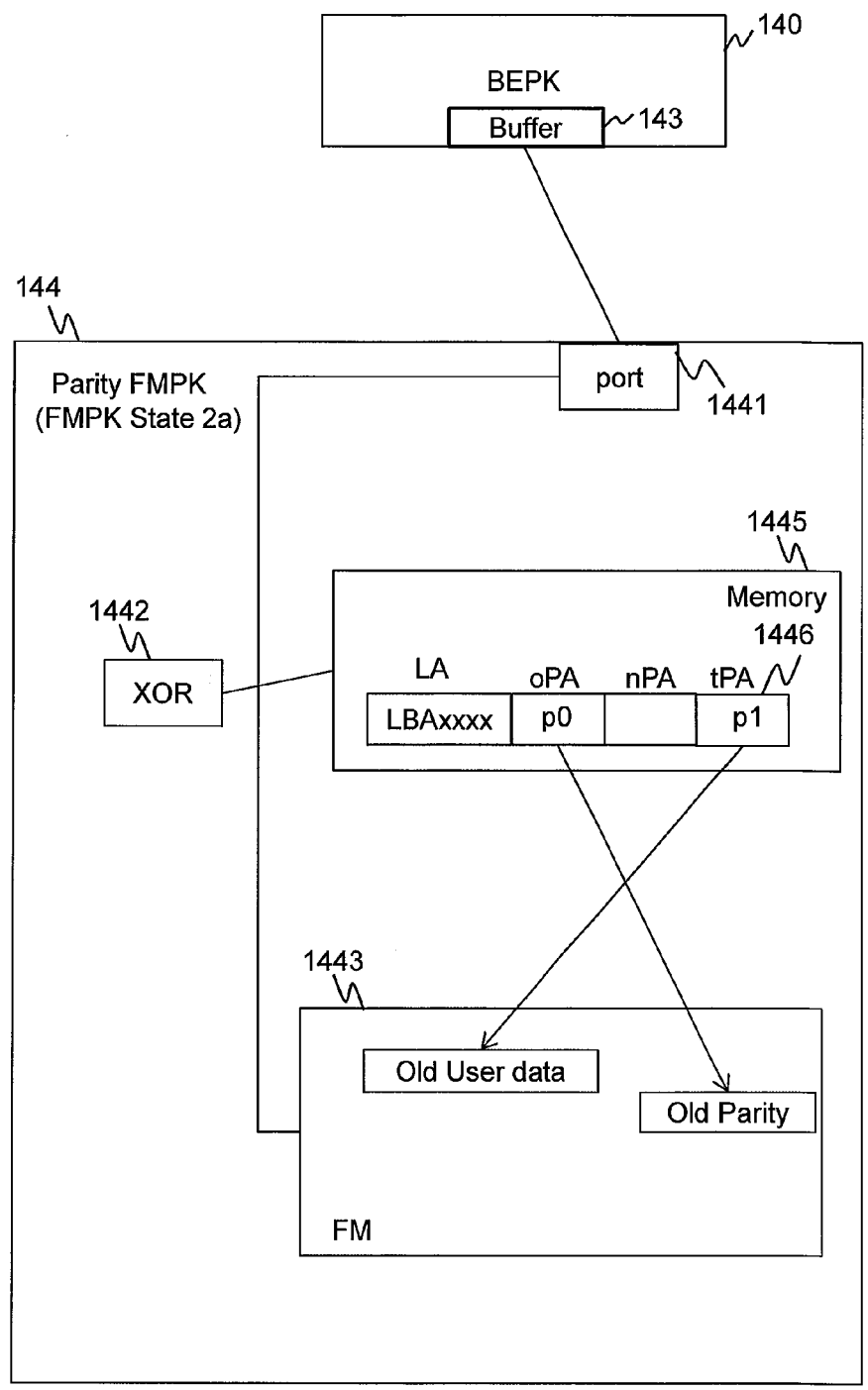
FIG. 72 shows a FMPK state 2a according to Embodiment 4.

The state of the parity FMPK 144P obtained at this moment is referred to as "FMPK state 2a." FIG. 72 shows the FMPK state of the parity FMPK 144P.

Accordingly, the MP 121 sends the new data transmission command to the parity FMPK 144P (S8130). This new data transmission command designates the logical page having the old user data and the old parity stored therein, and accompanies the new user data. At this moment, in response to an instruction from the MP 121, the BEPK 140 reads the new user data from the CM 131, writes the new user data into the buffer 143, reads the new user data from the buffer 143, and sends the new user data to the parity FMPK 144P.

Next, the parity FMPK 144P receives the new data transmission command and the new user data from the controller 100. The operations performed by the FMPK 144P based on the new data transmission command in this embodiment are different from those described in Embodiment 1. Consequently, the parity FMPK 144P writes the new user data into the memory 1445, reads the old user data and the old parity from the FM 1443, generates the new parity by means of the XOR circuit 1442, and writes the new parity into the FM 1443. The parity FMPK 144P then notifies the controller 100 of a normal end of the new data transmission command.

The MP 121 is then notified by the parity FMPK 144P of the normal end of the new data transmission command. Accordingly, the MP 121 changes the value of each process stage information item to the post-parity generation stage.

Figure 73:
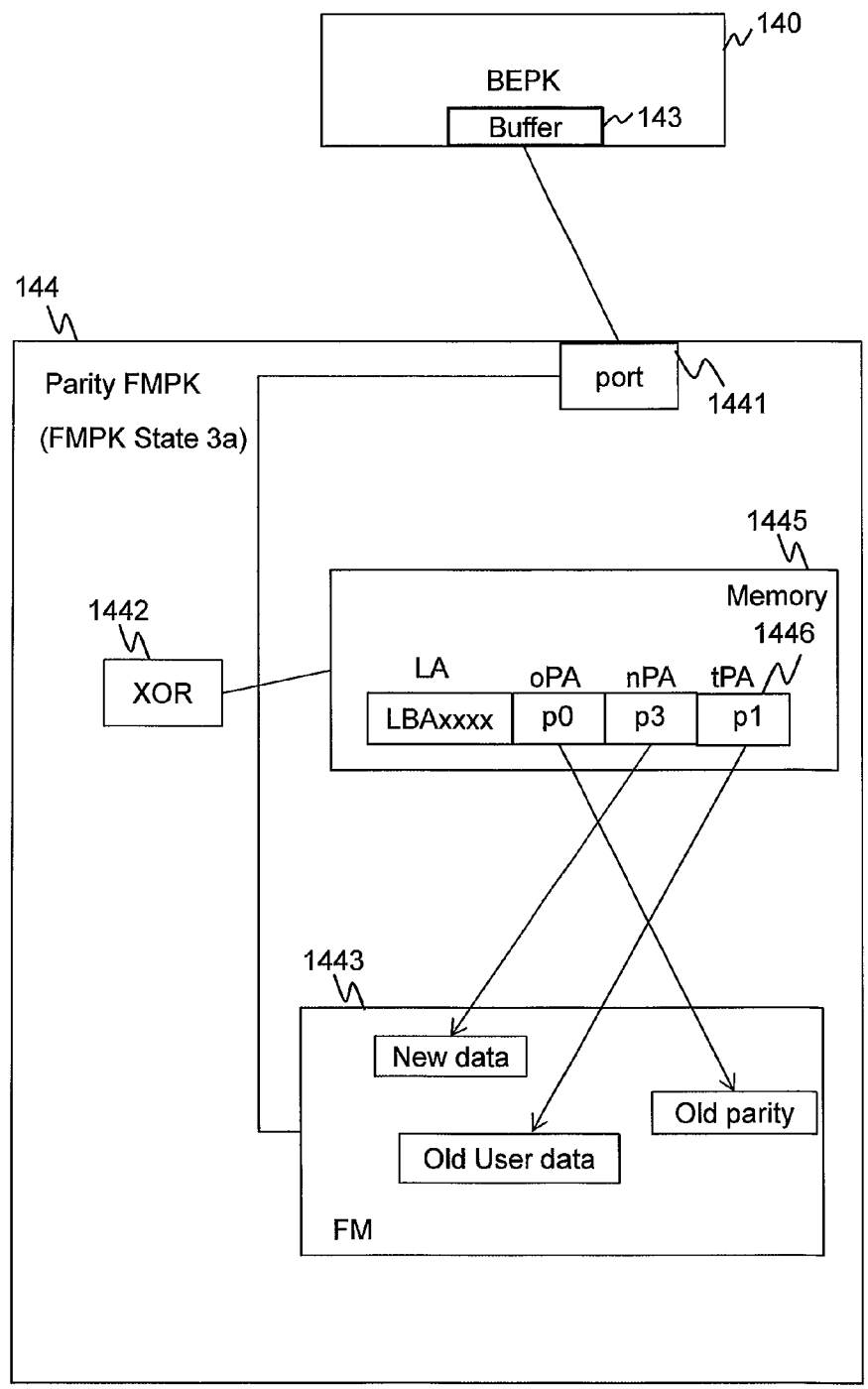
FIG. 73 shows a FMPK state 3a according to Embodiment 4.

The state of the parity FMPK 144P obtained at this moment is referred to as "FMPK state 3a." FIG. 73 shows the FMPK state of the parity FMPK 144P.

Subsequently, the MP 121 sends the normal write command to the data FMPK 144A (S8140). This normal write command accompanies the new user data. At this moment, in response to an instruction from the MP 121, the BEPK 140 reads the new user data from the buffer 143, and sends the new user data to the data FMPK 144A. At this moment, the BEPK 140 transmits the new user data, which is stored in the buffer in S8130, to the data FMPK 144A. Since the MPPK 120 can control the CMPK 130 and the BEPK 140, it is not necessary to read the new user data from the CMPK 130 again. Therefore, the access load imposed on the CMPK 130 can be reduced.

Next, the data FMPK 144A receives the normal write command and the new user data from the controller 100. The data FMPK 144A accordingly writes the new user data into the FM 1443, and notifies the controller 100 of a normal end of the normal write command. The normal write command is processed in the same manner as shown in FIG. 31.

Subsequently, the MP 121 is notified by the data FMPK 144A of the normal end of the normal write command. Accordingly, the MP 121 sends the new data commit command to the parity FMPK 144P (S8150). This new data commit command designates the logical page having the new parity stored therein.

Next, the parity FMPK 144P receives the new data commit command from the controller 100. Accordingly, the parity FMPK 144P determines the new parity as the parity after update, and notifies the controller 100 of a normal end of the new data commit command.

Then, the MP 121 is notified by the parity FMPK 144P of the normal end of the new data commit command. Accordingly, the MP 121 clears the value of each process stage information item.

The Above is the Write Process.

In this manner, the controller 100 sends the old user data from the buffer 143 to the parity FMPK 144P without writing the old user data received from the data FMPK 144A into the CM 131. As a result, the number of accesses to the CM 131 during the write process becomes three, thereby the number of accesses to the CM 131 can be reduced.

According to this embodiment, the reliability of the storage system 10 can be improved by storing the new user data and each process stage information item in the two CMPKs 130.

Specific Examples of Transition Write Process According to Embodiment 4

Several specific examples of the transition write process performed upon the occurrence of an MP fault are now described hereinafter. By storing the process stage information item in the SM 132 at an appropriate stage, another MP 121 free of faults can take over the write process when a fault occurs in a certain MP 121, without causing data loss.

First Specific Example of Transition Write Process According to Embodiment 4

Here is described a transition write process that is performed upon the occurrence of the MP fault in the pre-parity generation stage.

Figure 69:
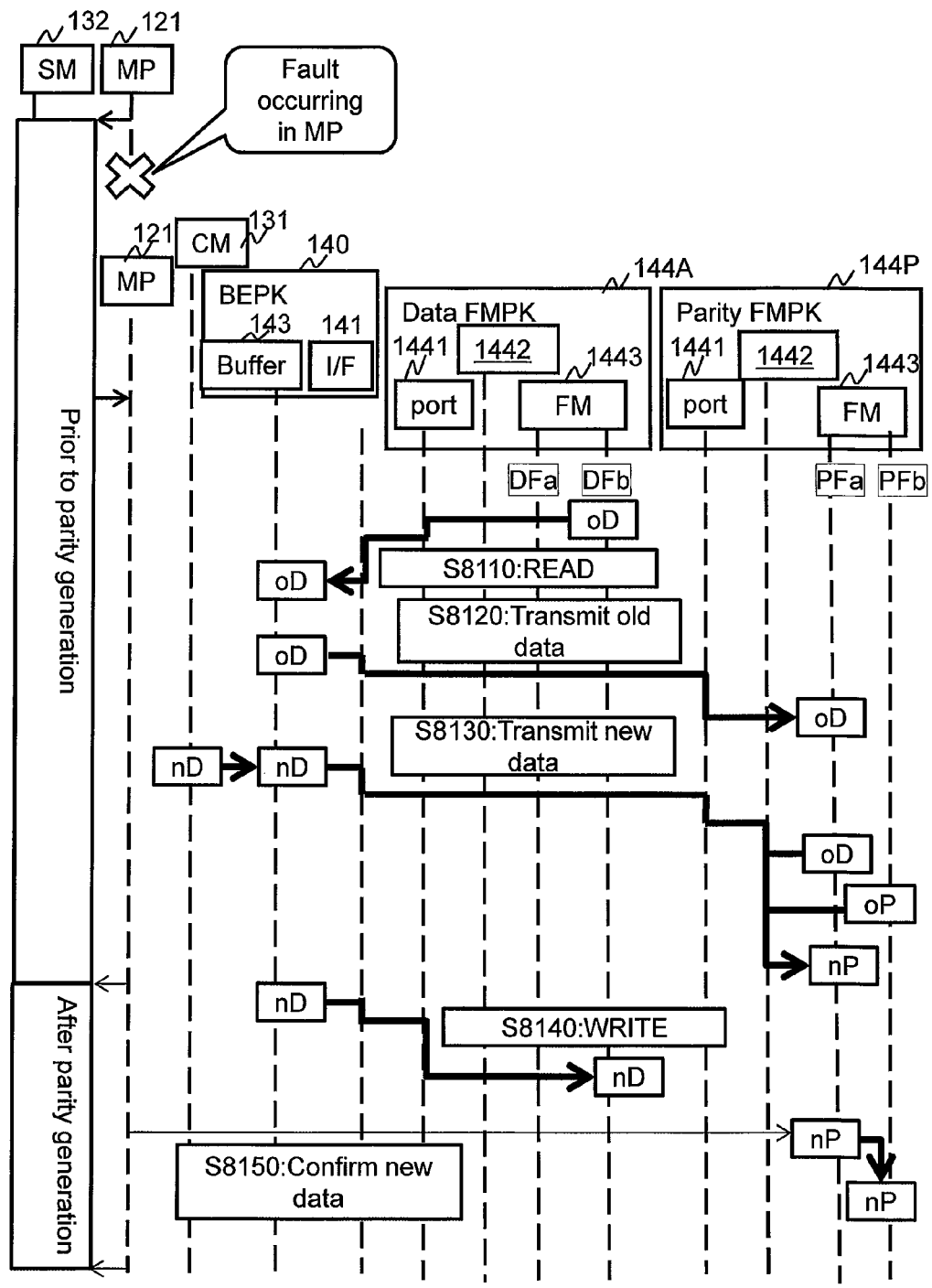
FIG. 69 shows a transition write process performed upon the occurrence of the MP fault in the pre-parity generation stage, according to Embodiment 4.

FIG. 69 shows the transition write process performed upon the occurrence of the MP fault in the pre-parity generation stage, according to Embodiment 4. The operation targets shown in this sequence diagram are the same as those shown in the sequence diagrams related to the normal write process.

Once the MP 121 free of faults recognizes the MP 121 fault, the MP 121 acknowledges that each process stage information item of the SM 132 indicates the pre-parity generation stage. Accordingly, the MP 121 performs the processes S8110 to S8150, as in the normal write process.

The MP 121 then clears the process stage information items stored in the SM 132.

The above is the first specific example of the transition write process. In the present embodiment, it is guaranteed that the old user data existing in the data FMPK 144A can be read as long as the process stage information item indicates the pre-parity generation stage. Therefore, the MP 121 that carries out the transition process can take over the write process, from the point where the old user data is read (S8110), and complete the write process.

Second Specific Example of Transition Write Process According to Embodiment 4

Figure 70:
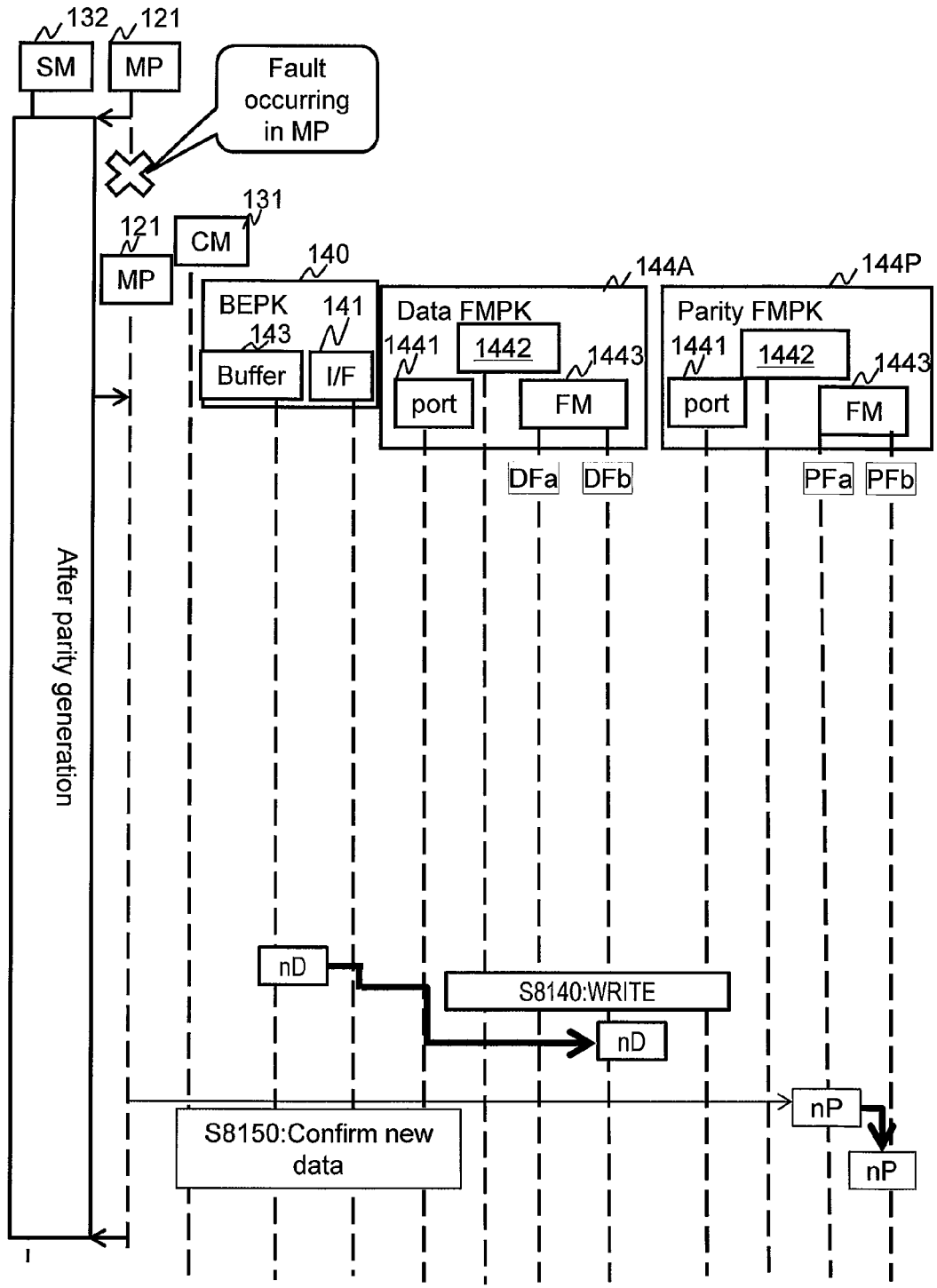
FIG. 70 shows the transition write process performed upon the occurrence of the MP fault in the post-parity generation stage, according to Embodiment 4.

FIG. 70 shows a transition write process performed upon the occurrence of the MP fault in the post-parity generation stage, according to Embodiment 4. The operation targets shown in this sequence diagram are the same as those shown in the sequence diagrams related to the normal write process.

Once the MP 121 free of faults recognizes a fault in another MP 121, the MP 121 acknowledges that each process stage information item of the SM 132 indicates the post-parity generation stage. Accordingly, the MP 121 transfers the new user data from the CM 131 to the BEPK 140 and performs the processes S8140 and S8150, as in the normal write process.

The MP 121 then clears the process stage information items.

The above is the second specific example of the transition write process. In the present embodiment, it is guaranteed that the new parity is written into the physical page of the parity FMPK 144P as long as the process stage information item indicates the post-parity generation stage. Therefore, the MP 121 that carries out the transition process can take over the write process, from the point where the new user data is written (S8140), and complete the write process.

According to this embodiment, the other MPs 121 can take over the write process to perform the transition write process, even when the MP fault occurs in the pre-parity generation stage or the post-parity generation stage. Similarly, data loss does not occur even when the simultaneous point of fault occurs in the plurality of MPPKs 120, the plurality of CMPKs 130, the plurality of BEPKs 140 and the plurality of FMPKs 144.

Write Process to FMPK 144 According to Embodiment 4

The FMPK states in the aforementioned write process are now described hereinafter.

The FMPK 144 here is the same as the parity FMPK 144P.

FIG. 71 shows a state of the parity FMPK 144P in the FMPK state 1a according to Embodiment 4. In the following description, the logical page that is designated by a command sent from the controller 100 to the parity FMPK 144P is referred to as "target logical page." Of the entries of the pointer table shown in the memory 1445 of the FMPK 144, the entry corresponding to the target logical page is referred to as "target entry 1449." The target entry 1449 has a field for a logical page address, which is a logical address designating the target logical page, a field for an old physical page address, which is a physical address designating an old physical page, a field for a new physical page address, which is a physical address designating a new physical page, and a field for a temporary physical page address, which is a physical address designating a temporary physical page. In the diagram and the following description, in the target entry 1449, the logical page address is called "LA," the old physical page address "oPA," the new physical page address "nPA," and the temporary physical page address "tPA." In addition, the value of the logical page address is described as "LBA xxxx," and the values of the old physical page address, the new physical page address, and the temporary physical page address are described as "p0," "p1," "p2," "p3," and "p4."

In the parity FMPK 144P under the FMPK state 1a, the old parity is stored in the old physical page. Furthermore, the logical page address and the old physical page address are associated with each other and stored in the target entry 1449.

FIG. 72 shows an FMPK state 2a according to Embodiment 4. In the parity FMPK 144P under the FMPK state 2a, the old parity is stored in the old physical page, and the old user data is stored in the temporary physical page. The correspondence relationship among the logical page address, the old physical page address, and the temporary physical page address is stored in the target entry 1449.

FIG. 73 shows an FMPK state 3a according to Embodiment 4. In the parity FMPK 144P under the FMPK state 3a, the old data is stored in the old physical page, the old user data is stored in the temporary physical page, and the new parity in the new physical page. The correspondence relationship among the logical page address, the old physical page address, the temporary physical page address, and the new physical page address is stored in the target entry 1449.

Operations by FMPK 144 Based on Commands, According to Embodiment 4

Next are described operations that are performed in Embodiment 4 by the FMPK 144 under the FMPK states and based on commands upon the occurrence of system faults under the FMPK states.

Figure 74:
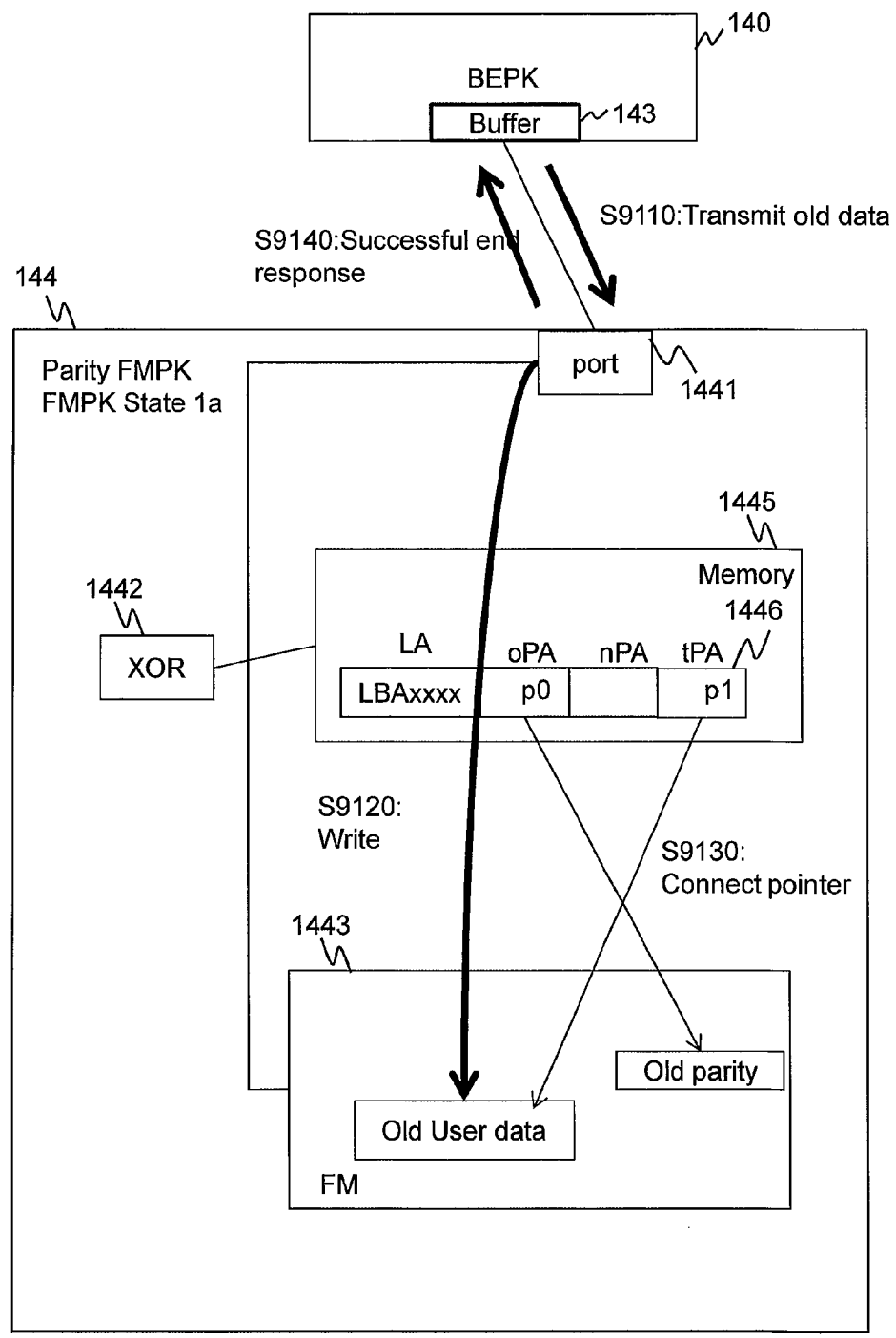
FIG. 74 shows an operation performed based on an old data transmission command under the FMPK state 1a, according to Embodiment 4.

FIG. 74 shows an operation performed based on the old data transmission command under the FMPK state 1a, according to Embodiment 4. First, the parity FMPK 144P receives the old data transmission command from the BEPK 140 of the controller 100 (S9110). This old data transmission command accompanies the old user data. The parity FMPK 144P then writes the old user data into the temporary physical page different from the old physical page (S9120). Next, the parity FMPK 144P performs the pointer connection on the old user data by designating the temporary physical page for the temporary physical page address of the target entry 1449 (S9130). The parity FMPK 144P then sends a normal end response to the controller 100 (S9140). With the old data transmission command, the parity FMPK 144P can write the received data into the physical page different from the old parity, without overwriting the data into the old parity. As a result of transmitting the old data transmission command to the parity FMPK in the FMPK state 1a, the FMPK state transits to the FMPK state 2a.

Figure 75:
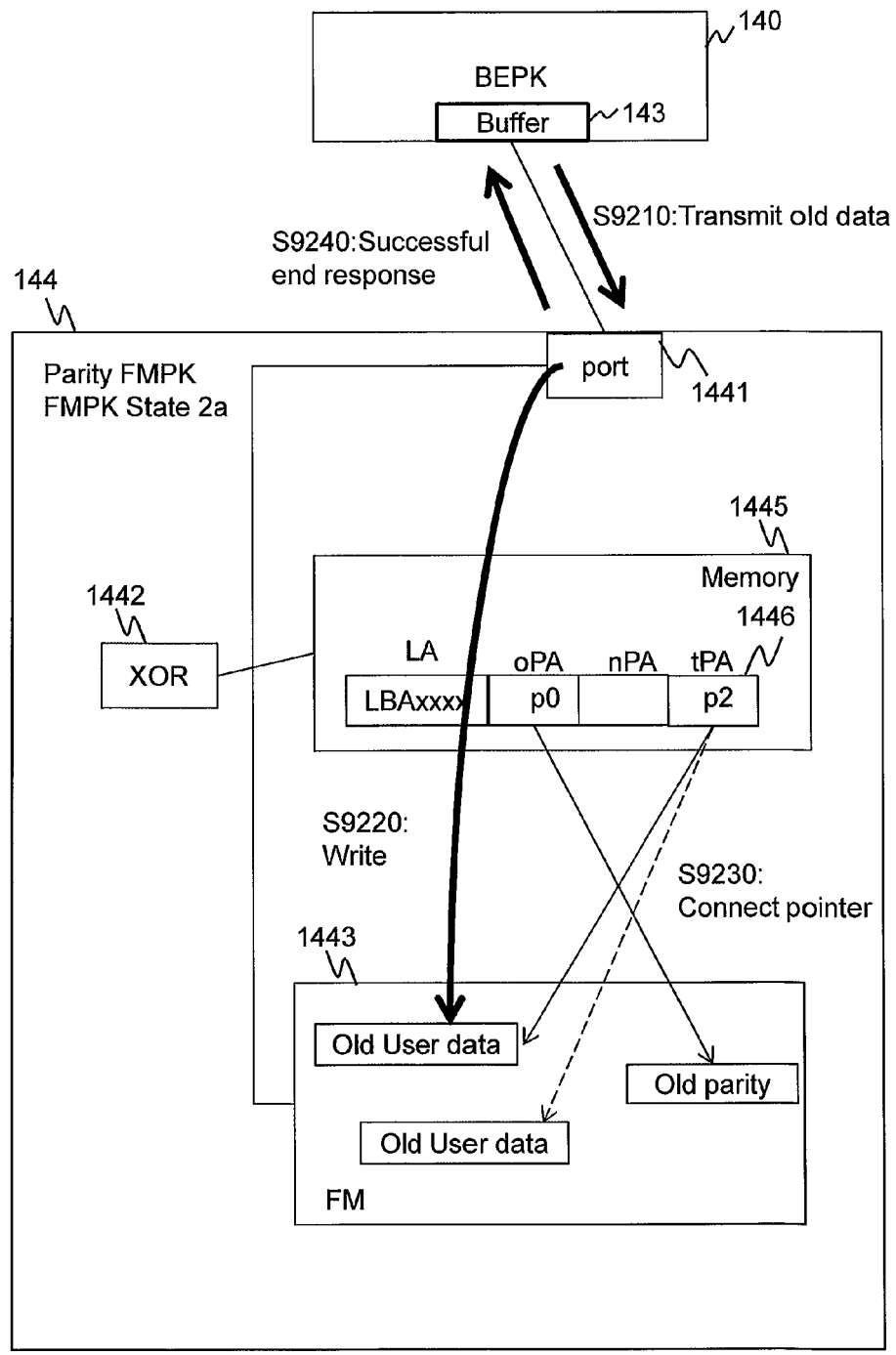
FIG. 75 shows an operation performed based on the old data transmission command under the FMPK state 2a, according to Embodiment 4.

FIG. 75 shows an operation performed by the parity FMPK 144P under the FMPK state 2a based on the old data transmission command, according to Embodiment 4. First, the parity FMPK 144P receives the old data transmission command from the BEPK 140 of the controller 100 (S9210). This old data transmission command accompanies the old user data. The parity FMPK 144P then secures an additional temporary physical page, which is a physical page different from the temporary physical page, and writes the old user data into the additional temporary physical page (S9220). Subsequently, the parity FMPK 144P performs the pointer replacement for replacing the first temporary data of the temporary physical page with the first temporary data of the additional temporary physical page, by designating the additional temporary physical page for the temporary physical page address of the target entry 1449 (S9230). The parity FMPK 144P then sends a normal end response to the controller 100 (S9240). This process is carried out during the transition write process when a fault occurs after the transmission of the old data (S8120) in the pre-parity generation stage. In other words, even when the old data transmission command is transmitted to the parity FMPK in the FMPK state 2a, the state same as the FMPK state 2a can be obtained.

Figure 76:
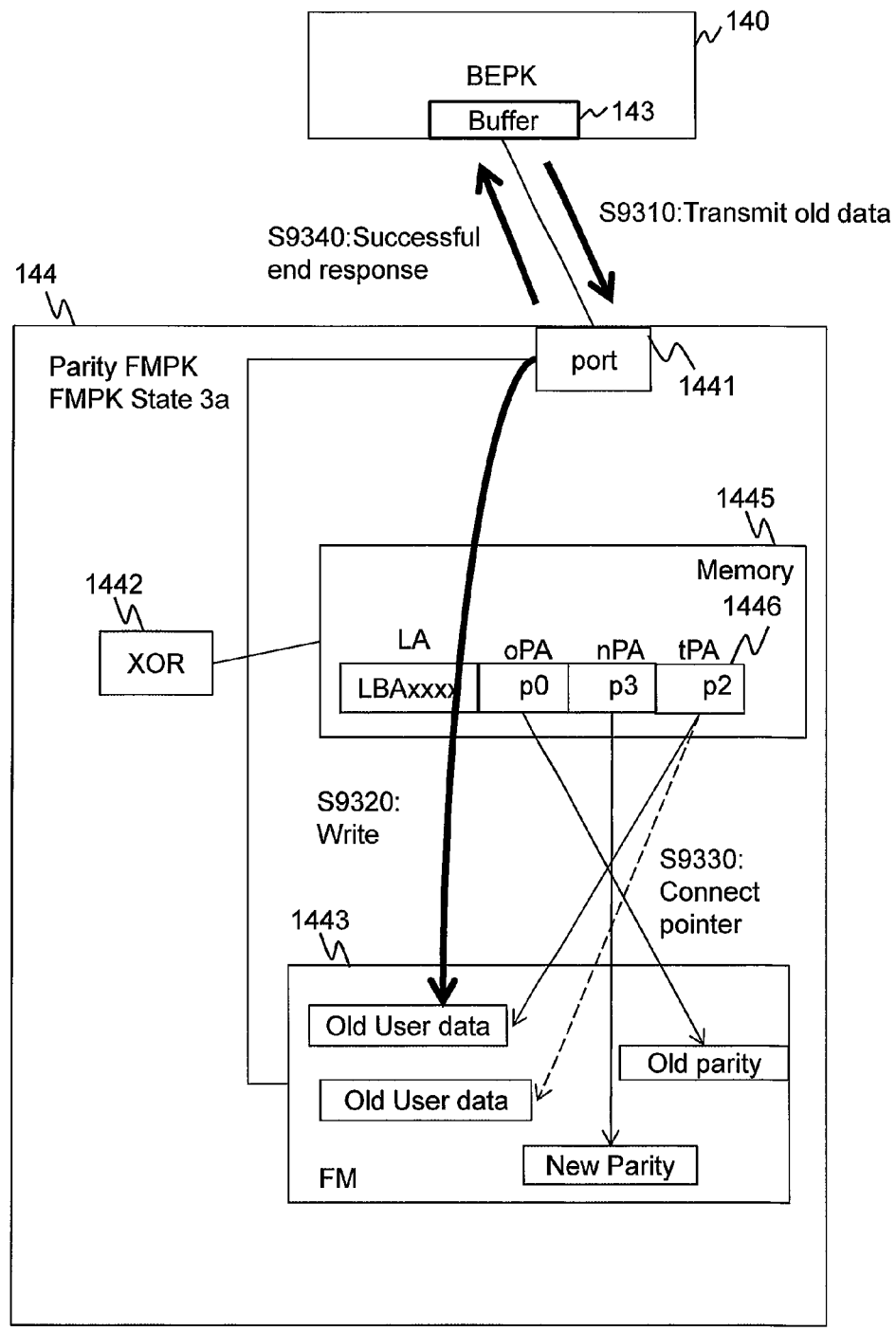
FIG. 76 shows an operation performed based on the old data transmission command under the FMPK state 3a, according to Embodiment 4.

FIG. 76 shows an operation performed based on the old data transmission command in the parity FMPK 144P under the state 3a, according to Embodiment 4. First, the FMPK 144 receives the old data transmission command from the BEPK 140 of the controller 100 (S9310). This old data transmission command accompanies the first temporary data. The parity FMPK 144P then writes the first temporary data into the additional temporary physical page (S9320). Subsequently, the parity FMPK 144P performs the pointer replacement for replacing the first temporary data of the temporary physical page with the first temporary data of the additional temporary physical page, by designating the additional temporary physical page for the temporary physical page address of the target entry 1449 (S9330). Then, the parity FMPK 144P sends a normal end response to the controller 100 (S9340). This process is carried out during the transition write process when a fault occurs after the transmission of the new data (S8130) in the pre-parity generation stage. In other words, even when the old data transmission command is transmitted to the parity FMPK in the FMPK state 3a, the state same as the FMPK state 3a can be obtained.

Figure 77:
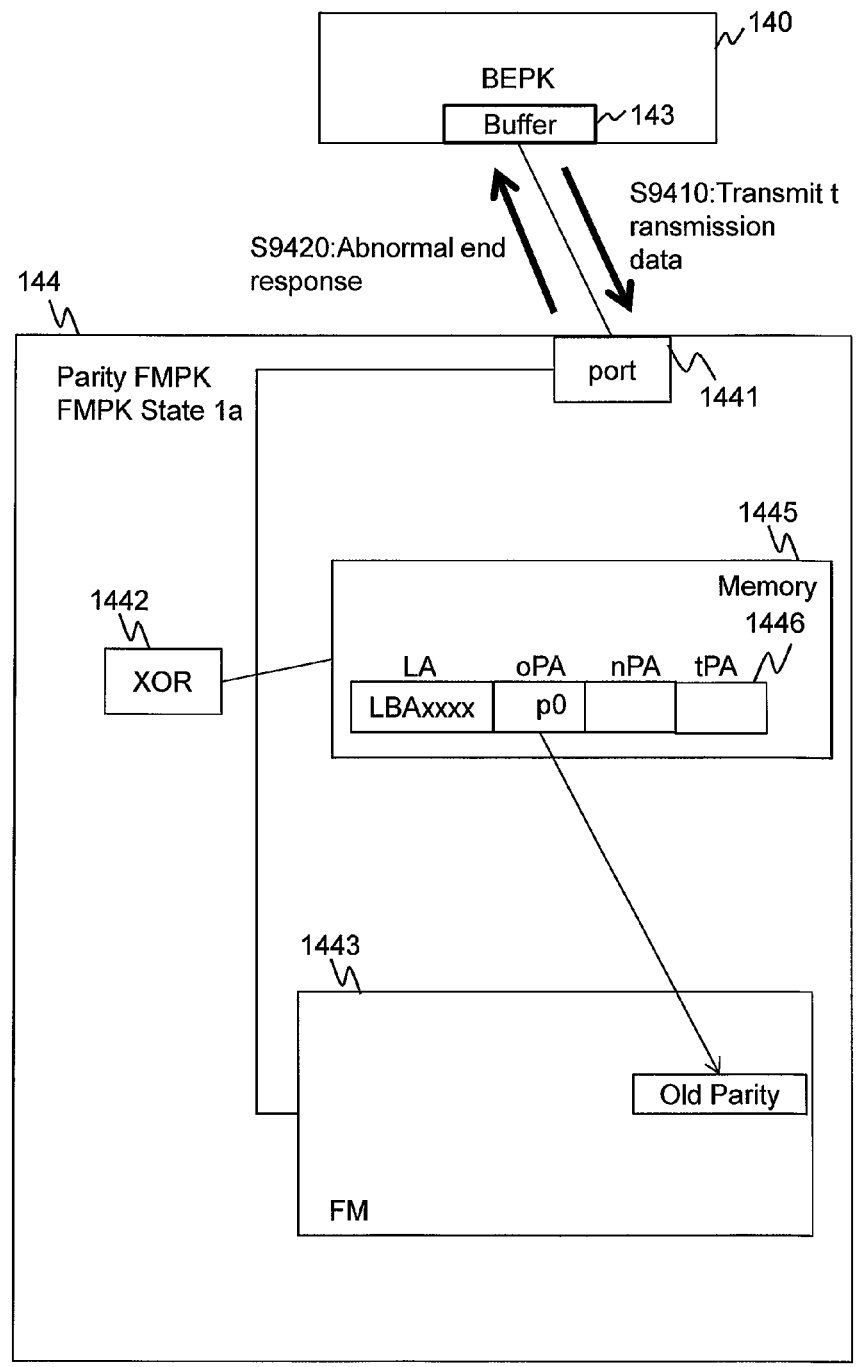
FIG. 77 shows an operation performed based on a new data transmission command under the FMPK state 1a, according to Embodiment 4.

FIG. 77 shows an operation performed based on the new data transmission command under the FMPK state 1a, according to Embodiment 4. First, the parity FMPK 144P receives the new data transmission command from the BEPK 140 of the controller 100 (S9410). This new data transmission command accompanies second temporary data. The second temporary data is the same as the new user data obtained in the aforementioned write process. The FMPK 144 then sends an abnormal end response to the controller 100 (S9420).

Figure 78:
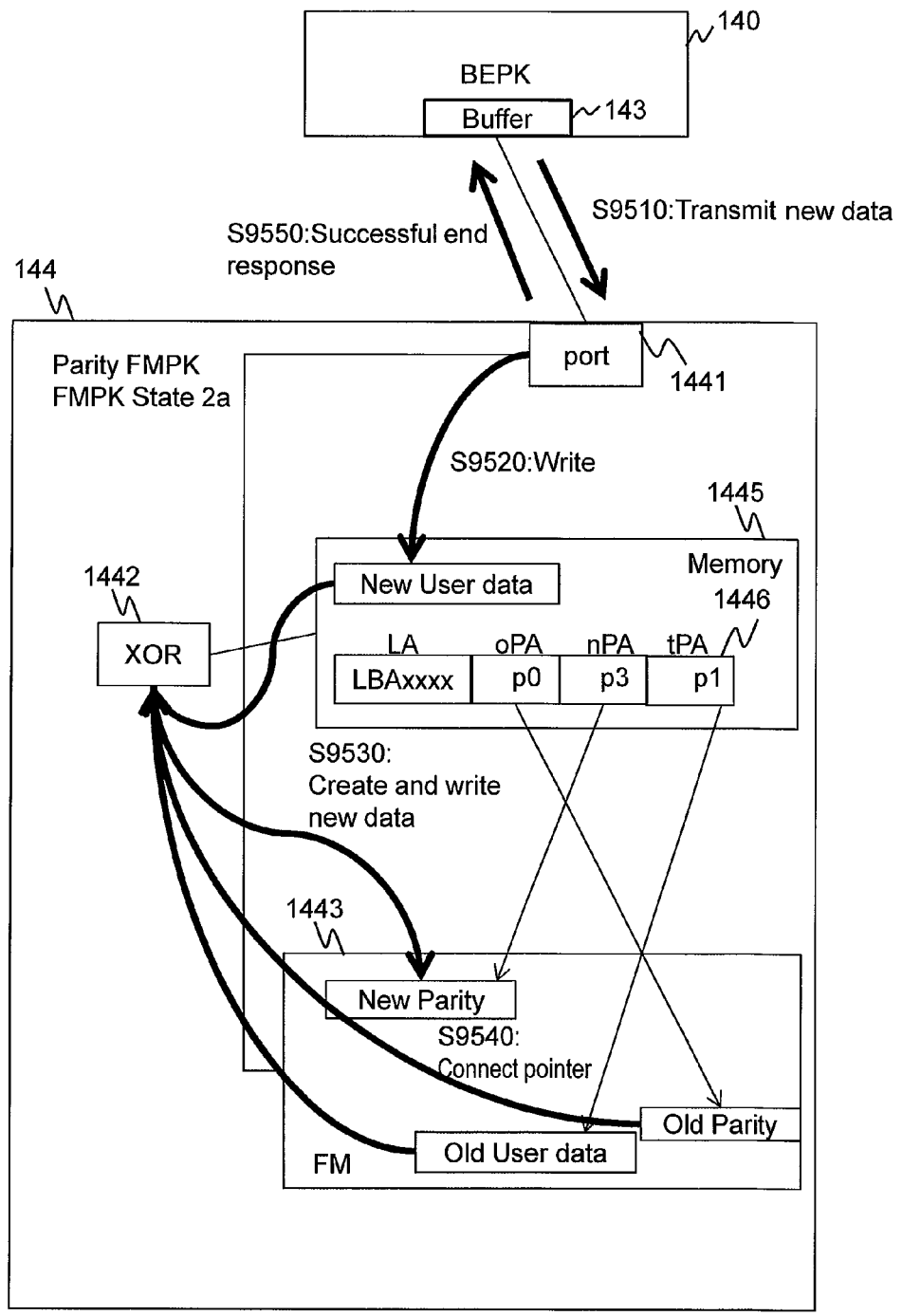
FIG. 78 shows an operation performed based on the new data transmission command under the FMPK state 2a, according to Embodiment 4.

FIG. 78 shows an operation performed based on the new data transmission command under the FMPK state 2a, according to Embodiment 4. First, the parity FMPK 144P receives the new data transmission command from the BEPK 140 of the controller 100 (S9510). This new data transmission command accompanies the new user data. The FMPK 144 then writes the new user data into the memory 1445 (S9520). Next, the FMPK 144 reads the old parity in the old physical page and old user data in the temporary physical page, and the new user data stored in the memory 1445, generates the new parity by means of the XOR circuit 1442, and writes the new data into the new physical page (S9530). Subsequently, the FMPK 144 performs the pointer connection on the new parity by designating the new physical page for the new physical page address of the target entry 1449 (S9540). The FMPK 144 then sends a normal end response to the controller 100 (S9550). As a result of transmitting the new data transmission command to the parity FMPK in the FMPK state 2a, the FMPK state transits to the FMPK state 3a.

Figure 79:
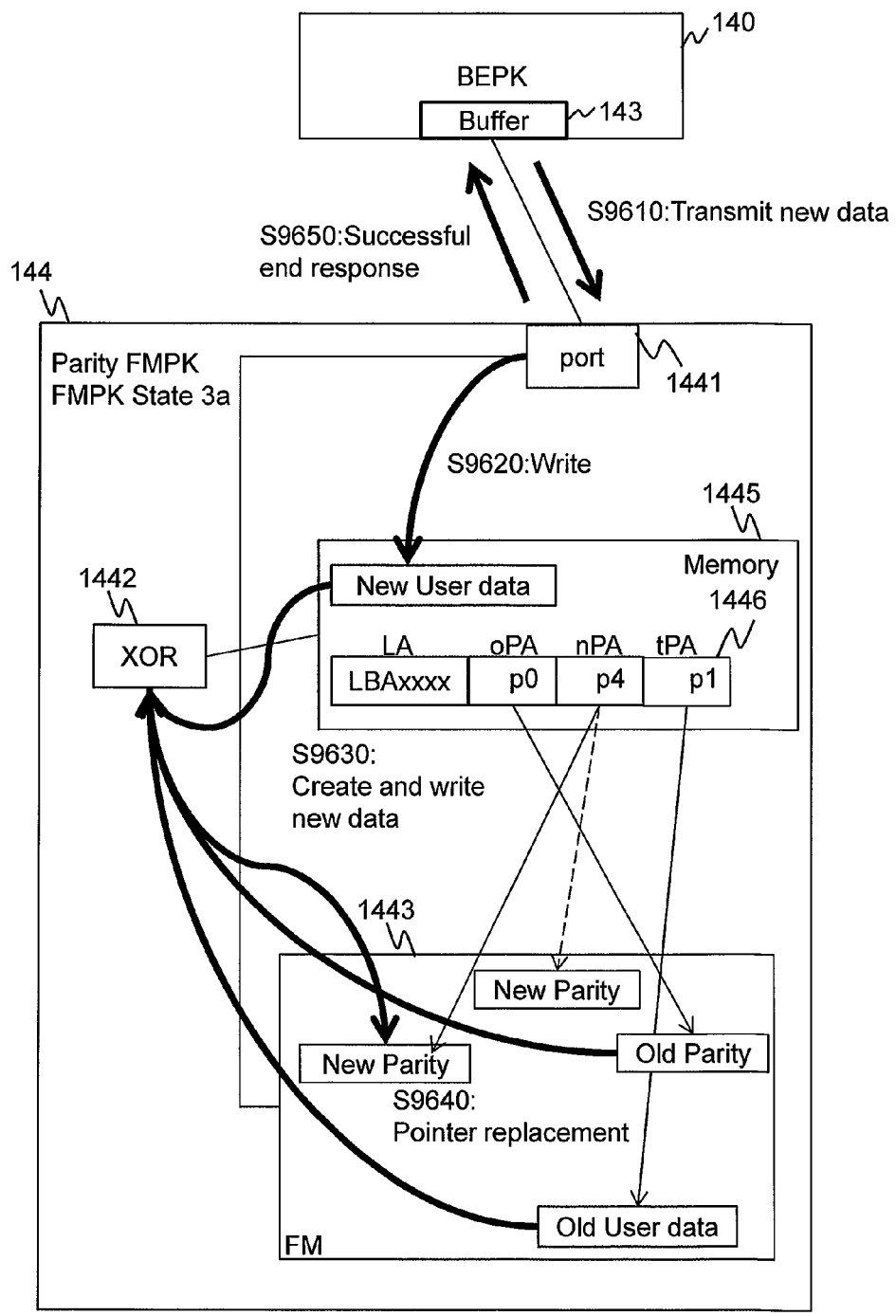
FIG. 79 shows an operation performed based on the new data transmission command under the FMPK state 3a, according to Embodiment 4.

FIG. 79 shows an operation performed based on the new data transmission command under the FMPK state 3a, according to Embodiment 4. First, the parity FMPK 144P receives the new data transmission command from the BEPK 140 of the controller 100 (S9610). This new data transmission command accompanies the new user data. The FMPK 144 then writes the new user data into the memory 1445 (S9620). The parity FMPK 144P then reads the old data stored in the old physical page, the old user data stored in the temporary physical page, and the new user data stored in the memory 1445, generates the new data by means of the XOR circuit 1442, secures an additional physical page, which is a physical page different from the new physical page, and writes the new data into the additional physical page (S9630). Subsequently, the parity FMPK 144P performs the pointer replacement for replacing the new data stored in the new physical page with the new data stored in the additional physical page, by designating the additional physical page for the new physical page address of the target entry 1449 (S9640). Subsequently, the parity FMPK 144P sends a normal end response to the controller 100 (S9650). This process is carried out during the transition write process, subsequent to the one shown in FIG. 76, when a fault occurs after the transmission of the new data (S8130) in the pre-parity generation stage. In other words, even when the old data transmission command is transmitted to the parity FMPK in the FMPK state 3a, the same FMPK state 3a can be obtained.

In this manner, regardless of the presence/absence of a system fault, the MP 121 can change the FMPK state to the FMPK state 3a by issuing the command from the old data reading process, as long as the process stage information item indicates the pre-parity generation stage.

Figure 80:
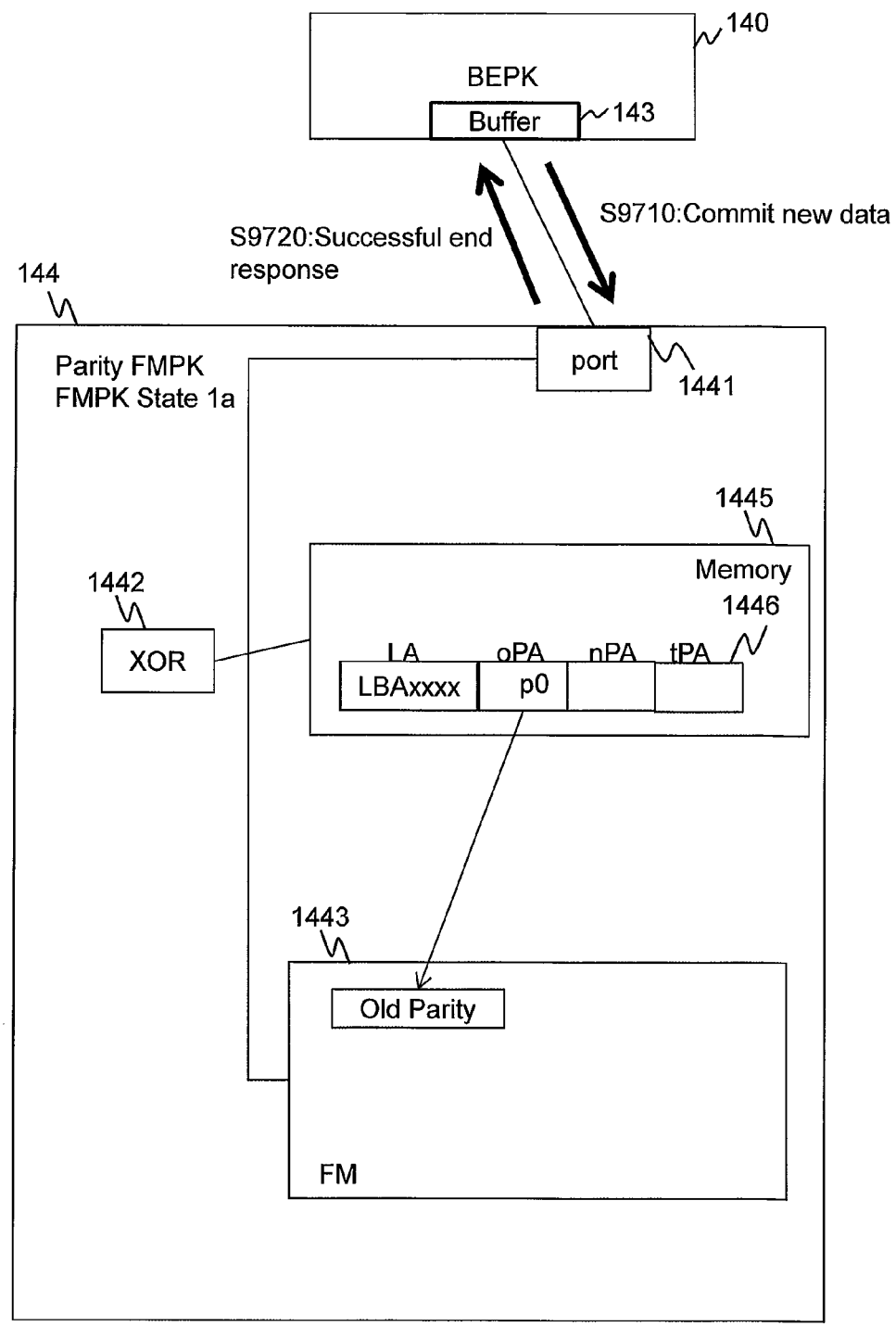
FIG. 80 shows an operation performed based on the new data commit command under the FMPK state 1a, according to Embodiment 4.

FIG. 80 shows an operation performed based on the new data commit command under the state 1a, according to Embodiment 4. First, the parity FMPK 144P receives the new data commit command from the BEPK 140 of the controller 100 (S9710). The new data commit command designates the logical page in which the new data is stored. The parity FMPK 144P then sends a normal end response to the controller 100 (S9720). This process is carried out during the transition write process when a fault occurs after the transmission of the new data commit command (S8150) in the post-parity generation stage.

Figure 81:
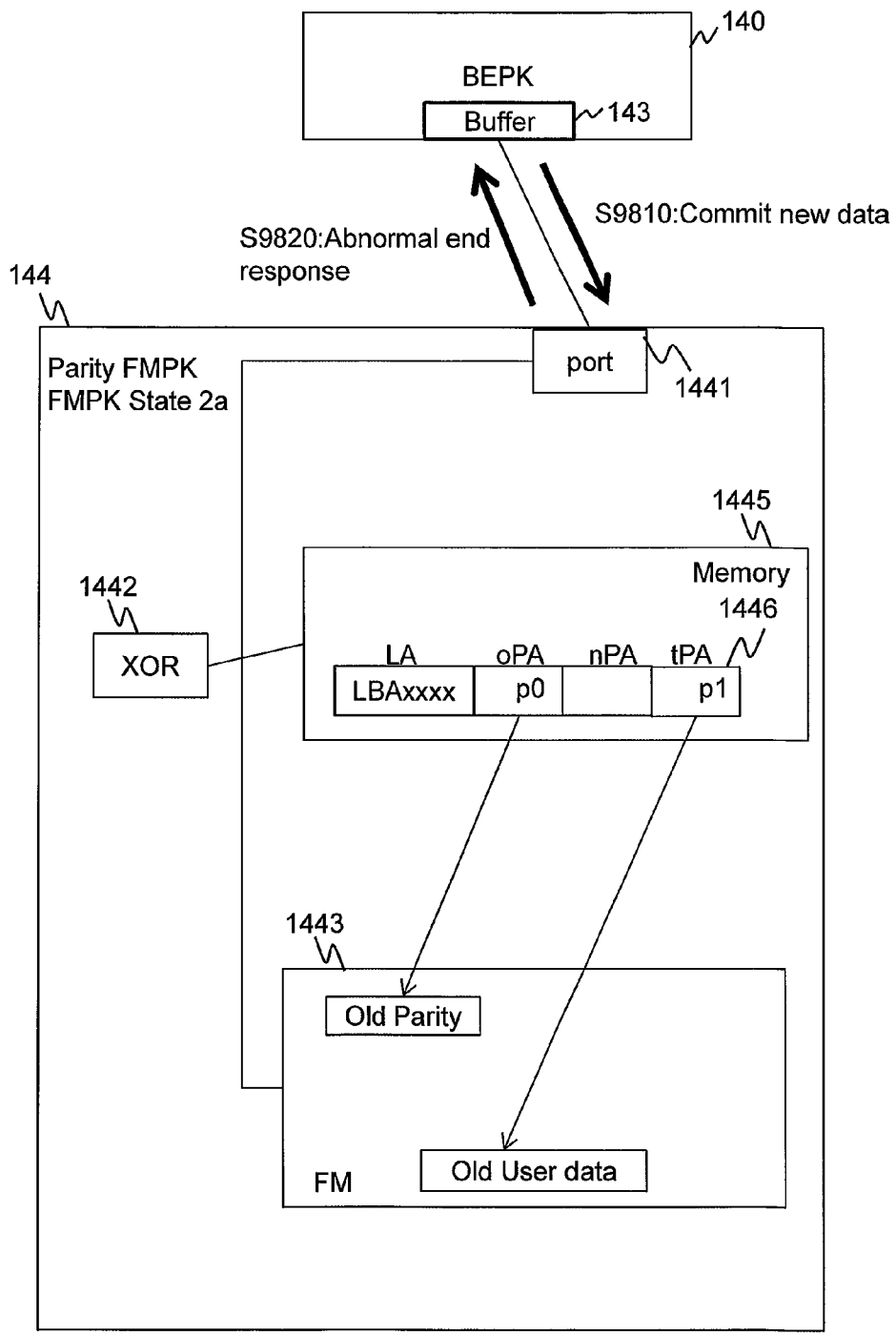
FIG. 81 shows an operation performed based on the new data commit command under the FMPK state 2a, according to Embodiment 4.

FIG. 81 shows an operation performed based on the new data commit command under the state 2a, according to Embodiment 4. First, the parity FMPK 144P receives the new data commit command from the BEPK 140 of the controller 100 (S9810). This new data commit command designates the logical page having the new data stored therein. The parity FMPK 144P then sends an abnormal end response to the controller 100 (S9820).

Figure 82:
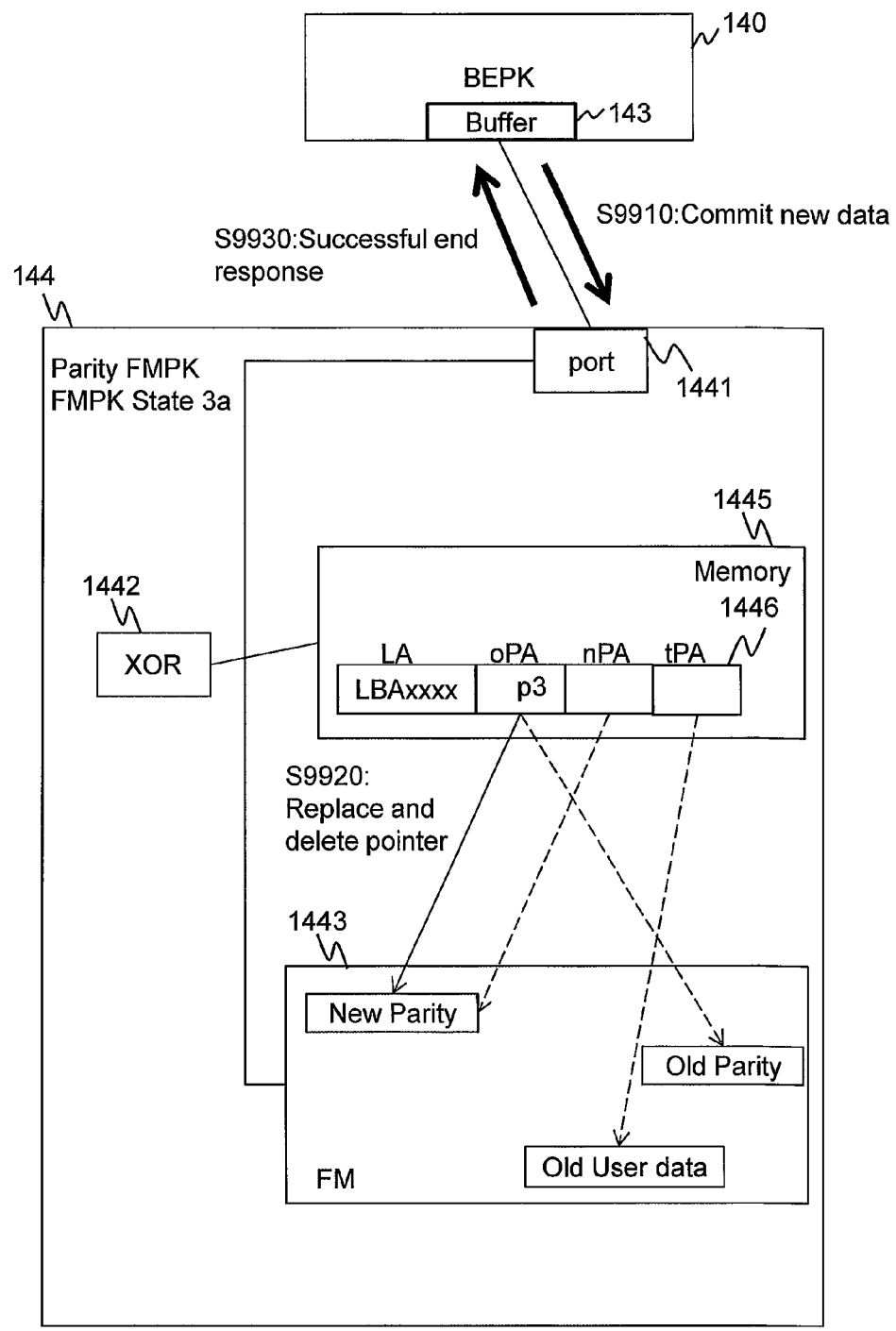
FIG. 82 shows an operation performed based on the new data commit command under the FMPK state 3a, according to Embodiment 4.

FIG. 82 shows an operation performed based on the new data commit command under the state 3a, according to Embodiment 4. First, the parity FMPK 144P receives the new data commit command from the BEPK 140 of the controller 100 (S9910). This new data commit command designates the logical page in which the new data is stored. The parity FMPK 144P then performs the pointer replacement for replacing the old data stored in the old physical page with the new data stored in the new physical page, by designating the new physical page for the old physical page address of the target entry 1449, and performs the pointer deletion on the first temporary data stored in the temporary physical page, by clearing the temporary physical page address (S9920). Next, the parity FMPK 144P sends a normal end response to the controller 100 (S9930). As a result of this process, the state can transit to a state in which the new parity is determined in the parity FMPK 144P, even upon the occurrence of a fault prior to the transmission of the new data commit command in the post-parity generation stage. In this manner, defining each of the commands can allow the process to be taken over even upon the occurrence of a system fault and prevent the occurrence of data loss. In addition, in the present embodiment, when the process stage information item indicates the two stages, "pre-parity generation stage" and "post-parity generation stage," the process is taken over upon the occurrence of a fault, whereby the number of accesses to the SM 132 for recording the process stage information item therein and the access load can be reduced.

Embodiment 5

This embodiment has the same functions as those described in Embodiment 2 but illustrates a situation where the XOR circuit 1442 of the FMPK 144 supports only an XPWRITE function of the SCSI command. Furthermore, in the present embodiment, the process stage information item stored in the SM 132 indicates the pre-parity generation stage, the stage in process of parity media update, and the post-parity generation stage.

Write Process According to Embodiment 5

A normal write process is now described hereinafter.

Figure 83:
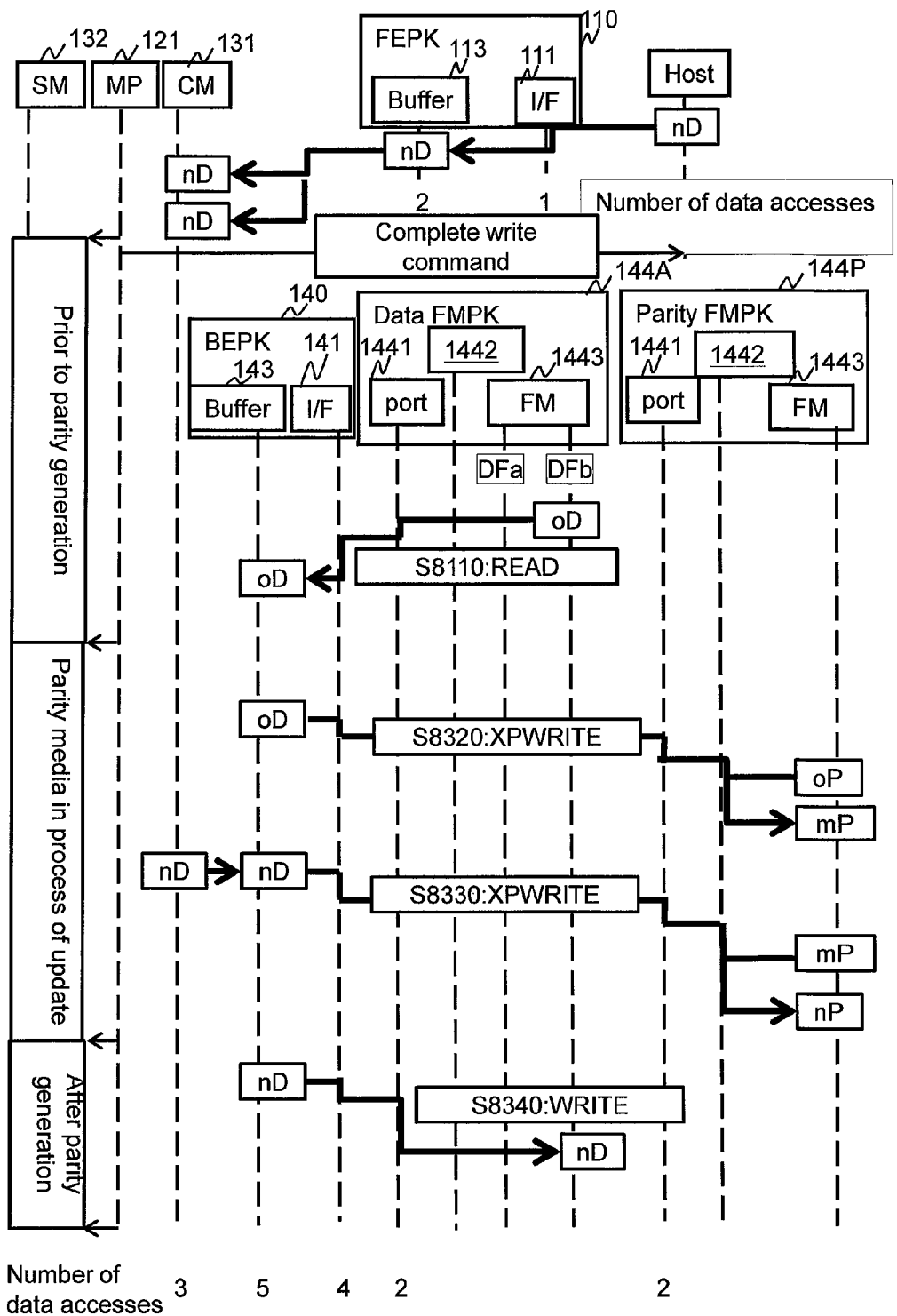
FIG. 83 shows a write process according to Embodiment 5.

FIG. 83 shows a write process according to Embodiment 5. In this sequence diagram, the DFa and DFb of the data FMPK 144A represent the memory 1445 and the FM 1443 (physical page) of the data FMPK 144A. Also, the DFa and the DFb of the parity FMPK 144P represent the memory 1445 and the FM 1443 (physical page) of the parity FMPK 144P. The key components of the operations shown in this sequence diagram are the same as those shown in the sequence diagrams related to the write process according to Embodiment 2.

First, the MP 121 performs the processes S2110 to S2350, as in the write process according to Embodiment 1. The MP 121 accordingly changes the values of the process stage information items of the two SMs 132 corresponding to the regions of the two CMs 131 having the new user data stored therein, to the pre-parity generation, as in the write process according to Embodiment 1.

The MP 121 then performs the process S8110, as in the write process according to Embodiment 4. Consequently, the BEPK 140 receives the old user data from the data FMPK 144A and writes the old user data into the buffer 143. The MP 121 accordingly changes the value of each process stage information to the parity media update.

Subsequently, the MP 121 sends the XPWRITE command to the parity FMPK 144P (S8320). This XPWRITE command designates the logical page having the old parity stored therein, and accompanies the old user data. At this moment, in response to an instruction from the MP 121, the BEPK 140 reads the old user data from the buffer 143, and sends the old user data to the parity FMPK 144P.

Subsequently, the parity FMPK 144P receives the XPWRITE command and the old user data from the controller 100. The parity FMPK 144P accordingly writes the old user data into the memory 1445, reads the old parity from the FM 1443, reads the old user data from the memory 1445, generates the intermediate parity using the XOR circuit 1442, and writes the intermediate parity into the memory 1445 of the FM 1443. The parity FMPK 144P then notifies the controller 100 of a normal end of the XPWRITE command.

Subsequently, the MP 121 is notified by the parity FMPK 144P of the normal end of the XPWRITE command.

Accordingly, the MP 121 sends the XPWRITE command to the parity FMPK 144P (S8330). This XPWRITE command designates the physical address of the memory 1445 having the intermediate parity stored therein, and accompanies the new user data. At this moment, in response to an instruction from the MP 121, the BEPK 140 reads the new user data from the CM 131, writes the new user data into the buffer 143, reads the new user data from the buffer 143, and sends the new user data to the parity FMPK 144P.

Next, the parity FMPK 144P receives the XPWRITE command and the new user data from the controller 100. The parity FMPK 144P accordingly writes the new user data into the memory 1445, reads the intermediate parity from the memory 1445, reads the new user data from the memory 1445, generates the new parity from the intermediate parity and the new user data by means of the XOR circuit 1442, and writes the new parity into the FM 1443. The parity FMPK 144P then notifies the controller 100 of a normal end of the XPWRITE command.

Subsequently, the MP 121 is notified by the parity FMPK 144P of the normal end of the XPWRITE command. The MP 121 accordingly changes the value of each process stage information item to the post-parity generation stage.

The MP 121 then sends the normal write command to the data FMPK 144A (S8340). This normal write command accompanies the new user data.

The data FMPK 144A then receives the normal write command and the new user data from the controller 100. The data FMPK 144A accordingly writes the new user data into the FM 1443 and notifies the controller 100 of a normal end of the normal write command.

Subsequently, the MP 121 is notified by the data FMPK 144A of the normal end of the normal write command. The MP 121 accordingly clears the value of each process stage information item.

The Above is the Write Process.

In this manner, the controller 100 sends the old user data from the buffer 143 to the parity FMPK 144P without writing the old user data received from the data FMPK 144A into the CM 131. As a result, the number of accesses to the CM 131 during the write process is reduced, thereby the number of accesses to the CM 131 can be reduced.

Moreover, according to this embodiment, the reliability of the storage system 10 can be improved by storing the new user data and each process stage information item into the two CMPKs 130.

Specific Examples of Transition Write Process According to Embodiment 5

Several specific examples of a transition write process performed upon the occurrence of an MP fault are described hereinafter.

First Specific Example of Transition Write Process According to Embodiment 5

Here is described a transition write process that is performed upon the occurrence of an MP fault in the pre-parity generation stage.

Figure 84:
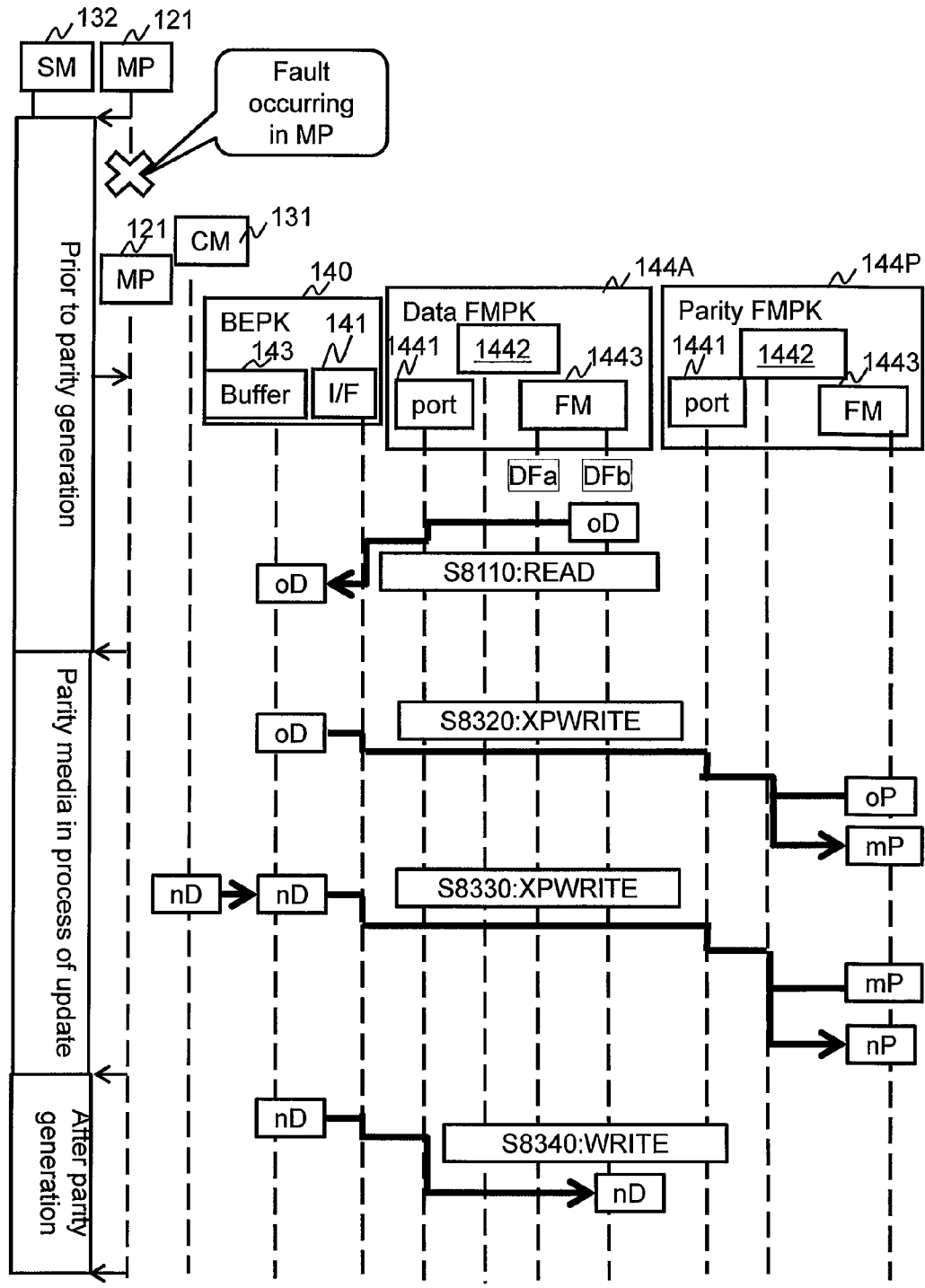
FIG. 84 shows a transition write process performed upon the occurrence of the MP fault in the pre-parity generation stage, according to Embodiment 5.

FIG. 84 shows the transition write process performed upon the occurrence of the MP fault in the pre-parity generation stage, according to Embodiment 5. The operation targets shown in this sequence diagram are the same as those illustrated in the sequence diagrams related to the normal write process.

Once the MP 121 free of faults recognizes a fault in another MP 121, the MP 121 acknowledges that the process stage information item indicates the pre-parity generation stage. Accordingly, the MP 121 performs the processes S8110 to S8340, as in the normal write process. In other words, when the process stage information item indicates the pre-parity generation stage, the MP 121 takes over the write process, from the point where the old user data is transmitted from the data FMPK 144A to the buffer 143 of the BEPK 140.

Subsequently, the MP 121 clears the process stage information item stored in the SM 132.

The above is the transition write process.

Second Specific Example of Transition Write Process According to Embodiment 5

Here is described a transition write process that is performed upon the occurrence of the MP fault in the mid-stage of parity media update.

Figure 85:
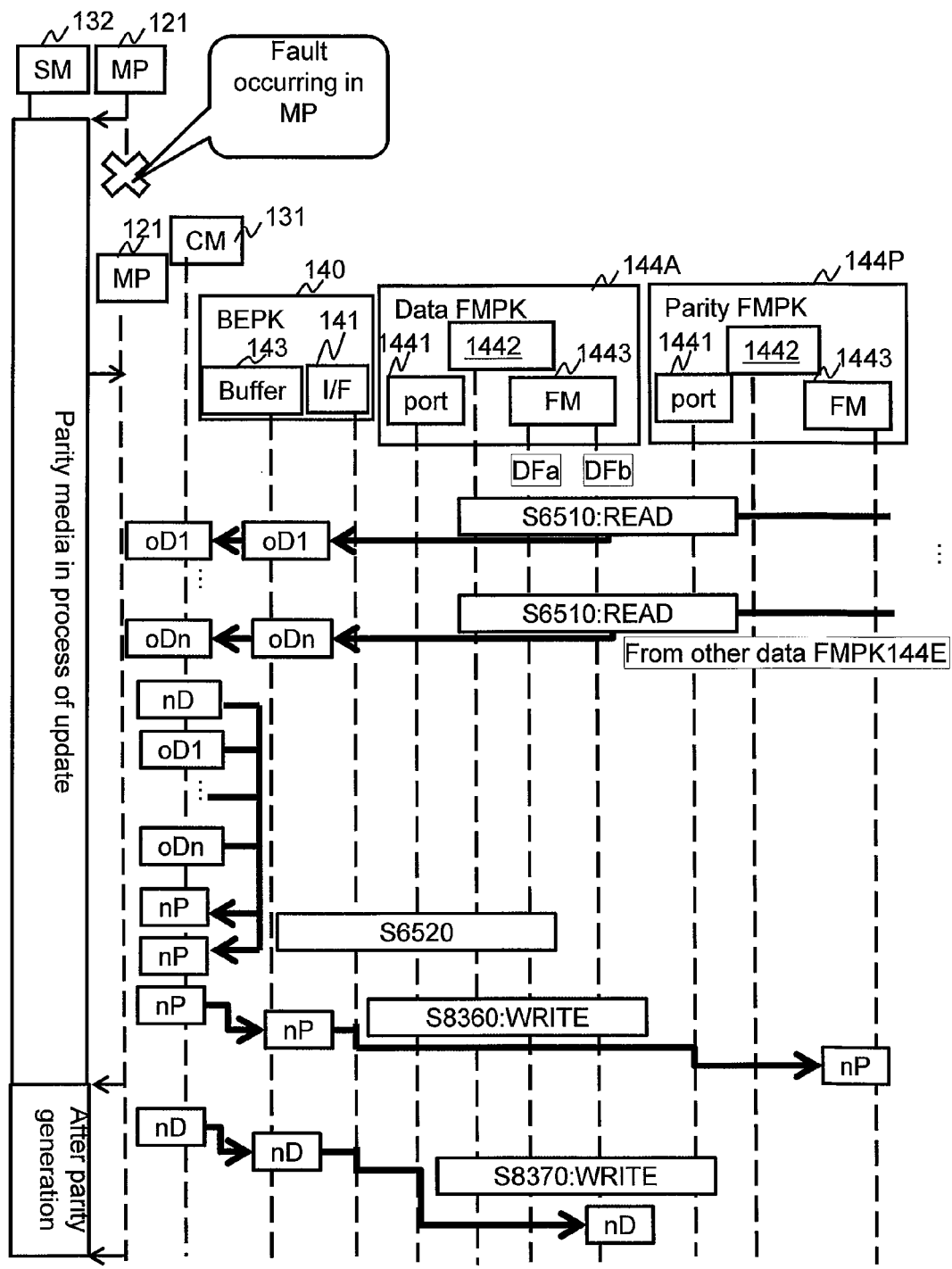
FIG. 85 shows the transition write process performed upon the occurrence of the MP fault in the mid-stage of parity media update, according to Embodiment 5.

FIG. 85 shows the transition write process performed upon the occurrence of the MP fault in the mid-stage of parity media update, according to Embodiment 5. The key operation targets illustrated in this sequence diagram are the same as those shown in the sequence diagrams related to the normal write process.

Once the MP 121 free of faults recognizes the fault occurring in another MP, the MP 121 acknowledges that the process stage information items indicate the mid-stage of parity media update. Accordingly, the MP 121 performs the processes S6510 and S6520, as in the transition write process that is performed upon the occurrence of the MP fault in the mid-stage of parity media update according to Embodiment 2 (see FIG. 56). In other words, the MP 121 free from faults takes over a write process from a process of generating a new parity.

The MP 121 then sends the normal write command to the parity FMPK 144P (S8360). This normal write command accompanies the new parity. Consequently, the BEPK 140 writes the new parity stored in the CM 131 into the buffer 143, and sends the new parity to the parity FMPK 144P. The parity FMPK 144P accordingly writes the new parity into the FM 1443.

Subsequently, the MP 121 is notified by the parity FMPK 144P of a normal end of the normal write command. The MP 121 accordingly changes the value of each process stage information item to the post-parity generation.

The MP 121 then sends the normal write command to the data FMPK 144A (S8370). The normal write command accompanies the new user data. Consequently, the BEPK 140 writes the new user data stored in the CM 131 into the buffer 143, and sends the new user data to the data FMPK 144A. The data FMPK 144A accordingly writes the new user data into the FM 1443.

Subsequently, the MP 121 clears each process stage information item stored in the SM 132.

The above is the transition write process.

Third Specific Example of Transition Write Process According to Embodiment 5

Here is described a transition write process that is performed upon the occurrence of the MP fault in the post-parity generation stage.

Figure 86:
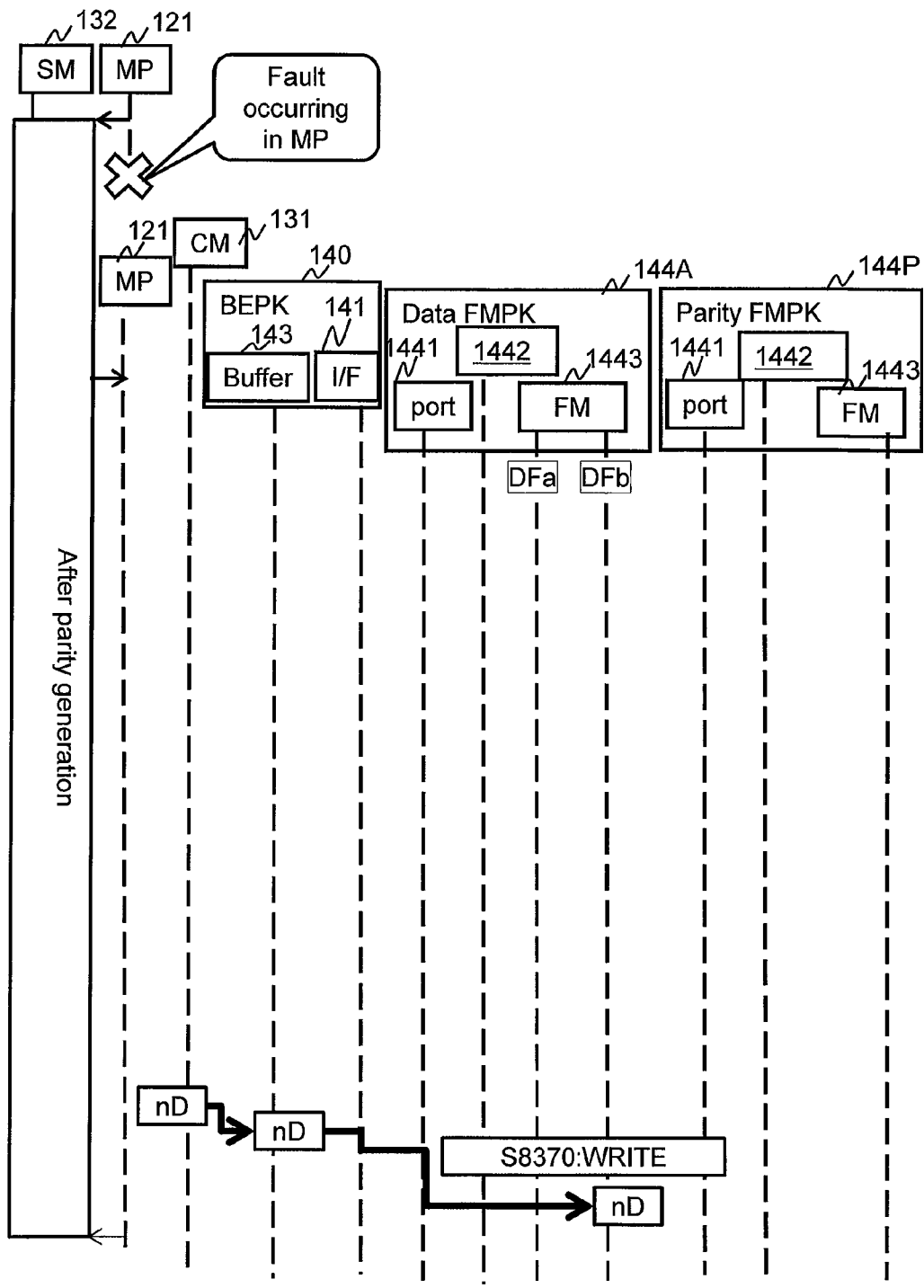
FIG. 86 shows the transition write process performed upon the occurrence of the MP fault in the post-parity generation stage, according to Embodiment 5.

FIG. 86 shows a transition write process performed upon the occurrence of the MP fault in the post-parity generation, according to Embodiment 5. The key components of the operations illustrated in this sequence diagram are the same as those shown in the sequence diagrams related to the normal write process.

Once the MP 121 free of faults recognizes the MP fault, the MP 121 acknowledges that the process stage information items indicate the post-parity generation. Accordingly, the MP 121 performs the process S8370, as in the aforementioned transition write process that is performed upon the occurrence of the MP fault in the parity media update. In other words, the MP 121 free of faults takes over the write process, from the point where the normal write command is sent to the data FMPK 144A (S8370).

Subsequently, the MP 121 clears the process stage information item stored in the SM 132.

The above is the transition write process.

According to these transition write processes (the first specific example to the third specific example), even when the MP fault occurs in the pre-parity generation stage, the stage in process of parity media update, or the post-parity generation stage, which are indicated by the process stage information item, in the present embodiment another MP 121 free of faults can take over the write process to perform the transition write process. Similarly, data loss does not occur in the present embodiment even when the simultaneous point of fault occurs in the plurality of MPPKs 120, the plurality of CMPKs 130, and the plurality of BEPKs 140. Therefore, the reliability of the storage system 10 can be improved.

In addition, this embodiment can realize the same functions as those described in Embodiment 2, by using the XPWRITE function of the FMPK 144.

Embodiment 6

This embodiment has the same configurations as those described in Embodiment 5, and illustrates a situation where the reliability of the storage system 10 is improved more than by Embodiment 5. In this embodiment, the process stage information item stored in the SM 132 indicates the pre-parity generation stage, the stage in process of parity media update, and the post-parity generation stage.

Write Process According to Embodiment 6

A normal write process is described hereinafter.

Figure 87:
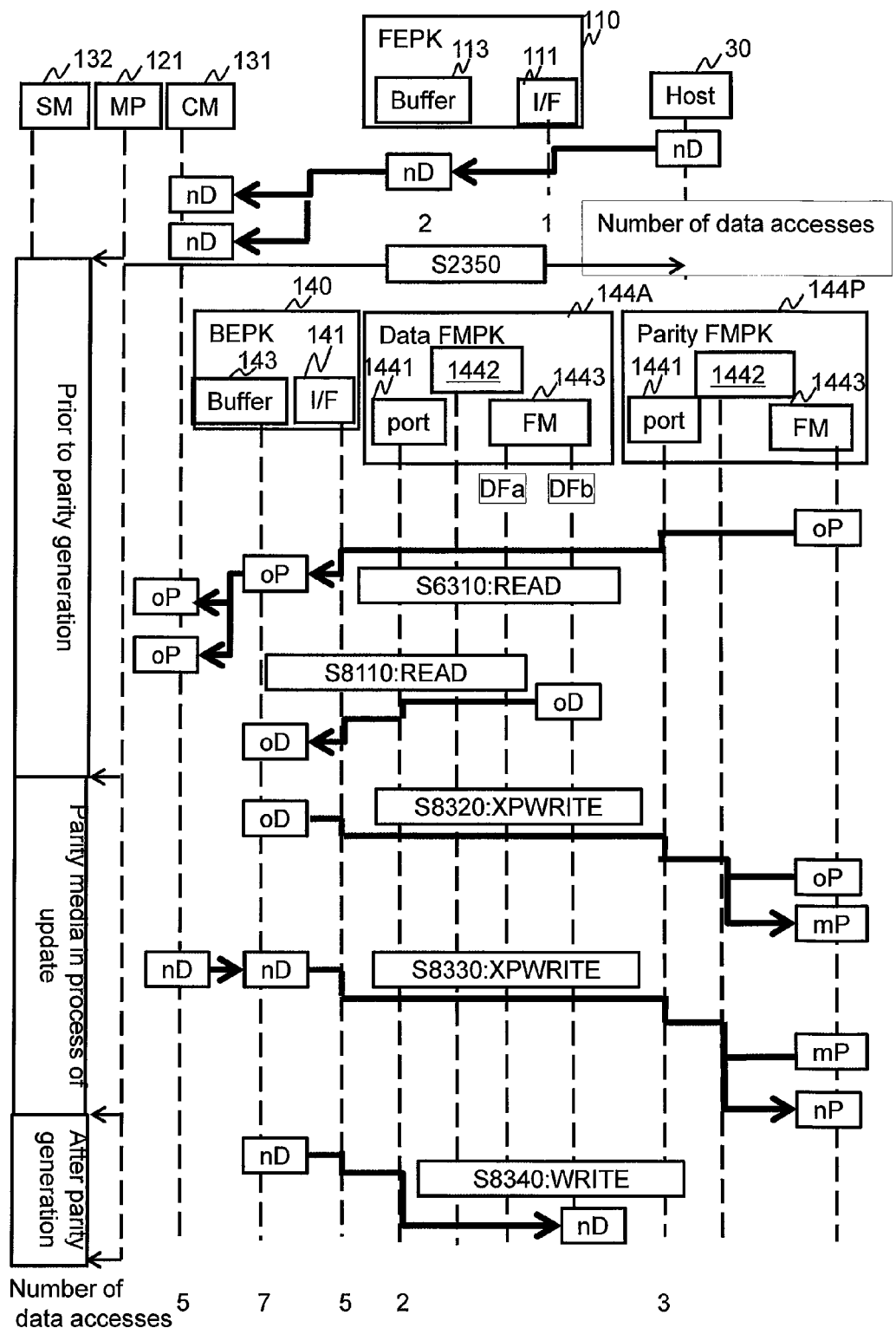
FIG. 87 shows a write process according to Embodiment 6.

FIG. 87 shows a write process according to Embodiment 6. The operation targets illustrated in this sequence diagram are the same as those shown in the sequence diagrams related to the write process according to Embodiment 2.

First, the MP 121 performs the processes S2110 to S2350, as in the write process according to Embodiment 1. The MP 121 accordingly changes the values of the process stage information items of the two SMs 132 corresponding to the two CMs 131 having the new user data stored therein, to the pre-parity generation.

The MP 121 then performs the process S6310, as in the write process according to Embodiment 3. Accordingly, the old parity stored in the parity FMPK 144P is written to the buffer 143.

Subsequently, the MP 121 performs the process S8110, as in the write processes according to Embodiment 4 and Embodiment 5. Accordingly, the old user data stored in the data FMPK 144A is written to the buffer 143. The MP 121 accordingly changes the value of each process stage information item to the of parity media update.

The MP 121 then performs the processes S8320 to S8340, as in the write process according to Embodiment 5. Accordingly, the intermediate parity is generated in the parity FMPK 144P and written to the memory 1445. Additionally, the new user data stored in the CM 131 is written into the buffer 143. The new parity is generated in the parity FMPK 144P and written into the FM 1443.

Accordingly, the MP 121 clears each process stage information item stored in the SM 132.

The Above is the Write Process.

In this manner, the controller 100 sends the old user data from the buffer 143 to the parity FMPK 144P without writing the old user data received from the data FMPK 144A into the CM 131. As a result, the number of accesses to the CM 131 during the write process is reduced.

Furthermore, according to this embodiment, the reliability of the storage system 10 can be improved by storing the new user data, each process stage information, and the old parity in the two CMPKs 130.

Specific Examples of Transition Write Process According to Embodiment 6

Several specific examples of a transition write process performed upon the occurrence of an MP fault are now described hereinafter.

First Specific Example of Transition Write Process According to Embodiment 6

Here is described a transition write process that is performed upon the occurrence of an MP fault in the pre-parity generation stage.

Figure 88:
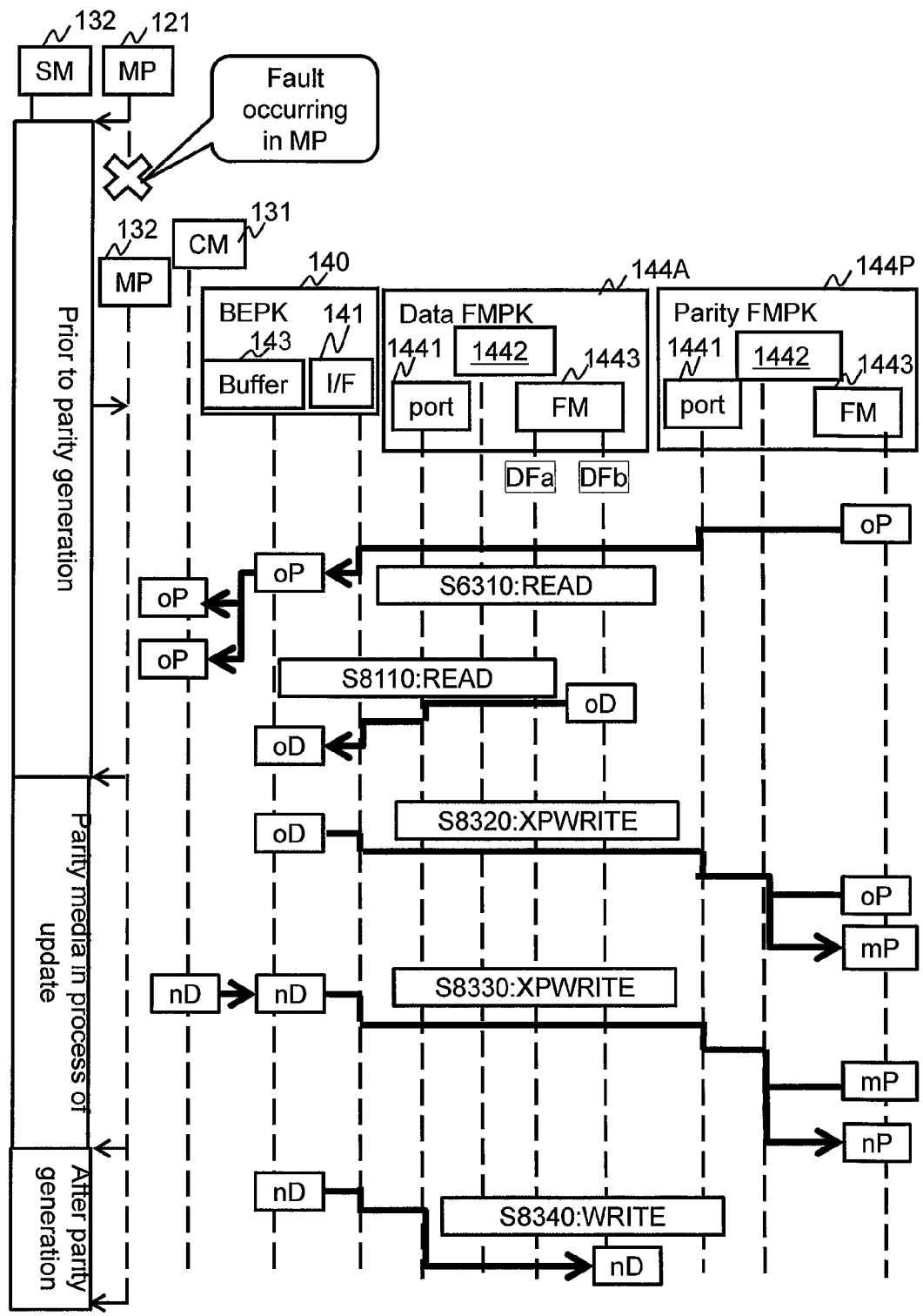
FIG. 88 shows a transition write process performed upon the occurrence of the MP fault in the pre-parity generation stage, according to Embodiment 6.

FIG. 88 shows a transition write process performed upon the occurrence of the MP fault in the pre-parity generation stage, according to Embodiment 6. The operation targets illustrated in this sequence diagram are the same as those shown in the sequence diagrams related to the normal write process.

Once the MP 121 free of faults recognizes a fault occurring in another MP 121, the MP 121 acknowledges that the process stage information item indicates the pre-parity generation stage. Accordingly, the MP 121 performs the processes S6310 to S8340, as in the normal write process. In other words, the MP 121 free of faults takes over the write process, from the point where the old parity stored in the parity FMPK 144P is written to the buffer 143.

The MP 121 accordingly clears the process stage information item stored in the SM 132.

The above is the transition write process.

Second Specific Example of Transition Write Process According to Embodiment 6

Here is described a transition write process that is performed upon the occurrence of the MP fault in the mid-stage of parity media update.

Figure 89:
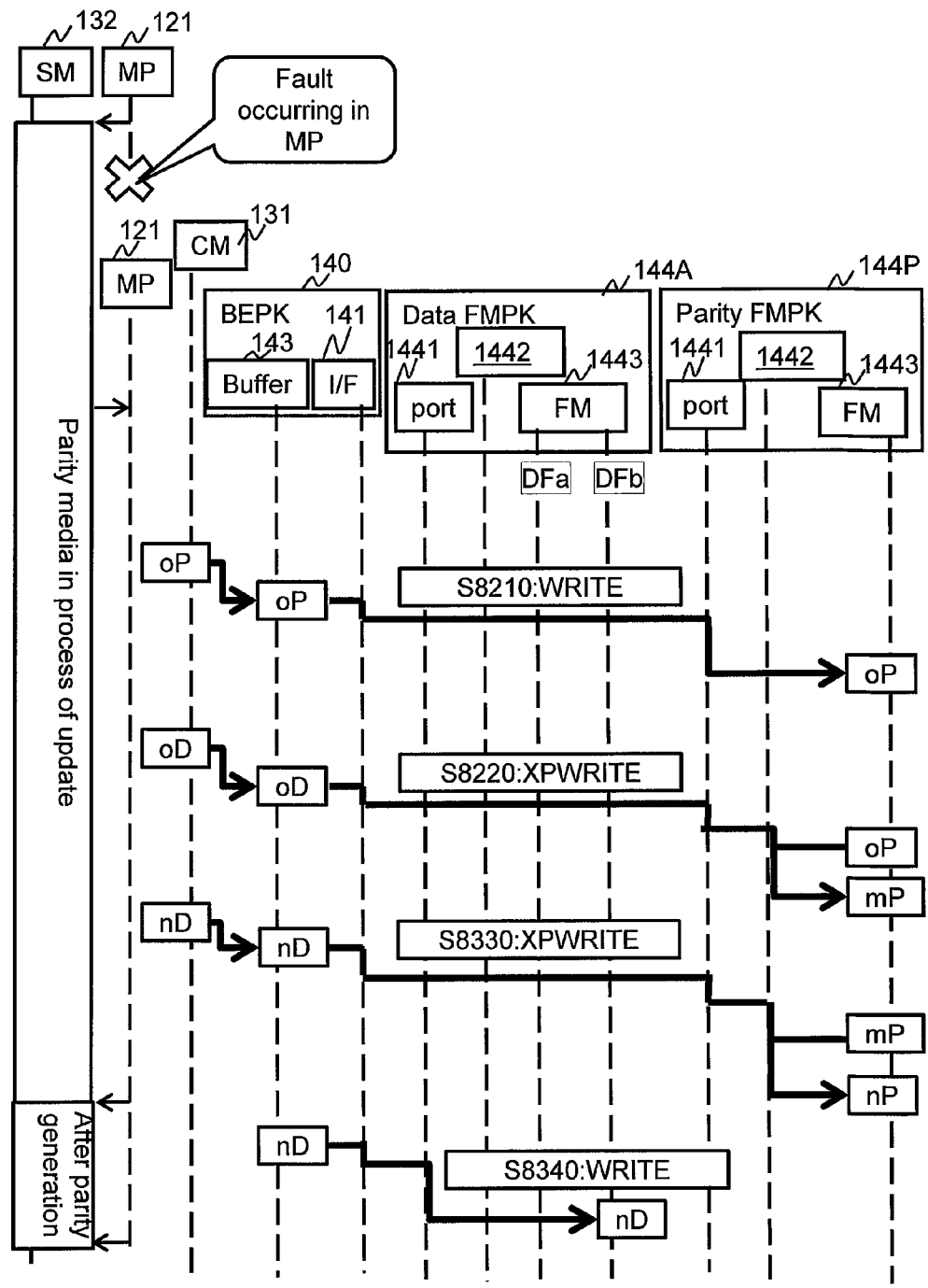
FIG. 89 shows the transition write process performed upon the occurrence of the MP fault in the mid-stage of parity media update, according to Embodiment 6.

FIG. 89 shows a transition write process performed upon the occurrence of the MP fault in the mid-stage in process of parity media update, according to Embodiment 6. The key components of the operations illustrated in this sequence diagram are the same as those shown in the sequence diagrams related to the normal write process.

Once the MP 121 free of faults recognizes a fault occurring in another MP 121, the MP 121 acknowledges that the process stage information item indicates the stage in process of parity media update. Accordingly, the MP 121 sends the normal write command to the parity FMPK 144P (S8210). In other words, the MP 121 free of faults takes over the write process, from the point where the normal write command is sent to the parity FMPK 144P. This normal write command accompanies the old parity. Consequently, the BEPK 140 writes the old parity stored in the CM 131 into the buffer 143, and sends the old parity to the parity FMPK 144P. Accordingly, the parity FMPK 144P writes the old parity into the FM 1443.

The MP 121 is then notified by the parity FMPK 144P of a normal end of the normal write command. Accordingly, the MP 121 sends the XPWRITE command to the parity FMPK 144P (S8220). This normal write command accompanies the old user data. Accordingly, the BEPK 140 writes the old user data stored in the CM 131 into the buffer 143, and sends the old user data to the data FMPK 144A. The parity FMPK 144P accordingly writes the old user data into the memory 1445, generates the intermediate parity from the old parity stored in the FM 1443 and the old user data stored in the memory 1445, and writes the intermediate parity into the FM 1443.

Subsequently, the MP 121 is notified by the parity FMPK 144P of a normal end of the XPWRITE command. The MP 121 accordingly performs the S8330 and S8340, as in the normal write process.

Accordingly, the MP 121 clears each process stage information item stored in the SM 132.

The above is the transition write process.

Third Specific Example of Transition Write Process According to Embodiment 6

Here is described a transition write process that is performed upon the occurrence of an MP fault in the post-parity generation stage.

Figure 90:
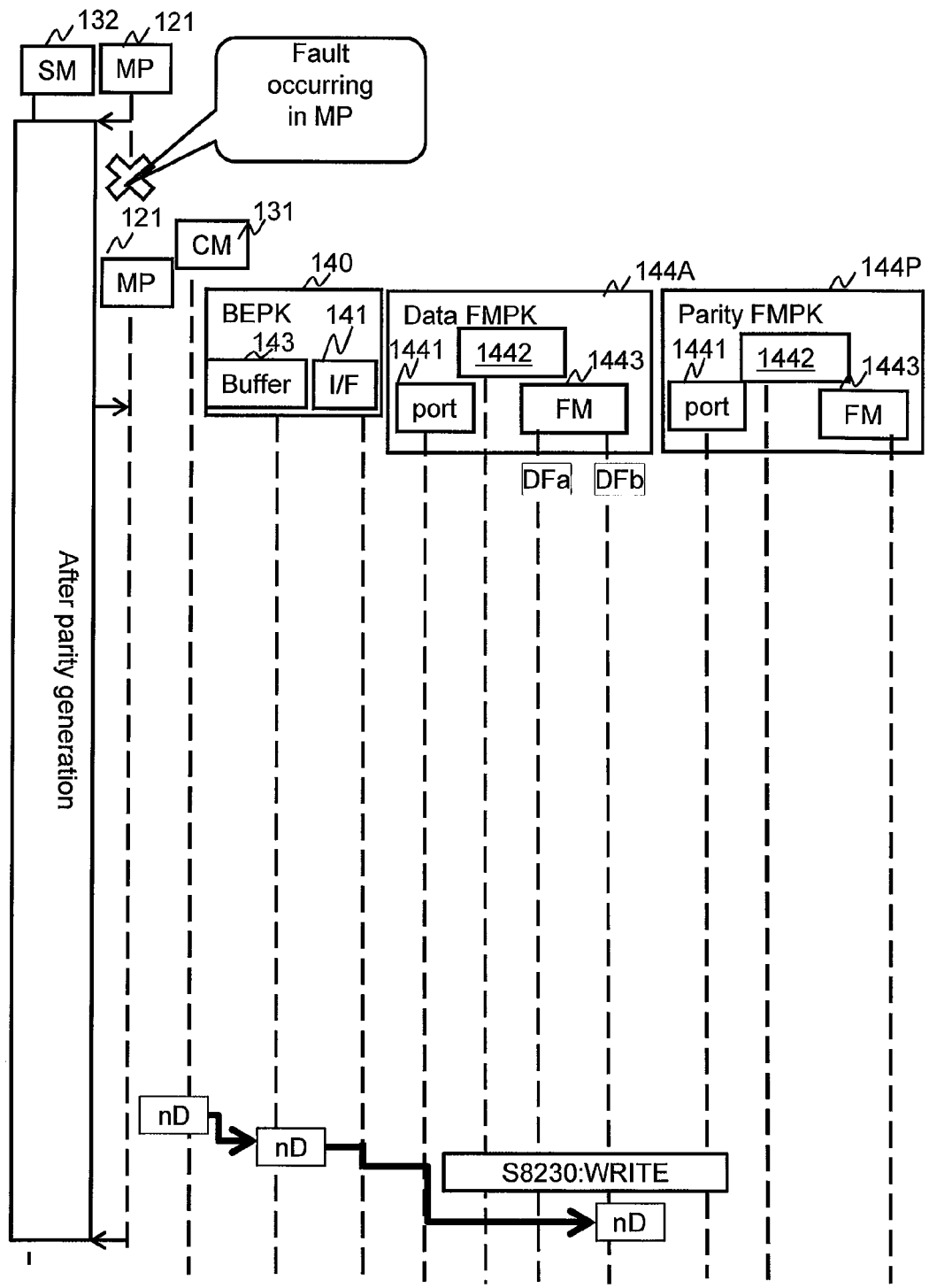
FIG. 90 shows the transition write process performed upon the occurrence of the MP fault in the post-parity generation stage, according to Embodiment 6.

FIG. 90 shows a transition write process performed upon the occurrence of the MP fault in the post-parity generation stage, according to Embodiment 6. The operation targets illustrated in this sequence diagram are the same as those shown in the sequence diagrams related to the normal write process.

Once the MP 121 free of faults recognizes a fault has occurred in the MP 121, the MP 121 acknowledges that the process stage information items indicate the post-parity generation stage. Accordingly, the MP 121 then sends the normal write command to the data FMPK 144A (S8230). The MP 121 free of faults takes over the write process, from the point where the normal write command is sent to the data FMPK 144A. This normal write command accompanies the new user data.

Subsequently, the data FMPK 144A receives the normal write command and the new user data from the controller 100. The data FMPK 144A accordingly writes the new user data stored in the CM 131 into the FM 1443, and notifies the controller 100 of a normal end of the normal write command.

Subsequently, the MP 121 is notified by the data FMPK 144A of the normal end of the normal write command. The MP 121 accordingly clears the value of each process stage information item stored in the SM 132.

The above is the transition write process.

According to these transition write processes (first to third specific examples), even when the MP fault occurs in the pre-parity generation stage, the mid-stage of the parity media update, or the post-parity generation stage, the other MPs 121 free from faults can take over the write process to perform the transition write process. Similarly, data loss does not occur even when the simultaneous point of fault occurs in the plurality of MPPKs 120, the plurality of CMPKs 130, the plurality of BEPKs 1440, and the plurality of FMPKs 144. Therefore, the reliability of the storage system 10 can be improved.

This embodiment can realize the same functions as those described in Embodiment 2, by using the XPWRITE function of the FMPK 144. Moreover, this embodiment can improve the reliability of the storage system 10 better than by Embodiment 5, by writing the old parity into the two CMs 131.

Embodiment 7

This embodiment illustrates a situation where Embodiment 1 is applied to RAID level 6.

The controller 100 uses the plurality of FMPKs 144 to construct a RAID group of RAID level 6. This RAID group uses a Reed-Solomon method. A P parity and Q parity are obtained by the following formulae by using the user data D[0], D[1], ..., D[n−1], and Q parity generation coefficients A[0], A[1], A[n−1]:

$$P = D[0] + D[1] + \ldots + D[n-1] \tag{Ep}$$

$$Q = A[0]*D[0] + A[1]*D[1] + \ldots + A[n-1]*D[n-1] \tag{Eq}$$

The memory 1445 of the FMPK 144 has A[i] stored therein, where i is a data row number within the stripe (i=0, 1, ..., n−1). A[i] may be stored in the XOR circuit 1442.

Write Process According to Embodiment 7

A normal write process is now described hereinafter.

Figure 91:
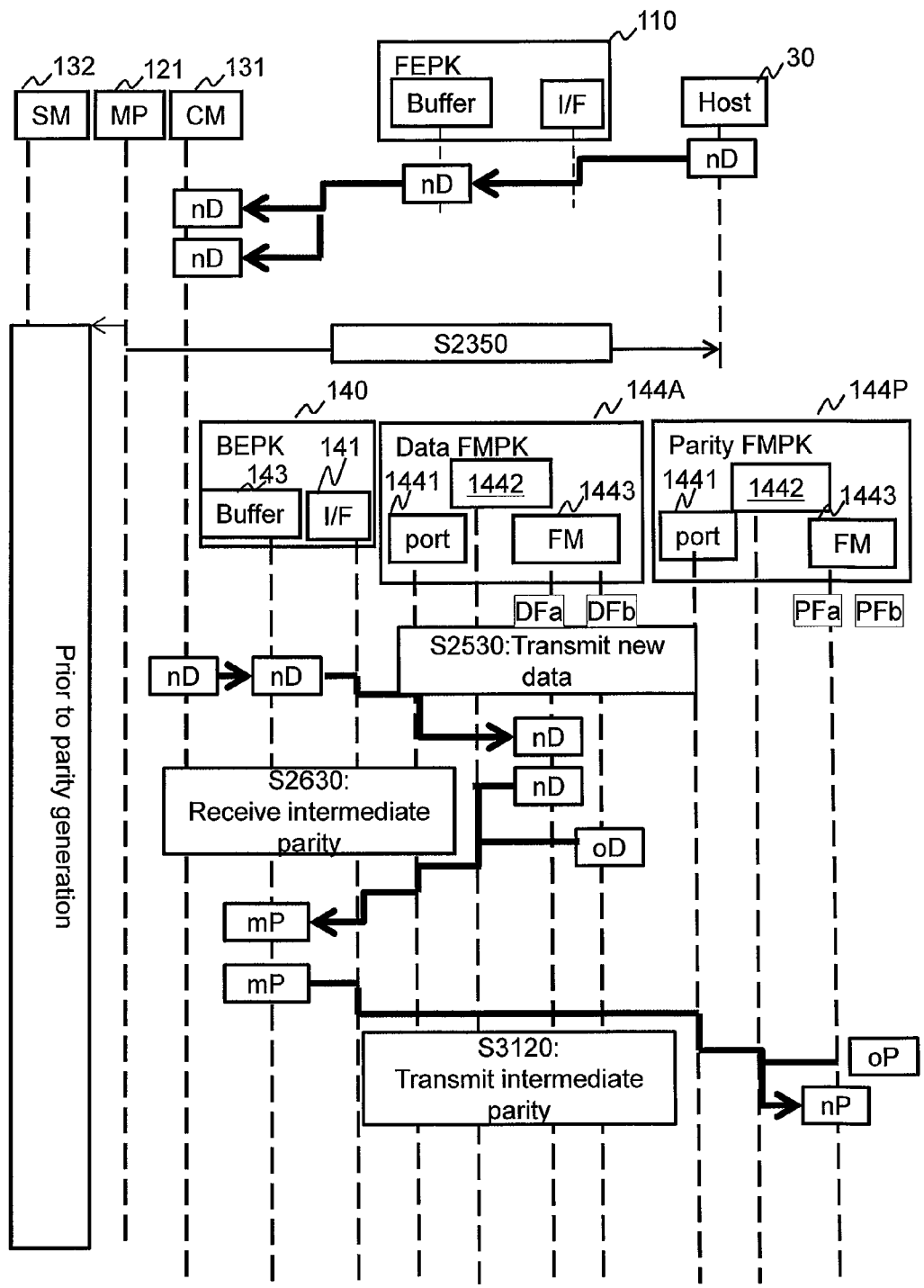
FIG. 91 shows a first process of a write process according to Embodiment 7.
Figure 92:
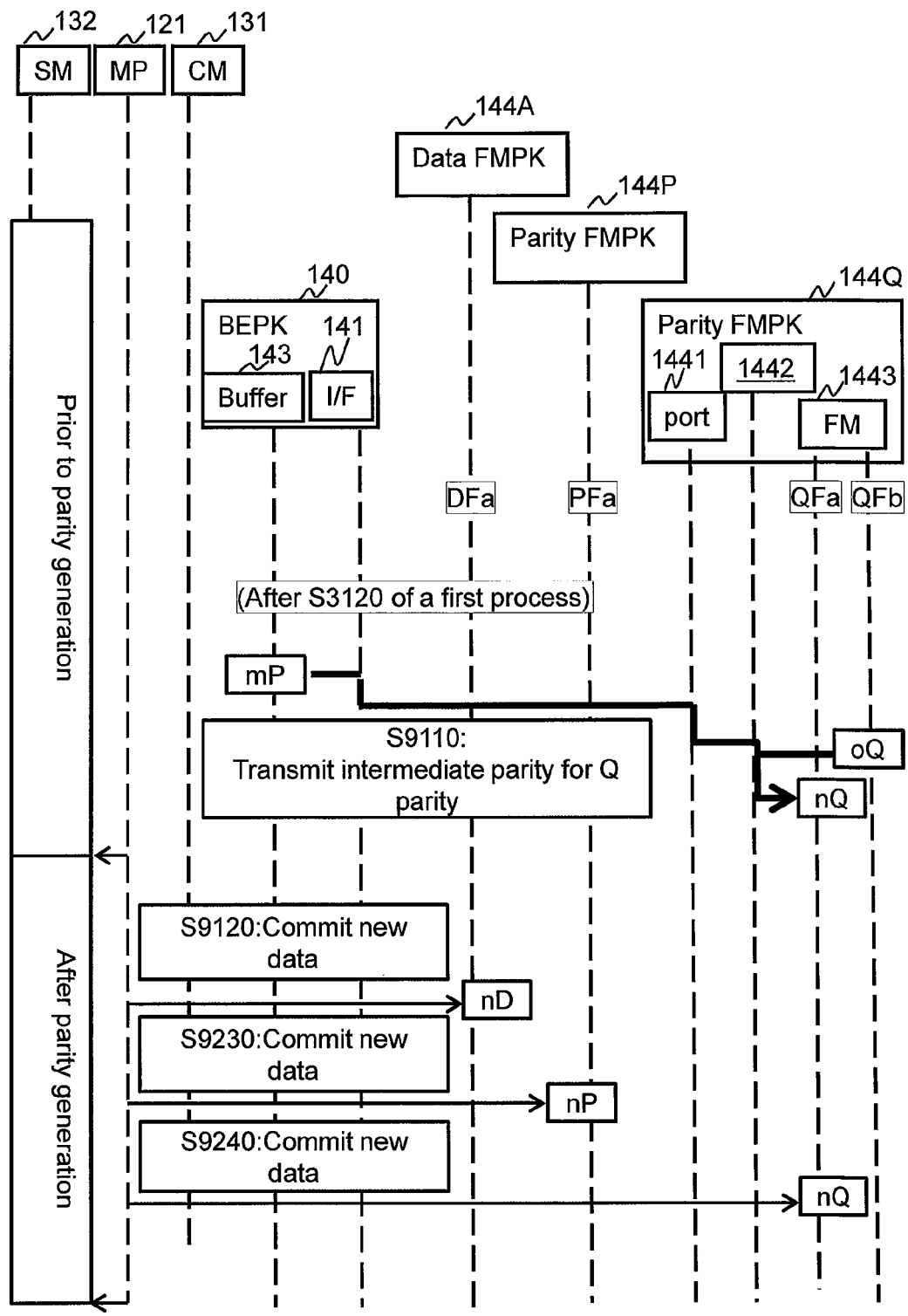
FIG. 92 shows a second process of the write process according to Embodiment 7.

In the diagrams, the write process according to Embodiment 7 is divided into a first process and a second process. FIG. 91 shows the first process of the write process according to Embodiment 7. FIG. 92 shows the second process of the write process according to Embodiment 7.

In the following description, the P parity generated from the old user data is referred to as "old parity," the Q parity generated from the old user data as "old Q parity," the P parity generated from the new user data as "new parity," and the Q parity generated from the new user data as "new Q parity."

In the following description, of the plurality of FMPKs 144 configuring the RAID group, the FMPK 144 having the old party stored therein is referred to as "parity FMPK 144P," and the FMPK 144 having the old Q parity stored therein is referred to as "parity FMPK 144Q." The configurations other than that of the parity FMPK 144Q in the storage system 10 are the same as those described in Embodiment 1. The controller 100 sends information indicating the data row number to the parity FMPK 144Q so that the parity FMPK 144Q specifies the A[i].

In this embodiment, a Q parity intermediate parity transmission command is newly defined as the I/O command sent from the controller 100 to the FMPK 144.

Each of the operation targets illustrated in the sequence diagram of the first process are the same as each of the operation targets illustrated in the sequence diagram related to the write process according to Embodiment 1. The operation targets illustrated in the sequence diagram of the second process are, in addition to the operation targets illustrated in the sequence diagram of the first process, the port 1441 within the parity FMPK 144Q, the XOR circuit 1442 within the parity FMPK 144Q, and storage media QFa and QFb within the parity FMPK 144Q. The storage media QFa and QFb of the parity FMPK 144Q respectively represent two physical pages stored in the FM 1443.

The first process of the write process is described hereinafter.

First, MP 121 performs the processes S2110 to S3120, as in the write process according to Embodiment 1. Accordingly, the buffer 143 of the BEPK 140 has the intermediate parity stored therein. Furthermore, the FM 1443 of the parity FMPK 144P has the old parity and the new parity stored therein.

The second process of the write process is described hereinafter.

Subsequently, the MP 121 sends the Q parity intermediate parity transmission command to the parity FMPK 144Q (S9110). This Q parity intermediate parity transmission command designates the logical page having the old Q parity stored therein, and accompanies the intermediate parity and the data row number. At this moment, in response to an instruction from the MP 121, the BEPK 140 reads the intermediate parity from the buffer 143, and sends the intermediate parity to the parity FMPK 144Q.

The parity FMPK 144Q then receives the Q parity intermediate parity transmission command, the intermediate parity, and the data row number from the controller 100. The parity FMPK 144Q accordingly writes the intermediate parity into the memory 1445, reads the old Q parity stored in the FM 1443, reads the intermediate parity stored in the memory 1445, reads the Q parity generation coefficient stored in the memory 1445 on the basis of the data row number, generates the new Q parity by means of the XOR circuit 1442, and writes the new parity Q into the FM 1443. The parity FMPK 144Q then notifies the controller 100 of a normal end of the Q parity intermediate parity transmission command.

Subsequently, the MP 121 is notified by the parity FMPK 144Q of the normal end. The MP 121 accordingly changes the value of each process stage information item to the post-parity generation stage.

The MP 121 then sends the new data commit command to the parity FMPK 144P (S9120). This new data commit command designates the logical page having the new user data stored therein.

Then, the data FMPK 144A receives the new data commit command from the controller 100. Accordingly, the data FMPK 144A determines the new user data as the user data after update, and notifies the controller 100 of a normal end of the new data commit command.

Subsequently, the MP 121 is notified by the data FMPK 144A of the normal end of the new data commit command. Accordingly, the MP 121 sends the new data commit command to the parity FMPK 144P (S9230). This new data commit command designates the logical page having the new parity stored therein.

The parity FMPK 144P then receives the new data commit command from the controller 100. Accordingly, the parity FMPK 144P determines the new parity as the P parity after update, and notifies the controller 100 of a normal end of the new data commit command.

Subsequently, the MP 121 is notified by the parity FMPK 144P of the normal end of the new data commit command. The MP 121 accordingly sends the new data commit command to the parity FMPK 144Q (S9240). This new data commit command designates the logical page having the new Q parity stored therein.

The parity FMPK 144Q then receives the new data commit command from the controller 100. Accordingly, the parity FMPK 144Q determines the new Q parity as the Q parity after update, and notifies the controller 100 of a normal end of the new data commit command.

Subsequently, the MP 121 is notified by the parity FMPK 144Q of the normal end of the new data commit command. Accordingly, the MP 121 clears the value of each process stage information item stored in the SM 132.

The above is the write process.

In this manner, the controller 100 sends the intermediate parity from the buffer 143 to the parity FMPK 144P and the parity FMPK 144Q without writing the intermediate parity received from the data FMPK 144A into the CM 131. As a result, the number of accesses to the CM 131 during the write process is reduced.

In addition, as with Embodiment 1, data loss does not occur even when the simultaneous point of fault occurs in the plurality of MPPKs 120, the plurality of CMPKs 130, the plurality of BEPKs 140, and the plurality of FMPKs 144. Therefore, the reliability of the storage system 10 can be improved.

According to each of the embodiments described above, reducing the number of accesses to the CM 131 can reduce the communication overhead of the communication with the CMPK 130 and the load on the CM 131, improving the throughput of the storage system 10.

According to each of the embodiments described above, the reliability of the storage system 10 can be improved by storing the new user data and each process stage information item in the two CMPKs 130.

Furthermore, according to each of the embodiments described above, the occurrence of data loss can be prevented even when the simultaneous point of fault occurs in the plurality of MPPKs 120, the plurality of CMPKs 130, and the plurality of BEPKs 140 during the write processes.

In each of the embodiments described above, hamming codes, redundancy codes and the like may be used in place of the parities.

Moreover, the order of the steps of the operations performed by the controller 100 is often changed. For instance, S3230 and S3320 can be switched over. Additionally, S8120 and S8310 can be switched over as well.

Each logical region group may be in the form of a stripe based on the RAID group. Each logical region may be an element configuring the stripe, or may be provided one-on-one to a nonvolatile memory. Each logical region group may be a component of a logical unit provided to a transmission-source device to which a write request is transmitted (e.g., the host computer or another storage system), or may be a region group (a region group that is allocated to a write-destination virtual segment, when writing occurs on the virtual segment) that is dynamically allocated to any of a plurality of virtual segments (virtual storage regions), which configure a virtual logical unit (e.g., a logical unit according to thin provisioning) provided to the transmission-source device. In the latter case, a storage region pool may be configured by the plurality of logical segments. Each logical segment may be configured by one or more logical region groups and allocated to a virtual segment in units of the logical segments. The storage region pool may be configured by a plurality of logical units, in which case each of the logical units may be configured by two or more logical segments.

The present specification has described, for example, the following storage systems according to (Description 1) to (Description 4).

(Description 1)

A storage system, comprising:
a plurality of storage devices, each of which has a plurality of storage media and a device controller for controlling the plurality of storage media and has a RAID group configured by the plurality of storage media; and
a system controller that has a processor, a buffer memory coupled to the plurality of storage devices and the processor by a predetermined communication network, and a cache memory coupled to the processor and the buffer memory by the predetermined communication network,
wherein the processor stores first data, which is related to a write request from a host computer, in the cache memory, specifies from the plurality of storage devices a first storage device for storing data before update, which is data obtained before updating the first data, and transfers the first data to the specified first storage device,
a first device controller of the first storage device transmits the first data and second data based on the data before update, from the first storage device to the system controller, and
the processor stores the second data in the buffer memory, specifies a second storage device from the plurality of storage devices, transfers the stored second data to the specified second storage device, and manages a process stage information item indicating a stage of a process performed on the write request.

(Description 2)

The storage system according to Description 1,
wherein the second data is an intermediate parity and the second storage device is a storage device in which parity data before update is stored,
the first device controller calculates the intermediate parity based on the first data and the data before update that are stored in the first storage device, and transmits the calculated intermediate parity to the system controller,
the processor stores the intermediate parity in the buffer memory and transfers the stored intermediate parity to the second storage device, and
a second device controller of the second storage device calculates an updated parity based on the transferred intermediate parity and a parity before update, and writes the calculated updated parity into the second storage device.

(Description 3)

The storage system according to Description 2,
wherein each of the storage media is a flash memory,
the data before update is stored in a first physical region of the flash memory, and
the first device controller stores the first data in a second physical region different from the first physical region of the flash memory, and keeps a correspondence relationship between the data before update and the first physical region and a correspondence relationship between the first data and the second physical region until the updated parity is stored in a flash memory of the second storage device.

(Description 4)

The storage control apparatus according to Description 4,
wherein the first device controller allocates the first physical region storing the data before update to a first logical region designated by a write request, and writes first data obtained from the second memory into the second physical region, which is a physical region different from the first physical region in the first storage device, and
after the updated parity is written to the second storage device, the first device controller allocates the second physical region to the first logical region.

In these descriptions, the system controller and additional system controller correspond to, for example, the MPs 121. Each device controller corresponds to, for example, the CPU 1444 of the FMPK 144. Each storage device corresponds to, for example, the FM 1443 of the FMPK 144. The first memory corresponds to, for example, the SM 132. The first data corresponds to, for example, the new user data. The second data corresponds to, for example, the intermediate parity or the old user data.

REFERENCE SIGNS LIST

10 Storage system
100 Controller
112 Transfer circuit
113 Buffer
123 Internal path
142 Transfer circuit
143 Buffer
150 Communication network
200 Storage unit
1441 Port
1442 Logical operation circuit
1443 FM (Flash Memory)
1444 CPU (Central Processing Unit)
1445 Memory
   1446 Disk I/F

The invention claimed is:

1. A storage system comprising:
a plurality of flash memory packages, and
a system controller including:
   a processor configured to manage the plurality of flash memory packages as a RAID group, the plurality of flash memory packages including a first flash memory package storing old data and a second flash memory package storing old parity related to the old data,
   a cache memory coupled to the processor in which data stored in the cache memory remains after a particular process is completed and is reused by another process, and
   a buffer memory coupled to the processor, the cache memory and the plurality of flash memory packages, where data stored in the buffer memory is deleted after another particular process is completed,
wherein the processor is configured to:
store new data, which is sent from a host computer into the cache memory;
transfer the new data from the cache memory to the first flash memory package storing old data to generate intermediate parity which is based on the new data and the old data,
transfer the intermediate parity to the second flash memory package storing old parity via the buffer memory without storing the intermediate parity into the cache memory to generate new parity which is based on the intermediate parity and the old parity, and
delete the intermediate parity from the buffer memory according to receiving a response, from the second flash memory package, that indicates the transfer of the intermediate parity is completed.

2. A storage system according to claim 1, wherein
the first flash memory package includes a first memory controller and a plurality of first flash memory chips,
the first memory controller configured to:
store the new data into one of the plurality of flash memory chips,
generate the intermediate parity from the new data and the old data, and
transfer the intermediate parity to the buffer memory, while the first memory controller maintains the new data and the old data as a valid status.

3. A storage system according to claim 2, wherein
the second flash memory package includes a second memory controller and a plurality of second flash memory chips,
the second memory controller configured to:
generate the new parity from the intermediate parity and the old parity, and
store the new parity into one of the plurality of second flash memory chips.

4. A storage system according to claim 3, wherein
the processor is configured to send a commit command to the first flash memory package for invalidating the old data after storing the new parity into the one of the plurality of second flash memory chips.

5. A storage system according to claim 4, wherein
the second memory controller stores the new parity into the one of the plurality of second flash memory chips and sends a completion reply to the system controller, and
the processor receives the completion reply and deletes the intermediate parity from the buffer memory.

6. A storage system according to claim 5, wherein
the processor, after receiving the completion reply, sends the commit command to the first flash memory package for invalidating the old data and sends the commit command to the second flash memory package for invalidating the old parity.

7. A storage system according to claim 6, wherein
the new data within the cache memory is maintained after receiving the completion reply.

8. A storage system according to claim 7, wherein
when the processor detects a failure of the buffer memory before the new parity is stored into the one of the plurality of second flash memory chips, the processor sends the new data which is maintained within the cache memory to the first flash memory package so that the first memory controller generates the intermediate parity from the received new data and the old data.

9. A storage system according to claim 7, wherein
the system controller further includes another processor, and
when the another processor detects a failure of the processor before the new parity is stored into the one of the plurality of second flash memory chips, the another processor sends the new data which is maintained within the cache memory to the first flash memory package so that the first memory controller generates the intermediate parity from the received new data and the old data.

10. A storage system according to claim 9, wherein
when the another processor detects the failure of the processor after the new parity is stored into the one of the plurality of second flash memory chips, the another processor sends the commit command to the first flash memory package for invalidating the old data stored within the one of the plurality of first flash memory chips.

11. A storage system according to claim 1, wherein
different flash memory packages in the RAID group are coupled to the system controller with different data busses, respectively.

12. A storage system comprising:
a plurality of flash memory packages, each of which includes a plurality of flash memory chips and a flash controller coupled to the flash memory chips, and
a system controller including:
   a processor configured to manage the plurality of flash memory packages as a RAID group,
   a cache memory coupled to the processor in which data stored in the cache memory remains after a particular process is completed is reused by another process, and
   a buffer memory coupled to the processor, the cache memory and the plurality of flash memory packages, the buffer memory is used to transfer any data among the plurality of flash memory packages, and data stored in the buffer memory is deleted after another particular process is completed, wherein the processor is configured to:

store new data, which is sent from a host computer, into the cache memory;

transfer the new data from the cache memory to a first flash memory package of the plurality of flash memory packages to generate intermediate parity which is based on the new data and old data stored in the first flash memory package, transfer the intermediate parity to a second flash memory package of the plurality of flash memory packages via the buffer memory without storing the intermediate parity into the cache memory to generate new parity which is based on the intermediate parity and old parity related to the old data stored in the second flash memory package, and delete the intermediate parity from the buffer memory according to receiving a response, from the second flash memory package, that indicates the transfer of the intermediate parity is completed.

13. A storage system according to claim 12, wherein a first memory controller of the first flash memory package is configured to:

store the new data into one of a plurality of first flash memory chips of the first flash memory package, generate the intermediate parity from the new data and the old data, and transfer the intermediate parity to the buffer memory, while the first memory controller maintains the new data and the old data as a valid status.

14. A storage system according to claim 13, wherein a second memory controller of the second flash memory package is configured to:

generate the new parity from the intermediate parity and the old parity and store the new parity into one of the plurality of second flash memory chips.

15. A storage system according to claim 14, wherein the processor is configured to send a commit command to the first flash memory package for invalidating the old data after storing the new parity into the one of a plurality of second flash memory chips of the second flash memory package.

16. A storage system according to claim 15, wherein the second memory controller stores the new parity into the one of the plurality of second flash memory chips and sends a completion reply to the system controller, and the processor receives the completion reply and deletes the intermediate parity from the buffer memory.

17. A storage system according to claim 16, wherein the processor, after receiving the completion reply, sends the commit command to the first flash memory package for invalidating the old data and sends the commit command to the second flash memory package for invalidating the old parity.

18. A storage system according to claim 17, wherein the new data within the cache memory is maintained after receiving the completion reply.

19. A storage system according to claim 18, wherein when the processor detects a failure of the buffer memory before the new parity is stored into the one of the plurality of second flash memory chips, the processor sends the new data which is maintained within the cache memory to the first flash memory package so that the first memory controller generates the intermediate parity from the received new data and the old data.

20. A storage system according to claim 18, wherein the system controller further includes another processor, and when the another processor detects a failure of the processor before the new parity is stored into the one of the plurality of second flash memory chips, the another processor sends the new data which is maintained within the cache memory to the first flash memory package so that the first memory controller generates the intermediate parity from the received new data and the old data.

21. A storage system according to claim 20, wherein when the another processor detects the failure of the processor after the new parity is stored into the one of the plurality of second flash memory chips, the another processor sends the commit command to the first flash memory package for invalidating the old data stored within the one of the plurality of first flash memory chips.

22. A storage system according to claim 12, wherein different flash memory packages in the RAID group are coupled to the system controller with different data busses, respectively.

* * * * *